(12) United States Patent
Silverbrook et al.

(10) Patent No.: US 7,607,756 B2
(45) Date of Patent: *Oct. 27, 2009

(54) PRINTHEAD ASSEMBLY FOR A WALLPAPER PRINTER

(75) Inventors: Kia Silverbrook, Balmain (AU); Tobin Allen King, Balmain (AU); Janette Faye Lee, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 356 days.

This patent is subject to a terminal disclaimer.

(21) Appl. No.: 10/760,214

(22) Filed: Jan. 21, 2004

(65) Prior Publication Data

US 2004/0207688 A1     Oct. 21, 2004

Related U.S. Application Data

(63) Continuation-in-part of application No. 10/160,273, filed on Jun. 4, 2002, now Pat. No. 6,746,105, which is a continuation of application No. 09/112,767, filed on Jul. 10, 1998, now Pat. No. 6,416,167.

(30) Foreign Application Priority Data

Jul. 15, 1997   (AU)  ..................................... PO7991
Mar. 25, 1998   (AU)  ..................................... PP2592

(51) Int. Cl.
   *B41J 2/155*     (2006.01)
(52) U.S. Cl. ............................... 347/42; 347/56; 347/61
(58) Field of Classification Search .................. 347/42
   See application file for complete search history.

(56) References Cited

U.S. PATENT DOCUMENTS

| 1,941,001 | A |   | 12/1933 | Hansell |
| 3,373,437 | A |   | 3/1968  | Sweet et al. |
| 3,596,275 | A |   | 7/1971  | Sweet |
| 3,683,212 | A |   | 8/1972  | Zoltan |
| 3,747,120 | A | * | 7/1973  | Stemme ..................... 347/70 |
| 3,946,398 | A |   | 3/1976  | Kyser et al. |
| 4,423,401 | A |   | 12/1983 | Mueller |
| 4,459,601 | A |   | 7/1984  | Howkins |
| 4,490,728 | A |   | 12/1984 | Vaught et al. |
| 4,553,393 | A |   | 11/1985 | Ruoff |
| 4,584,590 | A |   | 4/1986  | Fischbeck et al. |
| 4,587,898 | A |   | 5/1986  | Welschlau |
| 4,672,398 | A |   | 6/1987  | Kuwabara et al. |
| 4,737,802 | A |   | 4/1988  | Mielke |

(Continued)

FOREIGN PATENT DOCUMENTS

DE    195 16 997    11/1995

(Continued)

*Primary Examiner*—Matthew Luu
*Assistant Examiner*—Brian J Goldberg

(57) ABSTRACT

The invention provides a printhead assembly for a printer which prints onto a moving web that follows a path. A full width printhead located across the path of the printer. The printhead is a color printhead which is at least as wide as the web. The printhead is supplied with a number of different inks which are remote from the printhead and which are supplied to the printhead through tubes. In some embodiments the printhead is retained by a rail which is located across the path and along which the printhead slides into and out of a printing position.

16 Claims, 87 Drawing Sheets

U.S. PATENT DOCUMENTS

| | | | |
|---|---|---|---|
| 4,864,824 A | 9/1989 | Gabriel et al. | |
| 4,899,181 A | 2/1990 | Hawkins et al. | |
| 5,029,805 A | 7/1991 | Albarda et al. | |
| 5,051,761 A * | 9/1991 | Fisher et al. | 347/30 |
| 5,187,501 A | 2/1993 | Lewicki et al. | |
| 5,258,774 A | 11/1993 | Rogers | |
| 5,666,141 A | 9/1997 | Matoba et al. | |
| 5,719,604 A | 2/1998 | Inui et al. | |
| 6,007,187 A * | 12/1999 | Kashino et al. | 347/65 |
| 6,022,104 A * | 2/2000 | Lin et al. | 347/102 |
| 6,322,195 B1 * | 11/2001 | Silverbrook | 347/20 |
| 6,354,212 B1 | 3/2002 | Krinsky | |
| 6,416,167 B1 | 7/2002 | Silverbrook | |
| 6,435,643 B1 | 8/2002 | Miura et al. | |
| 2001/0017089 A1 | 8/2001 | Fuji | |
| 2002/0069078 A1 | 6/2002 | Goldstein | |
| 2002/0171692 A1* | 11/2002 | Martin | 347/2 |
| 2002/0180834 A1* | 12/2002 | Silverbrook | 347/42 |
| 2003/0168148 A1 | 9/2003 | Gerber et al. | |

FOREIGN PATENT DOCUMENTS

| | | |
|---|---|---|
| DE | 195 32 913 | 3/1996 |
| DE | 196 23 620 | 12/1996 |
| EP | 0 634 273 | 1/1995 |
| EP | 0 713 774 | 5/1996 |
| FR | 2604120 A1 | 3/1988 |
| GB | 2102737 | 2/1983 |
| GB | 23433415 A | 5/2000 |
| JP | 02-092643 | 4/1990 |
| JP | 02-108544 | 4/1990 |
| JP | 02158348 A | 6/1990 |
| JP | 02-265752 | 10/1990 |
| JP | 03065348 | 3/1991 |
| JP | 04-001051 A | 1/1992 |
| JP | 04-353458 | 12/1992 |
| JP | 05284765 A | 10/1993 |
| JP | 06-091865 | 4/1994 |
| JP | 06-091866 | 4/1994 |
| JP | 2000-248217 A | 9/2000 |
| WO | WO 01/79372 | 10/2001 |

* cited by examiner

I-I

II—II

PRINTHEAD ASSEMBLY FOR A WALLPAPER PRINTER

CROSS REFERENCE TO RELATED APPLICATIONS

The present application is a Continuation-In-Part of U.S. application Ser. No. 10/160,273 filed on Jun. 4, 2002, now issued as U.S. Pat. No. 6,746,105, which is a Continuation of U.S. application Ser. No. 09/112,767 filed on Jul. 10, 1998, now issued as U.S. Pat. No. 6,416,167.

FIELD OF THE INVENTION

The invention pertains to printers and more particularly to a printer for wallpaper. The printer is particularly adapted to print long rolls of full color wallpaper and is well suited to serve as the basis of both retail and franchise operations which pertain to print-on-demand wallpaper.

CO-PENDING APPLICATIONS

Various methods, systems and apparatus relating to the present invention are disclosed in the following co-pending applications filed by the applicant or assignee of the present invention simultaneously with the present application:

| | | | | |
|---|---|---|---|---|
| 10/760,272 | 10/760,273 | 7,083,271 | 10/760,182 | 7,080,894 |
| 10/760,218 | 7,090,336 | 10/760,216 | 10/760,233 | 10/760,246 |
| 7,083,257 | 10/760,243 | 10/760,201 | 10/760,185 | 10/760,253 |
| 10/760,255 | 10/760,209 | 10/760,208 | 10/760,194 | 10/760,238 |
| 7,077,505 | 10/760,235 | 7,077,504 | 10/760,189 | 10/760,262 |
| 10/760,232 | 10/760,231 | 10/760,200 | 10/760,190 | 10/760,191 |
| 10/760,227 | 10/760,207 | 10/760,181 | 10/760,254 | 10/760,210 |
| 10/760,202 | 10/760,197 | 10/760,198 | 10/760,249 | 10/760,263 |
| 10/760,196 | 10/760,247 | 10/760,223 | 10/760,264 | 10/760,244 |
| 10/760,245 | 10/760,222 | 10/760,248 | 7,083,273 | 10/760,192 |
| 10/760,203 | 10/760,204 | 10/760,205 | 10/760,206 | 10/760,267 |
| 10/760,270 | 10/760,259 | 10/760,271 | 10/760,275 | 10/760,274 |
| 10/760,268 | 10/760,184 | 10/760,195 | 10/760,186 | 10/760,261 |
| 7,083,272 | 10/760,180 | 10/760,229 | 10/760,213 | 10/760,219 |
| 10/760,237 | 10/760,221 | 10/760,220 | 7,002,664 | 10/760,252 |
| 10/760,265 | 10/760,230 | 10/760,225 | 10/760,224 | 6,991,098 |
| 10/760,228 | 6,944,970 | 10/760,215 | 10/760,256 | 10/760,257 |
| 10/760,240 | 10/760,251 | 10/760,266 | 6,920,704 | 10/760,193 |
| 10/760,260 | 10/760,226 | 10/760,269 | 10/760,199 | 10/760,241 |

The disclosures of these co-pending applications are incorporated herein by cross-reference.

CROSS REFERENCES TO RELATED APPLICATIONS

The following patent applications are hereby incorporated by cross-reference. For the purposes of location and identification, US patent applications identified by their US patent application serial numbers (USSN) are listed alongside the Australian applications from which the US patent applications claim the right of priority.

| Cross-Referenced Australian Provisional Patent Application No. | U.S. Patent/Patent Application (Claiming Right of Priority from Australian Provisional Application) | Docket No. |
|---|---|---|
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |

-continued

| Cross-Referenced Australian Provisional Patent Application No. | U.S. Patent/Patent Application (Claiming Right of Priority from Australian Provisional Application) | Docket No. |
|---|---|---|
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113 | IJM22 |
| PO8074 | 09/113,130 | IJM23 |
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 6,111,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 09/112,745 | IR20 |
| PP0881 | 09/113,092 | IR21 |
| PO8006 | 6,087,638 | MEMS02 |
| PO8007 | 09/113,093 | MEMS03 |
| PO8008 | 09/113,062 | MEMS04 |
| PO8010 | 6,041,600 | MEMS05 |
| PO8011 | 09/113,082 | MEMS06 |
| PO7947 | 6,067,797 | MEMS07 |
| PO7944 | 09/113,080 | MEMS09 |
| PO7946 | 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

BACKGROUND OF THE INVENTION

Printing Technologies

Many different types of printing have been invented, a large number of which are presently in use. The known forms of print have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques on ink jet printing have been invented. For a survey of the field, reference is made to an article by J Moore, "Non-Impact Printing: Introduction and Historical Perspective", Output Hard Copy Devices, Editors R Dubeck and S Sherr, pages 207-220 (1988).

Ink Jet printers themselves come in many different types. The utilization of a continuous stream of ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of a continuous ink jet printing including the step wherein the ink jet stream is modulated by a high frequency electro-static field so as to cause drop separation. This technique is still utilized by several manufacturers including Elmjet and Scitex (see also U.S. Pat. No. 3,373,437 by Sweet et al)

Piezoelectric inkjet printers are also one form of commonly utilized inkjet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a shear mode type of piezoelectric transducer element.

Recently, thermal inkjet printing has become an extremely popular form of inkjet printing. The inkjet printing techniques include those disclosed by Endo et al in GB 2007162 (1979) and Vaught et al in U.S. Pat. No. 4,490,728. Both the aforementioned references disclosed inkjet printing techniques that rely upon the activation of an electrothermal actuator which results in the creation of a bubble in a constricted space, such as a nozzle, which thereby causes the ejection of ink from an aperture connected to the confined space onto a relevant print media. Printing devices utilizing the electrothermal actuator are manufactured by manufacturers such as Canon and Hewlett Packard.

As can be seen from the foregoing, many different types of printing technologies are available. Ideally, a printing technology should have a number of desirable attributes. These include inexpensive construction and operation, high speed operation, safe and continuous long term operation etc. Each technology may have its own advantages and disadvantages in the areas of cost, speed, quality, reliability, power usage, simplicity of construction operation, durability and consumables.

In the construction of any inkjet printing system, there are a considerable number of important factors which must be traded off against one another especially as large scale printheads are constructed, especially those of a pagewidth type. A number of these factors are outlined in the following paragraphs.

Firstly, inkjet printheads are normally constructed utilizing micro-electromechanical systems (MEMS) techniques. As such, they tend to rely upon standard integrated circuit construction/fabrication techniques of depositing planar layers on a silicon wafer and etching certain portions of the planar layers. Within silicon circuit fabrication technology, certain techniques are more well known than others. For example, the techniques associated with the creation of CMOS circuits are likely to be more readily used than those associated with the creation of exotic circuits including ferroelectrics, galium arsenide etc. Hence, it is desirable, in any MEMS constructions, to utilize well proven semi-conductor fabrication techniques which do not require any "exotic" processes or materials. Of course, a certain degree of trade off will be undertaken in that if the advantages of using the exotic material far out weighs its disadvantages then it may become desirable to utilize the material anyway.

With a large array of ink ejection nozzles, it is desirable to provide for a highly automated form of manufacturing which results in an inexpensive production of multiple printhead devices.

Preferably, the device constructed utilizes a low amount of energy in the ejection of ink. The utilization of a low amount of energy is particularly important when a large pagewidth full color printhead is constructed having a large array of individual print ejection mechanism with each ejection mechanisms, in the worst case, being fired in a rapid sequence. The device would have wide application in traditional areas of inkjet printing as well as areas previously unrelated to inkjet printing. On such area is the production wallpaper.

Wallpaper

The size of the wallpaper market in the United States, Japan and Europe offers strong opportunities for innovation and competition. The retail wall covering market in the United States in 1997 was USD $1.1 billion and the market in the United States is estimated at over US 1.5 billion today. The wholesale wallpaper market in Japan in 1999 was JPY $158.96 billion. The UK wall coverings market was £186 m in 2000 and is expected to grow to £197 m in 2004.

Wallpapers are a leading form of interior design product for home improvement and for commercial applications such as in offices, hotels and halls. About 70 million rolls of wallpaper are sold each year in the United States through thousands of retail and design stores. In Japan, around 280 million rolls of wallpaper are sold each year.

The wallpaper industry currently operates around an inventory based model where wallpaper is printed in centralized printing plants using large and expensive printing presses. Printed rolls are distributed to a point of sale where wallpaper designs are selected by consumers and purchased subject to availability. Inventory based sales are hindered by the size and content of the inventory.

The present invention seeks to transform the way wallpaper is currently manufactured, distributed and sold. The invention provides for convenient, low cost, high quality products coupled with a dramatically expanded range of designs and widths which may be offered by virtue of the present invention.

OBJECTS AND SUMMARY OF THE INVENTION

It is an object of the invention to provide an alternative to existing wallpaper printing technology and business methods.

The invention seeks to enable immediate printing and delivery of wallpapers in retail or design stores to a customer's required roll length.

The invention also seeks to enable immediate access to an extensive portfolio of designs for customer sampling and sale.

The invention may provide photographic quality designs that are not possible using analogue printing techniques.

The invention also seeks to eliminate stock-out, stock-control/ordering and stock obsolesces issues.

It is an object of the invention to significantly reducing customer wastage by printing to any length (and a variety of widths) required by the customer rather that restricting purchases to fixed roll sizes.

The invention seeks to enable customization and innovation of wallpaper design for individuals or businesses.

In a first aspect the present invention provides a self contained printer for producing rolls of wallpaper, comprising a cabinet in which is located a media path which extends from a media cartridge loading area to a winding area; a full width digital color printhead located in the media path; a processor which accepts operator inputs which are used to configure the printer for producing a particular roll; and the winding area adapted to removably retain a core and wind onto it, wallpaper produced by the printer.

Preferably the self contained printer further comprises an internal dryer, the dryer located between the printhead and the winding area and adapted to blow hot air onto a printed media web.

Preferably the self contained printer, further comprises a cutting mechanism located between the printhead and the winding area and adapted to divide with a transverse cut, a media web in accordance with instructions provided by the processor.

Preferably the self contained printer further comprises a slitting mechanism located between the printhead and the winding area and adapted to longitudinally slit a media web in accordance with instructions provided by the processor.

Preferable the self contained printer further comprises a bar code scanner which communicates with the processor and through which operator preferences are input.

Preferably the self contained printer further comprises a well, external to the cabinet and adjacent to an exit slot; the well having at each end, spindles for aligning, retaining and removing a core, and for rotating the core according to instructions provided by the processor.

Preferably the self contained printer further comprises on a front exterior surface of the cabinet, a video display for displaying information about wallpaper that the printer may print.

Preferably the video display is a touch screen which can receive operator selections for use by the processor.

Preferably the media cartridge loading area further comprises a location for a media cartridge, in which a media cartridge dispensing slot is adjacent to the path.

Preferably the media cartridge loading area further comprises one or more locations where a media cartridge can be stored.

Preferably the printhead is mounted on a rail on which it slides into and out of a printing position across the path.

Preferably the printhead is a multi-color printhead which is supplied by separate ink reservoirs, the reservoirs connected to the printhead by a number of ink supply tubes, there being a tube disconnect coupling between the reservoirs and the printhead.

Preferably the contained printer further comprises an air supply and a tube for bringing a supply of air to the printhead which supply prevents media from sticking to the printhead.

Preferably the self contained printer further comprises a capper motor, the capper motor driving a capping device; the capping device sealing the printhead when not in use in order to prevent contamination from entering the printheads.

Preferably the capper device further comprises a blotter, which moves into and out of position and which is used for absorbing ink fired from the printheads.

Preferably the self contained printer further comprises one or more rail microadjusters for accurately adjusting a gap between the printhead and the media onto which it is printing.

Preferably the path comprises a generally straight path.

Preferably the self contained printer further comprises a pre-heater platen located under the path and before the printhead.

Preferably the self contained printer further comprises a door which covers an opening into a lower compartment of the dryer; the door being moveable from a closed position which covers the opening, to an open position in which the media passes through the opening into the lower compartment and out of the compartment, also through the opening.

Preferably the slitting mechanism further comprises a pair of rotating end plates between which extend a number of transverse shafts, each shaft having one or more cutting disks, the end plates rotatable so that any shaft can be selected, or that no shaft be selected for cutting the media web.

In a second aspect the present invention provides a media cartridge, comprising a case in which a roll of blank media may be deployed; the case having two halves, hinged together, an area between the two halves, when closed, defining a media supply slot; and the case having internally and adjacent to the slot, a pair of rollers, at least one of the rollers being a driven roller which is supported at each end, by the case, for rotation by an external motor.

Preferably the two rollers are held in proximity by a resilient bias, one roller on either side of the slot.

Preferably the driven roller has at one end, a fixture for coupling to a driving shaft, the case having an opening which allows access to the fixture.

Preferably the rollers are held in proximity by a pair of clips; each roller having a circumferential slot at each end; each clip having two extensions which engage the slots of both rollers at one end.

Preferably the two extensions of a clip are joined to a clip body, the body having a central opening for receiving and locating a core which fits in the case.

Preferably the clip body has an anti-rotation feature which is adapted to engage with a cooperating feature of a core, to prevent the core from rotating in the case.

Preferably the media cartridge further comprises a core, adapted to cooperate with the clip body by engaging with the anti-rotation feature.

Preferably the case has at one or both ends, slots for receiving and retaining a clip body.

Preferably the media cartridge further comprises an integral handle at one end of the case.

Preferably the media cartridge further comprises a folding handle located on a top surface of the case.

Preferably the media cartridge further comprising an integral handle at one end of the case and a folding handle located on a top surface of the case.

Preferably the case is a molded polymeric case with an integral hinge, held in a closed position by one or more clips.

Preferably the driven roller is longer than the other roller, the other roller being an idler roller which is contained within the case when it is closed.

Preferably the clips are reversible and adapted to be used at either end of the case.

Preferably the two case halves are formed as a single molding with an integral hinge, the molding having formed in it internal slots for receiving a pair of clips which are used to hold the rollers in proximity.

Preferably one case half has formed in it a journal at each end for supporting one of the rollers.

Preferably one case half has formed in it a journal at each end for supporting the driven roller.

Preferably the media cartridge further comprises a core which is located in the case, the core having around it, a supply of blank wallpaper media.

In a third aspect the present invention provides a consumer tote for a roll of wallpaper, the tote comprising a disposable exterior in which is formed a main access flap and a pair of core access openings; and the tote having an interior in which is located a disposable core which is aligned with the access openings.

Preferably there is formed a gap between the access flap and an adjacent edge of the exterior, when the flap is closed.

Preferably the exterior is formed from a non-metallic textile.

Preferably the core is supported at each end by a molding having a hub which engages the core.

Preferably each hub surrounded by a bearing surface which locates the hub in a respective access opening.

Preferably the bearing surface makes contact with an inside bottom surface of the disposable exterior when the hub is located in the openings.

Preferably the bearing surface is circular and connected to the hub by spokes.

Preferably at least one hub has an external coupling for engaging a rotating winding spindle.

Preferably the coupling comprises a ring of teeth.

Preferably the consumer tote further comprises a handle which folds flat against the exterior.

Preferably the handle is formed by two similar sub-units which fold from a flat position to a cooperating position in which a handle opening in each sub-unit align to form a grip.

Preferably there is formed a gap between the access flap and an adjacent edge of the exterior, when the flap is closed; and each sub-unit has an edge which is affixed to the exterior, adjacent to the gap; the sub-units arranged in a mirror image relationship about the gap.

Preferably the consumer tote further comprises one of the access openings exposes a coupling formed on a hub which carries the core; and a visible marker is located on the exterior for indicating the location of the coupling.

Preferably the exterior is dimensioned to fit between the loading spindles of a wallpaper printing machine.

Preferably the exterior further comprises a viewing window.

Preferably the exterior is adapted to hold about 50 meters of wallpaper wound onto a core.

Preferably the adjacent edge includes a return lip.

Preferably the core is supported at each end by a molding having a hub which engages the core.

Preferably each hub surrounded by a bearing surface which locates the hub in a respective access opening.

In a fourth aspect the present invention provides a transverse cutter for a printer such as a wallpaper printer, comprising a chassis having end plates; the end plates being separated to allow a web of media to pass between them; the end plates supporting between them a cutting blade; and the blade supported at each end to perform a cutting motion which begins on one side of the web and finishes on an opposite side of the web.

Preferably one end plate supports a motor which is coupled to the blade.

Preferably the blade has a driven end that is carried eccentrically by a rotating member.

Preferably both ends of the blade are carried eccentrically by a rotating member.

Preferably the end plates have extending between them a pair of entry rollers in proximity, at least one of the entry rollers being powered.

Preferably the end plates have extending between them a pair of exit rollers in proximity, at least one of the exit rollers being powered.

Preferably the end plates have extending between them a pair of exit rollers in proximity, at least one of the exit rollers being powered; one each of the entry and exit rollers powered by a single motor carried by the chassis.

Preferably the one each of the entry and exit rollers are powered by a belt which passes around the one each of the entry and exit rollers and a rotating shaft associated with the motor.

Preferably the belt is external to an end plate which carries it.

Preferably the transverse cutter further comprises a slitting mechanism, the slitting mechanism further comprising one or more slitting shafts extending between the end plates, each shaft having one or more slitting disks arranged along its length, each disk having a cutting edge, the slitting mechanism selectively engageable to either enter or not enter a path followed by the web according to a requirement of an operator.

Preferably the slitting mechanism further comprises a pair of rotating end brackets between which extend the one or more slitting shafts, at least one of the brackets rotated by a motor carried by an end plate.

Preferably there are two or more slitting shafts arranged around a central support shaft all of which are carried by the brackets.

Preferably the transverse cutter further comprises a guide roller which extends between the end plates and under the path of the media; the guide roller having a number of circumferential grooves, one groove corresponding to the location of each cutting disk associated with the slitting mechanism.

Preferably the transverse cutter further comprises a guide roller which extends between the end plates and under the path of the media; the guide roller having a number of circumferential grooves, one groove corresponding to the location of each cutting disk associated with the slitting mechanism; each slitting shaft having an arrangement of cutting disks on it and each shaft is positionable such that each cutting disk carried by a selected shaft enters a corresponding groove of the guide roller when the selected shaft is rotated into a cutting position.

Preferably each slitting shaft has a different arrangement of cutting disks on it.

Preferably the cutting motion is initiated by a signal from a processor in a self contained wallpaper printer in which the cutter is located, the operation of the cutter determining a length of wallpaper, the length being determined by an input provided by an operator of the printer.

Preferably the slitting mechanism is selectively engageable by a signal from a processor in a self contained wallpaper printer in which the cutter is located, the operation of the slitting mechanism determining a width or widths of wallpaper, the width or widths being determined by an input provided by an operator of the printer.

In a fifth aspect the present invention provides a slitting mechanism for a printer such as a wallpaper printer, the slitting mechanism comprising a chassis having end plates; the end plates being separated by a transverse portion of the chassis to allow a web of media to pass between them; one or more rotating slitting shafts extending between the end plates, each shaft having one or more slitters arranged along its length, each slitter having a cutting edge; and the slitting mechanism selectively engageable to either enter or not enter a path followed by the web according to an input provided by an operator of the printer.

Preferably the slitting mechanism further comprises a pair of rotating end brackets between which extend the one or more slitting shafts, at least one of the brackets rotated by a motor carried by an end plate.

Preferably there are two or more slitting shafts arranged around a central support shaft all of which are carried between and by the brackets.

Preferably the slitting mechanism further comprises a guide roller which extends between the end plates and under the path of the media; the guide roller having a number of circumferential grooves, one groove corresponding to the location of each cutting disk associated with the slitting mechanism.

Preferably the slitting mechanism further comprises a guide roller which extends between the end plates and under the path of the media; the guide roller having a number of circumferential grooves, one groove corresponding to the location of each cutting disk associated with the slitting mechanism; each slitting shaft having an arrangement of cutting disks on it and each shaft is positionable such that each cutting disk carried by a selected shaft enters a corresponding groove of the guide roller when the selected shaft is rotated into a cutting position.

Preferably each slitting shaft has a different arrangement of cutting disks on it.

Preferably the slitting mechanism rotates into a selected position in response to a signal from a processor in a self contained wallpaper printer in which the mechanism is located, the position of the slitting mechanism determining a width or widths of wallpaper, based on a discrete number of width options provided to the operator, an operator's selection being determined by the processor from an input provided by the operator to the printer.

Preferably the slitting mechanism further comprises a transverse cutter extending between the end plates; the blade supported at each end to perform a cutting motion which begins on one side of the web and finished on an opposite side of the web.

Preferably one end plate supports a motor which is coupled to the blade.

Preferably the blade has a driven end that is carried eccentrically by a rotating member.

Preferably each end of the blade is carried eccentrically by a rotating member.

Preferably the end plates have extending between them a pair of entry rollers in proximity, at least one of the entry rollers being powered.

Preferably the end plates have extending between them a pair of exit rollers in proximity, at least one of the exit rollers being powered.

Preferably the end plates have extending between them a pair of exit rollers in proximity, at least one of the exit rollers being powered; one each of the entry and exit rollers powered by a single motor carried by the chassis.

Preferably the one each of the entry and exit rollers are powered by a belt which passes around the one each of the entry and exit rollers and a rotating shaft associated with the motor.

Preferably the belt is external to an end plate which carries it.

Preferably the cutting motion is initiated by a signal from a processor in a self contained wallpaper printer in which the cutter is located, the operation of the cutter determining a length of wallpaper, the length being determined by an input provided by an operator of the printer.

Preferably the input is provided through a touch screen video display located on the printer.

In a sixth aspect the present invention provides a dryer for a printer such as a wallpaper printer, the dryer comprising a compartment with a top opening for receiving a media web fed from the printer; a source of heated air located above the top opening for blowing heated air into the opening to dry printing on the media web.

Preferably the door covers the entire opening and acts to support the web when the door is closed.

Preferably the door pivots along an axis transverse to the path to reveal the opening.

Preferably the door is operated by a motor that operates a spool; the spool winding and releasing a cord which operates the door.

Preferably the dryer further comprises a preheater in the path but located before the opening.

Preferably the preheater is in the same plane as the door.

Preferably the source of heated air comprises a blower which feeds a stream of air into a plenum.

Preferably the dryer further comprises a temperature sensor in the plenum.

Preferably the compartment is adapted to receive the web as a suspended partial loop.

Preferably the compartment has an air vent which supplies a recirculation duct.

Preferably the recirculation duct extends from the compartment to an intake of an air supply that feeds the compartment.

Preferably the recirculation duct is a tube which extends upwardly from the compartment and includes an exhaust vent at an upper extremity.

Preferably the source of heated air further comprises a second blower which feeds a stream of air into the plenum.

Preferably the plenum has a heating element within it.

Preferably the compartment has two vents, each one supplying vented air to a separate recirculation duct, the ducts located on opposite sides of the compartment, each duct supplying recirculated air to a source of heated air.

Preferably the source of heated air is a pair of blowers which direct air into a plenum.

Preferably the blowers are located above the plenum.

Preferably the dryer is located within an on-demand wallpaper printer and is controlled by a processor within the printer.

In a seventh aspect the present invention provides a printer for producing rolls of wallpaper, comprising a cabinet in which is located a media path which extends from a media loading area to a winding area; a printhead located in the media path; a processor which accepts operator inputs from one or more input devices which are used to configure the printer for producing a particular roll; and the winding area adapted to removably retain a core and wind onto it, wallpaper produced by the printer wherein, the length and design of the roll are determined by the operator inputs.

Preferably the printer further comprises an internal dryer, the dryer located between the printhead and the winding area and adapted to blow hot air onto a printed media web.

Preferably the printer further comprises a cutting mechanism located between the printhead and the winding area and adapted to divide with a transverse cut, a media web in accordance with instructions provided by the processor.

Preferably the printer further comprises an input device for capturing data relating to a print job; the data being transmitted by the device to the processor; the processor using the data to establish a configuration for the printer.

Preferably the input device is a bar code scanner.

Preferably the printer further comprises on a front exterior surface of the cabinet, a video display for displaying information about wallpaper that the printer may print, including images of an operator selected pattern.

Preferably the video display is a touch screen which can receive operator selections for use by the processor.

Preferably the printhead is mounted on a rail on which it slides into and out of a printing position across the path.

Preferably the printhead is a page width inkjet style multicolor printhead which is supplied by separate ink reservoirs, the reservoirs connected to the printhead by a number of ink supply tubes, there being a tube disconnect coupling between the reservoirs and the printhead.

Preferably the printer further comprises an air supply and a tube for bringing a supply of air to the printhead which supply prevents media from sticking to the printhead.

Preferably the printer further comprises a capper motor, the capper motor driving a capping device; the capping device sealing the printhead when not in use in order to prevent contamination from entering the printheads.

Preferably the printer further comprises the capper device further comprises a blotter, which moves into and out of position and which is used for absorbing ink fired from the printheads.

Preferably the printer further comprises one or more rail microadjusters for accurately adjusting a gap between the printhead and the media onto which it is printing.

Preferably the path comprises a generally straight path.

Preferably the printer further comprises a media supply canister, one or more of which may be inserted into and removed from the loading area, a canister containing a roll of blank wallpaper media.

Preferably the printer further comprises a door which covers an opening into a lower compartment of the dryer; the door being moveable from a closed position which covers the opening, to an open position in which the media passes through the opening into the lower compartment and out of the compartment, also through the opening.

Preferably the printer further comprises a slitting mechanism having a pair of rotating end plates between which extend a number of transverse shafts, each shaft having one or more cutters, the end plates rotatable so that any shaft can be selected, or that no shaft be selected for slitting the media web.

Preferably the printer further comprises the slitting mechanism is located between the printhead and the winding area and adapted to longitudinally slit a media web in accordance with instructions provided by the processor.

Preferably the printer further comprises a well, external to the cabinet and adjacent to an exit slot; the well having at each end, spindles for aligning, retaining and removing a core, and for rotating the core according to instructions provided by the processor.

Preferably the printer further comprises a pre-heater platen located under the path and before the printhead.

In an eighth aspect of the present invention there is provided a method for printing wallpaper onto a web of media, comprising the steps of utilizing an on-demand printer comprising a cabinet in which is located a media path which extends from a media loading area to a winding area, there being a printhead located in the media path, a processor which accepts operator inputs from one or more input devices; using one or more input devices which communicate with the processor to capture data from an operator regarding a specification for an operator's requirements; using the processor to operatively control the printer according to the data; and printing a single roll of wallpaper, on demand, according to a selected pattern.

Preferably the method further comprises representing the pattern as a symbol which can be captured as the data by an input device which communicates with the processor.

Preferably the method further comprises storing to a storage device accessible to the processor and internal to the cabinet, a plurality of selectable files for describing patterns for printing onto the media.

Preferably the method further comprises providing the printer with a video display for depicting the selected pattern.

Preferably the method further comprises using the video display as a touch screen input device to capture operator preferences.

Preferably the method further comprises providing the printer with a scanner for capturing data that specifies a selected pattern.

Preferably the method further comprises using the video display to display information that relates to the configuration.

Preferably printing a roll of wallpaper according to a selected pattern and the configuration further comprises inserting a blank core into a winding area, in or on the printer and accessible to an operator; winding the web onto the core after the web has been printed on; and severing the wound core from the web.

Preferably winding the web is performed by winding a length of a printed web onto the core; the length being determined in advance; the length being part of the configuration of the printer.

Preferably the core is contained in a tote during the winding.

Preferably winding the web is further performed by slitting the web, within the printer, to one or more specified widths prior to winding; the one or more specified widths being a part of the printer configuration, having been communicated through one of the input devices.

Preferably the method further comprises providing one or more collections of patterns; each pattern in a collection having a symbol which can be used as an operator input.

Preferably the specification for an operator's requirements comprises a pattern and the configuration; the configuration being one or more parameters selected from the group comprising: roll length, a roll slitting arrangement, one or more modifications to the pattern, or a selection of media to be printed on.

Preferably utilizing an on-demand printer further comprises loading a media cartridge into the printer, the cartridge containing a unprinted web of media; and using a motor in the printer to advance the unprinted web into the path; automatically threading the media from the loading area, to the winding area.

Preferably utilizing an on-demand printer further comprises loading a media tote into the winding area; winding a printed roll of wallpaper onto a core inside the tote; and severing the printed roll on the core from the web.

Preferably utilizing an on-demand printer further comprises loading an empty core into the winding area; winding a printed roll of wallpaper onto a core; and severing the printed roll on the core from the web using an automated cutting mechanism inside the printer, the cutting mechanism receiving a signal for commencing cutting from the processor.

Preferably printing a roll of wallpaper according to a selected pattern further comprises using a full width, stationary color printhead to print onto the web while it is in motion along the path.

Preferably the method further comprises drying the web after it is printed on but before it is dispensed by the printer.

Preferably the method further comprises admitting the printed web into a compartment in an internal dryer and exposing the web to a stream of heated air.

Preferably the method further comprises heating the web with a pre-heater platen located under the path before the web passes the printhead.

In a ninth aspect the present invention provides a method for operating a wallpaper printing business, comprising the steps of: utilizing an on-demand printer comprising a cabinet in which is located a media path which extends from a media loading area to a printhead and from the printhead to a dispensing slot; using one or more printer input devices which communicate with a processor to capture data regarding one or more customer's requirements; the data comprising at least a customer selected pattern; printing a roll of wallpaper, onto a web of blank media, on demand, according to the selected pattern; and charging a customer for the roll.

Preferably the method further comprises allowing the customer to select a width; capturing the width as data with a printer input device; and using the printer to slit the web to the width.

Preferably the method further comprises allowing the customer to select a roll length; capturing the roll length as data with a printer input device; and using the printer to cut the web to the roll length.

Preferably the method further comprises charging the customer only for the length.

Preferably the method further comprises acquiring data from a touch screen display which is also adapted to display the pattern.

Preferably the method further comprises providing the printer with a scanner for capturing data that specifies a selected pattern or other data.

Preferably the method further comprises allowing the customer to select a media type and using that media type in the printer.

Preferably the customer selected pattern is selected by the customer from a collection of swatches which correspond to patterns that the printer is able to print on demand.

Preferably the customer can use an input device to alter how the printer prints a selected pattern.

Preferably the method further comprises providing a collection of swatches; assigning a symbol to each swatch; using the symbol as an input by using a printer input device.

Preferably the method further comprises the customer's requirements comprise a pattern and a configuration; the configuration being one or more parameters selected from the group comprising: roll length, a roll slitting arrangement, one or more modifications to the pattern, or a selection of media to be printed on.

Preferably utilizing an on-demand printer further comprises loading a media canister into the printer, the canister containing an unprinted web of media; and using a motor in the printer to advance the unprinted web into the path; automatically threading the media from the loading area, to the dispensing slot.

Preferably utilizing an on-demand printer further comprises loading a disposable media tote into a winding area adjacent to the dispensing slot; winding a printed roll of wallpaper onto a core inside the tote; and severing the printed roll on the core from the web.

Preferably utilizing an on-demand printer further comprises severing the printed roll on the core from the web using an automated cutting mechanism inside the printer, the cutting mechanism receiving a signal for commencing cutting from the processor.

Preferably printing a roll of wallpaper according to a selected pattern further comprises using a full width, color printhead to print onto the web while it is in motion along the path.

Preferably the method further comprises drying the web after it is printed on but before it is dispensed by the printer.

Preferably an operator uses the printer for a customer.

Preferably the method further comprises allowing a customer to design a custom pattern defined by data; using the one or more input devices to capture the data; and printing the custom pattern on demand.

Preferably the method further comprises selling printed rolls as they are produced to eliminate printed wallpaper inventory.

In a tenth aspect the present invention provides a method for operating a wallpaper printing franchise, comprising the steps of providing to franchisees, an on-demand printer comprising a cabinet in which is located a media path which extends from a media loading area to a printhead and from the printhead to a dispensing slot; the printer having one or more printer input devices which communicate with a processor to capture data regarding one or more customer requirements, the data comprising at least a customer selected pattern; providing the franchisee with a collection of patterns in a digital storage medium that can be read by the printer; enabling the franchisee to print a roll of wallpaper, onto a web of blank media, on demand, according to the selected pattern; and obtaining or attempting to obtain a fee from the franchisee.

Preferably the printer allows the customer to select a width; the printer captures the width as data with a printer input device; and the printer is used to slit the web to the width.

Preferably the printer allows the customer to select a roll length; the printer captures the roll length as data with a printer input device; and the printer is used to cut the web to the roll length.

Preferably the franchisee charges the customer only for the length.

Preferably the printer acquires data from a touch screen display which is also adapted to display the pattern to a customer of the franchisee.

Preferably the printer is provided with a scanner for capturing data that specifies a customer selected pattern or other data.

Preferably the method further comprises providing the franchisee with a variety of blank media types so that the franchisee may use any one of them in the printer.

Preferably the franchisee is provided with one or more collections of printed swatches which correspond to patterns that the printer is able to print on demand.

Preferably a customer of the franchisee can use an input device to alter how the printer prints a selected pattern.

Preferably each swatch is assigned a printed symbol; and the franchisee uses the symbol as an input by using a printer input device.

Preferably the customer's requirements comprise a pattern and a configuration; the configuration being one or more parameters selected from the group comprising: roll length, a roll slitting arrangement, one or more modifications to the pattern, or a selection of media to be printed on.

Preferably enabling the franchisee to print further comprises providing the franchisee with a plurality of media canisters adapted to contain an unprinted web of media.

Preferably the method further comprises providing a motor in the printer to advance the unprinted web into the path by automatically threading the media through the printer.

Preferably the method further comprises loading the canister with blank media before providing it to the franchisee.

Preferably the franchisee is provided, from time to time, with new patterns for customers to select.

Preferably utilizing an on-demand printer further comprises loading a disposable media tote into a winding area adjacent to the dispensing slot; winding a printed roll of wallpaper onto a core inside the tote; and severing the printed roll on the core from the web.

Preferably the printhead is a full width color printhead that prints patterns accessible to the processor.

Preferably printing a roll of wallpaper according to a selected pattern further comprises using a full width, color printhead to print onto the web while it is in motion along the path.

Preferably the method further comprises drying the web after it is printed on but before it is dispensed by the printer.

Preferably the franchisee is instructed to operate the printer for a customer.

Preferably the franchisee is provided with totes for holding cores which cooperate with a winding area of the printer at which area are located one or more spindles that support the core during winding.

Preferably the method further comprises enabling the franchisee to sell printed rolls as they are produced to eliminate printed wallpaper inventory.

In an eleventh aspect the present invention provides a printer for producing rolls of wallpaper, comprising a frame in which is located a media path which extends from a media loading area to a winding area; a printhead located across the media path; one or more input devices for capturing operator instructions; a processor which accepts operator inputs which are used to configure the printer for producing a particular roll; and the winding area adapted to removably retain a core and wind onto it, wallpaper produced by the printer.

Preferably the printer further comprises an internal dryer, the dryer located between the printhead and the winding area and adapted to blow air onto a printed media web.

Preferably the printer further comprises a cutting mechanism located between the printhead and the winding area and adapted to divide a media web from a wound portion.

Preferably the printer further comprises a slitting mechanism located between the printhead and the winding area and adapted to longitudinally slit a media web prior to winding.

Preferably the printer further comprises a bar code scanner which communicates with the processor and through which data is input.

Preferably the printer further comprises a well, external to the cabinet and adjacent to an exit slot; the well having at each end, spindles for aligning, retaining and removing a core, and for rotating the core.

Preferably the printer further comprises on a front exterior surface of the cabinet, a tilting video display for displaying information about wallpaper that the printer may print.

Preferably the video display is a touch screen which can receive operator selections for use by the processor.

Preferably the loading area further comprises a location for a media cartridge, in which a media cartridge dispensing slot is adjacent to the path.

Preferably the media cartridge loading area further comprises one or more locations where a media cartridge can be stored.

Preferably the printhead is a full width color inkjet type printhead, mounted on a rail on which it slides into and out of a printing position across the path.

Preferably the printhead is a multi-color printhead which is supplied by separate ink reservoirs, the reservoirs connected to the printhead by a number of ink supply tubes, there being a tube disconnect coupling between the reservoirs and the printhead.

Preferably the printer further comprises an air supply and a tube for bringing a supply of air to the printhead which supply prevents media from contacting the printhead.

Preferably the printer further comprises a capper motor, the capper motor driving a capping and blotting device; the capping device sealing the printhead when not in use in order to prevent contamination from entering the printheads.

Preferably the capping and blotting device further comprises a blotter, which moves into and out of position and which is used for absorbing ink fired from the printheads.

Preferably the printer further comprises one or more rail microadjusters for accurately adjusting a gap between the printhead and the media onto which it is printing.

Preferably the path comprises a generally straight path which is self threading.

Preferably the printer further comprises a pre-heater platen located before the printhead.

Preferably the printer further comprises a door which covers an opening into a lower compartment of the dryer; the door being moveable from a closed position which covers the opening, to an open position in which the media passes through the opening into the lower compartment and out of the compartment, also through the opening.

Preferably the slitting mechanism further comprises a pair of rotating brackets between which extend a number of transverse shafts, each shaft having one or more cutters, the end brackets rotatable so that any shaft can be selected, or that no shaft be selected for cutting the media web.

In a twelfth aspect the present invention provides a method for printing wallpaper onto a web of media, comprising the steps of utilizing an on-demand printer comprising a cabinet in which is located a media path, there being a full width printhead located across the media path, there being a processor which accepts operator inputs from one or more input devices and which controls the printer; using one or more input devices which communicate with the processor to capture data from an operator regarding a specification; running the printer according to the data; printing a single roll of wallpaper, on demand, according to a selected pattern and configuration; changing the pattern according to a new datum from an operator; and then printing a new roll onto the same web.

Preferably the method further comprises representing the pattern and the new pattern as symbols which can be captured as the data by an input device which communicates with the processor.

Preferably the method further comprises storing to a storage device accessible to the processor and internal to the cabinet, a plurality of selectable files for describing the patterns for printing onto the media.

Preferably the method further comprises providing the printer with a video display for depicting the selected pattern.

Preferably the method further comprises using the video display as a touch screen input device to capture operator preferences.

Preferably the method further comprises providing the printer with a scanner for capturing symbols that specify a selected pattern.

Preferably the method further comprises using the video display to display information that relates to a roll.

Preferably printing a roll of wallpaper according to a selected pattern and the configuration further comprises inserting a blank core into a winding area, in or on the printer and accessible to an operator; affixing the web to the core; winding the web onto the core after the web has been printed on; and severing the wound core from the web.

Preferably winding the web is performed by winding a length of a printed web onto the core; the length being determined in advance; the length being specified by the data.

Preferably the core is contained in a closed tote during the winding.

Preferably winding the web is further performed by slitting the web, within the printer, to one or more specified widths prior to winding; the one or more specified widths being specified by data, having been communicated through one of the input devices.

Preferably the method further comprises providing one or more swatches of patterns; each swatch in a collection having a symbol which can be used as an operator input.

Preferably the specification for an operator's requirements comprises a pattern and the configuration; the configuration being one or more parameters selected from the group comprising: roll length, a roll slitting arrangement, one or more modifications to the pattern, or a selection of media to be printed on.

Preferably utilizing an on-demand printer further comprises loading a re-usable media cartridge into the printer, the cartridge containing a unprinted web of media; and using a motor in the printer to drive a roller in the cartridge to advance the unprinted web into the path; automatically threading the media from the loading area, to the winding area.

Preferably utilizing an on-demand printer further comprises loading a media tote into the winding area; winding a printed roll of wallpaper onto a core inside the tote when it is closed; and severing the printed roll on the core from the web.

Preferably utilizing an on-demand printer further comprises loading an empty core into the winding area; winding a printed roll of wallpaper onto a core; and severing the printed roll on the core from the web using an automated cutting mechanism inside the printer, the cutting mechanism receiving a signal for commencing cutting from the processor.

Preferably printing a roll of wallpaper according to a selected pattern further comprises: using a full width, stationary color inkjet type printhead to print onto the web while it is in motion along the path.

Preferably the method further comprises drying the web with hot air after it is printed on but before it is dispensed by the printer.

Preferably the method further comprises admitting the printed web as a hanging loop into a compartment in an internal dryer and exposing the web to a stream of heated air.

Preferably the method further comprises heating the web with a pre-heater platen located under the path before the web passes the printhead.

In a thirteenth aspect the present invention provides a method for drying a moving web of media in a printer such as a wallpaper printer, the method comprising the steps of loading the web in a path that traverses a compartment in a dryer within the printer, the compartment having an opening across the top; allowing the moving web to descend into the compartment, as required; and blowing heated air from above the opening.

Preferably a door covers the opening and acts to support the web when the door is closed.

Preferably the method further comprises opening the door along an axis transverse to the path to reveal the opening.

Preferably the method further comprises operating the door with a motor that operates a spool; the spool winding and releasing a cord which operates the door.

Preferably the method further comprises heating the web with a preheater in the path and located before the opening.

Preferably the preheater is in the same plane as the door.

Preferably the source of heated air comprises a blower which feeds a stream of air into a plenum in which is located a heating element.

Preferably the method further comprises using a temperature sensor in the plenum to control the flow of heated air.

Preferably the compartment is adapted to receive the web as a suspended partial loop.

Preferably the method further comprises recirculating air from the compartment through a recirculation duct.

Preferably the method further comprises recirculating air from the compartment to an intake of an air supply that feeds the compartment.

Preferably the method further comprises exhausting air from the recirculation duct through a tube which extends upwardly from the compartment and includes an exhaust vent at an upper extremity.

Preferably the method further comprises using a second blower which feeds a stream of air into the plenum.

Preferably the plenum has external recirculation ducts for the compartment at either end.

Preferably the compartment has two vents, each one supplying vented air to a separate recirculation duct, the ducts located on opposite sides of the compartment, each duct supplying recirculated air to a source of heated air and each one having an exhaust opening at an upper extremity.

Preferably the source of heated air is a pair of blowers which can receive recirculated air from the compartment.

Preferably the blowers are located above the plenum.

Preferably the dryer is located within an on-demand wallpaper printer and is controlled by a processor which controls the printer.

In a fourteenth aspect the present invention provides a method of supplying a media web to a wallpaper printer, comprising the steps of opening a reusable case; placing into the case a core onto which has been located a supply roll of blank wallpaper media; supporting the core for rotation within the case; leading a free edge of the roll between a pair of rollers and past an edge of the open case; then with the rollers located within the case and on either side of the web, closing the case and loading it into a printer.

Preferably the method further comprises introducing the two rollers into a pair of resilient bias devices that holds the rollers in proximity.

Preferably the method further comprises locating an opening of each resilient bias device around the core before closing the case.

Preferably one roller is a driven roller having at one end a coupling, and locating the coupling in an opening of the case which allows an external spindle to access the coupling when the case is closed.

Preferably each roller has a circumferential slot at each end; each bias device having two extensions which engage the slots of both rollers at one end.

Preferably the two extensions of each bias device are joined to a flat clip body, the body having a central opening for receiving and locating the core.

Preferably each body has an anti-rotation feature which is adapted to engage with a cooperating feature located at each end of the core, so to prevent the core from rotating in the case; and further comprising the step of engaging the anti-rotation feature with the cooperating feature before the case is closed.

Preferably the case has at one or both ends, slots for receiving the bodies, and further comprising the step of: locating one or both bodies in a respective slot before the case is closed.

Preferably the method further comprises lifting the case by an integral handle formed at one end of the case.

Preferably the method further comprises using a folding handle located on a top surface of the case.

Preferably the case has two halves which are hinged together and define when closed, a slot which extends between the halves through which the free edge of the roll exits the case.

Preferably the method further comprises using resilient clips which engage the case halves and hold them in a closed position.

Preferably the rollers are brought into proximity and biased against one another before the case is closed.

Preferably both rollers are located with respect to the core before the case is closed.

Preferably the case is formed from two case halves manufactured from a single molding with an integral hinge.

Preferably the rollers are both removable and one case half has formed in it a journal in which a roller is supported before the case is closed.

Preferably the method further comprises re-using the case by opening it, removing the core and the rollers, introducing a new core with a new roll around it; and leading a free edge of the new roll between a pair of rollers and past an edge of the open case; then closing the case with the rollers located in it and loading it again into a printer.

Preferably the roll and the new roll are of different blank media types.

Preferably the printer is self threading.

In a fifteenth aspect the present invention provides a printhead assembly for a printer which prints onto a moving web that follows a path, comprising: a full width printhead located across the path; the printhead comprising a color printhead which is at least as wide as the web; the printhead being supplied with a number of different inks which are remote from the printhead and which supply the printhead through tubes.

Preferably the printhead assembly further comprises a rail which is located across the path and along which the printhead slides into and out of a printing position.

Preferably the printhead is secured to the rail by fasteners which allow the printhead to be removed when the fasteners are disengaged.

Preferably the inks are contained in individual reservoirs and a supply tube connects each reservoir to the printhead.

Preferably the printhead assembly further comprises an air supply which supplies a stream of air, through a supply tube, to a location near the printhead from where the stream impinges onto the web to prevent it from adhering to the printhead.

Preferably the printhead assembly further comprises a capping device having a capper motor for sealing the printhead when not in use in order to prevent contamination from entering the printheads.

Preferably the capping device further comprises a blotter, which moves into and out of position and which is used for absorbing ink fired from the printhead.

Preferably the printhead assembly further comprises one or more rail microadjusters for accurately adjusting a gap between the printhead and the media onto which it is printing.

Preferably the printhead assembly further comprises a coupling in each ink supply tube which can be disconnected so that the printhead can be withdrawn.

Preferably the printhead assembly further comprises a coupling in the air supply tube which can be disconnected so that the printhead can be withdrawn.

Preferably the printhead assembly further comprises a pre-heater located adjacent to the path and before the printhead.

Preferably the printhead assembly further comprises a dryer in the same path as the printer the dryer adapted to dry the ink deposited by the printer.

Preferably the dryer has a compartment located beneath an opening; the opening being essentially in the path; there being a source of heated air located above the opening, the source of heated air adapted to blow heated air into the opening.

Preferably the opening is coverable by a door; and the door covers the entire opening and acts to support the web when the door is closed.

Preferably the door pivots along an axis transverse to the path to reveal the opening.

Preferably the door is operated by a motor that operates a spool; the spool winding and releasing a cord which operates the door.

Preferably the source of heated air comprises a blower which feeds a stream of air into a plenum.

Preferably a temperature sensor is located in the plenum.

Preferably the compartment is adapted to receive the web in a catenary path.

Preferably the compartment has an air vent which supplies a recirculation duct that leads to a motor intake.

In a sixteenth aspect the present invention provides a printer for producing rolls of wallpaper, comprising a housing in which is located a media path which extends from a blank media intake to a wallpaper exit slot; a multi-color roll width removable printhead located in the housing and across the media path; the printhead being supplied by separate ink reservoirs, the reservoirs connected to the printhead by a an ink supply harness, there being a disconnect coupling between the reservoirs and the printhead; one or more input devices for capturing operator instructions; a processor which accepts operator inputs which are used to configure the printer for producing a particular roll.

Preferably the printer further comprises an internal dryer, the dryer located between the printhead and the winding area and adapted to lengthen the path when additional drying is required.

Preferably the printer further comprises a transverse cutting mechanism located between the printhead and the winding area and adapted to divide a media web from a wound portion in response to an instruction from the processor.

Preferably the printer further comprises a slitting mechanism adapted to longitudinally slit a media web after it has been printed on.

Preferably the printer further comprises a bar code scanner which communicates with the processor and through which data is input.

Preferably the printer further comprises a well, adapted to retain a tote; the well being located external to the cabinet and adjacent to an exit slot; the well having at each end, spindles for aligning, retaining and removing a core, and for winding wallpaper onto the core.

Preferably the printer further comprises on a front exterior surface of the cabinet, a tilting video display for displaying information about wallpaper that the printer may print.

Preferably the video display is a touch screen which can receive operator selections for use by the processor.

Preferably the well retains a closed tote having a gap through which wallpaper is introduced during winding.

Preferably the media cartridge loading area further comprises one or more vertically stacked locations where a media cartridge can be stored.

Preferably the printhead is mounted on a rail on which it slides into and out of a printing position across the path.

Preferably the path further comprises a pre-heater located before the printhead in the path.

Preferably the printer further comprises an air supply and a tube for bringing a supply of air to the printhead which supply prevents media from contacting the printhead.

Preferably the printer further comprises a capper motor, the capper motor driving a capping and blotting device; the capping device sealing the printhead when not in use in order to prevent contamination from entering the printheads.

Preferably the capping and blotting device further comprises a blotter, which moves into and out of position and which is used for absorbing ink fired from the printheads.

Preferably the printer further comprises one or more rail microadjusters for accurately adjusting a gap between the printhead and the media onto which it is printing.

Preferably the path comprises a generally straight path which is self threading.

Preferably the pre-heater is a flat platen located below a moving web.

Preferably the printer further comprises a door which covers an opening into a lower compartment of the dryer; the door being moveable from a closed position which covers the opening, to an open position in which the media passes through the opening into the lower compartment and out of the compartment, also through the opening.

Preferably the slitting mechanism further comprises a pair of rotating brackets between which extend a number of transverse shafts, each shaft having one or more cutters, the end brackets rotatable so that any shaft can be selected, or that no shaft be selected for cutting the media web.

In a seventeenth aspect the present invention provides a consumer tote for a roll of wallpaper, the tote comprising a disposable exterior in which is formed a main access flap and a pair of core access openings; the tote having an interior in which is located a disposable core which is aligned with the access openings; both openings exposing a molded coupling, one coupling attached to each end of the core, at least one of the couplings being a driven coupling and adapted to engage a driving spindle that rotates the core.

Preferably there is formed a gap between the access flap and an adjacent edge of the exterior, when the flap is closed.

Preferably the exterior is formed from a non-metallic textile.

Preferably the core is supported at each end an inward facing hub which engages an interior of the core.

Preferably each hub surrounded by a bearing surface which locates the hub in a respective access opening.

Preferably the bearing surface makes contact with an inside bottom surface of the disposable exterior when the hub is located in the openings.

Preferably the bearing surface is circular and connected to the hub by spokes.

Preferably at least one hub has an axial coupling feature for engaging a rotating winding spindle.

Preferably the coupling comprises a ring of teeth.

Preferably the tote further comprises a handle which folds flat against the exterior.

Preferably the handle is formed by two similar sub-units which fold from a flat position to a cooperating position in which a handle opening in each sub-unit align to form a grip.

Preferably there is formed a gap between the access flap and an adjacent edge of the exterior, when the flap is closed; and each sub-unit has an edge which is affixed to the exterior, adjacent to the gap; the sub-units arranged in a mirror image relationship about the gap.

Preferably the tote further comprises one of the access openings exposes a coupling formed on a hub which carries the core; and a visible marker is located on the exterior for indicating the location of the coupling.

Preferably the exterior is dimensioned to fit between the loading spindles of a wallpaper printing machine.

Preferably the exterior further comprises a viewing window.

Preferably the exterior is adapted to hold about 50 meters of wallpaper wound onto a core.

Preferably the adjacent edge includes a return lip.

Preferably the return lip is folded from the exterior material.

Preferably the gap faces an exit slot of a printer when the tote is loaded for winding.

In an eighteenth aspect the present invention provides a removable printhead assembly for a printer which prints onto a moving web, comprising a full width stationary printhead located on a rail along which it slides for service and removal; a number of replaceable ink reservoirs which supply the printhead with different inks; the printhead comprising a color printhead which is at least as wide as the web; and the printhead being supplied with the different inks through tubes which can be disconnected so the printhead may be removed.

Preferably the printhead is secured to the rail by fasteners which allow the printhead to be removed when the fasteners are disengaged.

Preferably the inks are contained in individual reservoirs and a sensor in each reservoir monitors a level which may be displayed to a user of the printer.

Preferably the printhead assembly further comprises an air supply which supplies a stream of air, through a supply tube, to a location near the printhead from where the stream impinges onto the web to prevent it from adhering to the printhead.

Preferably the printhead assembly further comprises a first coupling which disconnects the printhead from the ink reservoirs.

Preferably the printhead assembly further comprises a capping device having a capper motor for sealing the printhead with a moveable cap when not in use in order to prevent contamination from entering the printheads.

Preferably the capping device further comprises a blotter, which moves into and out of position and which is used for absorbing ink fired from the printhead.

Preferably the printhead assembly further comprises one or more rail microadjusters for accurately adjusting a gap between the printhead and the media onto which it is printing.

Preferably the printhead assembly further comprises a second coupling with which the air supply can be disconnected from the printhead.

Preferably the first coupling and the second coupling are formed together as a single unit.

Preferably the printhead assembly further comprises a pre-heater located beneath a path followed by the media; the pre-heater located below the media and before the printhead.

Preferably the printhead assembly further comprises a dryer in the same path as the printer the dryer adapted to dry the ink deposited by the printer.

Preferably the dryer has a compartment located beneath an opening; the opening being essentially in the path; there being a source of heated air located above the opening, the source of heated air adapted to blow heated air into the opening.

Preferably the opening is coverable by a door; and the door covers the opening and acts to support the web when the door is closed.

Preferably the door pivots to reveal the opening.

Preferably the door is operated by a motor that operates a spool; the spool winding and releasing a member which operates the door.

Preferably a preheater is located in the path and located before the opening.

Preferably the preheater is in the same plane as the door.

Preferably the source of heated air comprises a blower which feeds a stream of air into a plenum.

Preferably a temperature sensor is located in the plenum.

In a nineteenth aspect the present invention provides a self threading printer for producing rolls of wallpaper, comprising a media loading area adapted to support a media cartridge in a position so that a media supply slot of the cartridge is closely adjacent to a pilot guide; a cabinet housing a media path which extends from the pilot guide to a printed media dispensing slot; a printhead located across the media path; a processor which accepts operator inputs which are used to configure the printer for producing a particular roll; a motor within the cabinet for advancing a media web out of the media cartridge; and one or more other motors adapted to urge the media along the path and out of the slot.

Preferably the printer further comprises a slitting mechanism in the cabinet adapted to longitudinally slit the media web, to different widths, as required and in accordance with instructions provided by a user.

Preferably the printer further comprises a cutting mechanism located between the printhead and the slot and adapted to divide with a transverse cut, the media web in accordance with instructions provided by the processor.

Preferably the printer further comprises an internal dryer, the dryer located between the printhead and the slot and adapted to blow hot air onto a printed web.

Preferably the motor is responsive to the processor.

Preferably the printer further comprises a well, external to the cabinet and adjacent to a printed media dispensing slot; the well having at each end, spindles for aligning, retaining and removing a core, at least one spindle being motorized to rotate the core.

Preferably the printer further comprises on a front exterior surface of the cabinet, a video display for displaying information about wallpaper that the printer may print.

Preferably the video display is a touch screen which can receive operator selections for use by the processor.

Preferably the media cartridge resides in the loading area with a handle accessible through a service door which provides access to the area.

Preferably the media cartridge loading area further comprises one or more empty locations where a media cartridge can be stored.

Preferably the printhead is mounted on a rail on which it slides into and out of a printing position across the path.

Preferably the printhead is a multi-color printhead which is supplied by separate ink reservoirs, the reservoirs connected to the printhead by a number of ink supply tubes, there being a tube disconnect coupling between the reservoirs and the printhead.

Preferably the printer further comprises an air supply and a tube for bringing a supply of air to the printhead which supply prevents media from sticking to the printhead.

Preferably the printer further comprises a capper motor, the capper motor driving a capping device; the capping device sealing the printhead with a cap when not in use, in order to prevent contamination from entering the printheads.

Preferably the capper device further comprises a blotter, which moves into and out of position and which is used for absorbing ink fired from the printheads.

Preferably the printer further comprises one or more rail microadjusters for accurately adjusting a gap between the printhead and the media onto which it is printing.

Preferably the path comprises a generally straight path.

Preferably the printer further comprises a pre-heater platen located under the path and before the printhead.

Preferably the printer further comprises a door which covers an opening into a lower compartment of the dryer; the door being moveable from a closed position which covers the opening, to an open position in which the media passes through the opening into the lower compartment and out of the compartment, also through the opening.

Preferably the media in the lower compartment forms a catenary path in the compartment.

In a twentieth aspect the present invention provides a method for producing wallpaper on-demand, comprising the steps of utilizing an on-demand printer comprising a cabinet in which is located a media path which passes a printhead on the way to a dispensing slot; selecting a pattern and a configuration using one or more printer input devices which communicate with a processor to input the pattern and the configuration; and printing a roll of wallpaper, onto a web of blank media, on demand, according to the selected pattern and configuration.

Preferably the method further comprises a selected width; and wherein the width is captured as data with a printer input device; and the printer is used to slit the web to the width.

Preferably the method further comprises a selected roll length; and wherein the roll length is captured as data with a printer input device; and the printer is used to cut the web to the roll length.

Preferably the method further comprises charging a customer only for the length.

Preferably the method further comprises acquiring data about pattern or configuration from a touch screen display.

Preferably the method further comprises providing the printer with a scanner on a tether for capturing data that specifies a selected pattern or other data.

Preferably the method further comprises allowing the customer to select a media type and using that media type in a replaceable media cartridge in the printer.

Preferably the pattern is selected from printed swatches which correspond to patterns that the printer is able to print on demand.

Preferably the method further comprises providing a plurality of swatches; assigning a symbol to each swatch; using the symbol as an input to a printer input device.

Preferably the configuration comprises one or more parameters selected from the group comprising: roll length, a roll slitting arrangement, one or more modifications to the pattern, or a media type to be printed on.

Preferably the configuration comprises both roll length and a roll width slitting arrangement.

Preferably utilizing an on-demand printer further comprises loading a media canister into the printer, the canister containing an unprinted web of media; and using a motor in the printer to advance the unprinted web into the path; automatically threading the media from the loading area, to the dispensing slot.

Preferably utilizing an on-demand printer further comprises loading a disposable core into a winding area adjacent to the dispensing slot; winding a printed roll of wallpaper onto a core; and severing the printed roll on the core from the web.

Preferably utilizing an on-demand printer further comprises severing the printed roll on the core from the web using an automated cutting mechanism inside the printer, the cutting mechanism receiving a signal for commencing cutting from the processor.

Preferably the core is contained within a tote during winding.

Preferably the method further comprises drying the web after it is printed on but before it is dispensed by the printer.

Preferably the method further comprises drying the web after it is printed on but before it is dispensed by the printer.

Preferably the method further comprises allowing a customer to design a custom pattern defined by data; using the one or more input devices to capture the data; and printing the custom pattern on demand.

Preferably the method further comprises selling printed rolls as they are produced to eliminate printed wallpaper inventory.

Preferably the media is printed by the printhead at a rate exceeding 0.02 square meters per second (775 square feet per hour)."

Preferably the media is printed by the printhead at a rate exceeding 0.1 square meters per second (3875 square feet per hour)."

Preferably the media is printed by the printhead at a rate exceeding 0.2 square meters per second (7750 square feet per hour)."

Preferably the printhead has more than 7680 nozzles.

Preferably the printhead has more than 20,000 nozzles.

Preferably the printhead has more than 100,000 nozzles.

Preferably the printhead has more than 250,000 nozzles.

Preferably the printhead prints ink drops with a volume of less than 5 picoliters Preferably the printhead prints ink drops with a volume of less than 3 picoliters Preferably the printhead prints ink drops with a volume of less than 1.5 picoliters

BRIEF DESCRIPTION OF THE FIGURES

Notwithstanding any other forms which may fall within the scope of the present invention, preferred forms of the invention will now be described, by way of example only, with reference to the accompanying drawings in which.

BEST MODE AND OTHER EMBODIMENTS OF THE INVENTION

Nozzle Arrangement—Schematic Overview

The fabrication of a variety of nozzles is disclosed in detail throughout this specification and the documents incorporated by cross-reference. In particular, a detailed description of the thermal bend actuator nozzles shown in FIGS. 64 to 73 is provided later in this specification. However, FIGS. 74 to 89 provide a useful schematic overview of the structure and operation of this type of nozzle.

It should be noted that the reference numbering used to identify particular features in FIGS. 74 to 89 does not correspond to the reference numbering used in other Figures or sections of this specification.

The nozzle arrangement shown in FIGS. 74 to 89 has a nozzle chamber containing ink and a thermal actuator connected to a paddle positioned within the chamber. The thermal bend actuator device is actuated so as to eject ink from the nozzle chamber. The preferred embodiment includes a particular thermal actuator, which includes a series of tapered portions for providing conductive heating of a conductive trace.

The actuator is connected to the paddle via an arm received through a slotted wall of the nozzle chamber. The actuator arm has a mating shape so as to mate substantially with the surfaces of the slot in the nozzle chamber wall.

Figure 74:
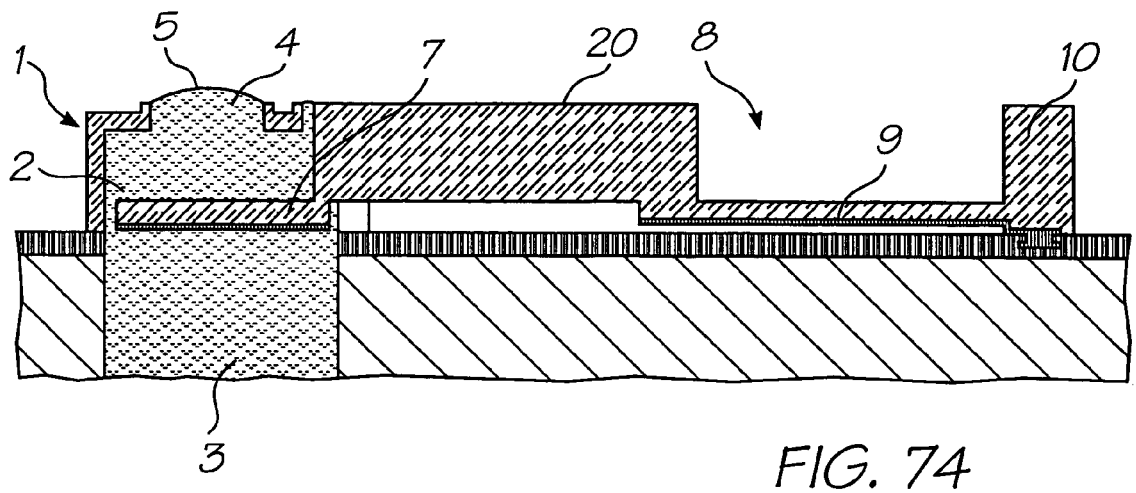
FIGS. 74-76 illustrate the basic operational principles of a preferred embodiment.
Figure 75:
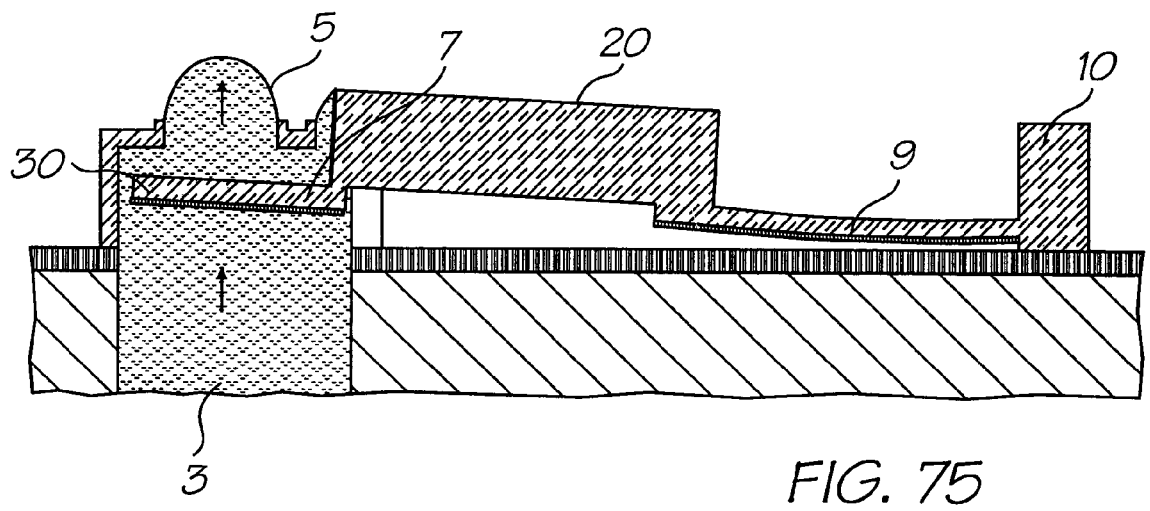
Figure 76:
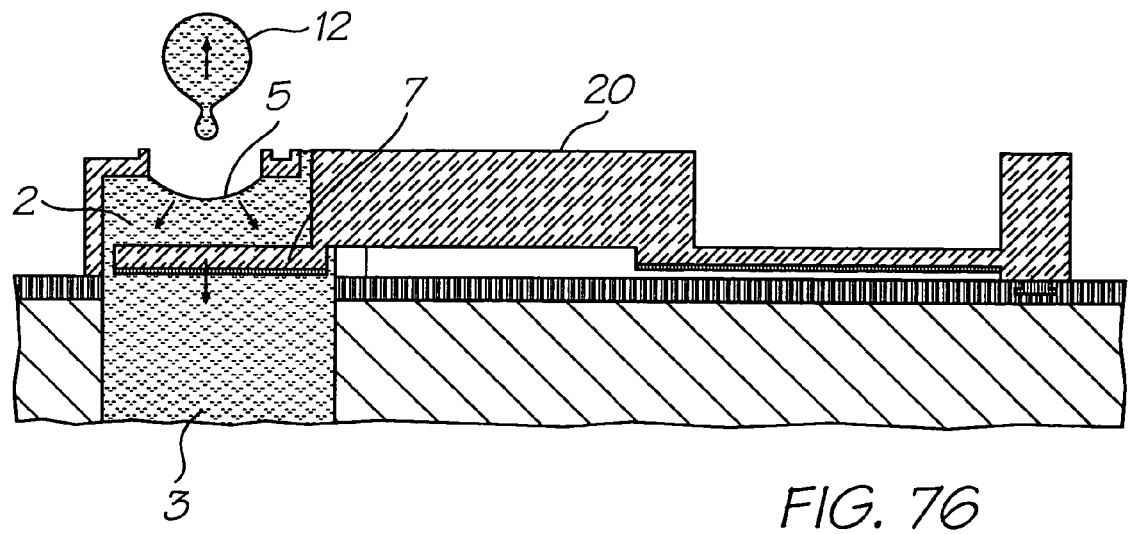

Turning initially to FIG. 74-76, there is provided schematic illustrations of the basic operation of a nozzle arrangement of the invention. A nozzle chamber 1 is provided filled with ink 2 by means of an ink inlet channel 3 which can be etched through a wafer substrate on which the nozzle chamber 1 rests. The nozzle chamber 1 further includes an ink ejection port 4 around which an ink meniscus forms.

Inside the nozzle chamber 1 is a paddle type device 7 which is interconnected to an actuator 8 through a slot in the wall of the nozzle chamber 1. The actuator 8 includes a heater means eg. 9 located adjacent to an end portion of a post 10. The post 10 is fixed to a substrate.

When it is desired to eject a drop from the nozzle chamber 1, as illustrated in FIG. 75, the heater means 9 is heated so as to undergo thermal expansion. Preferably, the heater means 9 itself or the other portions of the actuator 8 are built from materials having a high bend efficiency where the bend efficiency is defined as $$\text{bend efficiency} = \frac{\text{Young's Modulus} \times (\text{Coefficient of thermal Expansion})}{\text{Density} \times \text{Specific Heat Capacity}}$$

A suitable material for the heater elements is a copper nickel alloy which can be formed so as to bend a glass material.

The heater means 9 is ideally located adjacent the end portion of the post 10 such that the effects of activation are magnified at the paddle end 7 such that small thermal expansions near the post 10 result in large movements of the paddle end.

The heater means 9 and consequential paddle movement causes a general increase in pressure around the ink meniscus 5 which expands, as illustrated in FIG. 75, in a rapid manner. The heater current is pulsed and ink is ejected out of the port 4 in addition to flowing in from the ink channel 3.

Subsequently, the paddle 7 is deactivated to again return to its quiescent position. The deactivation causes a general reflow of the ink into the nozzle chamber. The forward momentum of the ink outside the nozzle rim and the corresponding backflow results in a general necking and breaking off of the drop 12 which proceeds to the print media. The collapsed meniscus 5 results in a general sucking of ink into the nozzle chamber 2 via the ink flow channel 3. In time, the nozzle chamber 1 is refilled such that the position in FIG. 74 is again reached and the nozzle chamber is subsequently ready for the ejection of another drop of ink.

Figure 77:
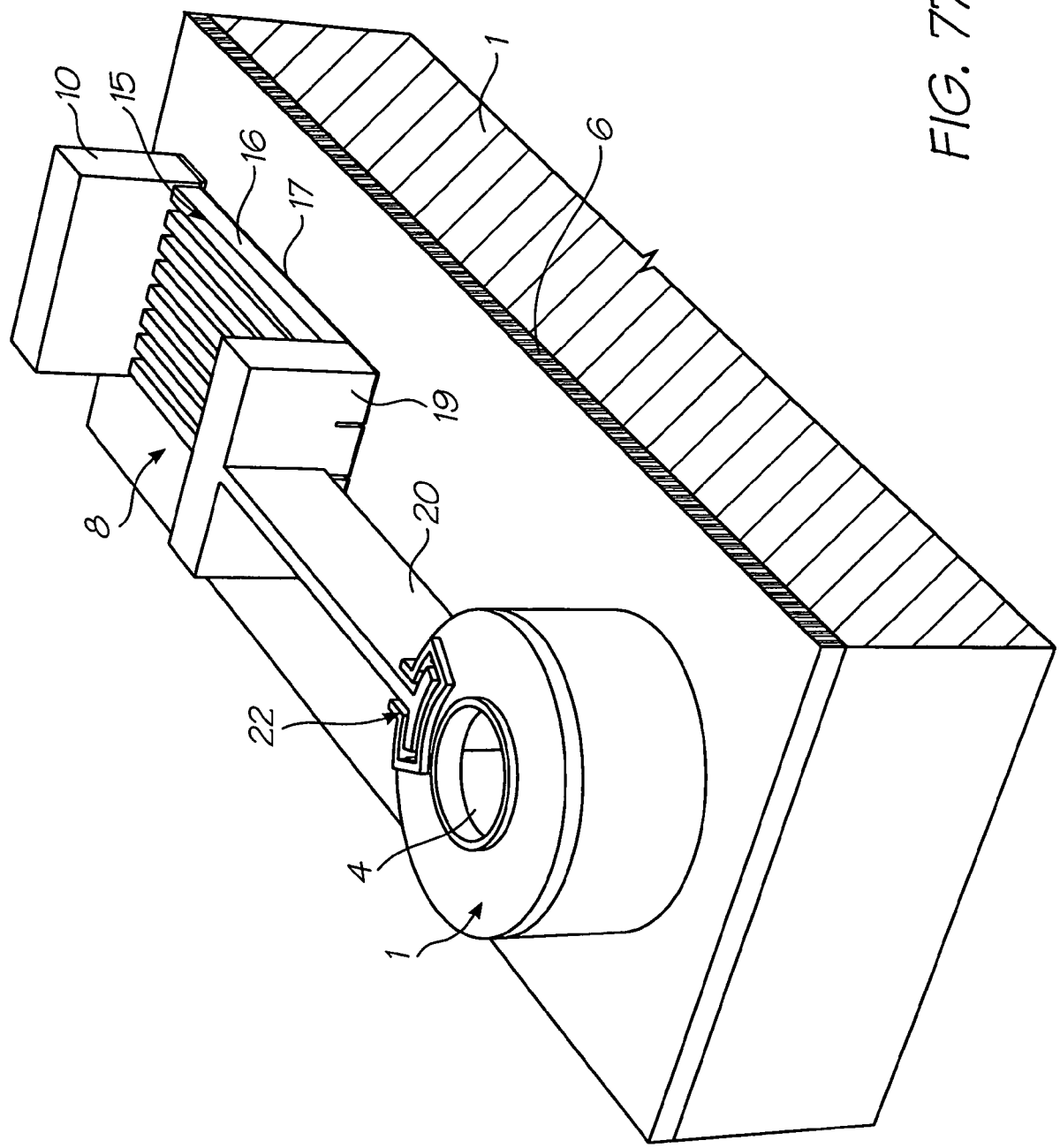
FIG. 77 illustrates a three dimensional view of a single ink jet nozzle arrangement.
Figure 78:
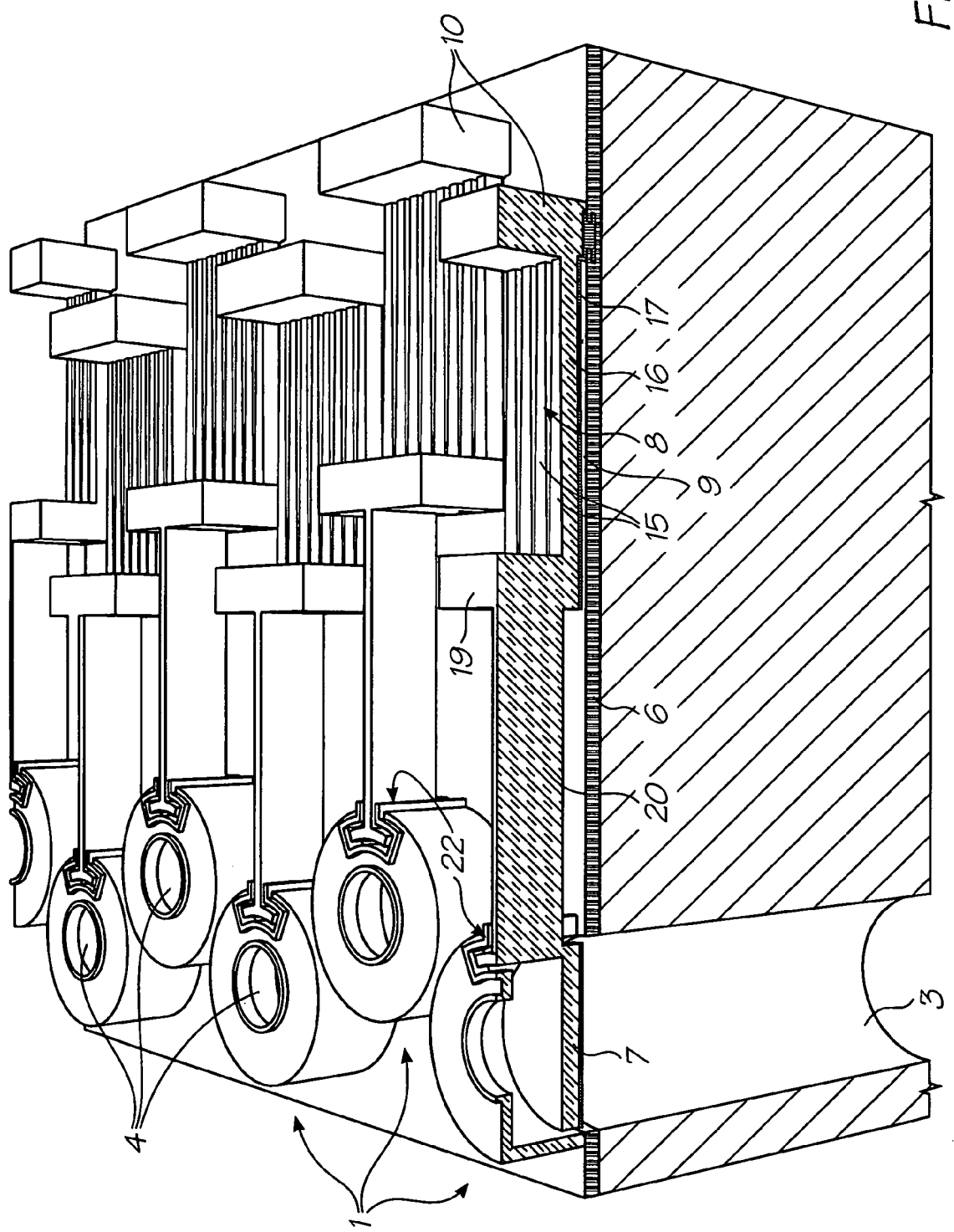
FIG. 78 illustrates an array of the nozzle arrangements of FIG. 77.
Figure 79:
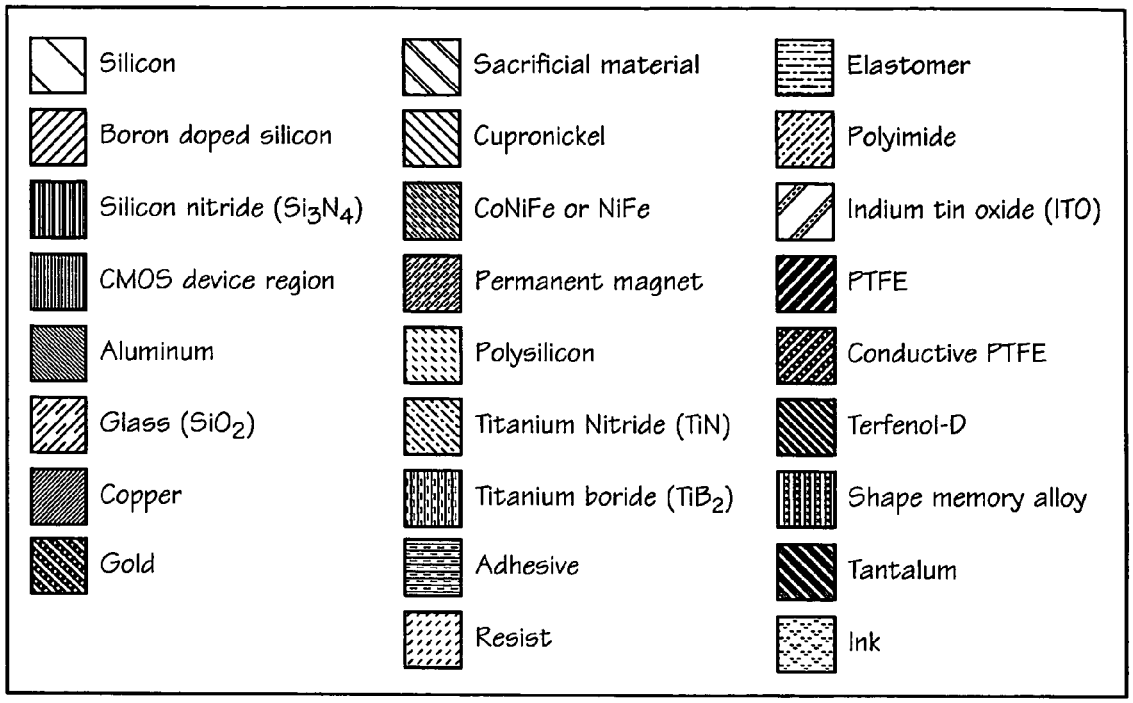
FIG. 79 shows a table to be used with reference to FIGS. 80 to 89.
Figure 80:
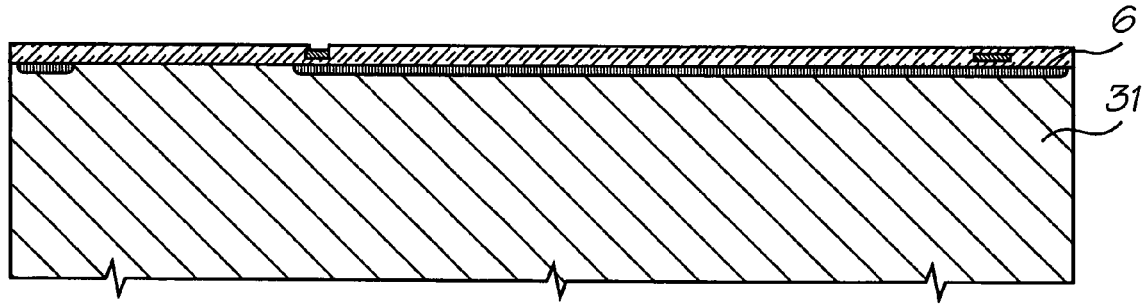
FIGS. 80 to 89 show various stages in the manufacture of the ink jet nozzle arrangement of FIG. 77.
Figure 81:
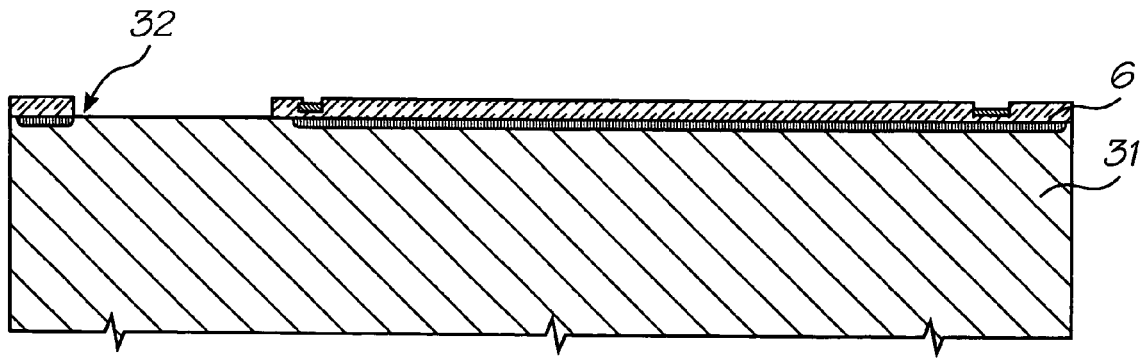
Figure 82:
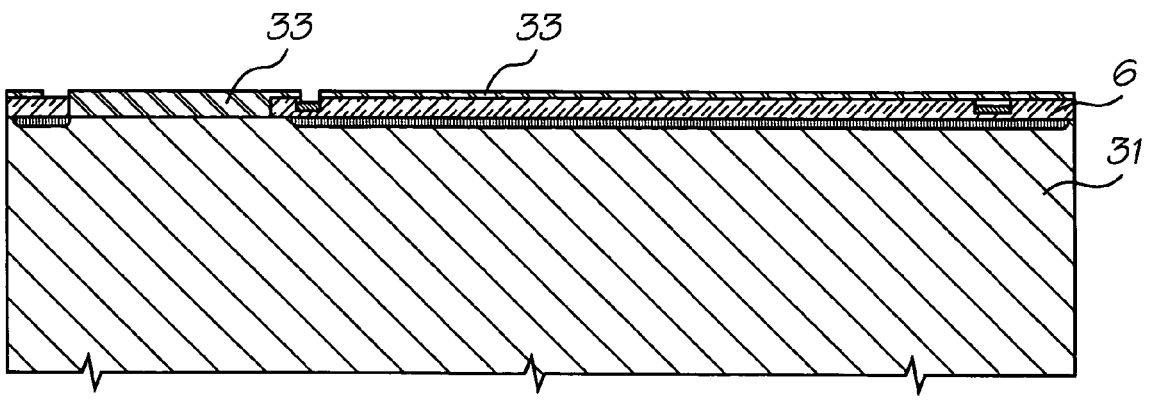
Figure 83:
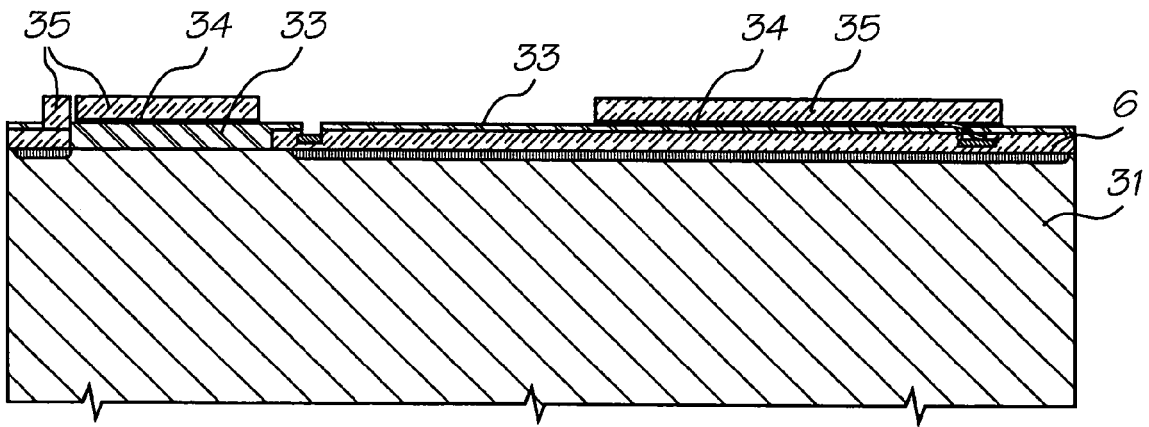
Figure 84:
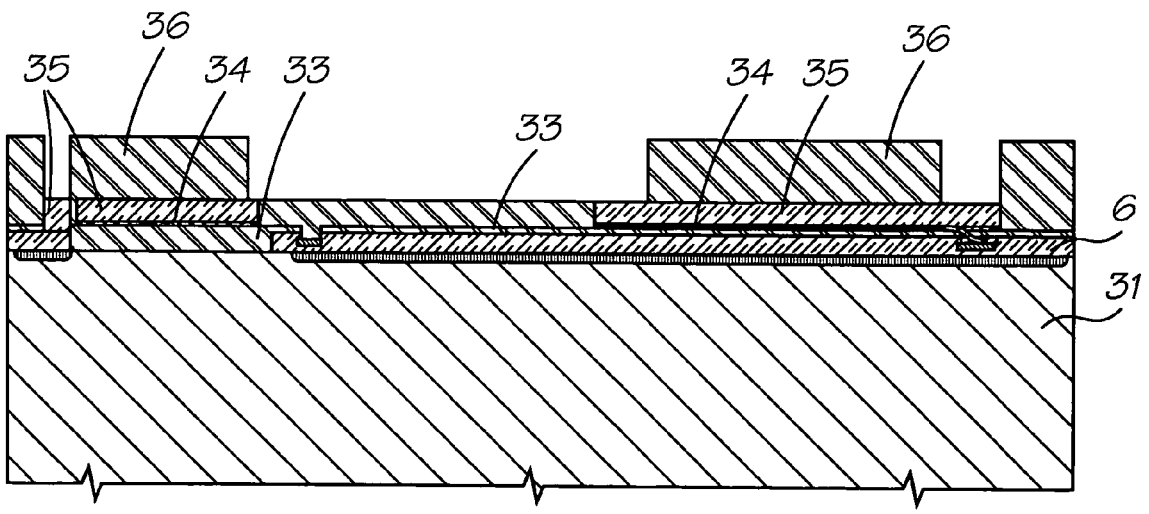
Figure 85:
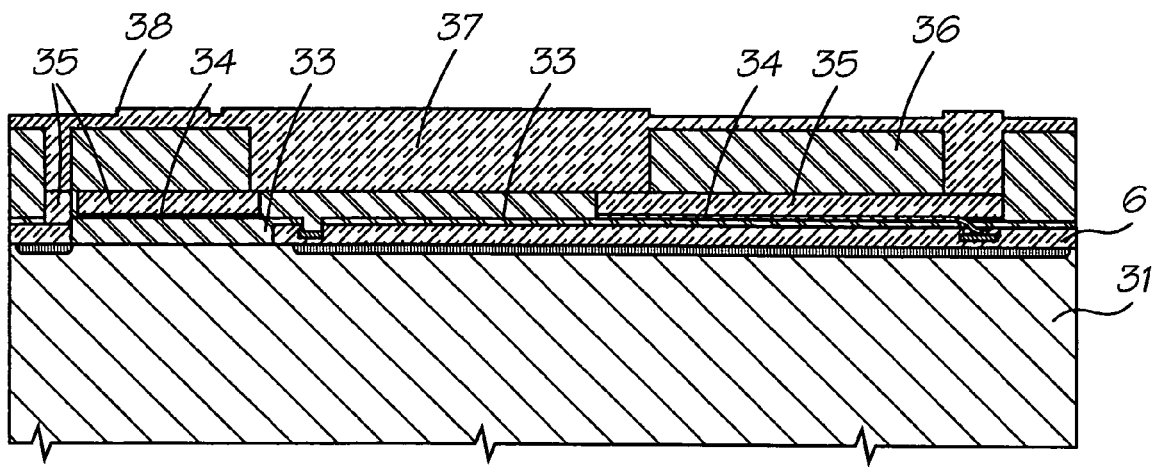
Figure 86:
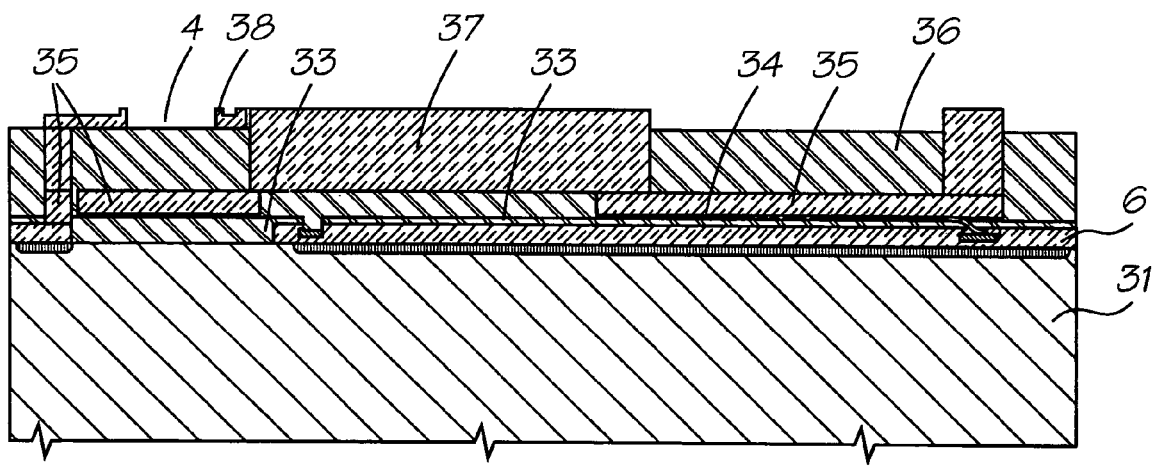
Figure 87:
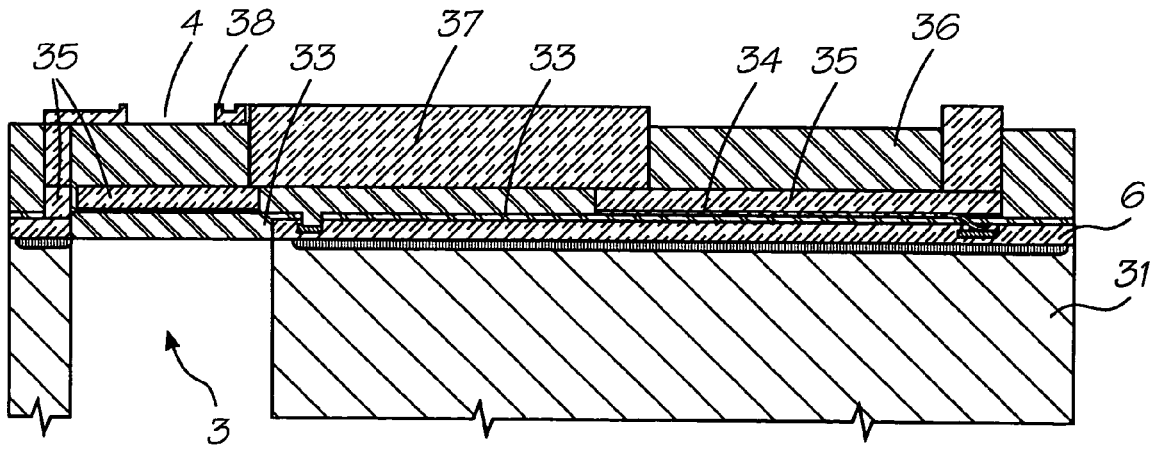
Figure 88:
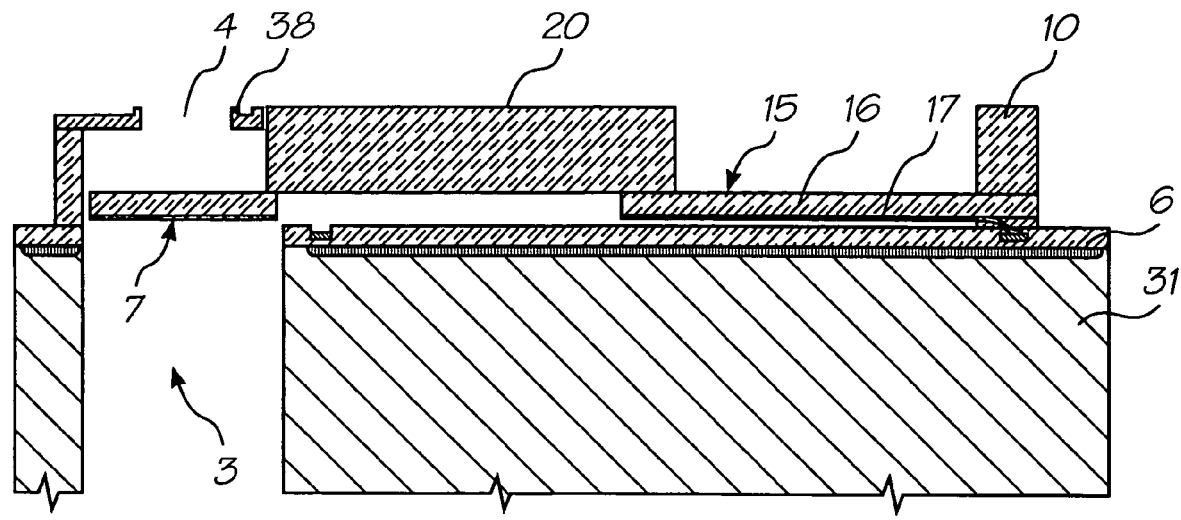
Figure 89:
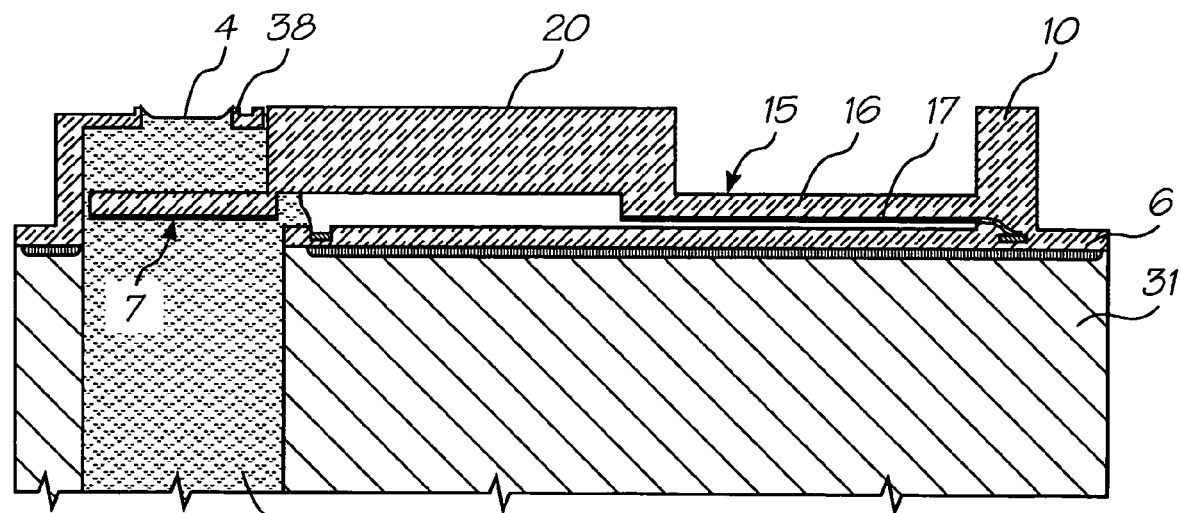

FIG. 77 illustrates a side perspective view of the nozzle arrangement FIG. 78 illustrates sectional view through an array of nozzle arrangement of FIG. 77. In these figures, the numbering of elements previously introduced has been retained.

Firstly, the actuator 8 includes a series of tapered actuator units eg. 15 which comprise an upper glass portion (amorphous silicon dioxide) 16 formed on top of a titanium nitride layer 17. Alternatively a copper nickel alloy layer (hereinafter called cupronickel) can be utilized which will have a higher bend efficiency where bend efficiency is defined as:

$$\text{bend efficiency} = \frac{\text{Young's Modulus} \times (\text{Coefficient of thermal Expansion})}{\text{Density} \times \text{Specific Heat Capacity}}$$

The titanium nitride layer 17 is in a tapered form and, as such, resistive heating takes place near an end portion of the post 10. Adjacent titanium nitride/glass portions 15 are interconnected at a block portion 19 which also provides a mechanical structural support for the actuator 8.

The heater means 9 ideally includes a plurality of the tapered actuator unit 15 which are elongate and spaced apart such that, upon heating, the bending force exhibited along the axis of the actuator 8 is maximized. Slots are defined between adjacent tapered units 15 and allow for slight differential operation of each actuator 8 with respect to adjacent actuators 8.

The block portion 19 is interconnected to an arm 20. The arm 20 is in turn connected to the paddle 7 inside the nozzle chamber 1 by means of a slot e.g. 22 formed in the side of the nozzle chamber 1. The slot 22 is designed generally to mate with the surfaces of the arm 20 so as to minimize opportunities for the outflow of ink around the arm 20. The ink is held generally within the nozzle chamber 1 via surface tension effects around the slot 22.

When it is desired to actuate the arm 20, a conductive current is passed through the titanium nitride layer 17 via vias within the block portion 19 connecting to a lower CMOS layer 6 which provides the necessary power and control circuitry for the nozzle arrangement. The conductive current results in heating of the nitride layer 17 adjacent to the post 10 which results in a general upward bending of the arm 20 and consequential ejection of ink out of the nozzle 4. The ejected drop is printed on a page in the usual manner for an inkjet printer as previously described.

An array of nozzle arrangements can be formed so as to create a single printhead. For example, in FIG. 78 there is illustrated a partly sectioned various array view which comprises multiple ink ejection nozzle arrangements of FIG. 77 laid out in interleaved lines so as to form a printhead array. Of course, different types of arrays can be formulated including full color arrays etc.

Fabrication of the inkjet nozzle arrangement is indicated in FIGS. 80 to 89. The preferred embodiment achieves a particular balance between utilization of the standard semi-conductor processing material such as titanium nitride and glass in a MEMS process. Obviously the skilled person may make other choices of materials and design features where the economics are justified. For example, a copper nickel alloy of 50% copper and 50% nickel may be more advantageously deployed as the conductive heating compound as it is likely to have higher levels of bend efficiency. Also, other design structures may be employed where it is not necessary to provide for such a simple form of manufacture.

The presently disclosed ink jet printing technology is potentially suited to a wide range of printing system including: colour and monochrome office printers, short run digital printers, high speed digital printers, offset press supplemental printers, low cost scanning printers high speed pagewidth printers, notebook computers with inbuilt pagewidth printers, portable colour and monochrome printers, colour and monochrome copiers, colour and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays. Of these applications, the printing of wallpaper will now be described in detail below.

Wallpaper

1. Exterior Overview

Figure 1:
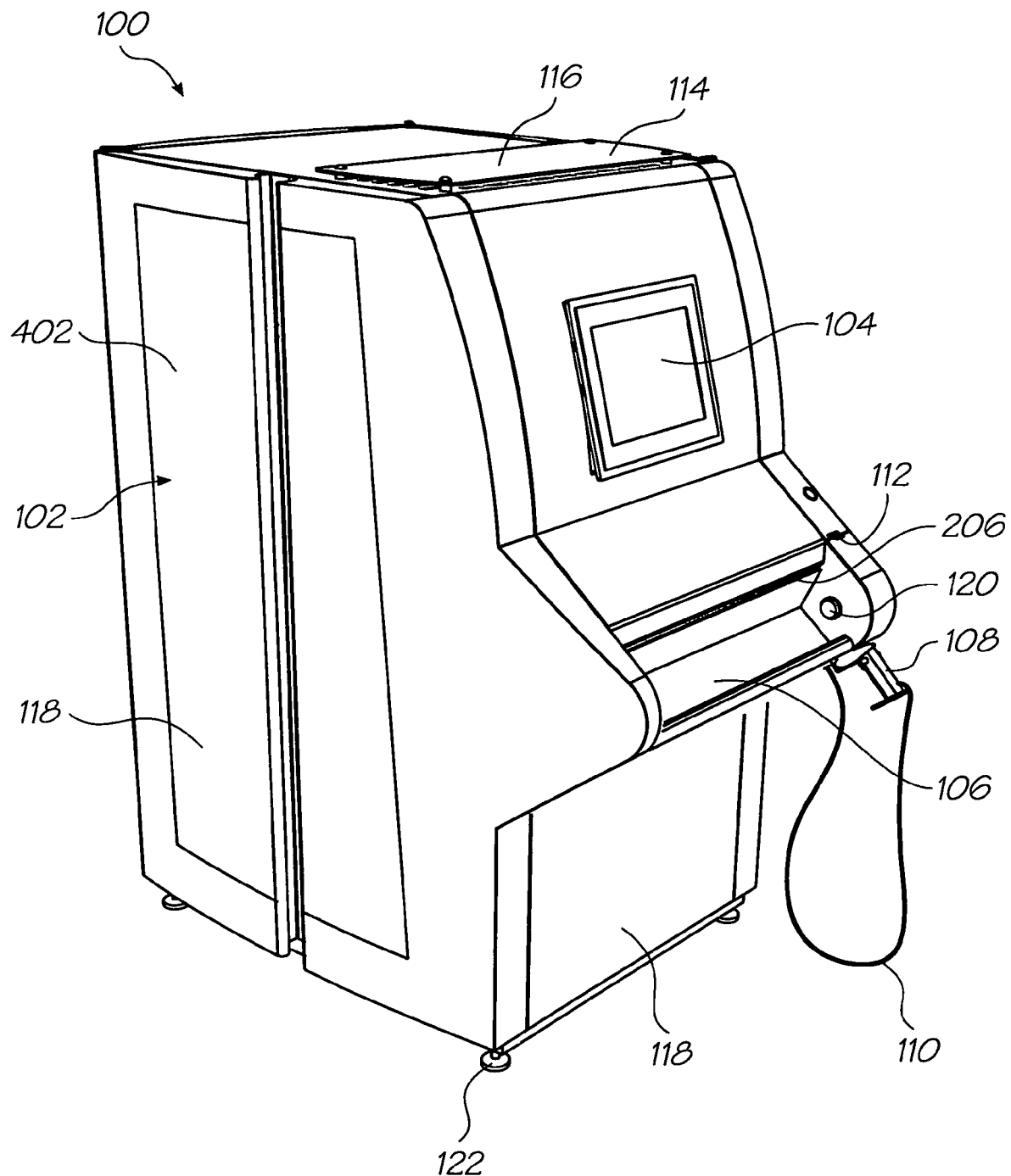
FIG. 1 is a perspective view of a wallpaper printer according to the teachings of the present invention.

As shown in FIG. 1 a wallpaper printer 100 comprises a cabinet 102 with exterior features to facilitate the specification of, purchase of, and packaging of wallpaper which is selected and printed, on-demand, for example at a point of sale. The cabinet 102 includes a tilting touch screen interface 104 such as an LCD TFT screen which is positioned at a convenient height for a standing person. The cabinet also supports a pistol grip type barcode scanner 108 which serves as a data capture device and input. The scanner 108 is preferably attached to the cabinet 102 by a data cable or a tether 110, even if the scanner 108 operates over a wireless network.

The cabinet 102 includes a winding area, in this example taking the form of an exterior well 106 for receiving a container for printed wallpaper, as will be further explained. The well holds a specially configured container 208 (see FIGS. 4 and 5). The container holds a winding core onto which is wound a roll of wallpaper for purchase. The well includes a pair of spindles 120, at least one of which is driven by a motor and which align, engage and rotate the winding core within the container 208. The cabinet also includes a tape dispenser 112 with a lid which is used by the machine operator to dispense tape for attaching the wallpaper media to the disposable winding core in the container 208, as will be further explained.

Other exterior cabinet features include a vent area 114 on the top of the cabinet for the discharge of heated or moist air. The vent or vent area 114 is covered by a top plate 116. The cabinet includes one or more service doors 402. When the service door is open, the media cartridges 400 can be inserted or withdrawn by their handles 1408. Adjustable feet 122 may be provided. The cabinet is preferably built around a frame (see FIG. 3) clad with stainless steel and may be decorated with ornamental insert panels 118.

2. Operation Overview

Figure 2:
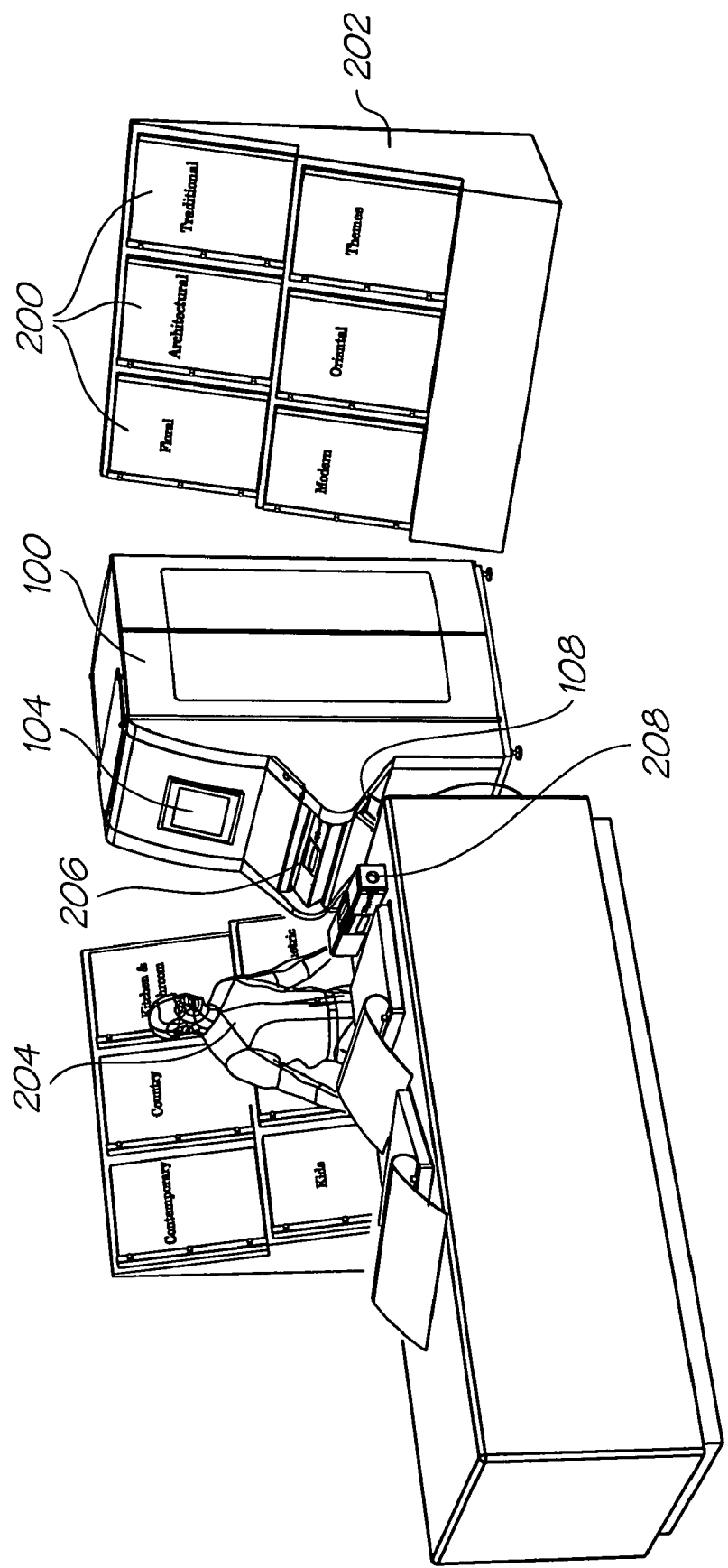
FIG. 2 is a perspective view of a typical retail setting, illustrating the deployment of the present invention.

As shown in FIG. 2, the wallpaper printer of the present invention 100 can serve as the production facility of a business operation such as a retail operation. In this Figure, it can be seen that wallpaper samples or swatches may be arranged into books or collections 200 and displayed on racks 202 for easy access by consumers. In short, a consumer 204 selects a wallpaper pattern from a collection 200 or bases a selection on the modification of an existing pattern. A machine operator scans an associated barcode or other symbol of that pattern with the scanner 108 or enters an alphanumeric code through the touch screen 104 (or other interface) to the printer's processor. Rolls of wallpaper are produced in standardized boxes or totes 208, on demand and according to consumer preferences which are input to the printer. Consumer preferences might include a selection of a pattern, a variation to the basic pattern, a custom pattern, the width and length of the finished product, or the web or substrate type onto which the pattern is printed.

After the appropriate selections have been made, a free end of a roll of media (already protruding from the exit slot 206 adjacent to the well 106) is taped to a winding core, for example with tape which is provided by the tape dispenser 112 (see FIG. 1). The disposable core (see 2014 in FIG. 20) is supported within a box 208. As the selected wallpaper is printed and dispensed from the slot 206, it is wound onto the winding core 2014. At the end of the production run of a particular roll, the web of printed wallpaper is separated with a transverse knife located with the cabinet. By further advancing the winding core, the training end of the roll is taken up into the container 208. When the winding is complete winding spindle may be disengaged from the box 208 allowing it to be withdrawn from the well 106 (see FIG. 1).

In some embodiments, a consumer of wallpaper may operate the printer. In other embodiments an operator with some degree of training may operate the machine in accordance with a customer's requirements, preferences or instructions.

It will be appreciated that this kind of operation provides the basis for a wallpaper printing business or the deployment of a franchise based on the technology.

In a franchise setting, a head licensor supplies the printer to franchisees. The licensor may also supply the consumables such as inks, media, media cartridges, totes, cores etc. As each of these items potentially require quality control supervision and therefore supply from the licensor in order to ensure the success of the franchise, their consumption by the franchisee may also serve as metrics for franchisee performance and a basis for franchisor remuneration. The franchisor may also supply new patterns and collections of patterns as software, in lieu of actual physical inventory. New patterns insure that the franchisees are able to exploit trends, fashions and seasonal variances in demand, without having to stock any printed media. A printer of this kind may be operated as a networked device, allowing for networked accounting, monitoring, support and pattern supply, also allowing decentralized control over printer operation and maintenance.

3. Construction Overview

Figure 3:
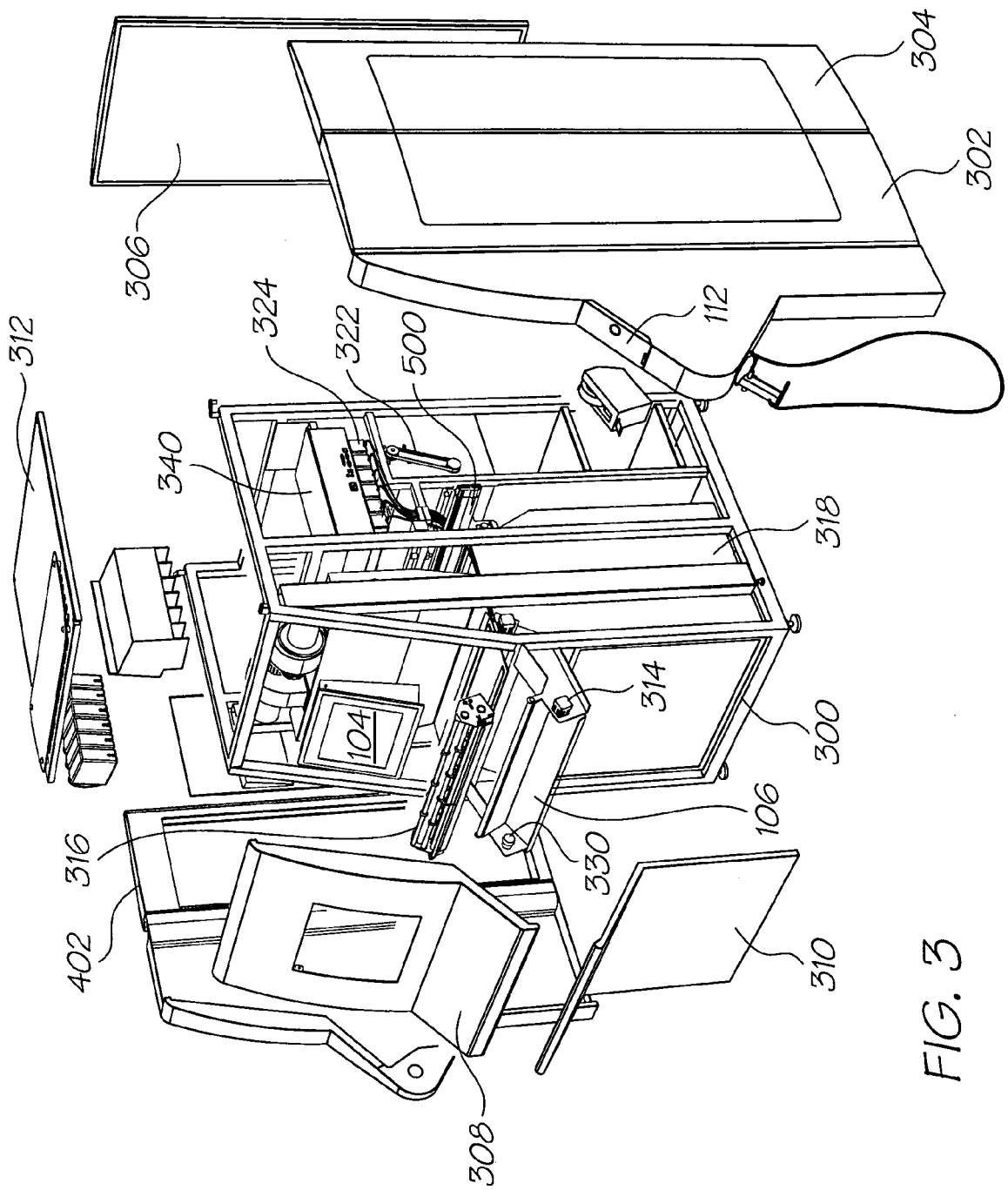
FIG. 3 is an exploded perspective view of a wallpaper printer of the type depicted in FIG. 1.

As shown in FIG. 3, the cabinet 100 is built around a frame 300. The frame 300 supports the outer panels, e.g. side panels 302, 304, a rear panel 306, upper and lower front panels 308 310 and a top panel 312. The well 106 is shown as having a support spindle 330 and a driven spindle 314. Tracing the paper flow path backward from the well 106, the path comprises a slitter and transverse cutter module 1200, a dryer 318, a full width stationery printhead 500, and the media cartridges with their drive mechanism 322. Ink reservoirs 324 are located above the printhead 500. The reservoirs may have level monitors or quality control means that measure or estimate the amount of ink remaining. This quantity may be transmitted to the printer's processor where it can be used to generate a display or alarm. The processing capabilities of the device are located in a module or enclosure 340. The processor operates the unit in accordance to stored technical and business rules in conjunction with operator inputs.

Figure 4:
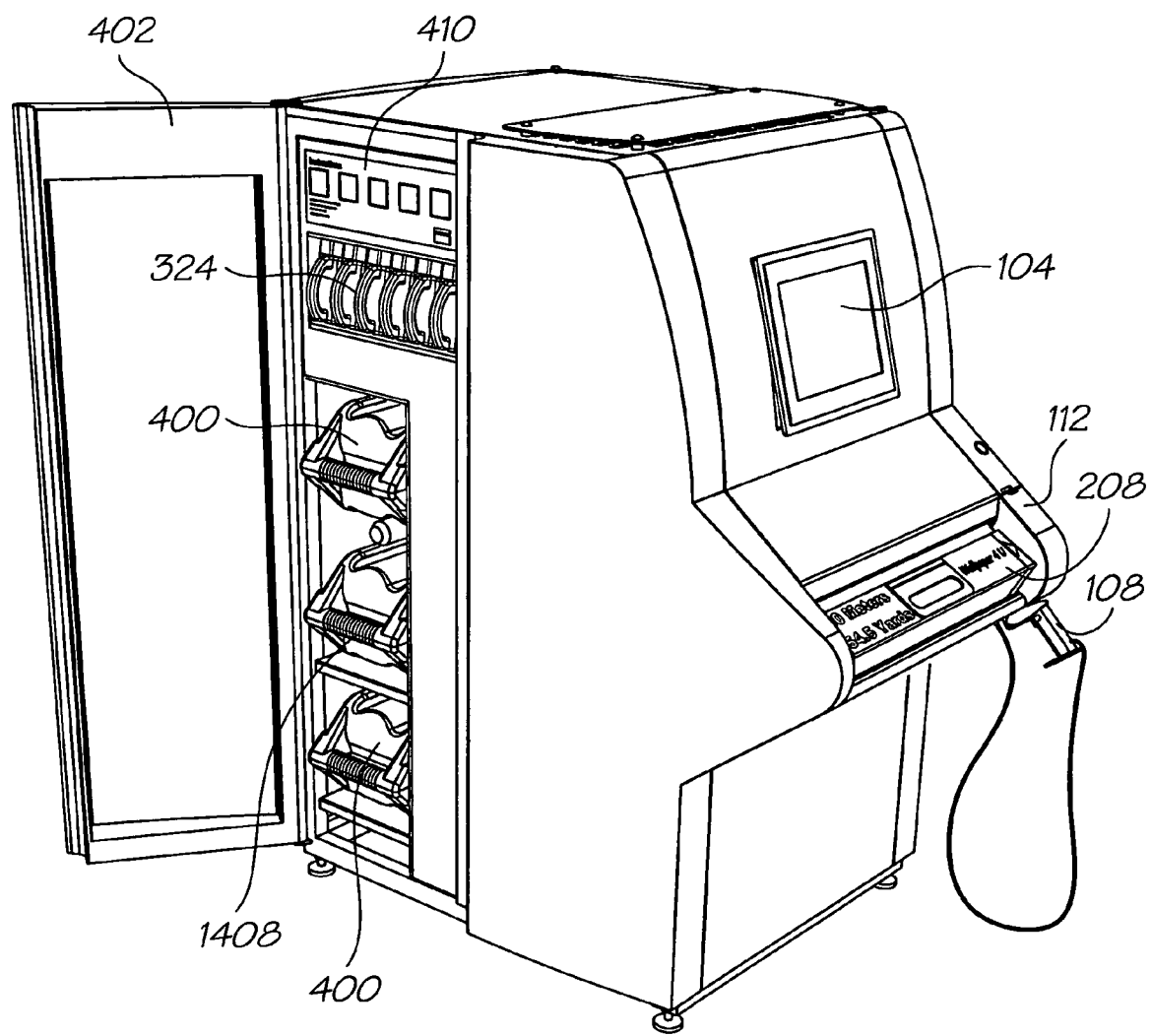
FIG. 4 is a perspective view of a wallpaper printer with a service door open.

As shown in FIG. 4, wallpaper media, before it is printed, is contained in cartridges 400. In this example there is an uppermost cartridge located in a loading area, ready for use and two other cartridges in storage located below it. As will be explained, the printer is self threading and no manual intervention is required by the machine operator to thread the web of unprinted paper into the printing system other than to load the upper cartridge 400 correctly. The service door 402 provides access to the media cartridges 400 and required machine interfaces as well as to the ink reservoirs 324. Ink reservoirs 324 hold up to several liters of ink and are easily removed and interchanged through the service door 402. An instruction panel or display screen 410 may be provided at or near eye level.

4. Printhead and Ink

The embodiment shown uses one of the applicant's Memjet™ printheads. A typical example of these printheads is shown in PCT Application No PCT/AU98/00550, the entire contents of which is incorporated herein by reference.

Figure 5:
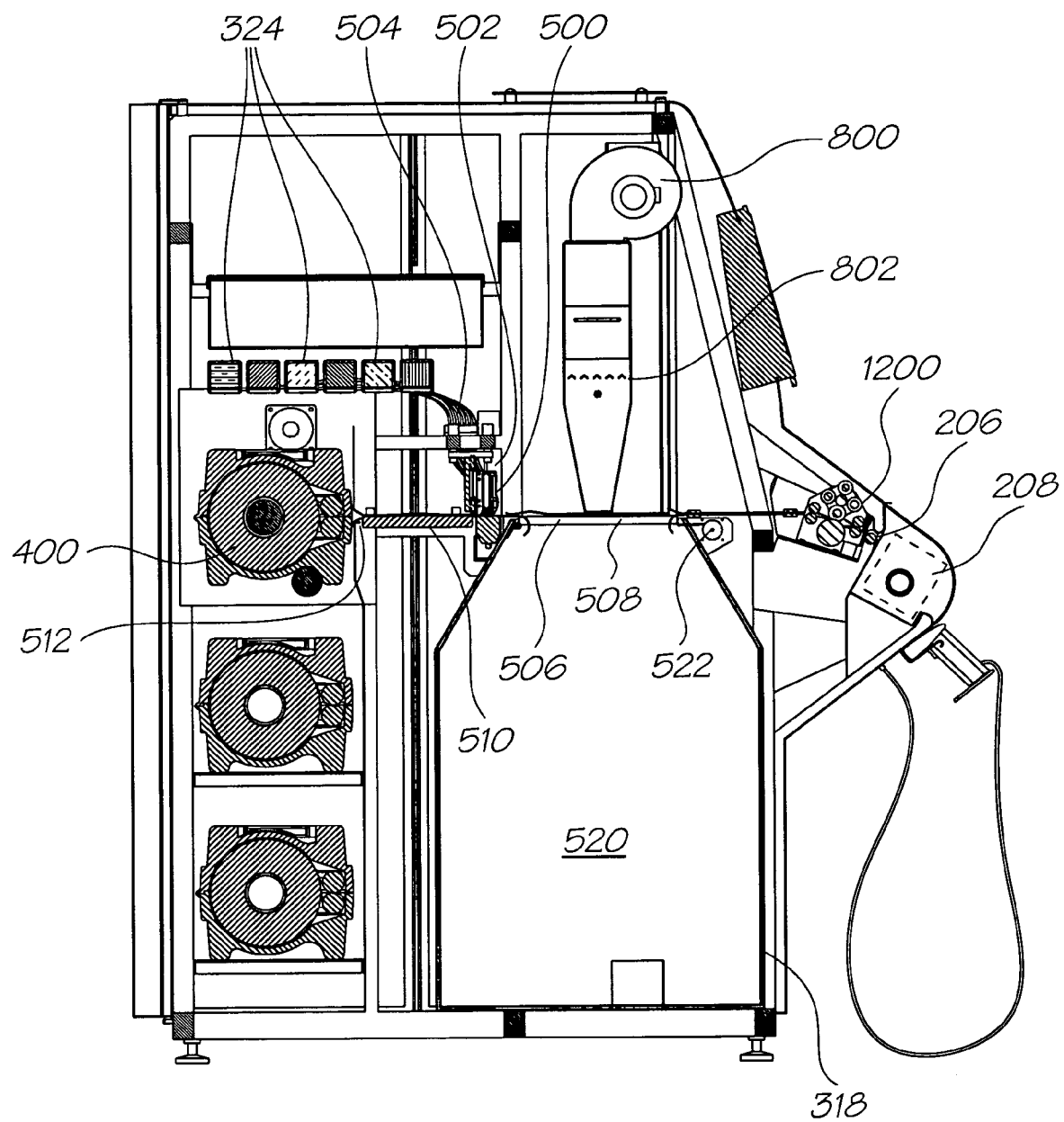
FIG. 5 is a cross section through the device depicted in FIG. 1.
Figure 11:
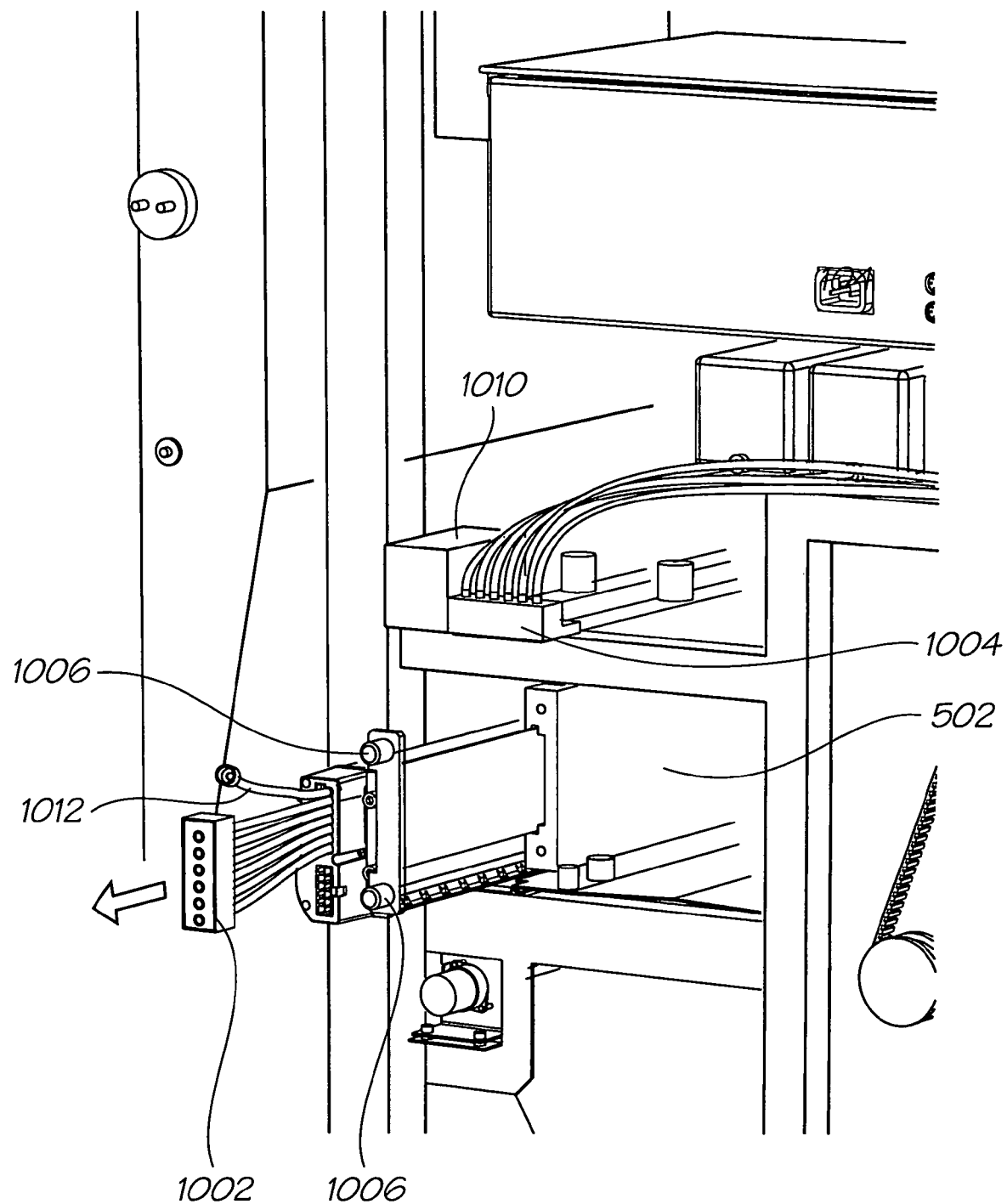
FIG. 11 is another perspective view of the printhead and ink harness showing removal of the printhead.

As shown in FIG. 5, the printhead 500 is preferably a Memjet™ style printhead which delivers 1600 dpi photographic quality reproduction. The style of printhead is fabricated using micro electro-mechanical techniques so as to deliver an essentially all silicon printhead with 9290 nozzles per inch or more than 250,000 nozzles covering a standard roll width of 27 inches. The media web is delivered past the stationary printhead at 90 feet per minute, allowing wallpaper for a standard sized room to be printed and packaged in about 2 minutes. FIG. 11 shows the elongated printhead 500 carried by a rail 502. The rail allows the printhead to be easily removed and installed, for service, maintenance or replacement by sliding motion, into and out of position.

Referring again to FIG. 5, the printhead is supplied with liquid ink from the reservoirs 324. The removable reservoirs are located above the printhead 500 and a harness 504 comprising a number of ink supply tubes carries the 6 different ink colors from the 6 reservoirs 324 to the printhead 500. The liquid ink harness 504 is interrupted by a self sealing coupling 1002, 1004 (see FIG. 11 ). Furthermore, by loosening thumb screws 1006 and disconnecting the ink harness coupling 1002, 1004 allows the printhead to be withdrawn from the rail 502. Also note that an air pump 1010 supplies compressed air through an air hose 1012 to the printhead or an area adjacent to it. This supply of air may be used to blow across the nozzles in order to prevent the media from resting on the nozzles.

Figure 10:
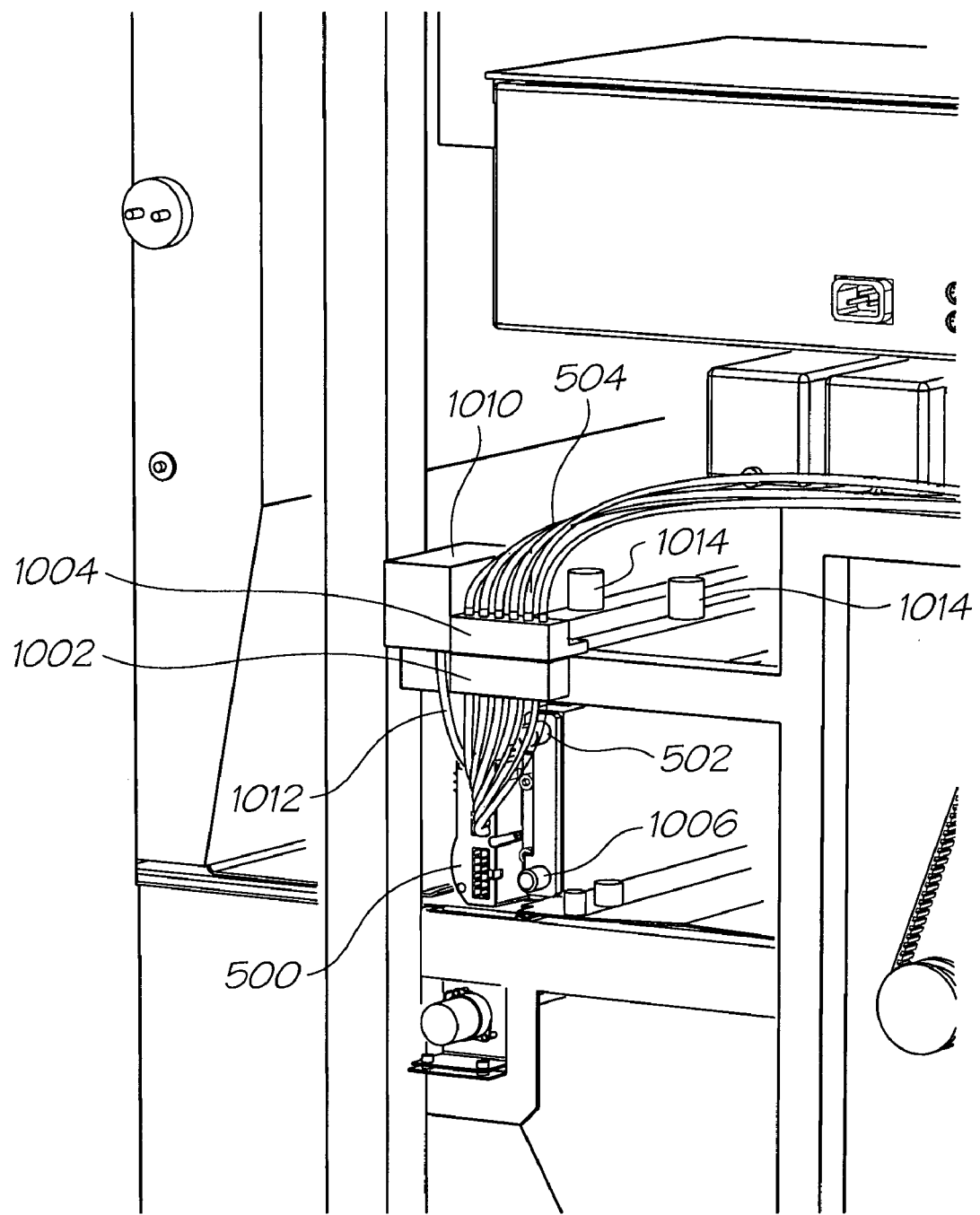
FIG. 10 is a perspective view of the printhead and ink harness.

Rail microadjusters 1014 (see FIGS. 6 and 10) are used to accurately adjust the distance or space that defines a gap between the printheads and the media being printed.

Figure 6:
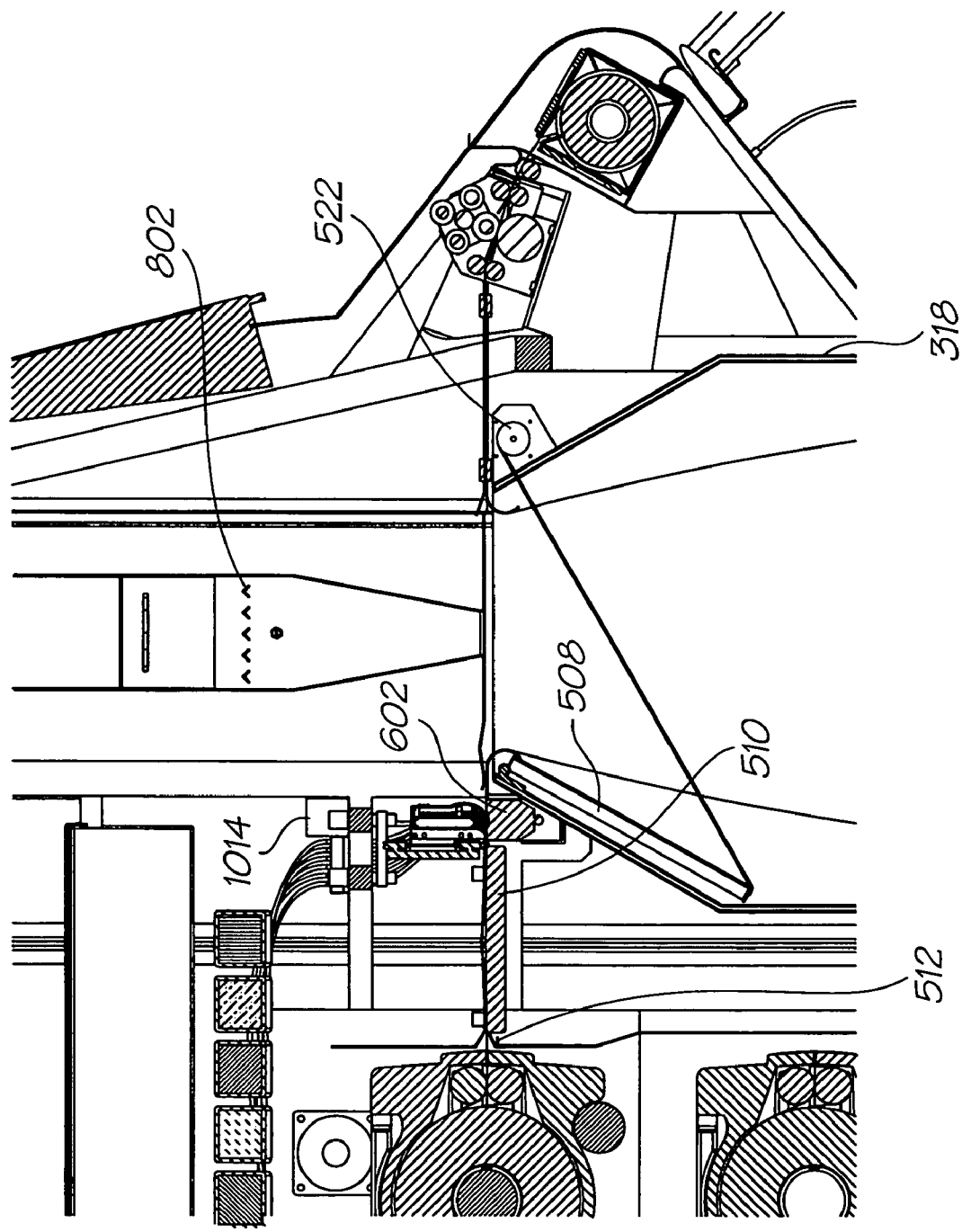
FIG. 6 is a detail of the cross section depicted in FIG. 5.

As shown in FIG. 6, a capper motor 602 drives a rotary capping and blotting device. The capping device seals the printheads when not in use in order to prevent dust or contaminants from entering the printheads. It uncaps and rotates to produce an integral blotter, which is used for absorbing ink fired from the printheads during routine printer start-up maintenance.

5. Media Path

Figure 7:
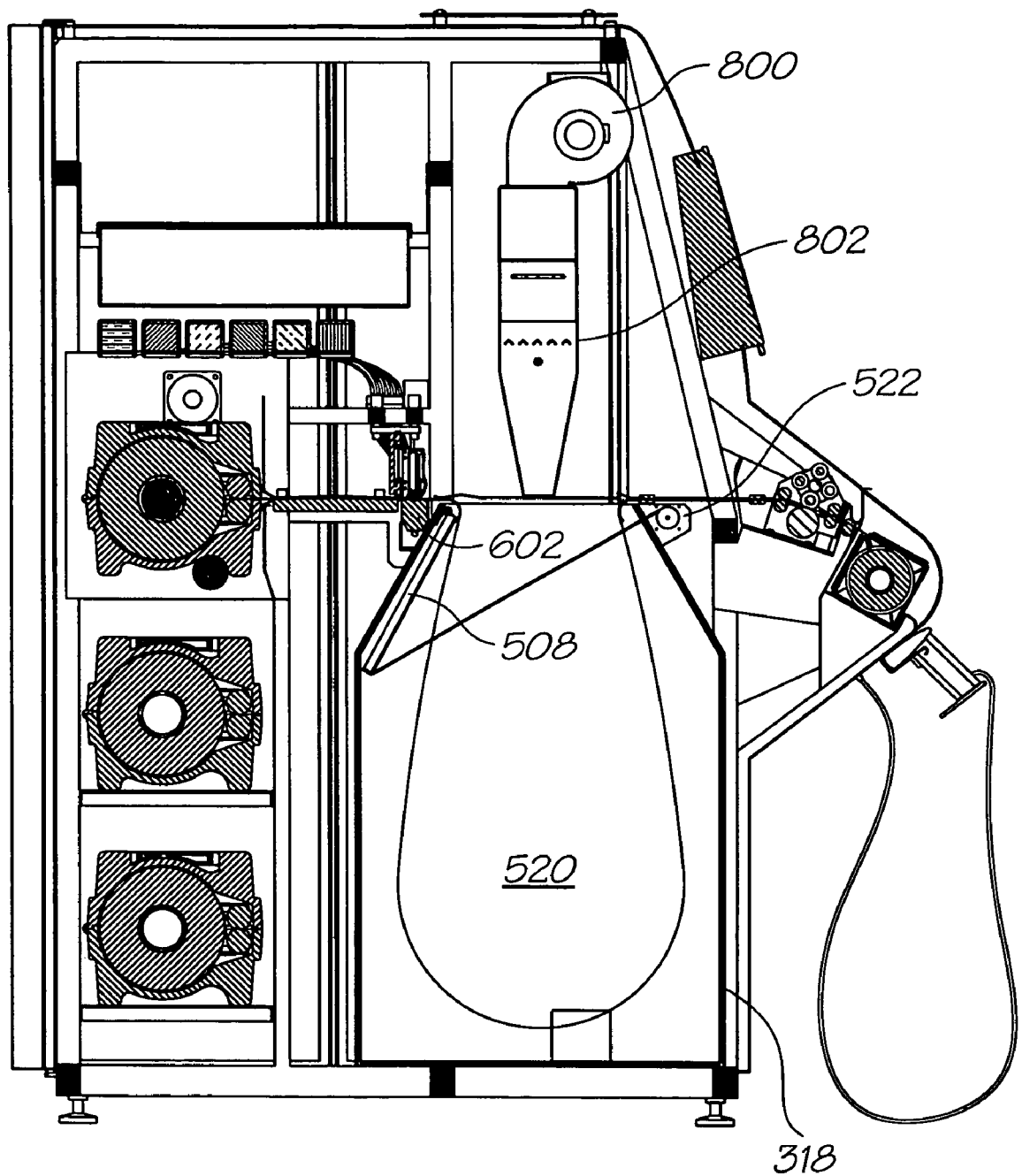
FIG. 7 is a cross section through a wallpaper printer depicting a wallpaper production paper path.
Figure 20:
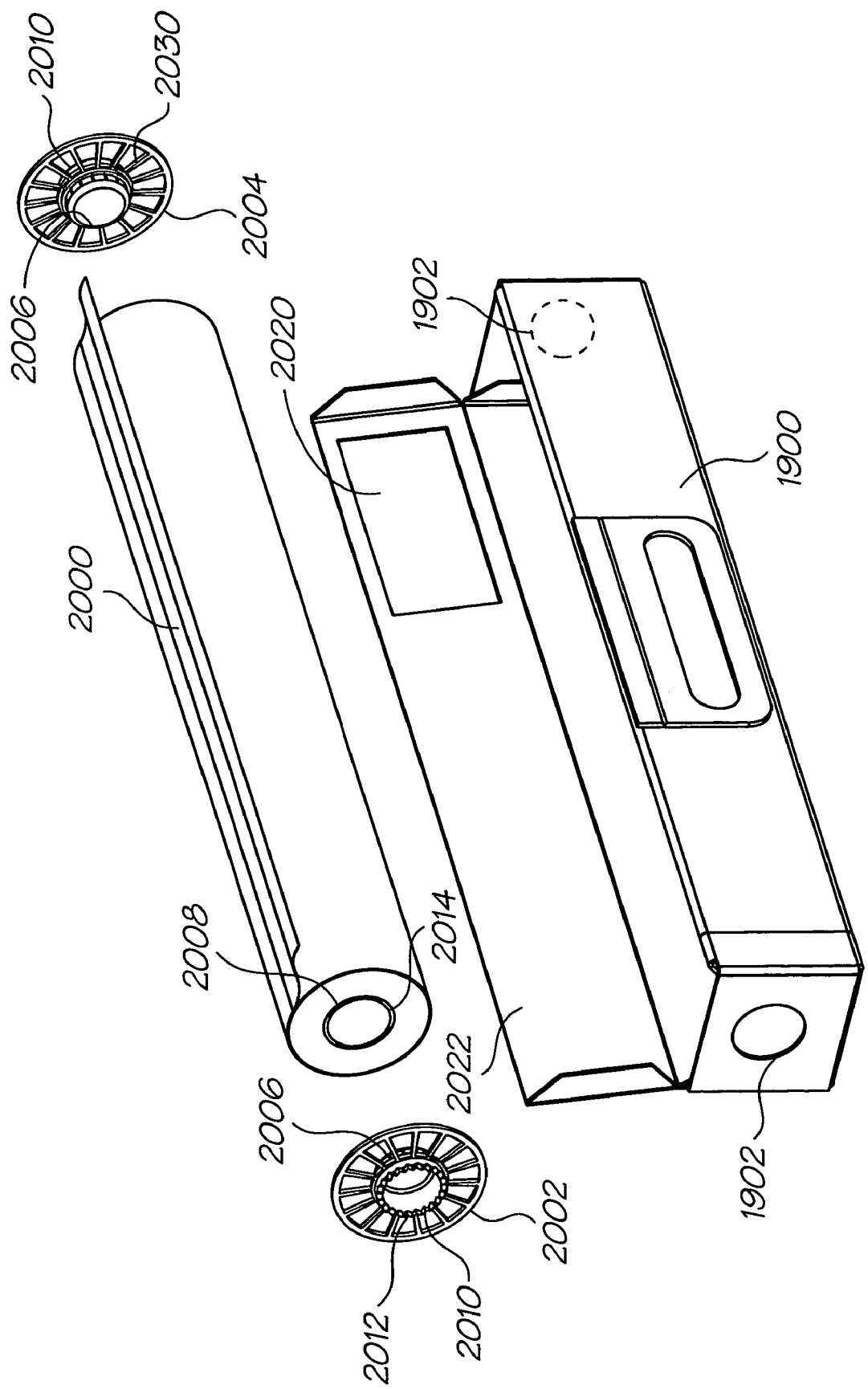
FIG. 20 is an exploded perspective of the container depicted in FIG. 19.

As shown in FIGS. 5, 6 and 7, the printhead 500 resides in an intermediate portion of a media path which extends from a blank media input near the upper cartridge 400 to the printed wallpaper exit slot near the winding roll 2014 (see FIG. 20). The media path is able to be threaded without user intervention because the media is guided at all times in the path. In some embodiments, the path extends to within the tote or container 208. The path extends in a generally straight line from cartridge 400, across a very short gap to between the pilot guides 512, across a flat pre-heater or platen 510 to a location under the printhead 500 and thereafter across an opening 506 which defines the mouth of the dryer's drying compartment 520. The opening into the compartment 520 is covered by a rotating door 508. The door is closed, except during printing which requires air drying. As shown in FIG. 7, the door 508 of the dryer 318 can be opened so that the media web descends, following a catenary path when required, into the compartment 520, providing additional path length and drying time. The path may form a catenary loop or strictly speaking, a loop portion which is suspended within the compartment from each end. In one embodiment the door 508 is biased into an open position and closed by the action of a winding motor 522 operated by the printer's processor.

After the dryer 318, the path continues in a generally straight line to the cutting and slitting or module 1200. The media path then extends from the cutting and slitting module 316 through the exit opening 206 of the cabinet.

6. The Dryer

Figure 8A:
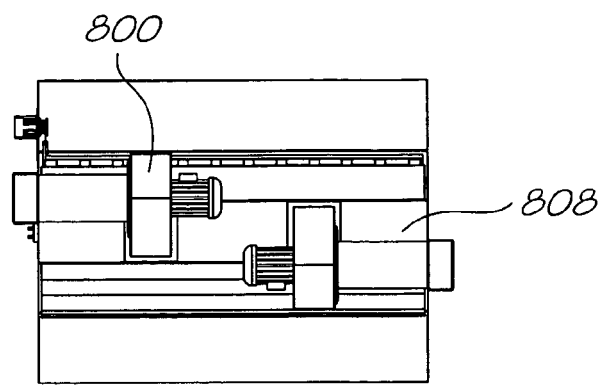
FIG. 8A is a top plan view of a dryer cabinet.
Figure 8B:
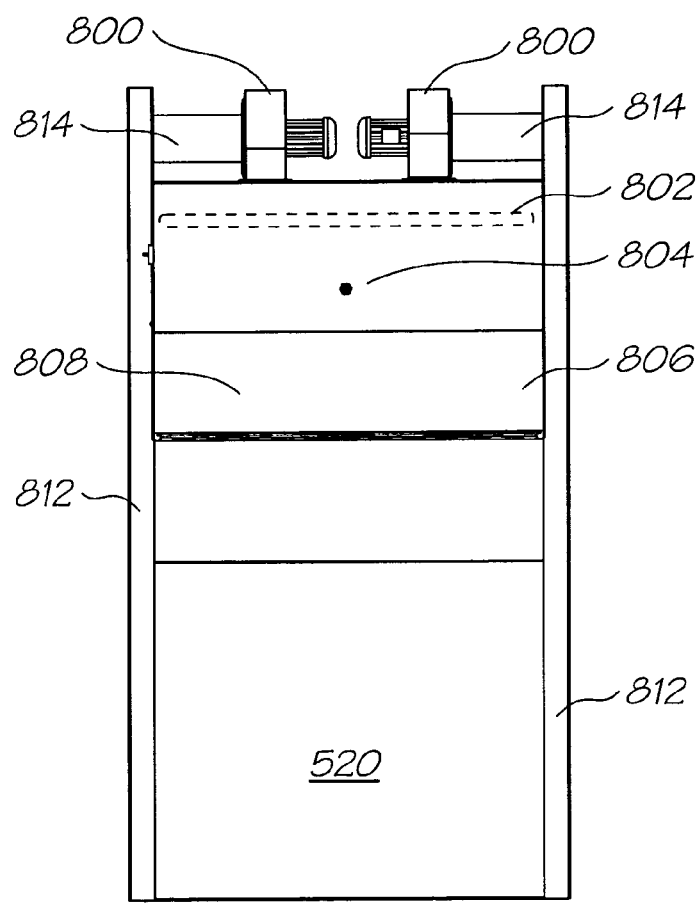
FIG. 8B is an elevation of a dryer cabinet.
Figure 8C:
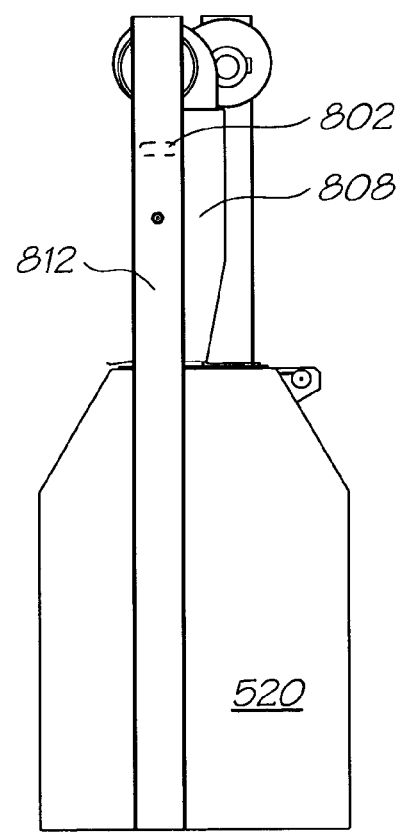
FIG. 8C is a side elevation of a dryer cabinet.
Figure 9:
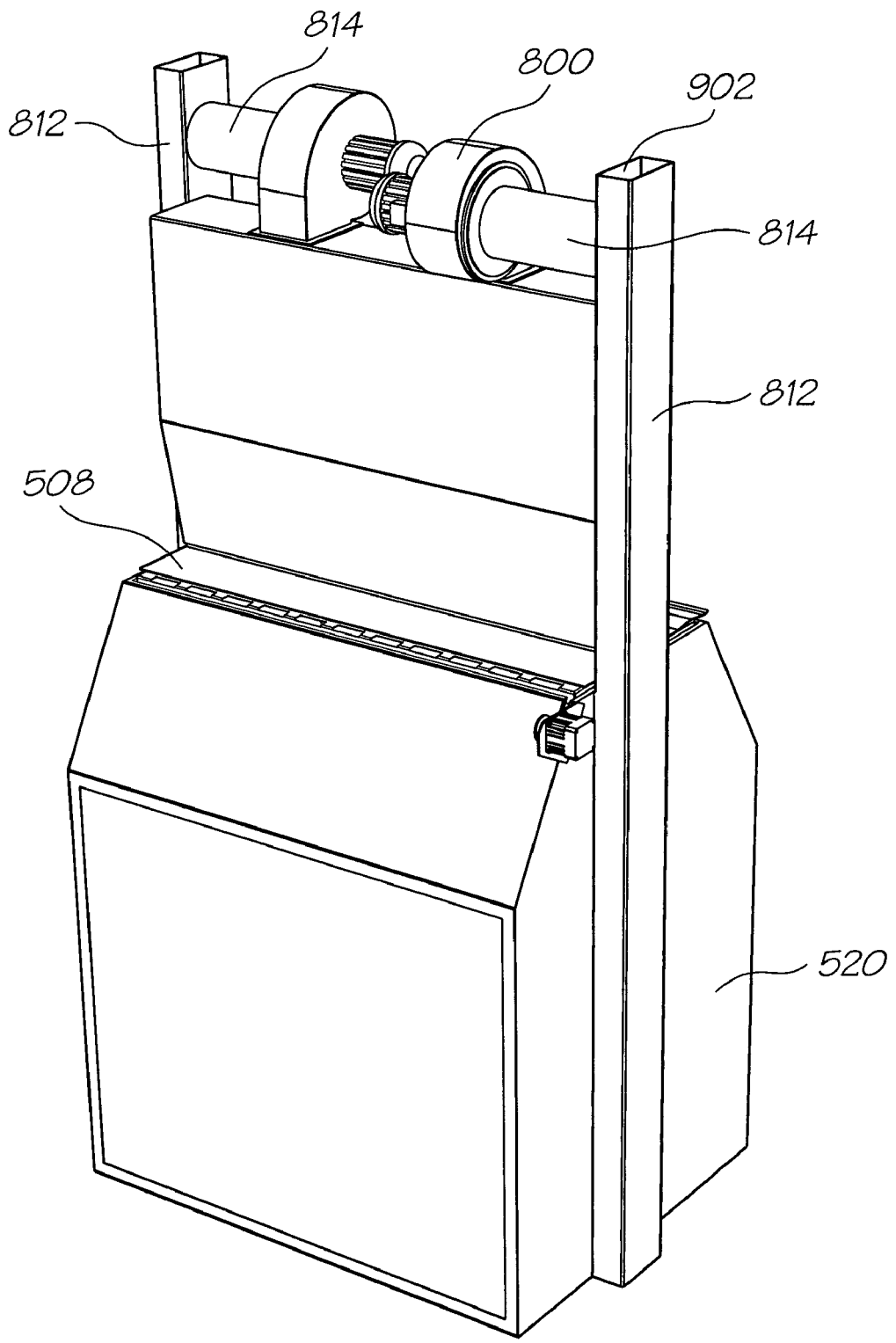
FIG. 9 is a perspective view of a dryer cabinet.

As shown in FIGS. 8 and 9, the removable drying cabinet or module 318 utilizes one or more top mounted blowers or centrifugal fans 800. The fans 800 provide a supply of air, downward through a plenum 808, across one or more heating elements 802 that are controlled by a thermal sensor 804. The stream of heated air is channeled by a tapered duct 806 and blown across the opening 506 (not shown in these Figures). When the door 508 is open, the heated air blows into the drying compartment 520. Exterior circulation ducts 812 allow air from the drying compartment 520 to be collected and supplied to the intakes 814 of each motor 800. The ducts extend from vents in the compartment upwardly and may include an upper vent 902 which allows hot or moist air to escape through the vent area 114 of the cabinet.

7. The Slitter/Cutter Module

Figure 12:
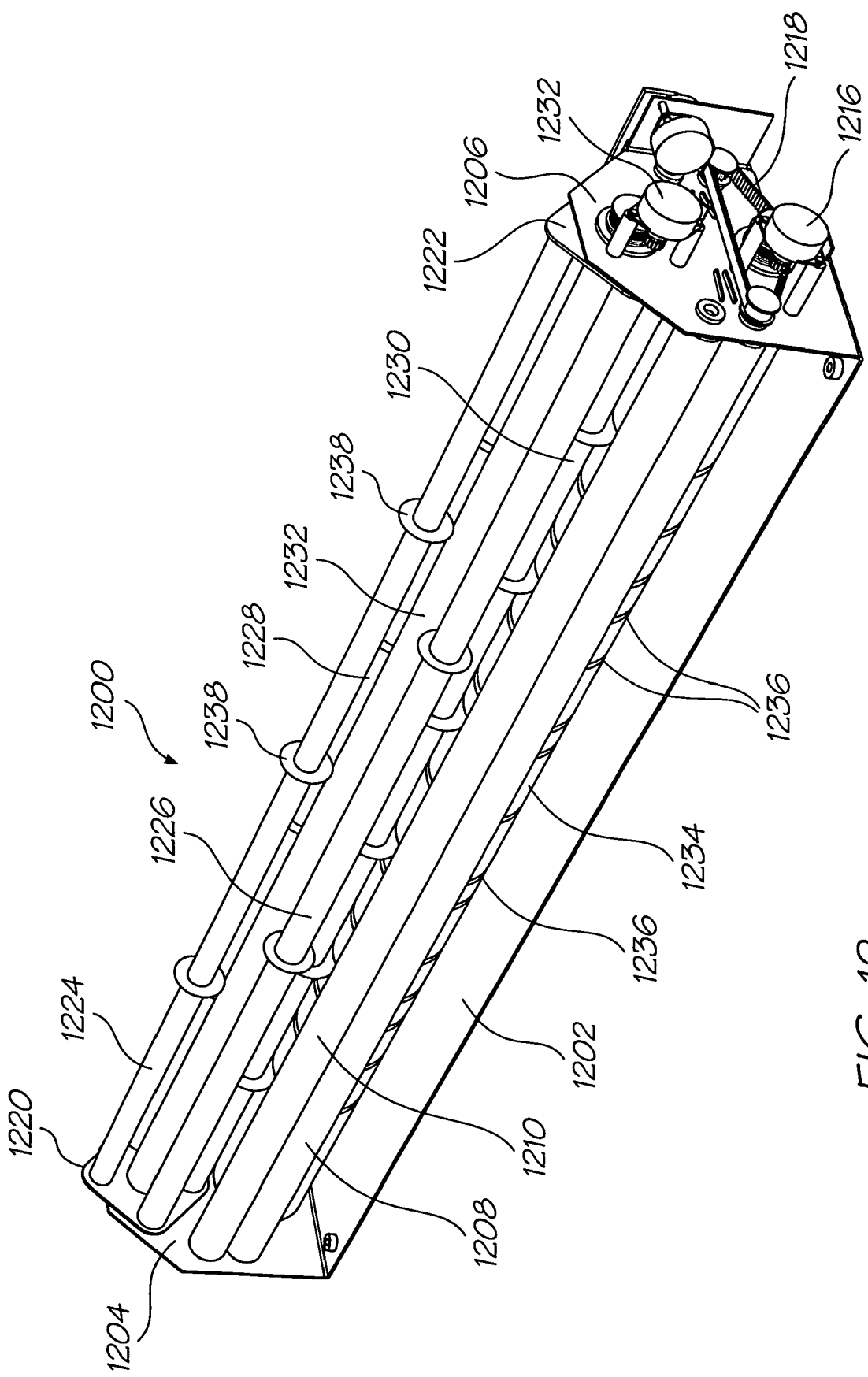
FIG. 12 is a perspective view of a slitter module.
Figure 13:
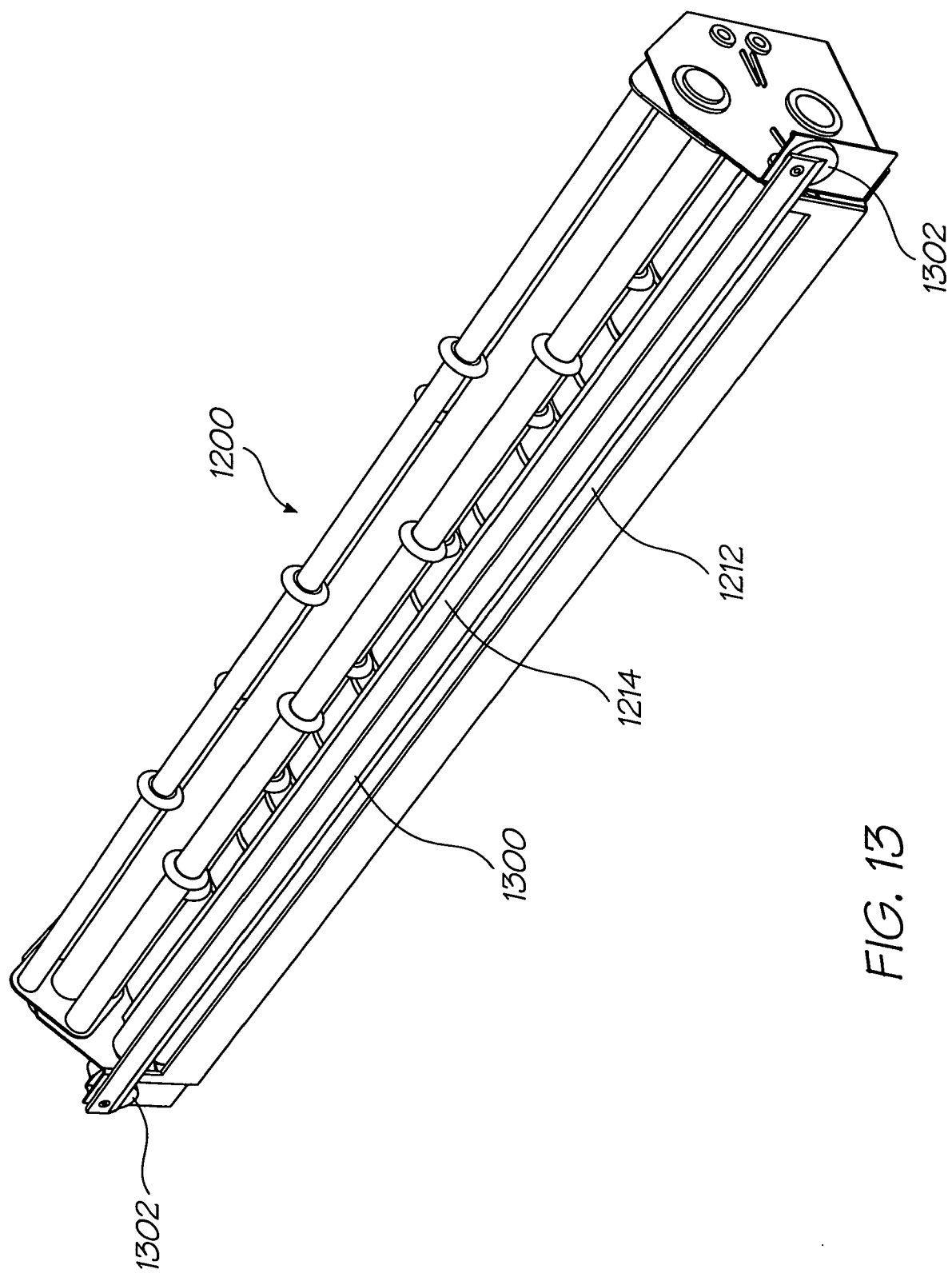
FIG. 13 is another perspective of a slitter module showing the transverse cutter.
Figure 14:
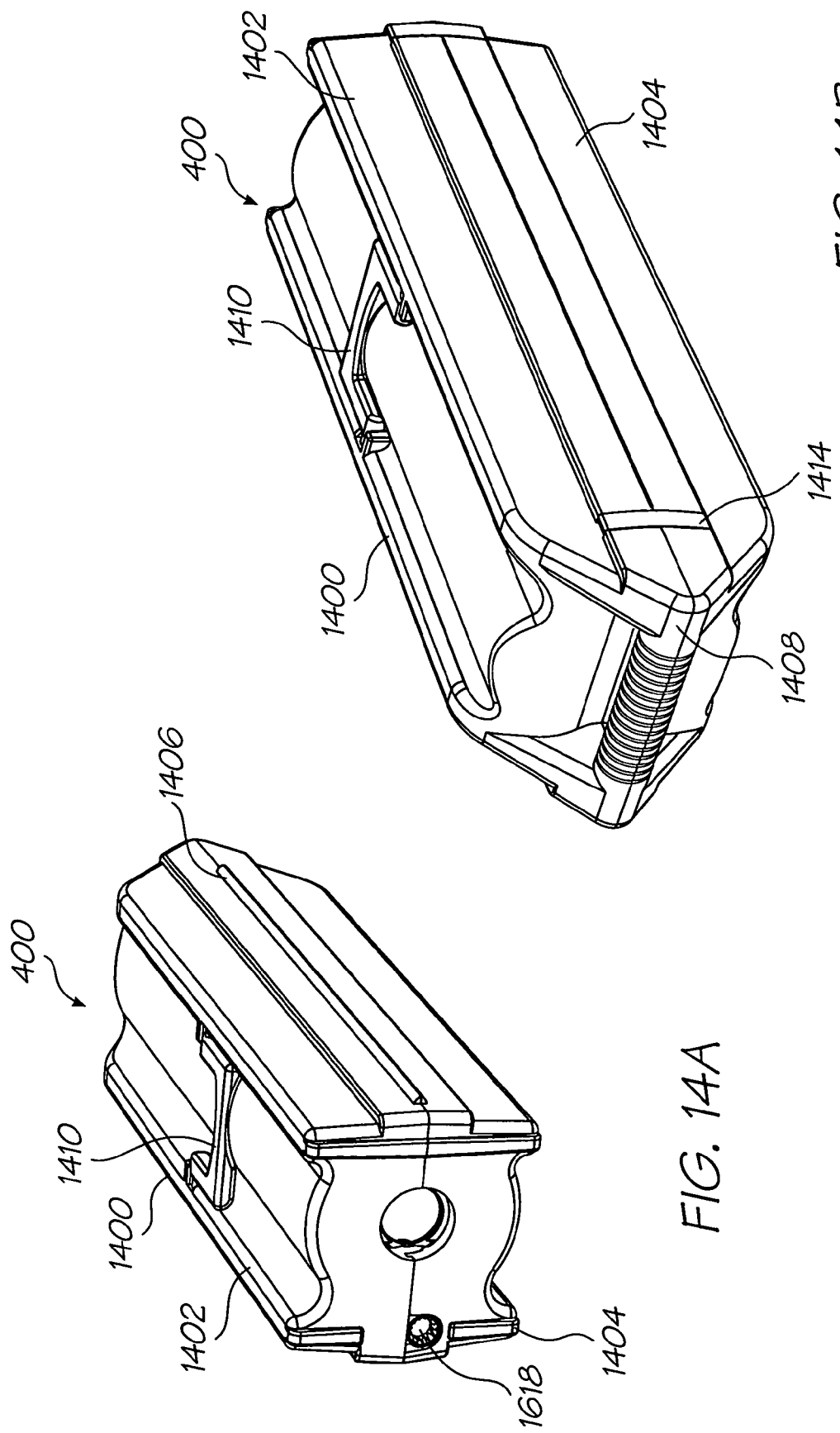
FIG. 14A and 14B are perspective views of a media cartridge.
Figure 15:
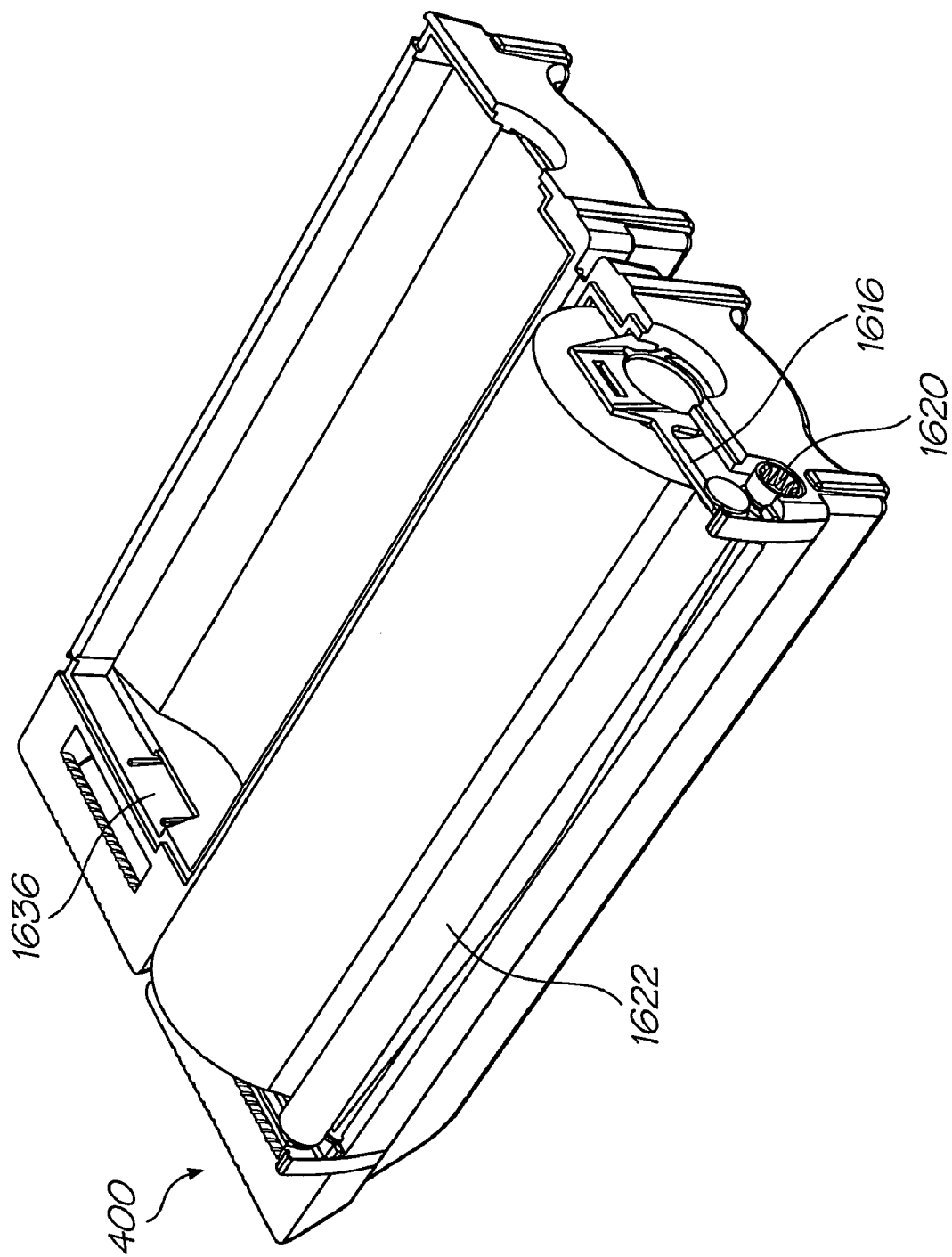
FIG. 15 is a perspective view of the media cartridge depicted in FIG. 14 with the case open.

FIGS. 12 and 13 illustrate the slitter/cutter module 1200. The module 1200 comprises a frame, such as a sheet metal frame 1202 having end plates 1204 and 1206. The paper path through the module 1200 is defined by a pair of entry rollers 1208 and 1210 and a pair of exit rollers 1212 and 1214. One of the entry rollers 1208 and one of the exit rollers 1212 is powered. Power is supplied to both drive rollers by a drive motor 1216 and a drive belt 1218. The drive rollers 1208, 1212 in conjunction with the idler rollers 1210, 1214 serve as a transport mechanism for the wallpaper through the module 1200.

Also located between the side plates 1204, 1206 is an optional, slitter gang or mechanism in a rotating carrousel configuration. The slitter gang comprises a separate pair of brackets or end plates 1220 and 1222 between which extend a plurality of slitter rollers 1224, 1226, 1228 and 1230 and a central stabilizing shaft 1232. In this example, four independent rollers are depicted along with a stabilizing shaft 1232. It will be understood that the slitter gang is optional and may be provided either as a single roller or a gang of two or more rollers as illustrated by FIG. 12. An actuating motor 1232 rotates the slitter gang into a selected position. A central guide roller 1234 extends between the end plates 1204, 1206 and beneath the slitter gang. The guide roller 1234 has a succession of circumferential grooves 1236 formed along its length. The grooves 1236 correspond to the position of each of the blades, cutters or rotating cutting disks 1238 which are formed on each of the slitters 1224-1230. In this way, the guide roller acts as a cutting block and allows the blades 1238 to penetrate the wallpaper when they are rotated into position. In this way, each of the slitters 1224-1230 can be rotated into an out of position, as required.

As shown in FIG. 13, the exit portion of the slitter/cutter module 1200 comprises a transverse cutter 1300. The cutter blade 1300 is mounted eccentrically between a pair of rotating cams 1302 which are rotated in unison by an actuating motor to provide a circular cutting stroke. The motor may be mounted on an end plate. Actuation of the cutter 1300 divides the wallpaper web.

8. Media Supply Cartridge

FIGS. 14-18 illustrate the construction of the wallpaper media supply cartridges 400. Each cartridge comprises, for example, a high density polyethylene molding which forms a hinged case 1400. The case 1400 includes a top half 1402 and a bottom half 1404 which are held together by hinge such as an integral hinge 1406. One end face of the cartridge 400 preferably includes a handle 1408. A second folding handle 1410 may be provided, for ease of handling, along the top of the cartridge 400. The two halves, 1402, 1404, may be held together by one or more resilient clips 1414.

Figure 16:
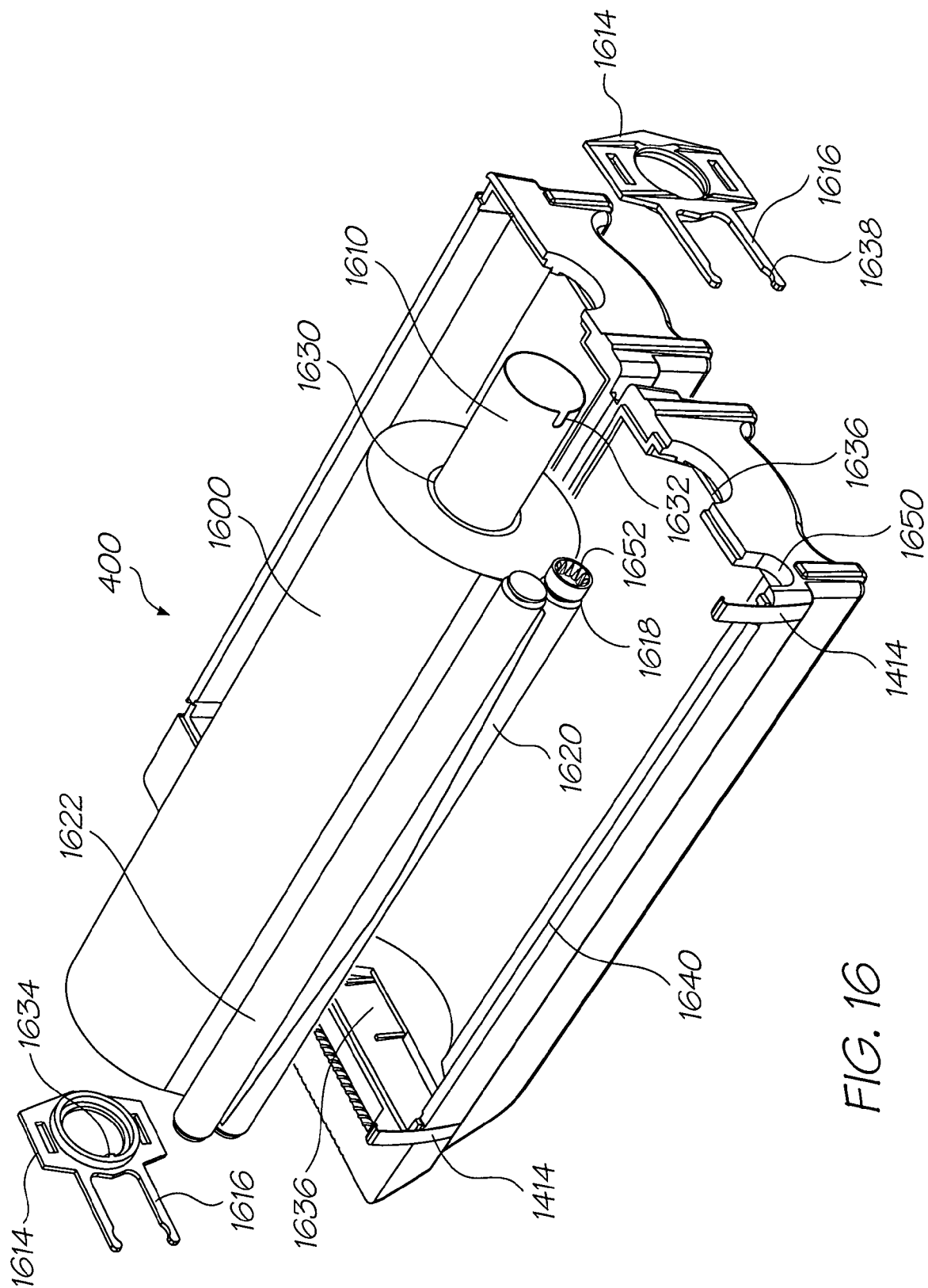
FIG. 16 in an exploded perspective of an interior of a media cartridge.
Figure 17D:
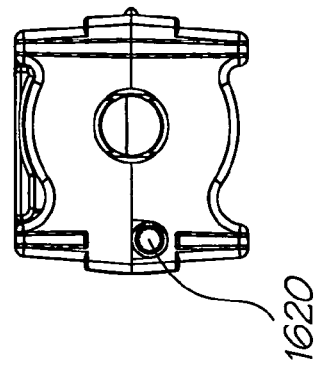
FIG. 17A to 17D are various views of the media cartridge depicted in FIGS. 14-16.
Figure 17A:
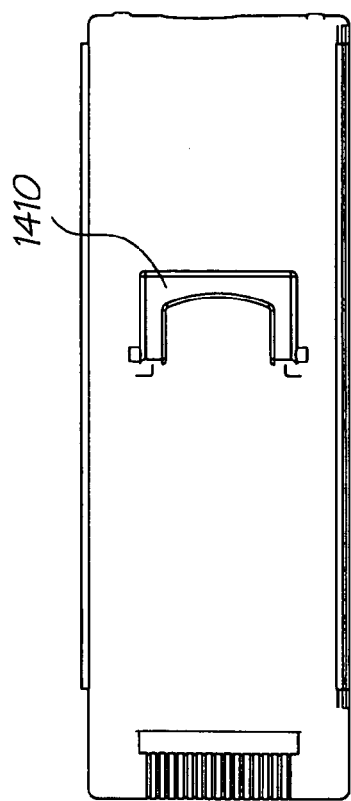
Figure 17C:
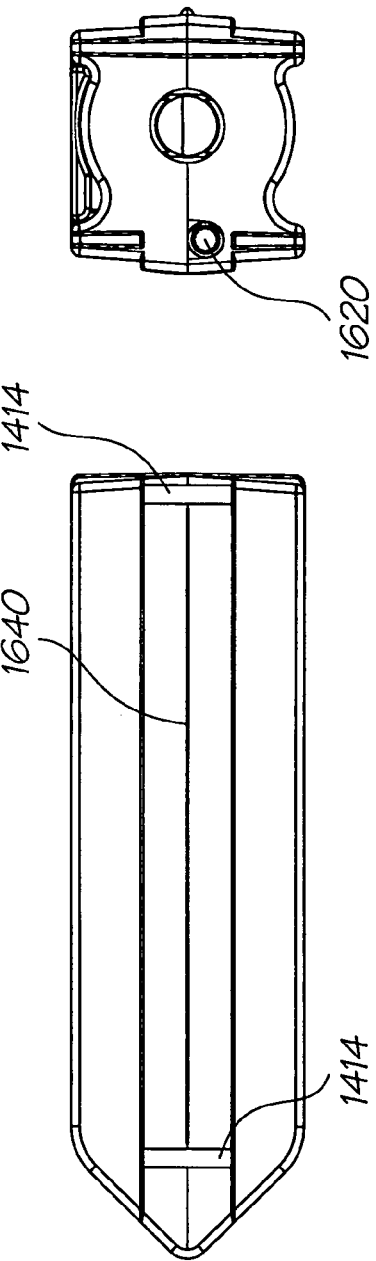
Figure 17B:
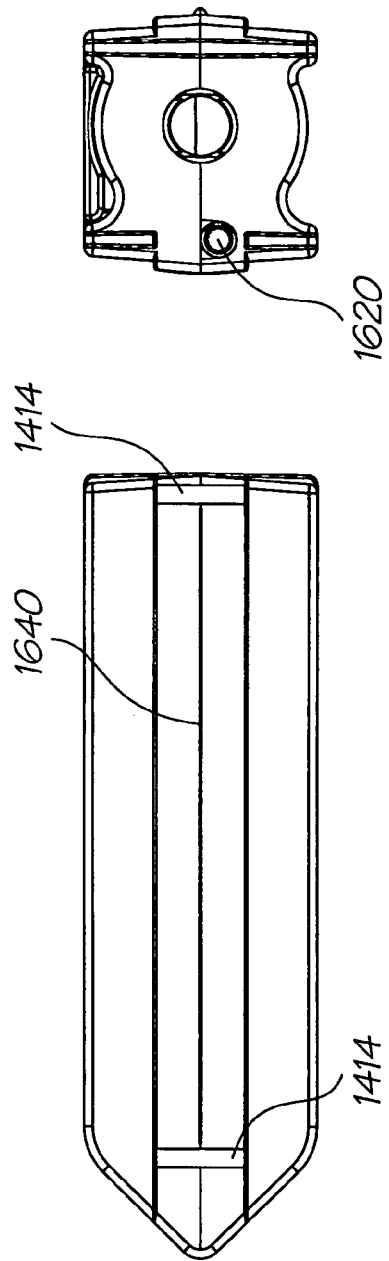
Figure 18:
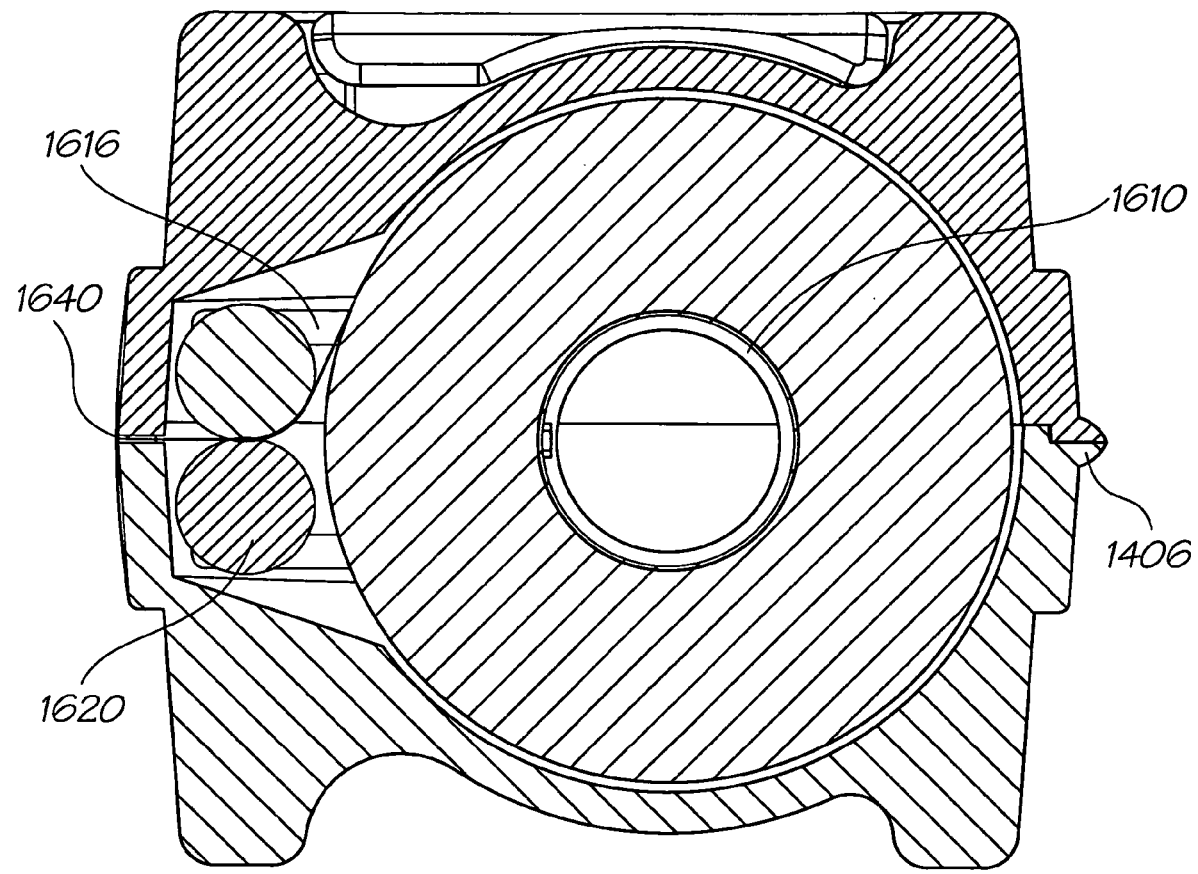
FIG. 18 is a cross section through a media cartridge.

As shown in FIG. 16, the cartridge 400 is preferably loaded by introducing an assembly into the bottom case half. The assembly includes a roll of blank media 1600 on a hollow core 1630 which rotates freely about a shaft 1610, rollers 1620, 1622 and the support moldings 1614.

The shaft 1610 carries a roller support molding 1614 at each end. The may be interchangeable so as to be used at either end. A notch 1632 at each end of the shaft 1610 engages a cooperating nib 1634 on the support moldings. Because the support moldings 1614 are restrained from rotating by locator slots 1636 formed in the cases halves, the shaft does not rotate (but the core 1630 does). The roller support moldings also may include resilient extensions 1616. Lunettes 1638 at the end of the extensions engage cooperating grooves 1618 formed at the ends of the cartridge drive roller 1620 and idler roller 1622. The rollers 1620, 1622 are supported between the ends of the cartridge 400, but maintained in proximity to one another and in registry with the shaft 1610 by the support moldings 1614. The resilient force imposed by the extensions 1616 keep the drive roller 1620 and the idler 1622 in close enough proximity (or in contact) that when the drive roller 1620 is operated on by the media driver motor, the wallpaper medium is dispensed from the dispensing slot 1640 of the cartridge 400. Further advancing the drive roller 1620 advances the media web into the media path.

In some embodiments, the driven roller 1620 is slightly longer than the idler roller 1622. One case half has an opening 1650 which allows a shaft or spindle to rotate the drive roller 1620 via a coupling half 1652 formed in the roller. The opening may serve as a journal for the shaft 1620. The idler roller remains fully within the case when the halves are shut.

9. Customer Tote

Figure 19:
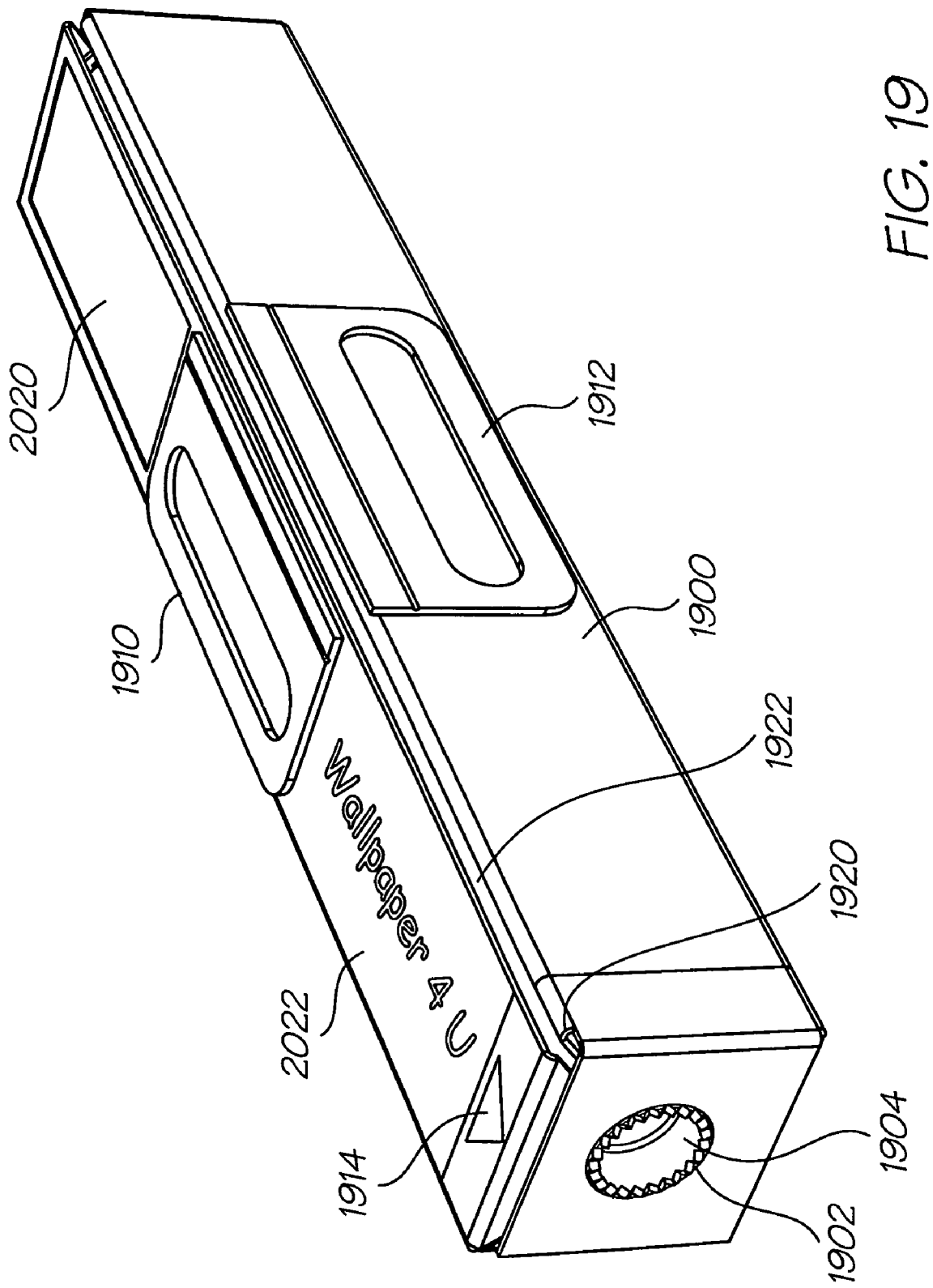
FIG. 19 is a perspective view of a carry container or finished wallpaper product.

As shown in FIGS. 19 and 20, a tote or container 1900 for the finished product comprises an elongated folding carton with a central axially directed opening 1904 at each end 1902. The carton may be disposable and formed from paper, cardboard or any other thin textile. The carton holds about 50 meters of printed wallpaper. As shown in FIG. 20, the finished roll of wallpaper 2000 is shown on a core 2008 supported between a pair of support moldings 2000-2004. The core 2008 may be disposable. Each of the support moldings comprises a hub or stub shaft 2006 which is adapted to engage the interior of the core 2008 which carries the printed wallpaper 2000. The support moldings may have a circumferential bearing surface 2022, attached to the stub shaft, for example by spokes 2030, for distributing the load onto the interior bottom and walls of the carton. Each molding, 2002, 2004 includes an external shoulder 2010 which is adapted to fit through the openings 1902. At least one of the moldings 2002 has axially or radially extending teeth 2012 forming a coupling feature which is adapted to be driven by the drive mechanism located within the cradle 106 formed on the front of the cabinet. Other types of coupling features may be used. A viewing window 2020 may be formed in an upper flap of the carton 1900 so that the printed pattern can be viewed with the lid 2022 closed.

An edge 1920 of the carton adjacent to the lid 2022 may include a return fold so as to smooth the edge presented to wallpaper as it is wound onto the core. A smooth edge may also be provided by applying a separate anti-friction material. Note the gap 1922 between the lid and the carton. Wallpaper enters the tote through the gap 1922.

The carton 1900 may include folding handles 1910 provided singly or in opposing pairs, 1910, 1912. In some embodiments a handle is provided on either side of the gap 1922. Folding handles of this kind form a grip when deployed but do not interfere with the location of the box 1900 within the cradle. An arrow 1914 or other visual device printed on the box indicates which end of the carton orients to or corresponds to the driving end of the cradle 106 (see FIG. 3).

10. Information Processing

The invention has been disclosed with reference to a module 340 in which is placed a processor. It will be understood that the processing capabilities of the printer of the present invention may be physically deployed and interconnected with the hardware and software required for the printer in a number of ways. In this document and the claims, the broad term "processor" is used to refer to the totality of electronic information processing resources required by the printer (regardless of location, platform, arrangement, network, configuration etc.) unless a contrary intention or meaning is indicated. In general the processor is responsible for coordination of the printer's functions in accordance with the operator inputs. The printer's functions may include any one or more of: providing operator instruction, creating alerts to system performance, self threading, operation of the printhead and its accessory features, obtaining operator inputs from any of a variety of sources, movement of the web through the printer and out of it, operation of any cutter or slitter, winding of the finished roll onto a spool or into a tote, communication with the operator and driving any display, self diagnosis and report, self maintenance, monitoring system parameters and adjusting printing systems.

11. Methods of Operation

The device of the present invention is preferably operated as an on demand printer. An operator of the device is able to select a pattern for printing in a number of ways. The pattern may be selected by viewing pattern on the display 104, or from a collection of printed swatches 200 or by referring to other sources. The identity of the selected pattern is communicated to the printer by the scanner 108 or by a keyboard, the touchscreen 104 or other means. In some embodiments the pattern may be customized by operator input, such as changing the color or scale of a pattern, the spacing of stripes or the combination of patterns. Input devices such as the touchscreen 104 also allow the customer, user or operator to configure the printer for a particular run or job. Configuration information that can be input to the processor includes roll length, slitting requirements, media selection or modifications to the pattern. The totality of inputs are processed and when the printer is ready to print, the operator insures that the web is taped to the core in the tote and that the core and tote are ready for winding. Alerts will be generated by the printer if any system function or parameter indicates that the job will not be printed and wound successfully. This may require the self diagnosis of a variety of physical parameters such as ink fill levels, remaining web length, web tension, end-to-end integrity of the web etc. Information requirement and resources may be parsed and checked as well prior to the initiation of a print run. Once the required roll length has been wound, the tote is severed from the web, either automatically or manually, as required.

Figure 73:
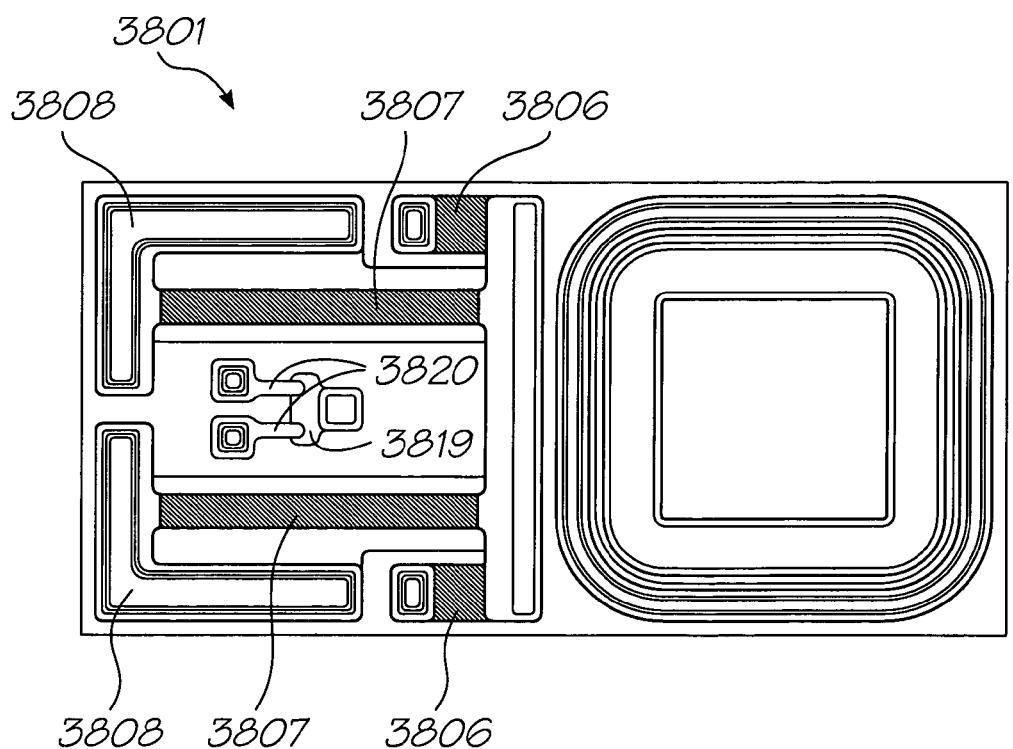
FIG. 73 shows a plan view of the nozzle of FIG. 65 with lever arm and movable nozzle portions omitted.

A detailed description of a preferred embodiment of the printhead will now be described with reference to FIGS. 21-73.

Figure 21:
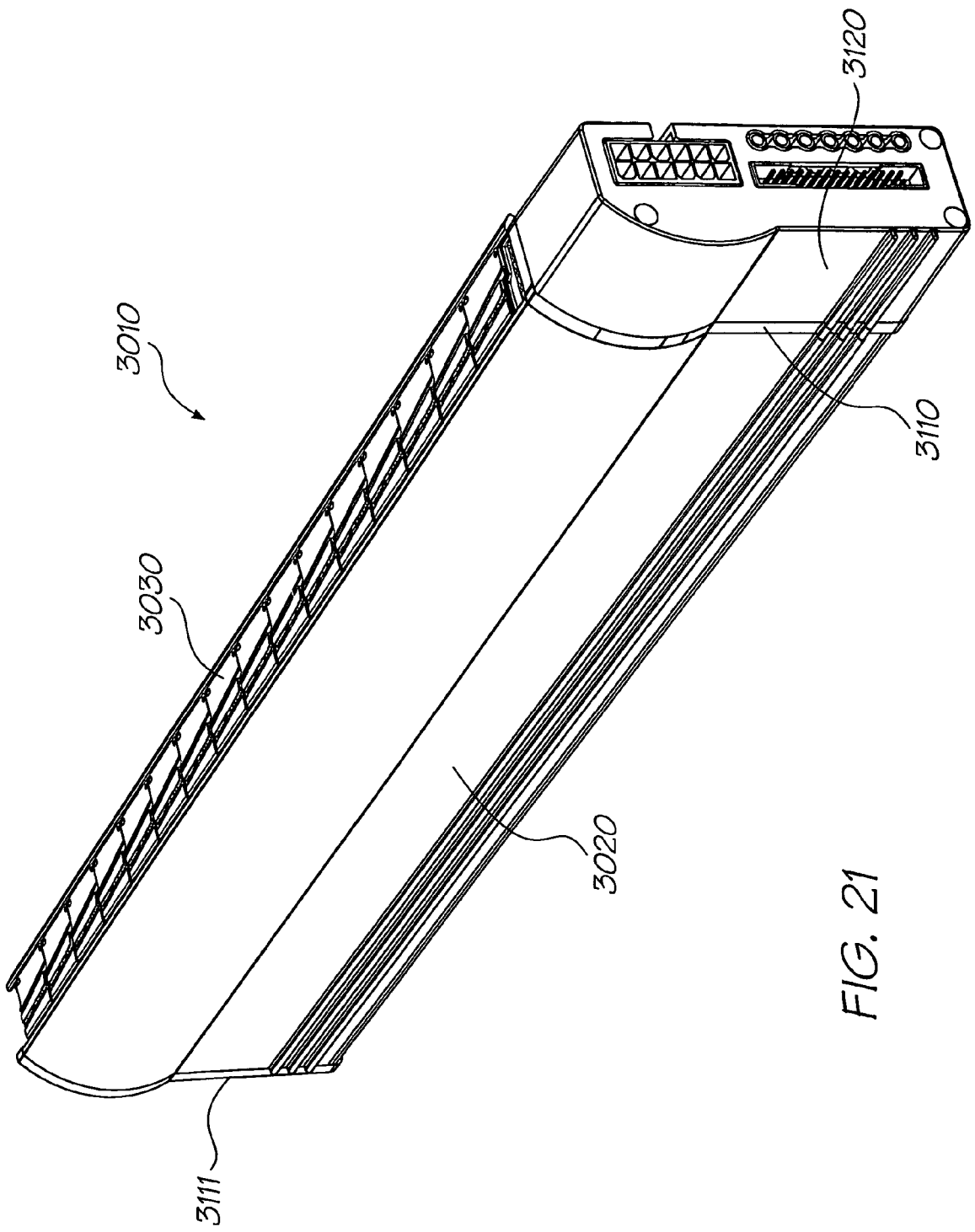
FIG. 21 shows a perspective view of a printhead assembly in accordance with an embodiment of the present invention.
Figure 22:
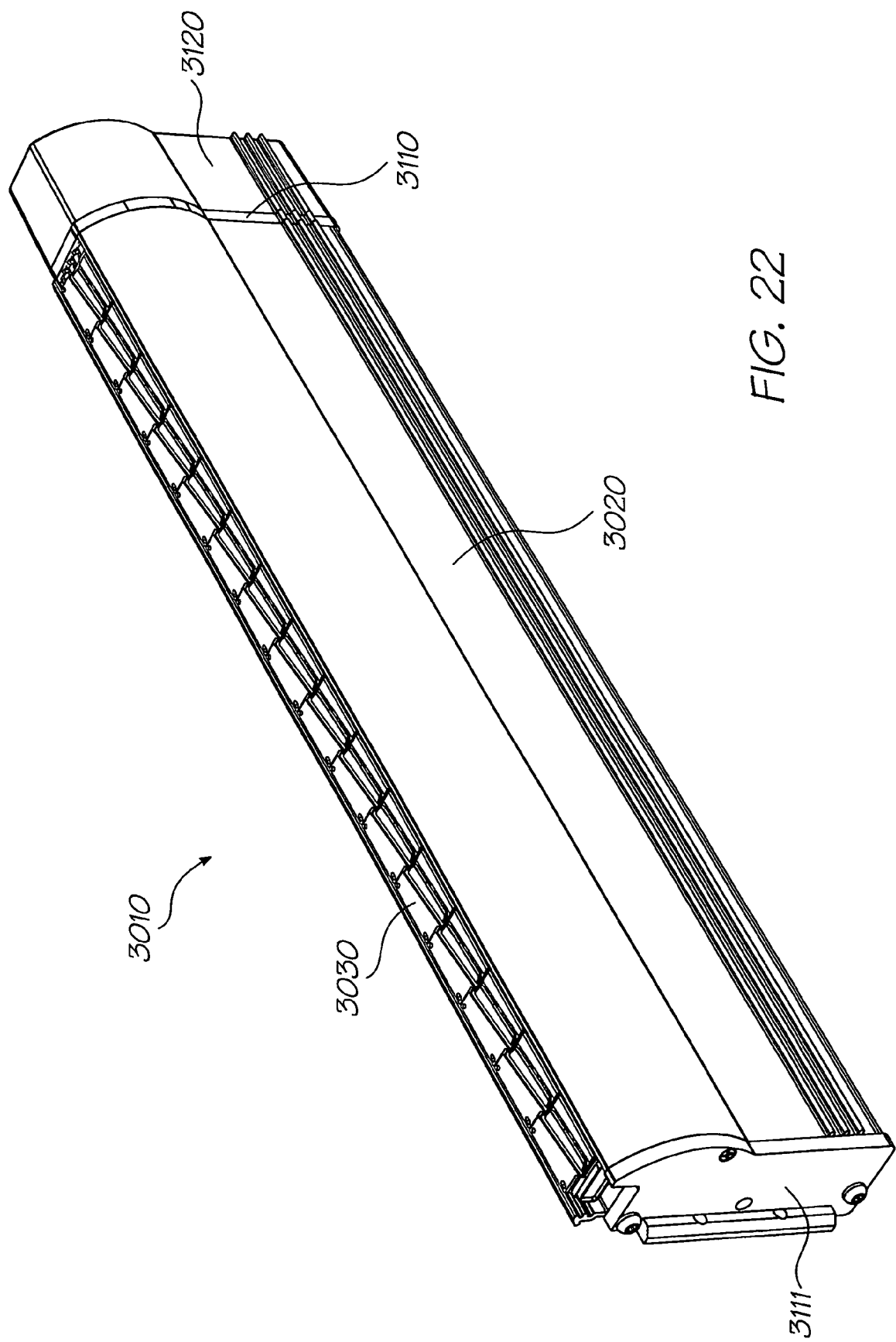
FIG. 22 shows the opposite side of the printhead assembly of FIG. 21.

The printhead assembly 3010 as shown in FIGS. 21 and 22 is intended for use as a page width printhead in a printing system. That is, a printhead which extends across the width or along the length of a page of print media, e.g., paper, for printing. During printing, the printhead assembly ejects ink onto the print media as it progresses past, thereby forming printed information thereon, with the printhead assembly being maintained in a stationary position as the print media is progressed past. That is, the printhead assembly is not scanned across the page in the manner of a conventional printhead.

As can be seen from FIGS. 21 and 22, the printhead assembly 3010 includes a casing 3020 and a printhead module 3030. The casing 3020 houses the dedicated (or drive) electronics for the printhead assembly together with power and data inputs, and provides a structure for mounting the printhead assembly to a printer unit. The printhead module 3030, which is received within a channel 3021 of the casing 3020 so as to be removable therefrom, includes a fluid channel member 3040 which carries printhead tiles 3050 having printhead integrated circuits 3051 incorporating printing nozzles thereon. The printhead assembly 3010 further includes an end housing 3120 and plate 3110 assembly and an end plate 3111 which are attached to longitudinal ends of the assembled casing 3020 and printhead module 3030.

The printhead module 3030 and its associated components will now be described with reference to FIGS. 21 to 34B.

Figure 23:
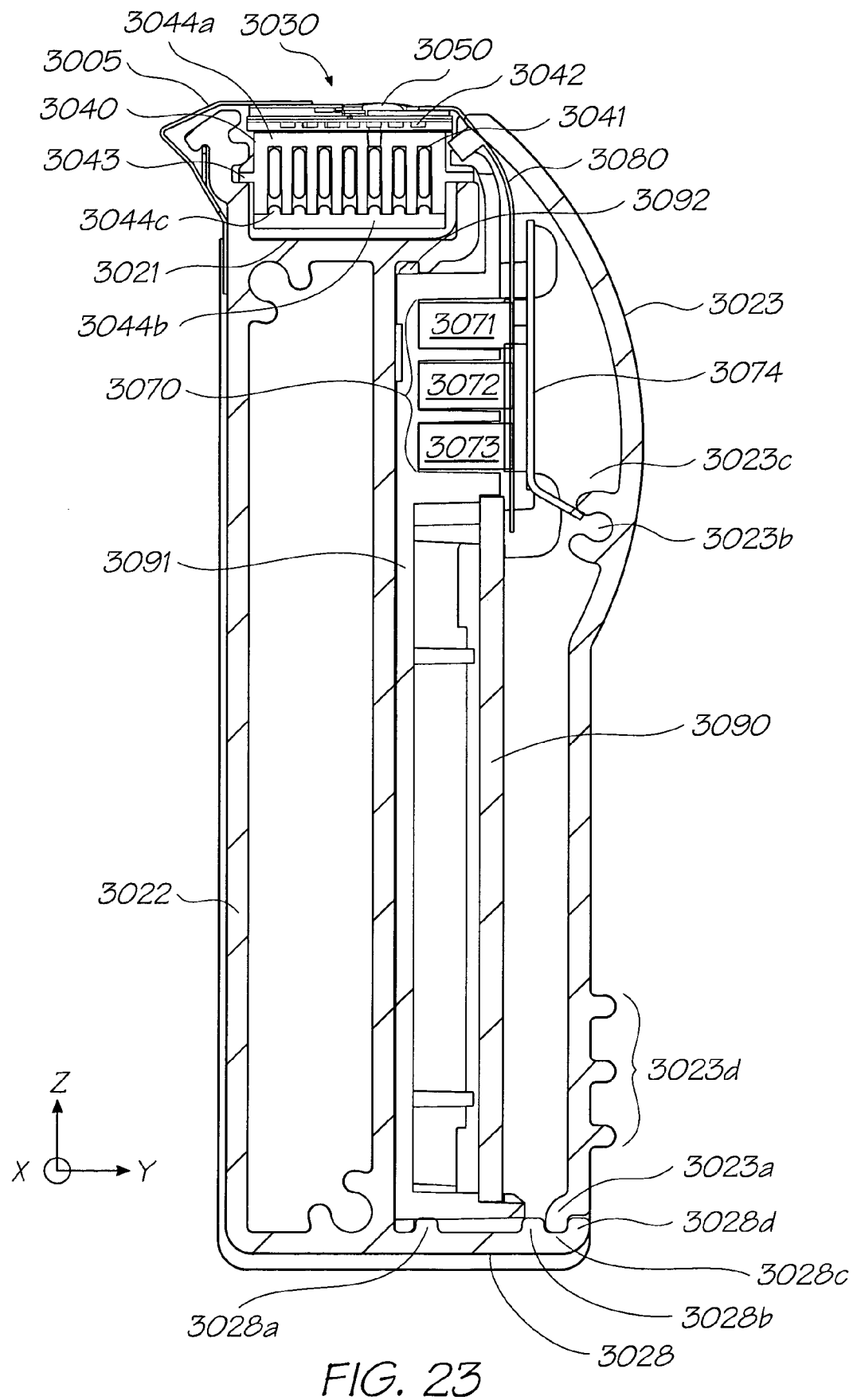
FIG. 23 shows a sectional view of the printhead assembly of FIG. 21.

As shown in FIG. 23, the printhead module 3030 includes the fluid channel member 3040 and the printhead tiles 3050 mounted on the upper surface of the member 3040.

As illustrated in FIGS. 21 and 22, sixteen printhead tiles 3050 are provided in the printhead module 3030. However, as will be understood from the following description, the number of printhead tiles and printhead integrated circuits mounted thereon may be varied to meet specific applications of the present invention.

As illustrated in FIGS. 21 and 22, each of the printhead tiles 3050 has a stepped end region so that, when adjacent printhead tiles 3050 are butted together end-to-end, the printhead integrated circuits 3051 mounted thereon overlap in this region. Further, the printhead integrated circuits 3051 extend at an angle relative to the longitudinal direction of the printhead tiles 3050 to facilitate overlapping between the printhead integrated circuits 3051. This overlapping of adjacent printhead integrated circuits 3051 provides for a constant pitch between the printing nozzles (described later) incorporated in the printhead integrated circuits 3051 and this arrangement obviated discontinuities in information printed across or along the print media (not shown) passing the printhead assembly 3010. This overlapping arrangement of the printhead integrated circuits is described in the Applicant's issued U.S. Pat. No. 6,623,106, which is incorporated herein by reference.

Figure 24A:
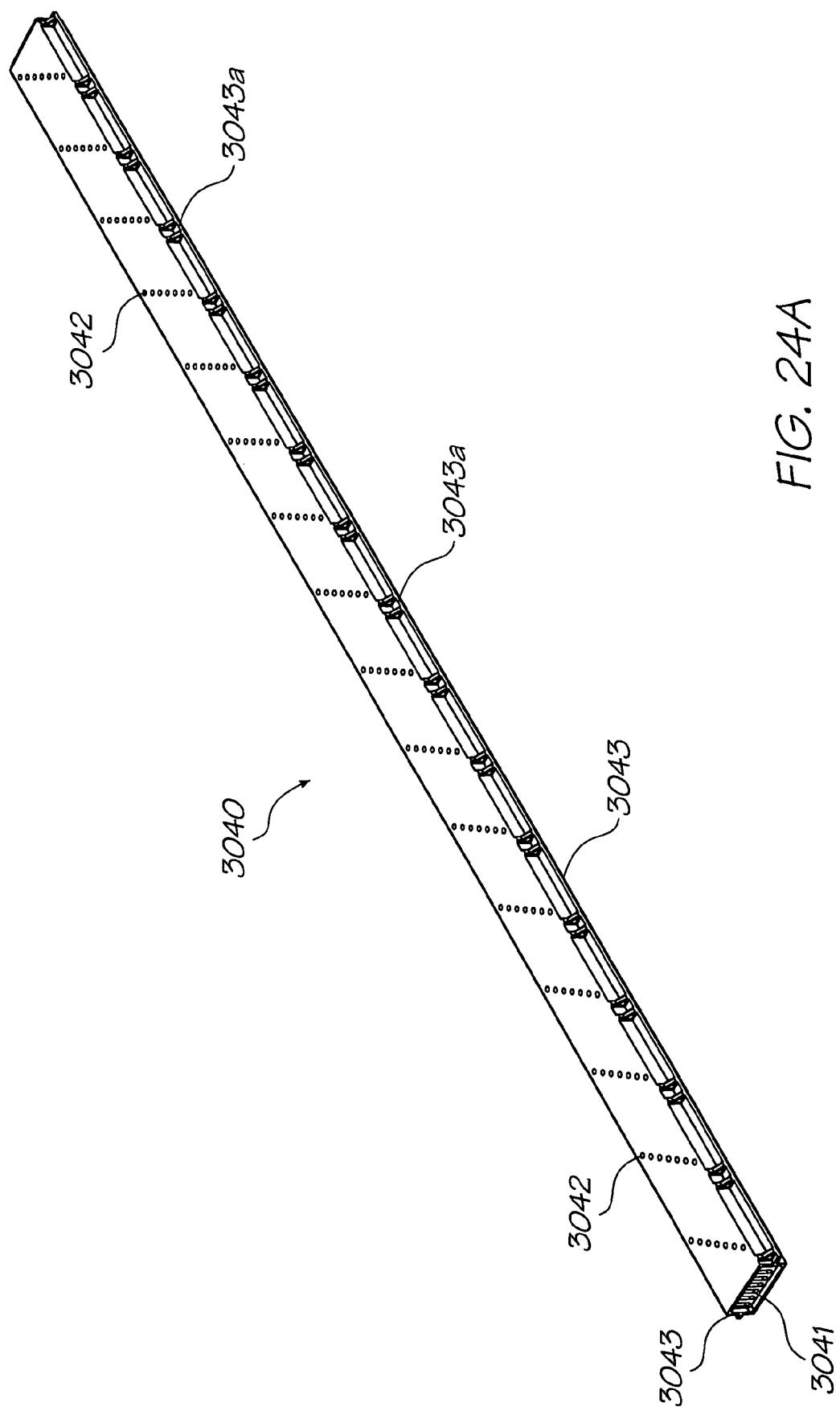
FIG. 24A illustrates a portion of a printhead module that is incorporated in the printhead assembly of FIG. 21.
Figure 24B:
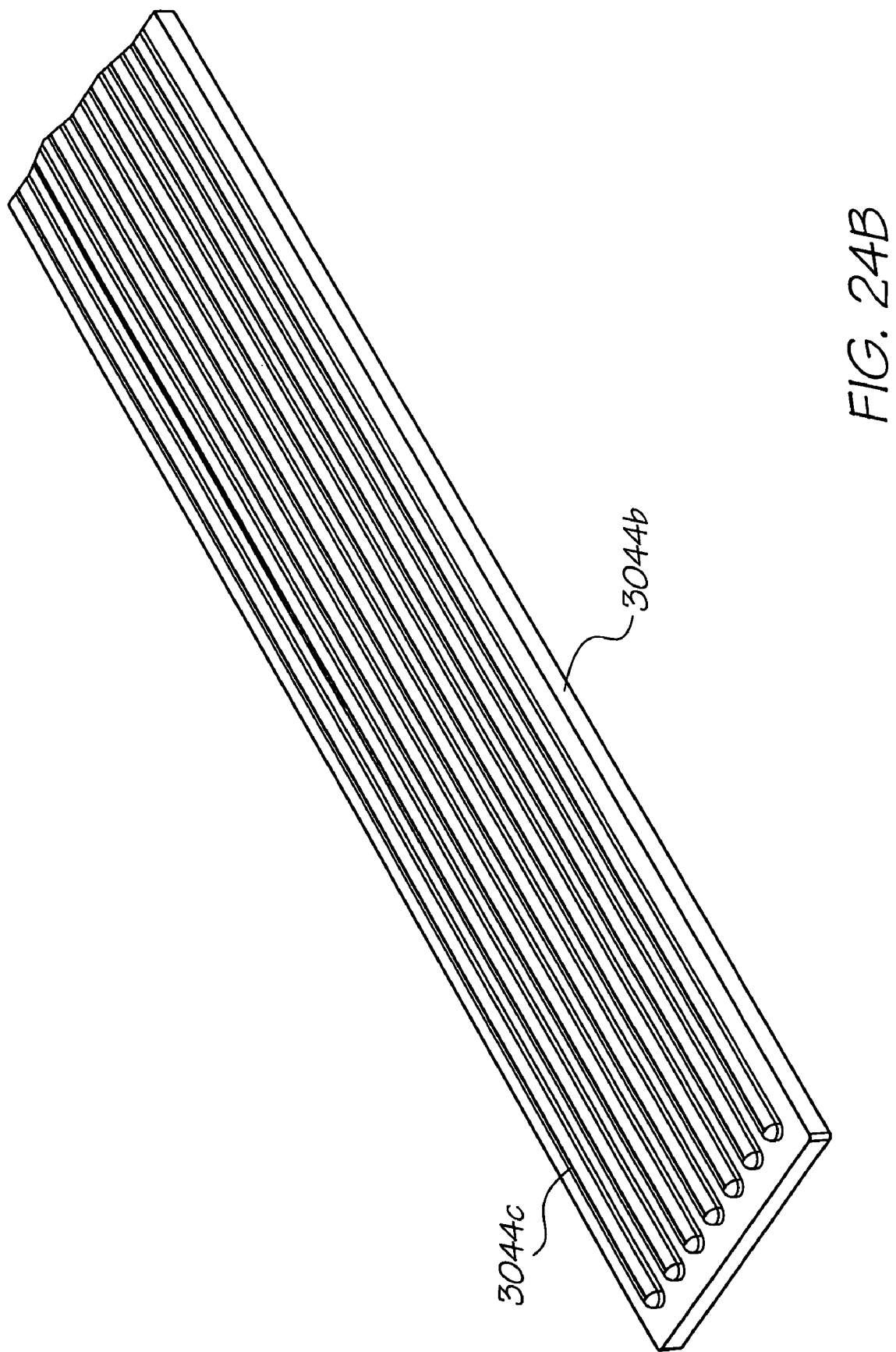
FIG. 24B illustrates a lid portion of the printhead module of FIG. 24A.

FIG. 24 shows the fluid channel member 3040 of the printhead module 3030 which serves as a support member for the printhead tiles 3050. The fluid channel member 3040 is configured so as to fit within the channel 3021 of the casing 3020 and is used to deliver printing ink and other fluids to the printhead tiles 3050. To achieve this, the fluid channel member 3040 includes channel-shaped ducts 3041 which extend throughout its length from each end of the fluid channel member 3040. The channel-shaped ducts 3041 are used to transport printing ink and other fluids from a fluid supply unit (of a printing system to which the printhead assembly 3010 is mounted) to the printhead tiles 3050 via a plurality of outlet ports 3042.

The fluid channel member 3040 is formed by injection moulding a suitable material. Suitable materials are those which have a low coefficient of linear thermal expansion (CTE), so that the nozzles of the printhead integrated circuits are accurately maintained under operational condition (described in more detail later), and have chemical inertness to the inks and other fluids channelled through the fluid channel member 3040. One example of a suitable material is a liquid crystal polymer (LCP). The injection moulding process is employed to form a body portion 3044a having open channels or grooves therein and a lid portion 3044b which is shaped with elongate ridge portions 3044c to be received in the open channels. The body and lid portions 3044a and 3044b are then adhered together with an epoxy to form the channel-shaped ducts 3041 as shown in FIGS. 23 and 24A. However, alternative moulding techniques may be employed to form the fluid channel member 3040 in one piece with the channel-shaped ducts 3041 therein.

The plurality of ducts 3041, provided in communication with the corresponding outlet ports 3042 for each printhead tile 3050, are used to transport different coloured or types of inks and the other fluids. The different inks can have different colour pigments, for example, black, cyan, magenta and yellow, etc., and/or be selected for different printing applications, for example, as visually opaque inks, infrared opaque inks, etc. Further, the other fluids which can be used are, for example, air for maintaining the printhead integrated circuits 3051 free from dust and other impurities and/or for preventing the print media from coming into direct contact with the printing nozzles provided on the printhead integrated circuits 3051, and fixative for fixing the ink substantially immediately after being printed onto the print media, particularly in the case of high-speed printing applications.

In the assembly shown in FIG. 24, seven ducts 3041 are shown for transporting black, cyan, magenta and yellow coloured ink, each in one duct, infrared ink in one duct, air in one duct and fixative in one duct. Even though seven ducts are shown, a greater or lesser number may be provided to meet specific applications. For example, additional ducts might be provided for transporting black ink due to the generally higher percentage of black and white or greyscale printing applications.

The fluid channel member 3040 further includes a pair of longitudinally extending tabs 3043 along the sides thereof for securing the printhead module 3030 to the channel 3021 of the casing 3020 (described in more detail later). It is to be understood however that a series of individual tabs could alternatively be used for this purpose.

Figure 25A:
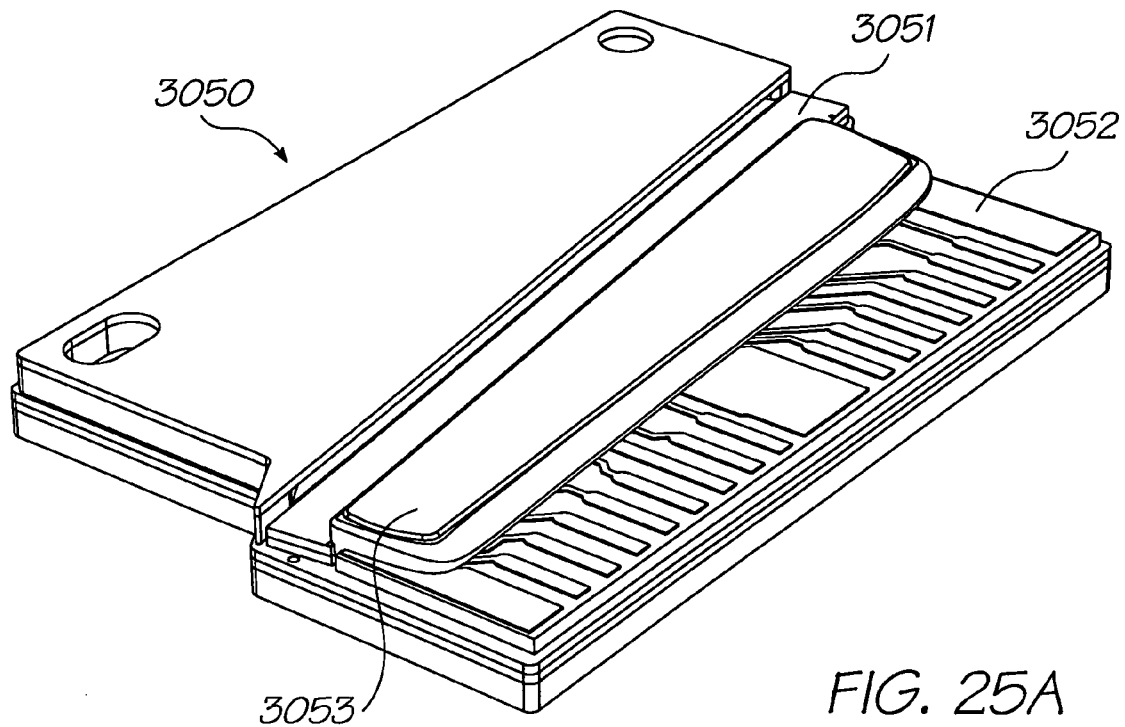
FIG. 25A shows a top view of a printhead tile that forms a portion of the printhead module of FIG. 24A.
Figure 26:
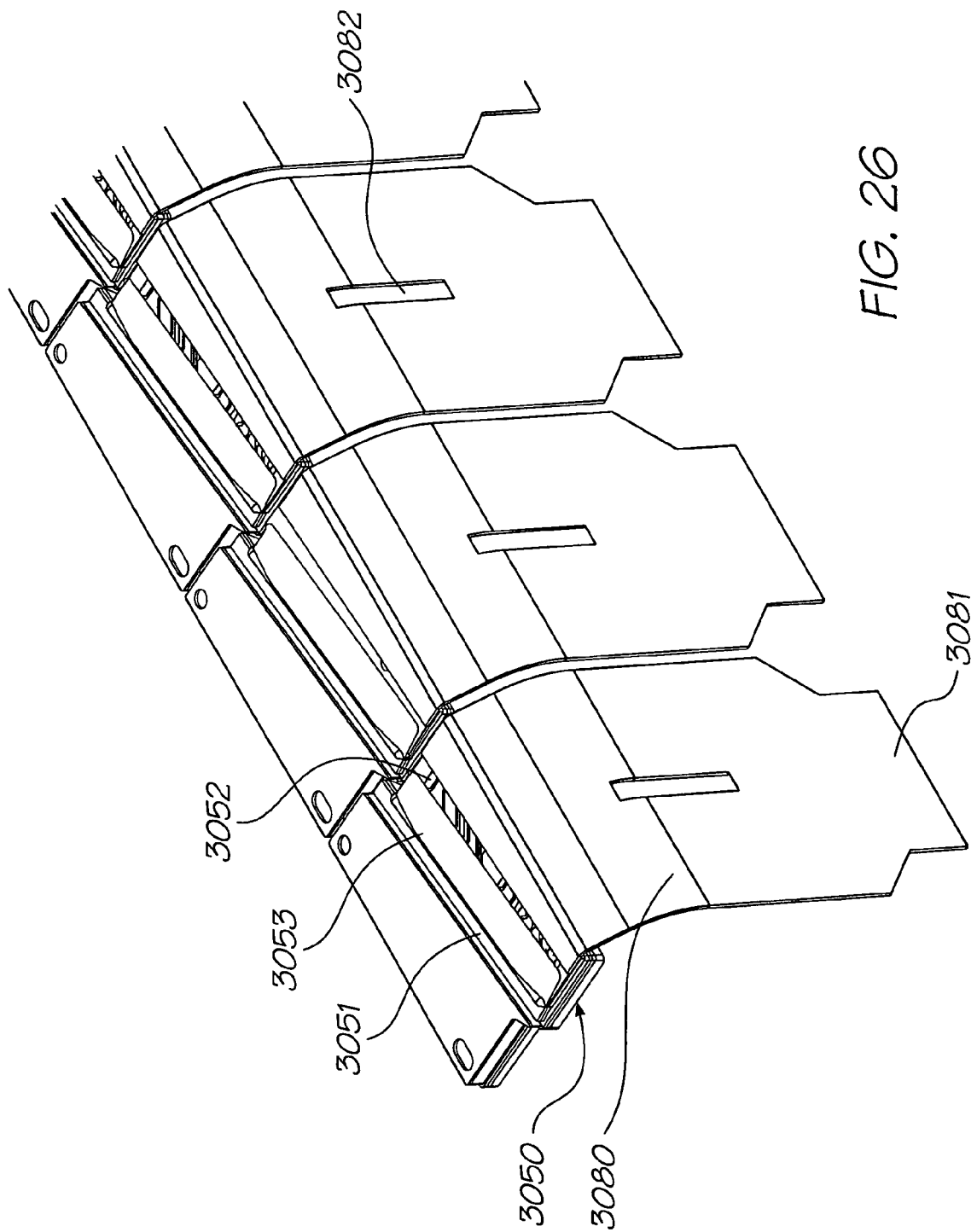
FIG. 26 illustrates electrical connectors for printhead integrated circuits that are mounted to the printhead tiles as shown in FIG. 25A.
Figure 27:
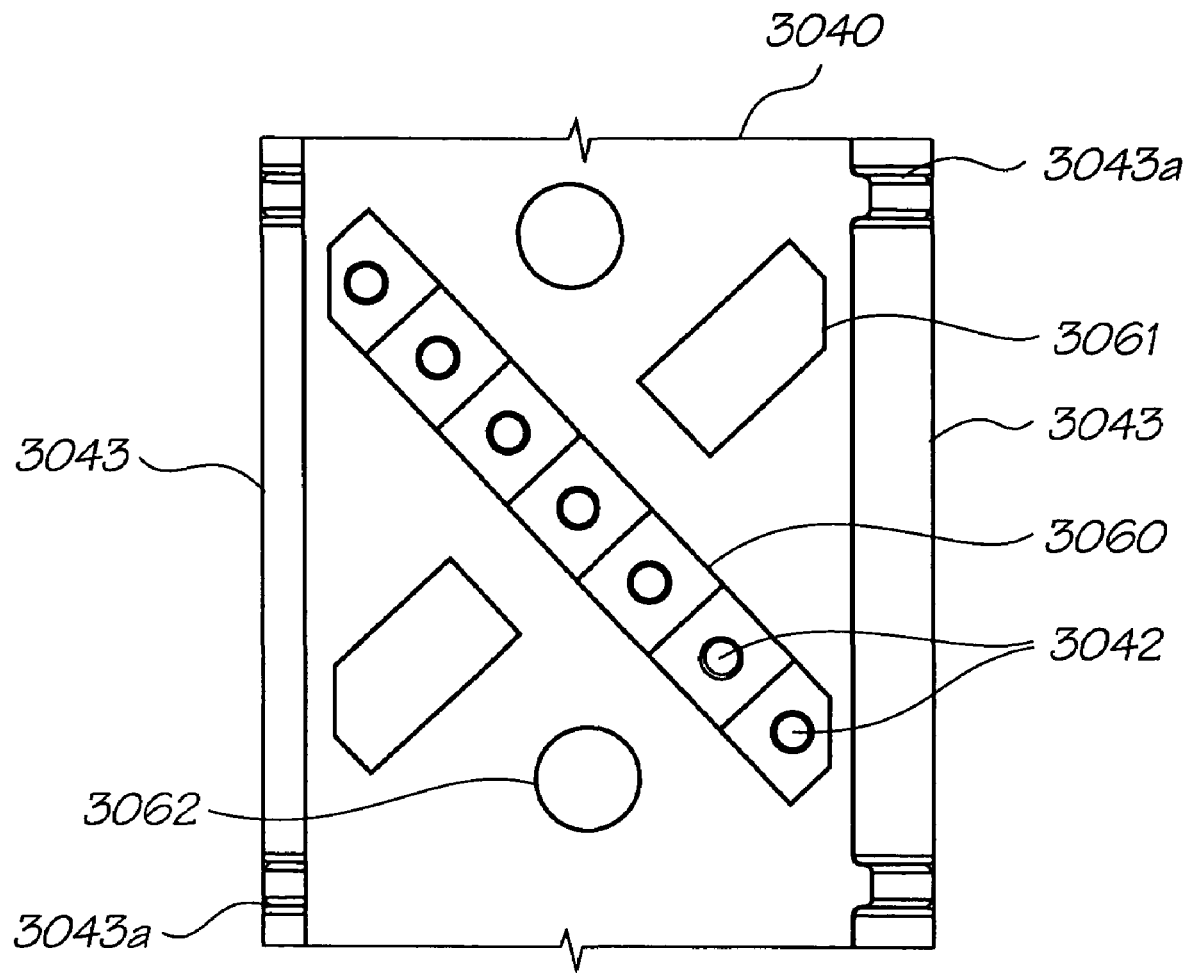
FIG. 27 illustrates a connection that is made between the printhead module of FIG. 24A and the underside of the printhead tile of FIGS. 25A and 25B.
Figure 38A:
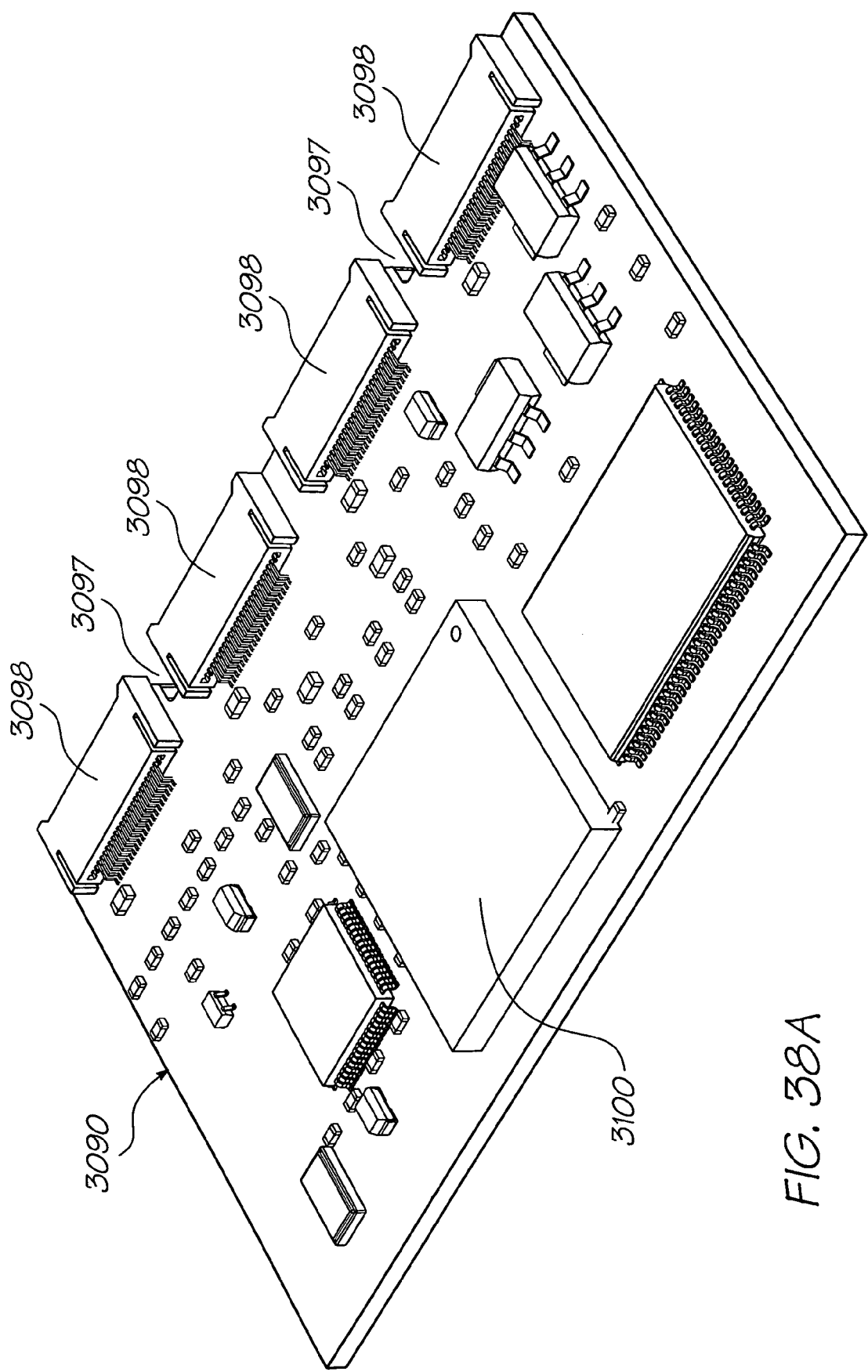
FIG. 38A illustrates circuit components carried by a PCB supported by the PCB support of FIG. 36.

As shown in FIG. 25A, each of the printhead tiles 3050 of the printhead module 3030 carries one of the printhead integrated circuits 3051, the latter being electrically connected to a printed circuit board (PCB) 3052 using appropriate contact methods such as wire bonding, with the connections being protectively encapsulated in an epoxy encapsulant 3053. The PCB 3052 extends to an edge of the printhead tile 3050, in the direction away from where the printhead integrated circuits 3051 are placed, where the PCB 3052 is directly connected to a flexible printed circuit board (flex PCB) 3080 for providing power and data to the printhead integrated circuit 3051 (described in more detail later). This is shown in FIG. 26 with individual flex PCBs 3080 extending or "hanging" from the edge of each of the printhead tiles 3050. The flex PCBs 3080 provide electrical connection between the printhead integrated circuits 3051, a power supply 3070 and a PCB 3090 (see FIG. 23) with drive electronics 3100 (see FIG. 38A) housed within the casing 3020 (described in more detail later).

Figure 25B:
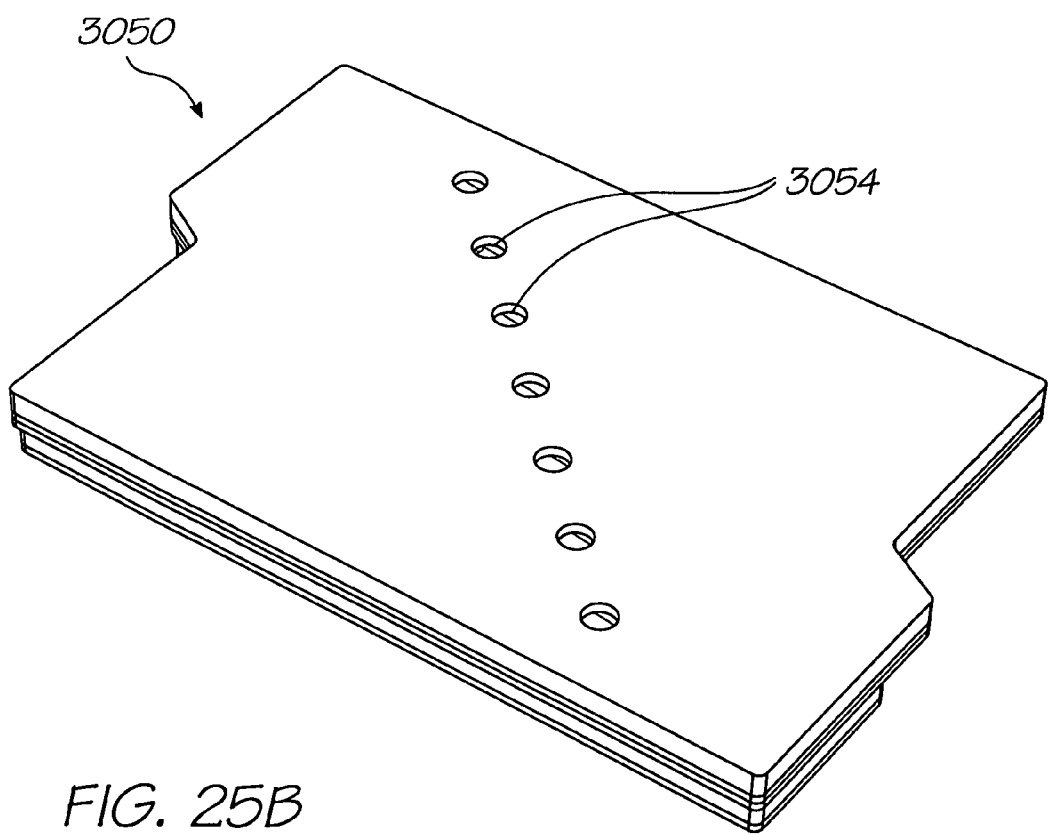
FIG. 25B shows a bottom view of the printhead tile of FIG. 25A.

FIG. 25B shows the underside of one of the printhead tiles 3050. A plurality of inlet ports 3054 is provided and the inlet ports 3054 are arranged to communicate with corresponding ones of the plurality of outlet ports 3042 of the ducts 3041 of the fluid channel member 3040 when the printhead tiles 3050 are mounted thereon. That is, as illustrated, seven inlet ports 3054 are provided for the outlet ports 3042 of the seven ducts 3041. Specifically, both the inlet and outlet ports are orientated in an inclined disposition with respect to the longitudinal direction of the printhead module so that the correct fluid, i.e., the fluid being channelled by a specific duct, is delivered to the correct nozzles (typically a group of nozzles is used for each type of ink or fluid) of the printhead integrated circuits.

On a typical printhead integrated circuit 3051 as employed in realisation of the present invention, more than 7000 (e.g., 7680) individual printing nozzles may be provided, which are spaced so as to effect printing with a resolution of 1600 dots per inch (dpi). This is achieved by having a nozzle density of 391 nozzles/mm$^2$ across a print surface width of 20 mm (0.8 in), with each nozzle capable of delivering a drop volume of 1 pl.

Accordingly, the nozzles are micro-sized (i.e., of the order of $10^{-6}$ meters) and as such are not capable of receiving a macro-sized (i.e., millimetric) flows of ink and other fluid as presented by the inlet ports 3054 on the underside of the printhead tile 3050. Each printhead tile 3050, therefore, is formed as a fluid distribution stack 3500 (see FIG. 63), which includes a plurality of laminated layers, with the printhead integrated circuit 3051, the PCB 3052, and the epoxy 3053 provided thereon.

The stack 3500 carries the ink and other fluids from the ducts 3041 of the fluid channel member 3040 to the individual nozzles of the printhead integrated circuit 3051 by reducing the macro-sized flow diameter at the inlet ports 3054 to a micro-sized flow diameter at the nozzles of the printhead integrated circuits 3051. An exemplary structure of the stack which provides this reduction is described in more detail later.

Nozzle systems which are applicable to the printhead assembly of the present invention may comprise any type of ink jet nozzle arrangement which can be integrated on a printhead integrated circuit. That is, systems such as a continuous ink system, an electrostatic system and a drop-on-demand system, including thermal and piezoelectric types, may be used.

There are various types of known thermal drop-on-demand system which may be employed which typically include ink reservoirs adjacent the nozzles and heater elements in thermal contact therewith. The heater elements heat the ink and create gas bubbles which generate pressures in the ink to cause droplets to be ejected through the nozzles onto the print media. The amount of ink ejected onto the print media and the timing of ejection by each nozzle are controlled by drive electronics. Such thermal systems impose limitations on the type of ink that can be used however, since the ink must be resistant to heat.

There are various types of known piezoelectric drop-on-demand system which may be employed which typically use piezo-crystals (located adjacent the ink reservoirs) which are caused to flex when an electric current flows therethrough. This flexing causes droplets of ink to be ejected from the nozzles in a similar manner to the thermal systems described above. In such piezoelectric systems the ink does not have to be heated and cooled between cycles, thus providing for a greater range of available ink types. Piezoelectric systems are difficult to integrate into drive integrated circuits and typically require a large number of connections between the drivers and the nozzle actuators.

As an alternative, a micro-electromechanical system (MEMS) of nozzles may be used, such a system including thermo-actuators which cause the nozzles to eject ink droplets. An exemplary MEMS nozzle system applicable to the printhead assembly of the present invention is described in more detail later.

Returning to the assembly of the fluid channel member 3040 and printhead tiles 3050, each printhead tile 3050 is attached to the fluid channel member 3040 such that the individual outlet ports 3042 and their corresponding inlet ports 3054 are aligned to allow effective transfer of fluid therebetween. An adhesive, such as a curable resin (e.g., an epoxy resin), is used for attaching the printhead tiles 3050 to the fluid channel member 3040 with the upper surface of the fluid channel member 3040 being prepared in the manner shown in FIG. 27.

That is, a curable resin is provided around each of the outlet ports 3042 to form a gasket member 3060 upon curing. This gasket member 3060 provides an adhesive seal between the fluid channel member 3040 and printhead tile 3050 whilst also providing a seal around each of the communicating outlet ports 3042 and inlet ports 3054. This sealing arrangement facilitates the flow and containment of fluid between the ports. Further, two curable resin deposits 3061 are provided on either side of the gasket member 3060 in a symmetrical manner.

The symmetrically placed deposits 3061 act as locators for positioning the printhead tiles 3050 on the fluid channel member 3040 and for preventing twisting of the printhead tiles 3050 in relation to the fluid channel member 3040. In order to provide additional bonding strength, particularly prior to and during curing of the gasket members 3060 and locators 3061, adhesive drops 3062 are provided in free areas of the upper surface of the fluid channel member 3040. A fast acting adhesive, such as cyanoacrylate or the like, is deposited to form the locators 3061 and prevents any movement of the printhead tiles 3050 with respect to the fluid channel member 3040 during curing of the curable resin.

With this arrangement, if a printhead tile is to be replaced, should one or a number of nozzles of the associated printhead integrated circuit fail, the individual printhead tiles may easily be removed. Thus, the surfaces of the fluid channel member and the printhead tiles are treated in a manner to ensure that the epoxy remains attached to the printhead tile, and not the fluid channel member surface, if a printhead tile is removed from the surface of the fluid channel member by levering. Consequently, a clean surface is left behind by the removed printhead tile, so that new epoxy can readily be provided on the fluid channel member surface for secure placement of a new printhead tile.

The above-described printhead module of the present invention is capable of being constructed in various lengths, accommodating varying numbers of printhead tiles attached to the fluid channel member, depending upon the specific application for which the printhead assembly is to be employed. For example, in order to provide a printhead assembly for A3-sized pagewidth printing in landscape orientation, the printhead assembly may require 16 individual printhead tiles. This may be achieved by providing, for example, four printhead modules each having four printhead tiles, or two printhead modules each having eight printhead tiles, or one printhead module having 16 printhead tiles (as in FIGS. 21 and 22) or any other suitable combination. Basically, a selected number of standard printhead modules may be combined in order to achieve the necessary width required for a specific printing application.

Figure 28:
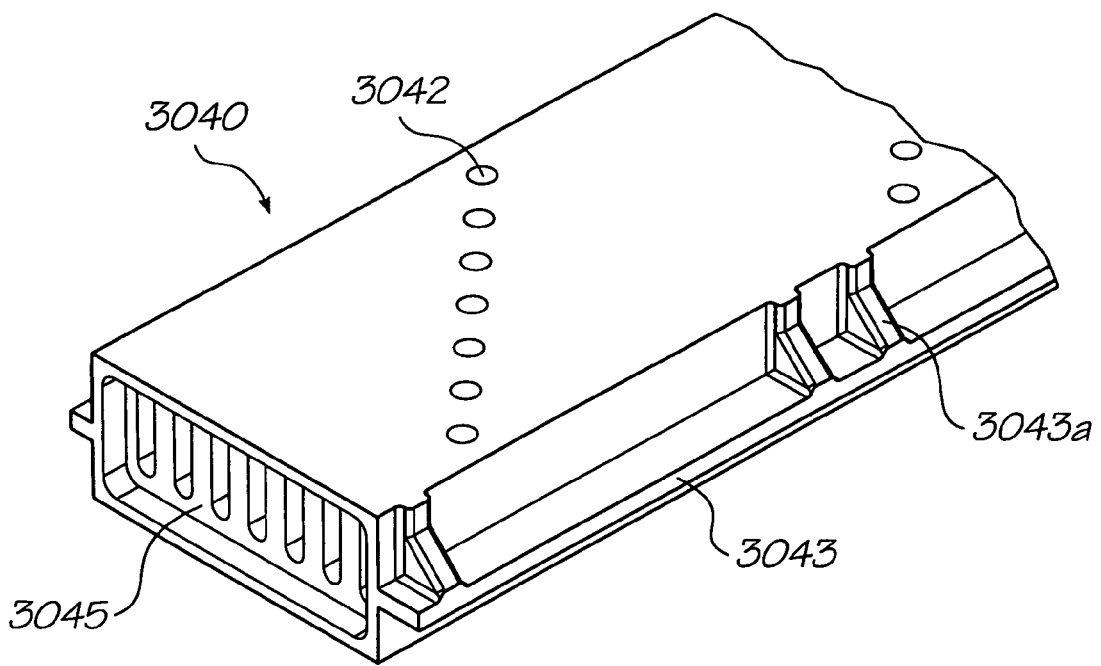
FIG. 28 illustrates a "female" end portion of the printhead module of FIG. 24A.
Figure 29:
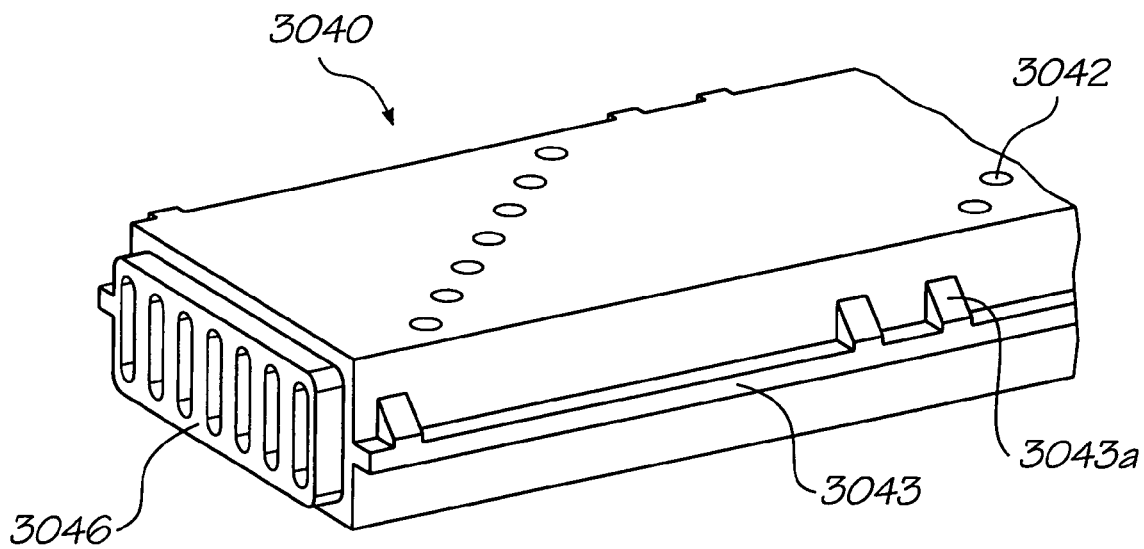
FIG. 29 illustrates a "male" end portion of the printhead module of FIG. 24A.

In order to provide this modularity in an easy and efficient manner, plural fluid channel members of each of the printhead modules are formed so as to be modular and are configured to permit the connection of a number of fluid channel members in an end-to-end manner. Advantageously, an easy and convenient means of connection can be provided by configuring each of the fluid channel members to have complementary end portions. In one embodiment of the present invention each fluid channel member 3040 has a "female" end portion 3045, as shown in FIG. 28, and a complementary "male" end portion 3046, as shown in FIG. 29.

The end portions 3045 and 3046 are configured so that on bringing the male end portion 3046 of one printhead module 3030 into contact with the female end portion 3045 of a second printhead module 3030, the two printhead modules 3030 are connected with the corresponding ducts 3041 thereof in fluid communication. This allows fluid to flow between the connected printhead modules 3030 without interruption, so that fluid such as ink, is correctly and effectively delivered to the printhead integrated circuits 3051 of each of the printhead modules 3030.

In order to ensure that the mating of the female and male end portions 3045 and 3046 provides an effective seal between the individual printhead modules 3030 a sealing adhesive, such as epoxy, is applied between the mated end portions.

It is clear that, by providing such a configuration, any number of printhead modules can suitably be connected in such an end-to-end fashion to provide the desired scale-up of the total printhead length. Those skilled in the art can appreciate that other configurations and methods for connecting the printhead assembly modules together so as to be in fluid communication are within the scope of the present invention.

Figure 30:
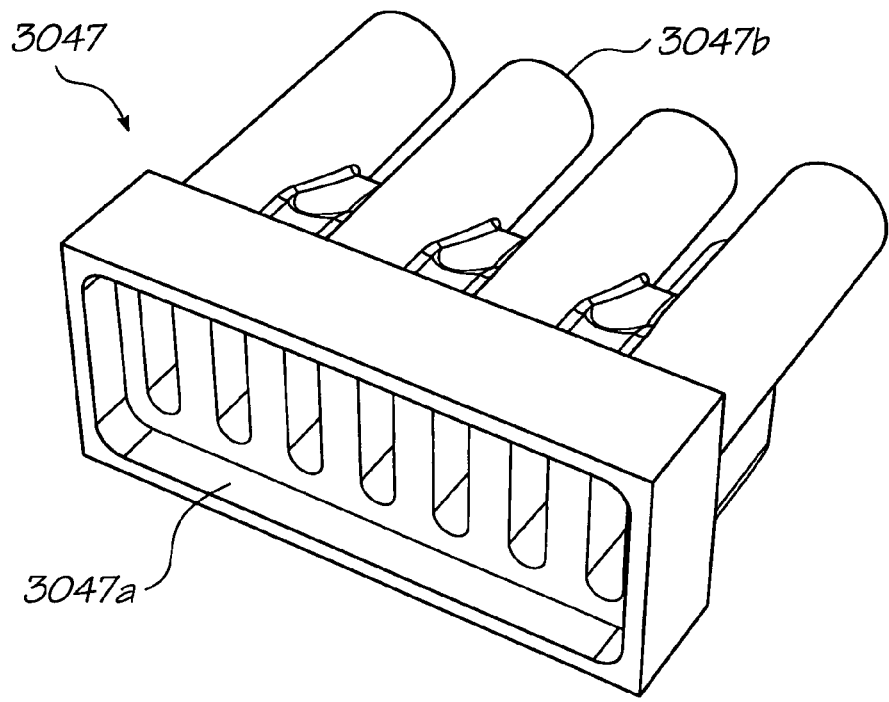
FIG. 30 illustrates a fluid delivery connector for the male end portion of FIG. 29.
Figure 31:
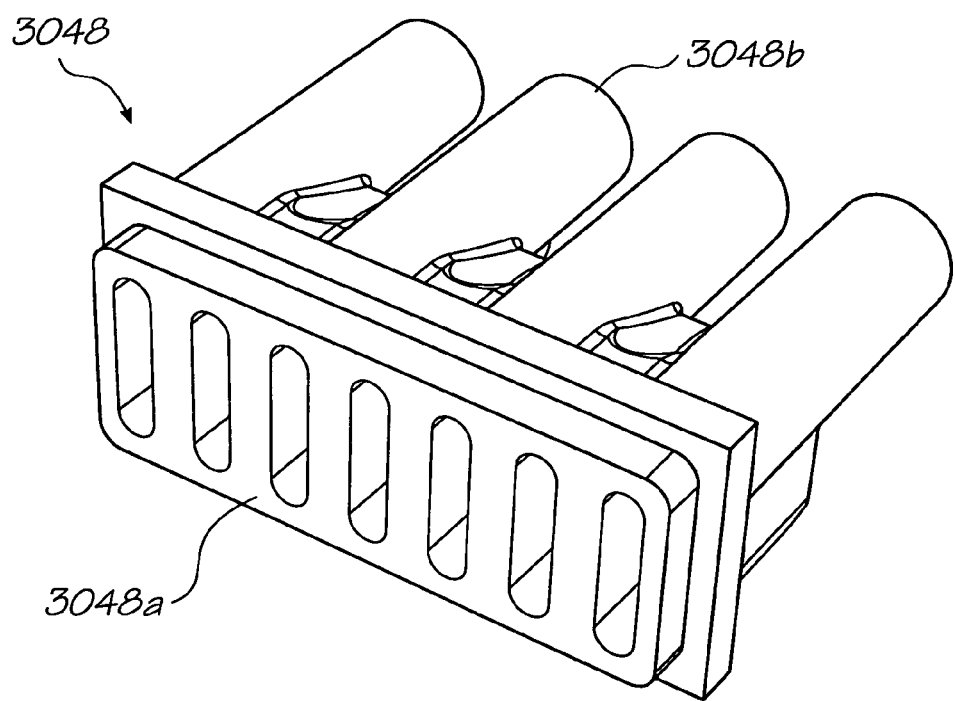
FIG. 31 illustrates a fluid delivery connector for the female end portion of FIG. 28.
Figure 32:
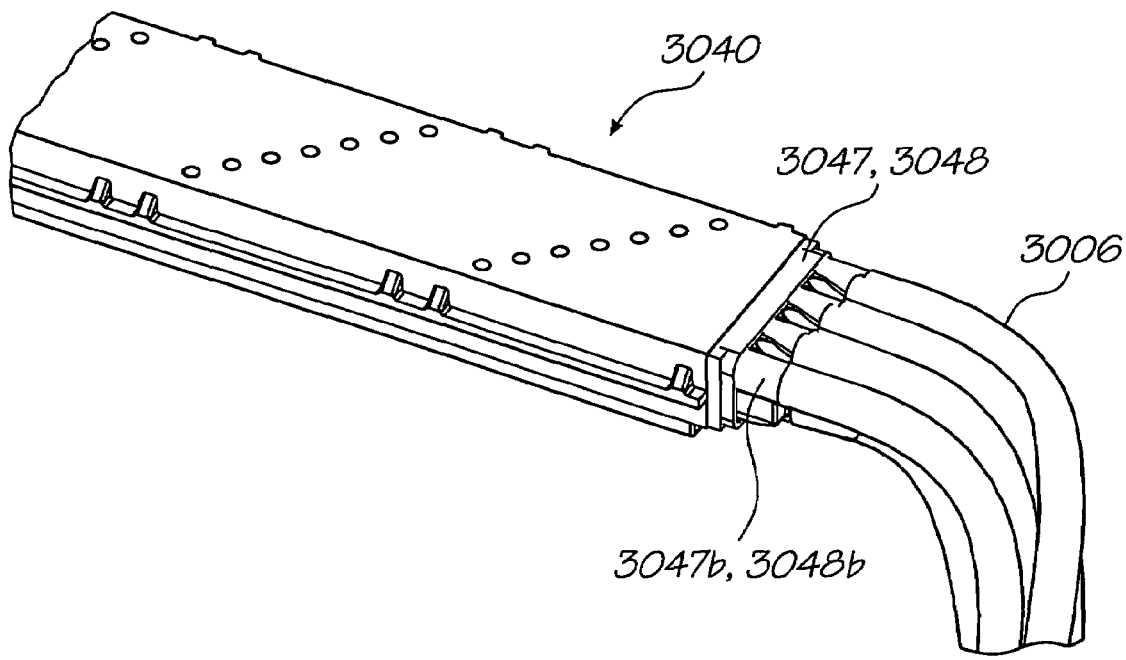
FIG. 32 illustrates the fluid delivery connector of FIGS. 30 or 31 connected to fluid delivery tubes.

Further, this exemplary configuration of the end portions 3045 and 3046 of the fluid channel member 3040 of the printhead modules 3030 also enables easy connection to the fluid supply of the printing system to which the printhead assembly is mounted. That is, in one embodiment of the present invention, fluid delivery connectors 3047 and 3048 are provided, as shown in FIGS. 30 and 31, which act as an interface for fluid flow between the ducts 3041 of the printhead modules 3030 and (internal) fluid delivery tubes 3006, as shown in FIG. 32. The fluid delivery tubes 3006 are referred to as being internal since, as described in more detail later, these tubes 3006 are housed in the printhead assembly 3010 for connection to external fluid delivery tubes of the fluid supply of the printing system. However, such an arrangement is clearly only one of the possible ways in which the inks and other fluids can be supplied to the printhead assembly of the present invention.

As shown in FIG. 30, the fluid delivery connector 3047 has a female connecting portion 3047a which can mate with the male end portion 3046 of the printhead module 3030. Alternatively, or additionally, as shown in FIG. 31, the fluid delivery connector 3048 has a male connecting portion 3048a which can mate with the female end portion 3045 of the printhead module 3030. Further, the fluid delivery connectors 3047 and 3048 include tubular portions 3047b and 3048b, respectively, which can mate with the internal fluid delivery tubes 3006. The particular manner in which the tubular portions 3047b and 3048b are configured so as to be in fluid communication with a corresponding duct 3041 is shown in FIG. 32.

As shown in FIGS. 30 to 33, seven tubular portions 3047b and 3048b are provided to correspond to the seven ducts 3041 provided in accordance with the above-described exemplary embodiment of the present invention. Accordingly, seven internal fluid delivery tubes 3006 are used each for delivering one of the seven aforementioned fluids of black, cyan, magenta and yellow ink, IR ink, fixative and air. However, as previously stated, those skilled in the art clearly understand that more or less fluids may be used in different applications, and consequently more or less fluid delivery tubes, tubular portions of the fluid delivery connectors and ducts may be provided.

Figure 34A:
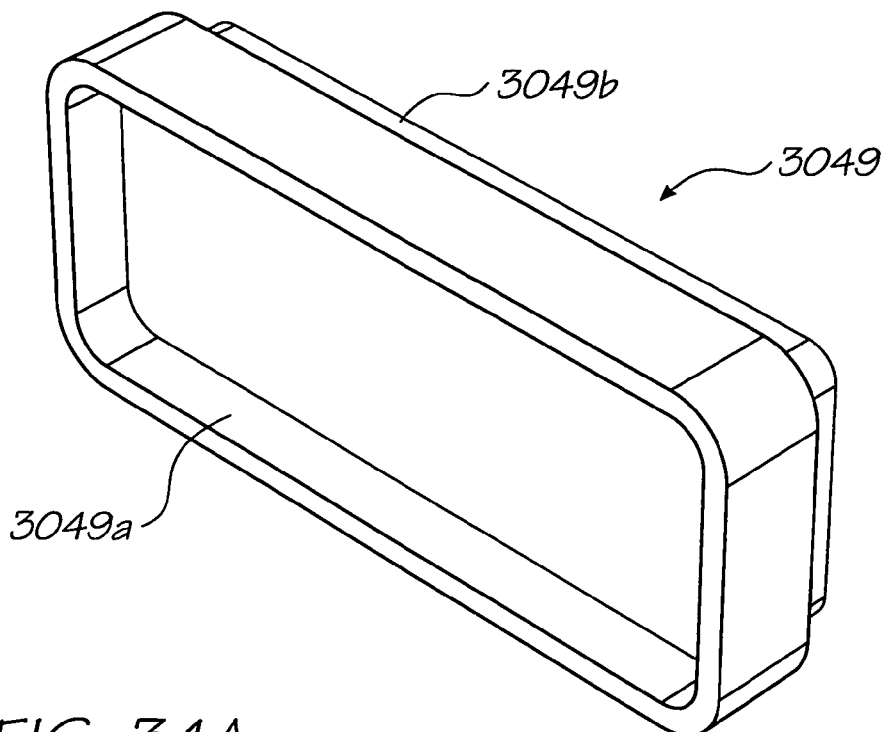
FIG. 34A illustrates a capping member for the female and male end portions of FIGS. 28 and 29.
Figure 34B:
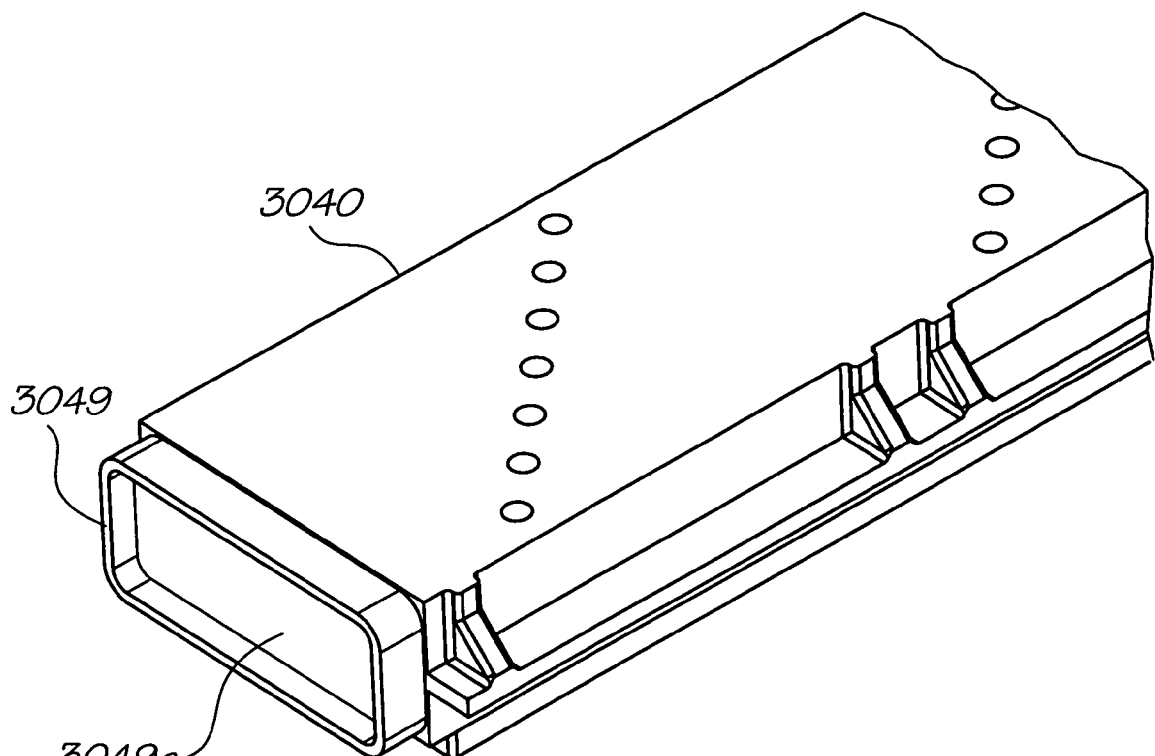
FIG. 34B illustrates the capping member of FIG. 34A applied to the printhead module of FIG. 24A.

Further, this exemplary configuration of the end portions of the fluid channel member 3040 of the printhead modules 3030 also enables easy sealing of the ducts 3041. To this end, in one embodiment of the present invention, a sealing member 3049 is provided as shown in FIG. 34A, which can seal or cap both of the end portions of the printhead module 3030. That is, the sealing member 3049 includes a female connecting section 3049a and a male connecting section 3049b which can respectively mate with the male end portion 3046 and the female end portion 3045 of the printhead modules 3030. Thus, a single sealing member is advantageously provided despite the differently configured end portions of a printhead module. FIG. 34B illustrates an exemplary arrangement of the sealing member 3049 sealing the ducts 3041 of the fluid channel member 3040. Sealing of the sealing member 3049 and the fluid channel member 3040 interface is further facilitated by applying a sealing adhesive, such as an epoxy, as described above.

In operation of a single printhead module 3030 for an A4-sized pagewidth printing application, for example, a combination of one of the fluid delivery connectors 3047 and 3048 connected to one corresponding end portion 3045 and 3046 and a sealing member 3049 connected to the other of the corresponding end portions 3045 and 3046 is used so as to deliver fluid to the printhead integrated circuits 3051. On the other hand, in applications where the printhead assembly is particularly long, being comprised of a plurality of printhead modules 3030 connected together (e.g., in wide format printing), it may be necessary to provide fluid from both ends of the printhead assembly. Accordingly, one each of the fluid delivery connectors 3047 and 3048 may be connected to the corresponding end portions 3045 and 3046 of the end printhead modules 3030.

The above-described exemplary configuration of the end portions of the printhead module of the present invention provides, in part, for the modularity of the printhead modules. This modularity makes it possible to manufacture the fluid channel members of the printhead modules in a standard length relating to the minimum length application of the printhead assembly. The printhead assembly length can then be scaled-up by combining a number of printhead modules to form a printhead assembly of a desired length. For example, a standard length printhead module could be manufactured to contain eight printhead tiles, which may be the minimum requirement for A4-sized printing applications. Thus, for a printing application requiring a wider printhead having a length equivalent to 32 printhead tiles, four of these standard length printhead modules could be used. On the other hand, a number of different standard length printhead modules might be manufactured, which can be used in combination for applications requiring variable length printheads.

However, these are merely examples of how the modularity of the printhead assembly of the present invention functions, and other combinations and standard lengths could be employed and fall within the scope of the present invention.

The casing 3020 and its associated components will now be described with reference to FIGS. 21 to 23 and 35A to 48.

In one embodiment of the present invention, the casing 3020 is formed as a two-piece outer housing which houses the various components of the printhead assembly and provides structure for the printhead assembly which enables the entire unit to be readily mounted in a printing system. As shown in FIG. 23, the outer housing is composed of a support frame 3022 and a cover portion 3023. Each of these portions 3022 and 3023 are made from a suitable material which is lightweight and durable, and which can easily be extruded to form various lengths. Accordingly, in one embodiment of the present invention, the portions 3022 and 3023 are formed from a metal such as aluminium.

Figure 35A:
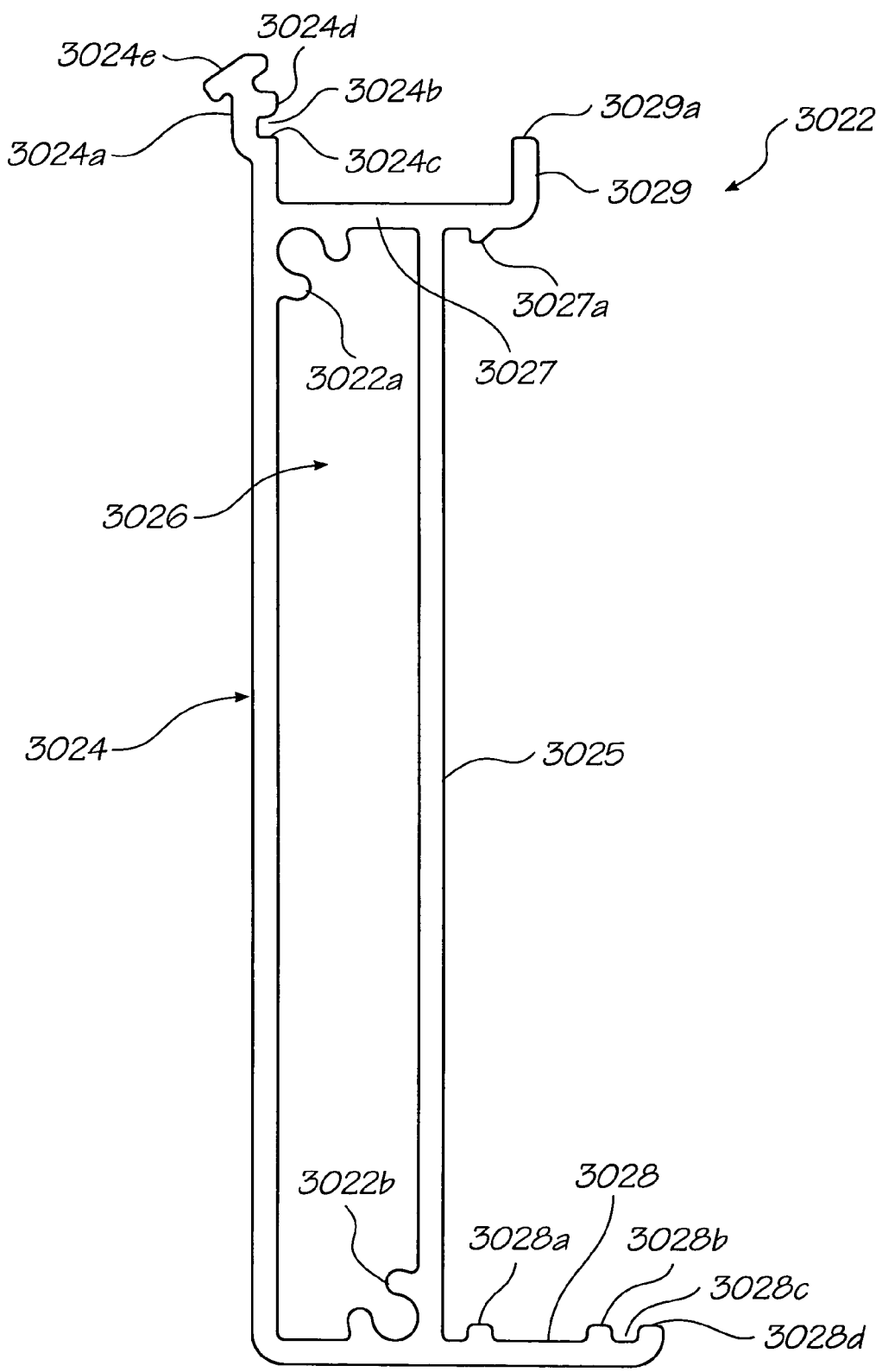
FIG. 35A shows a sectional (skeletal) view of a support frame of a casing of the printhead assembly of FIG. 21.
Figure 35B:
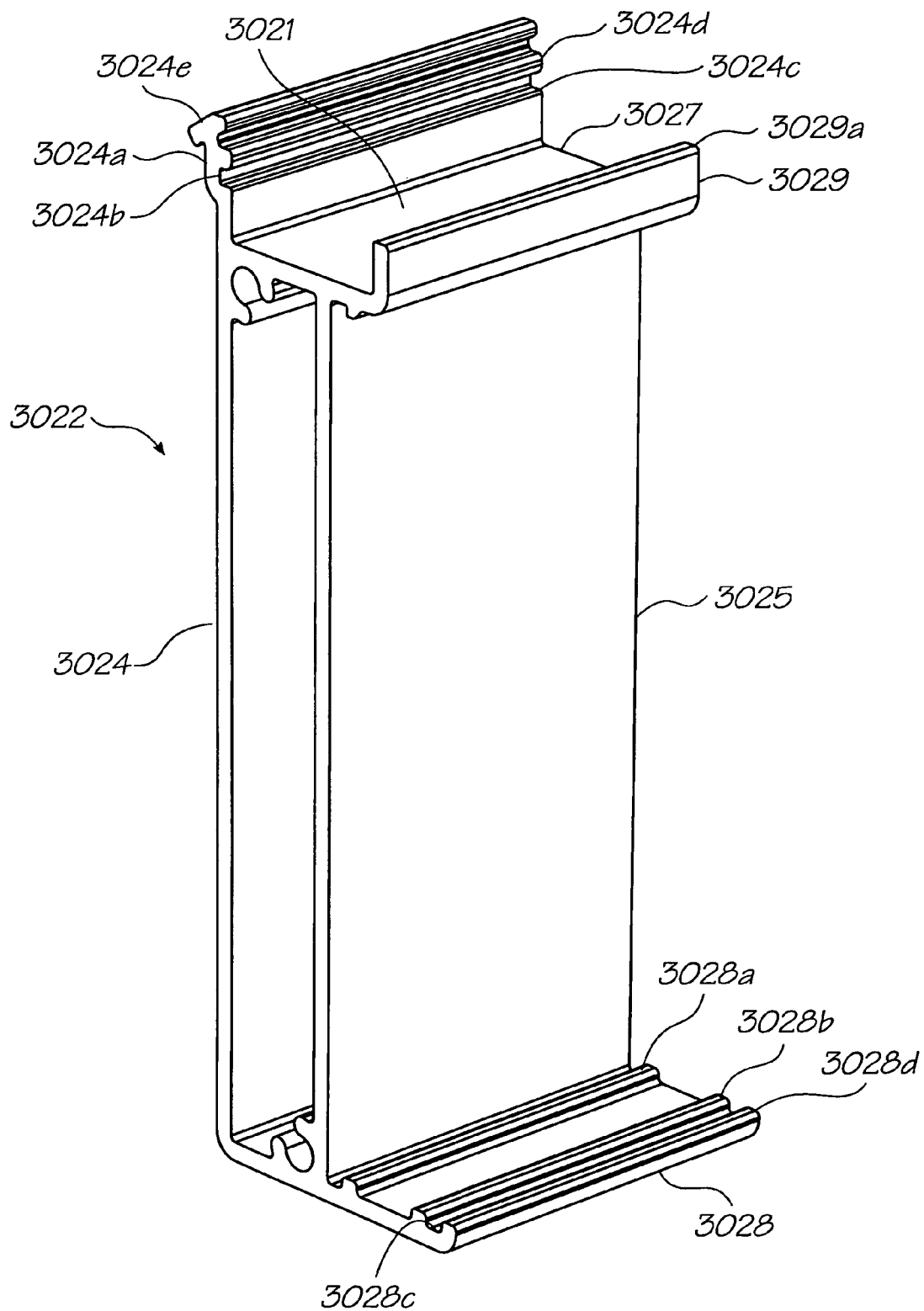
FIGS. 35B and 35C show perspective views of the support frame of FIG. 35A in upward and downward orientations, respectively.
Figure 35C:
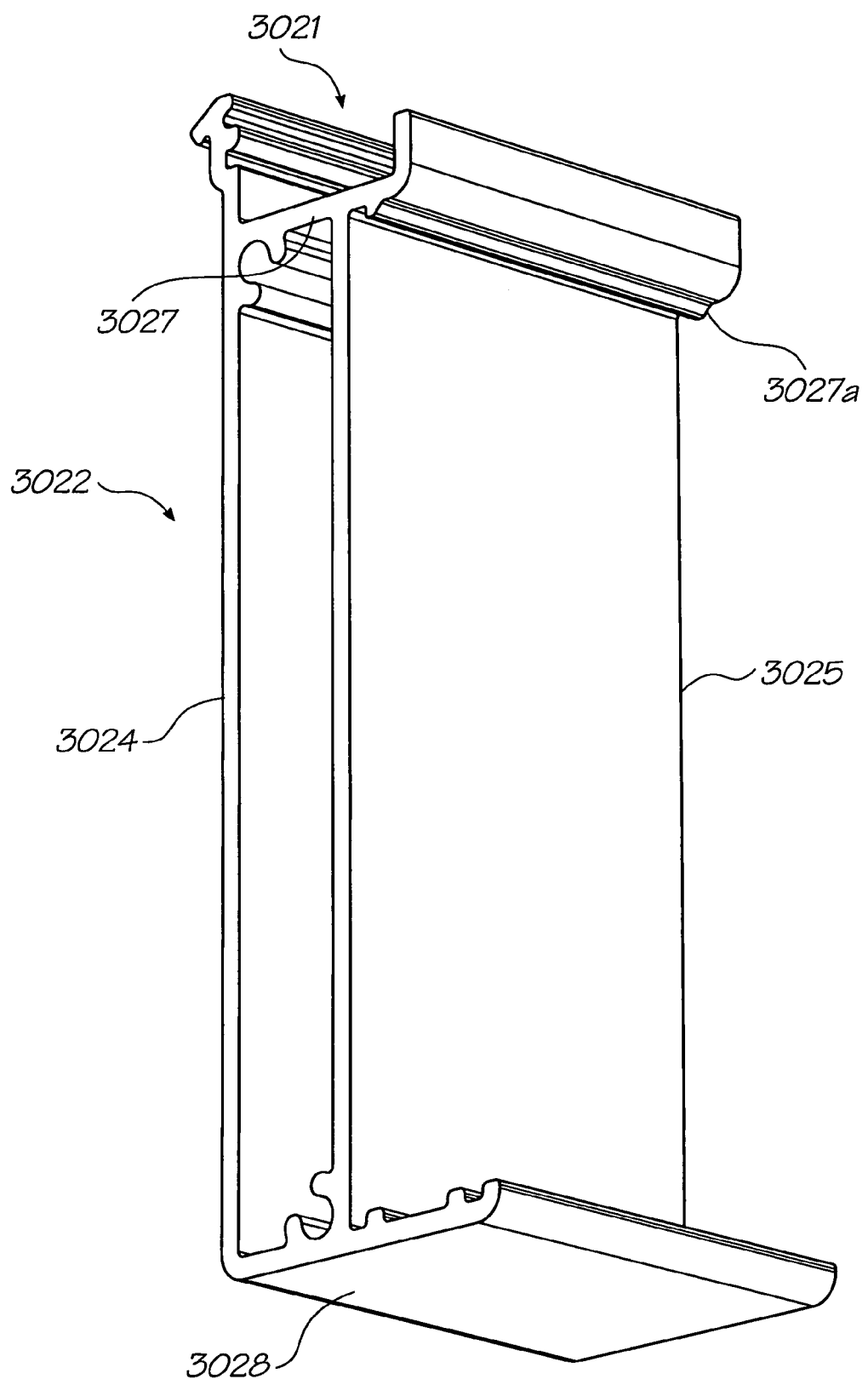

As shown in FIGS. 35A to 35C, the support frame 3022 of the casing 3020 has an outer frame wall 3024 and an inner frame wall 3025 (with respect to the outward and inward directions of the printhead assembly 3010), with these two walls being separated by an internal cavity 3026. The channel 3021 (also see FIG. 23) is formed as an extension of an upper wall 3027 of the support frame 3022 and an arm portion 3028 is formed on a lower region of the support frame 3022, extending from the inner frame wall 3025 in a direction away from the outer frame wall 3024. The channel 3021 extends along the length of the support frame 3022 and is configured to receive the printhead module 3030. The printhead module 3030 is received in the channel 3021 with the printhead integrated circuits 3051 facing in an upward direction, as shown in FIGS. 21 to 23, and this upper printhead integrated circuit surface defines the printing surface of the printhead assembly 3010.

As depicted in FIG. 35A, the channel 3021 is formed by the upper wall 3027 and two, generally parallel side walls 3024a and 3029 of the support frame 3022, which are arranged as outer and inner side walls (with respect to the outward and inward directions of the printhead assembly 3010) extending along the length of the support frame 3022. The two side walls 3024a and 3029 have different heights with the taller, outer side wall 3024a being defined as the upper portion of the outer frame wall 3024 which extends above the upper wall 3027 of the support frame 3022, and the shorter, inner side wall 3029 being provided as an upward extension of the upper wall 3027 substantially parallel to the inner frame wall 3025. The outer side wall 3024a includes a recess (groove) 24b formed along the length thereof. A bottom surface 3024c of the recess 3024b is positioned so as to be at the same height as a top surface 3029a of the inner side wall 3029 with respect to the upper wall 3027 of the channel 3021. The recess 3024b further has an upper surface 3024d which is formed as a ridge which runs along the length of the outer side wall 3024a (see FIG. 35B).

In this arrangement, one of the longitudinally extending tabs 3043 of the fluid channel member 3040 of the printhead module 3030 is received within the recess 3024b of the outer side wall 3024a so as to be held between the lower and upper surfaces 3024c and 3024d thereof. Further, the other longitudinally extending tab 3043 provided on the opposite side of the fluid channel member 3040, is positioned on the top surface 3029a of the inner side wall 3029. In this manner, the assembled printhead module 3030 may be secured in place on the casing 3020, as will be described in more detail later.

Further, the outer side wall 3024a also includes a slanted portion 3024e along the top margin thereof, the slanted portion 3024e being provided for fixing a print media guide 3005 to the printhead assembly 3010, as shown in FIG. 23. This print media guide is fixed following assembly of the printhead assembly and is configured to assist in guiding print media, such as paper, across the printhead integrated circuits for printing without making direct contact with the nozzles of the printhead integrated circuits.

As shown in FIG. 35A, the upper wall 3027 of the support frame 3022 and the arm portion 3028 include lugs 3027a and 3028a, respectively, which extend along the length of the support frame 3022 (see FIGS. 35B and 35C). The lugs 3027a and 3028a are positioned substantially to oppose each other with respect to the inner frame wall 3025 of the support frame 3022 and are used to secure a PCB support 3091 (described below) to the support frame 3022.

FIGS. 35B and 35C illustrate the manner in which the outer and inner frame walls 3024 and 25 extend for the length of the casing 3020, as do the channel 3021, the upper wall 3027, and its lug 3027a, the outer and inner side walls 3024a and 3029, the recess 3024b and its bottom and upper surfaces 3024c and 3024d, the slanted portion 3024e, the top surface 3029a of the inner side wall 3029, and the arm portion 3028, and its lugs 3028a and 3028b and recessed and curved end portions 3028c and 3028d (described in more detail later).

The PCB support 3091 will now be described with reference to FIGS. 23 and 36 to 42E. In FIG. 23, the support 3091 is shown in its secured position extending along the inner frame wall 3025 of the support frame 3022 from the upper wall 3027 to the arm portion 3028. The support 3091 is used to carry the PCB 3090 which mounts the drive electronics 3100 (as described in more detail later).

Figure 37A:
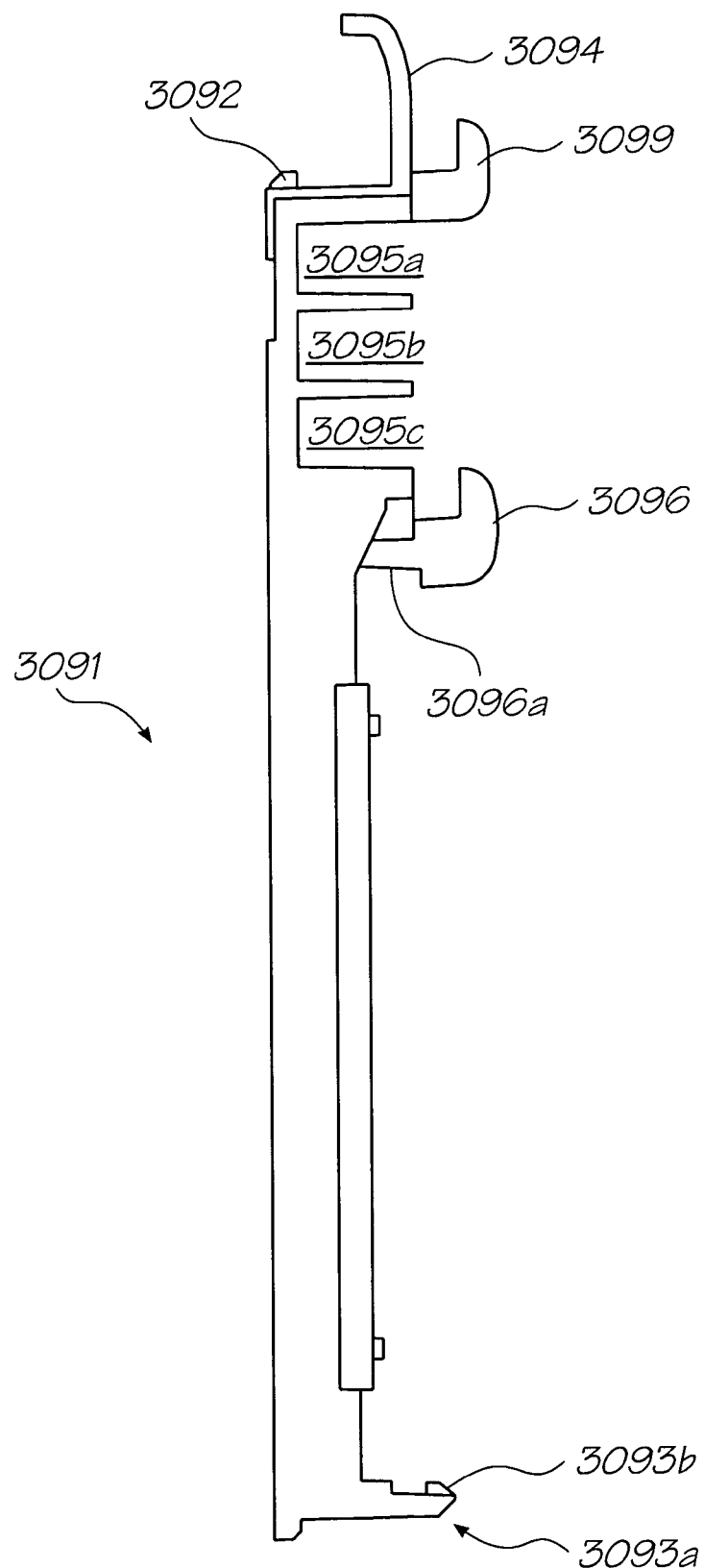
FIGS. 37A, 37B show side and rear perspective views of the PCB support of FIG. 36.
Figure 37B:
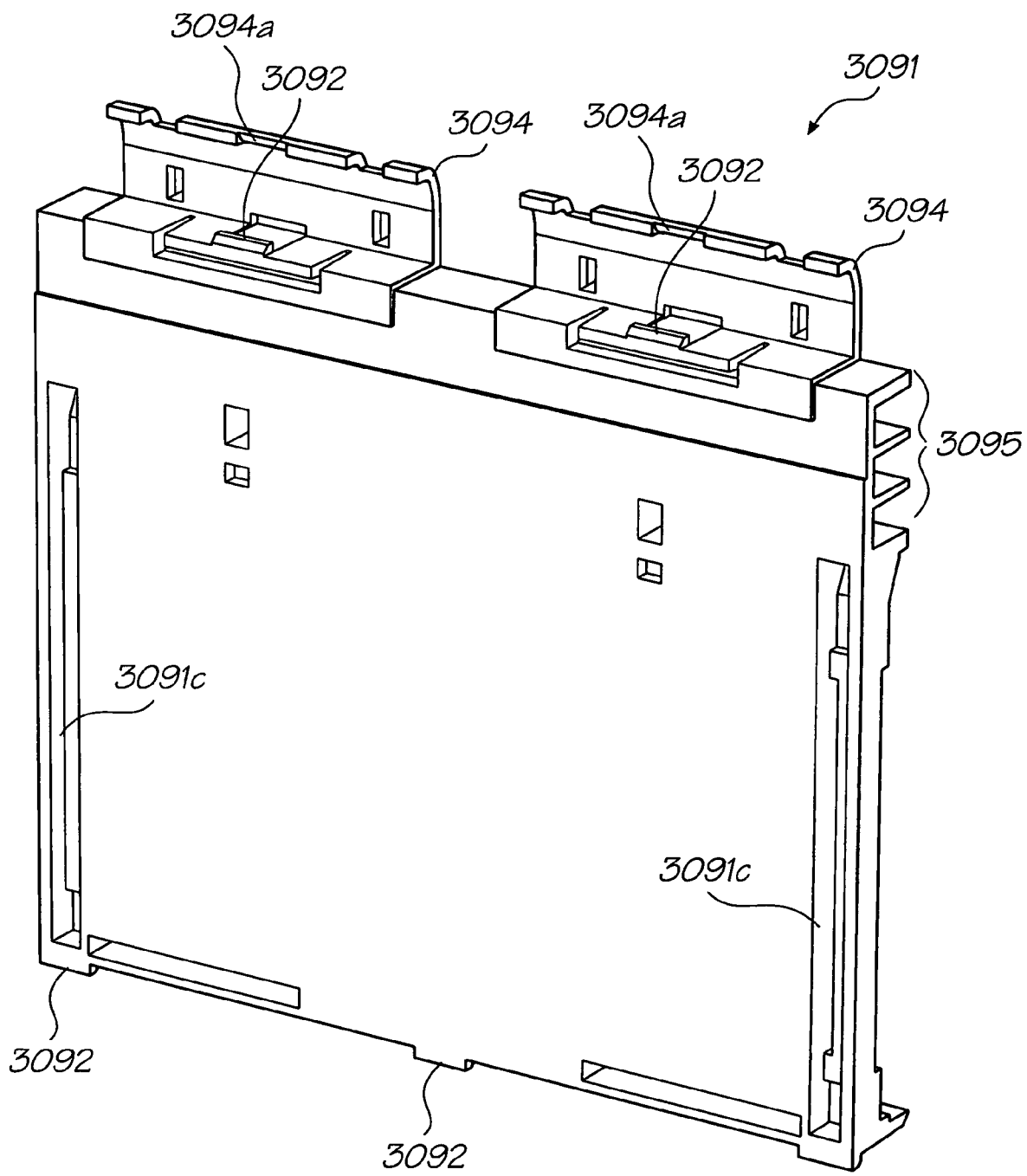

As can be seen particularly in FIGS. 37A to 37C, the support 3091 includes lugs 3092 on upper and lower surfaces thereof which communicate with the lugs 3027a and 3028a for securing the support 3091 against the inner frame wall 3025 of the support frame 3022. A base portion 3093 of the support 3091, is arranged to extend along the arm portion 3028 of the support frame 3022, and is seated on the top surfaces of the lugs 3028a and 3028b of the arm portion 3028 (see FIG. 35B) when mounted on the support frame 3022.

The support 3091 is formed so as to locate within the casing 3020 and against the inner frame wall 3025 of the support frame 3022. This can be achieved by moulding the support 3091 from a plastics material having inherent resilient properties to engage with the inner frame wall 3025. This also provides the support 3091 with the necessary insulating properties for carrying the PCB 3090. For example, polybutylene terephthalate (PBT) or polycarbonate may be used for the support 3091.

The base portion 3093 further includes recessed portions 3093a and corresponding locating lugs 3093b, which are used to secure the PCB 3090 to the support 3091 (as described in more detail later). Further, the upper portion of the support 3091 includes upwardly extending arm portions 3094, which are arranged and shaped so as to fit over the inner side wall 3029 of the channel 3021 and the longitudinally extending tab 3043 of the printhead module 3030 (which is positioned on the top surface 3029a of the inner side wall 3029) once the fluid channel member 3040 of the printhead module 3030 has been inserted into the channel 3021. This arrangement provides for securement of the printhead module 3030 within the channel 3021 of the casing 3020, as is shown more clearly in FIG. 23.

In one embodiment of the present invention, the extending arm portions 3094 of the support 3091 are configured so as to perform a "clipping" or "clamping" action over and along one edge of the printhead module 3030, which aids in preventing the printhead module 3030 from being dislodged or displaced from the fully assembled printhead assembly 3010. This is because the clipping action acts upon the fluid channel member 3040 of the printhead module 3030 in a manner which substantially constrains the printhead module 3030 from moving upwards from the printhead assembly 3010 (i.e., in the z-axis direction as depicted in FIG. 23) due to both longitudinally extending tabs 3043 of the fluid channel member 3040 being held firmly in place (in a manner which will be described in more detail below), and from moving across the longitudinal direction of the printhead module 3030 (i.e., in the y-axis direction as depicted in FIG. 23), which will be also described in more detail below.

In this regard, the fluid channel member 3040 of the printhead module 3030 is exposed to a force exerted by the support 3091 directed along the y-axis in a direction from the inner side wall 3029 to the outer side wall 3024a. This force causes the longitudinally extending tab 3043 of the fluid channel member 3040 on the outer side wall 3024a side of the support frame 3022 to be held between the lower and upper surfaces 3024c and 3024d of the recess 3024b. This force, in combination with the other longitudinally extending tab 3043 of the fluid channel member 3040 being held between the top surface 3029a of the inner side wall 3029 and the extending arm portions 3094 of the support 3091, acts to inhibit movement of the printhead module 3030 in the z-axis direction (as described in more detail later).

However, the printhead module 3030 is still able to accommodate movement in the x-axis direction (i.e., along the longitudinal direction of the printhead module 3030), which is desirable in the event that the casing 3020 undergoes thermal expansion and contraction, during operation of the printing system. As the casing is typically made from an extruded metal, such as aluminium, it may undergo dimensional changes due to such materials being susceptible to thermal expansion and contraction in a thermally variable environment, such as is present in a printing unit.

That is, in order to ensure the integrity and reliability of the printhead assembly, the fluid channel member 3040 of the printhead module 3030 is firstly formed of material (such as LCP or the like) which will not experience substantial dimensional changes due to environmental changes thereby retaining the positional relationship between the individual printhead tiles, and the printhead module 3030 is arranged to be substantially independent positionally with respect to the casing 3020 (i.e., the printhead module "floats" in the longitudinal direction of the channel 3021 of the casing 3020) in which the printhead module 3030 is removably mounted.

Therefore, as the printhead module is not constrained in the x-axis direction, any thermal expansion forces from the casing in this direction will not be transferred to the printhead module. Further, as the constraint in the z-axis and y-axis directions is resilient, there is some tolerance for movement in these directions. Consequently, the delicate printhead integrated circuits of the printhead modules are protected from these forces and the reliability of the printhead assembly is maintained.

Furthermore, the clipping arrangement also allows for easy assembly and disassembly of the printhead assembly by the mere "unclipping" of the PCB support(s) from the casing. In the exemplary embodiment shown in FIG. 36, a pair of extending arm portions 3094 is provided; however those skilled in the art will understand that a greater or lesser number is within the scope of the present invention.

Referring again to FIGS. 36 to 37C, the support 3091 further includes a channel portion 3095 in the upper portion thereof In the exemplary embodiment illustrated, the channel portion 3095 includes three channelled recesses 3095a, 3095b and 3095c. The channelled recesses 3095a, 3095b and 3095c are provided so as to accommodate three longitudinally extending electrical conductors or busbars 3071, 3072 and 3073 (see FIG. 22) which form the power supply 3070 (see FIG. 23) and which extend along the length of the printhead assembly 3010. The busbars 3071, 3072 and 3073 are conductors which carry the power required to operate the printhead integrated circuits 3051 and the drive electronics 3100 located on the PCB 3090 (shown in FIG. 38A and described in more detail later), and may be formed of copper with gold plating, for example.

In one embodiment of the present invention, three busbars are used in order to provide for voltages of Vcc (e.g., via the busbar 3071), ground (Gnd) (e.g., via the busbar 3072) and V+ (e.g., via the busbar 3073). Specifically, the voltages of Vcc and Gnd are applied to the drive electronics 3100 and associated circuitry of the PCB 3090, and the voltages of Vcc, Gnd and V+ are applied to the printhead integrated circuits 3051 of the printhead tiles 3050. It will be understood by those skilled in the art that a greater or lesser number of busbars, and therefore channelled recesses in the PCB support can be used depending on the power requirements of the specific printing applications.

The support 3091 of the present invention further includes (lower) retaining clips 3096 positioned below the channel portion 3095. In the exemplary embodiment illustrated in FIG. 36, a pair of the retaining clips 3096 is provided. The retaining clips 3096 include a notch portion 3096a on a bottom surface thereof which serves to assist in securely mounting the PCB 3090 on the support 3091. To this end, as shown in the exemplary embodiment of FIG. 38A, the PCB 3090 includes a pair of slots 3097 in a topmost side thereof (with respect to the mounting direction of the PCB 3090), which align with the notch portions 3096a when mounted so as to facilitate engagement with the retaining clips 3096.

As shown in FIG. 23, the PCB 3090 is snugly mounted between the notch portions 3096a of the retaining clips 3096 and the afore-mentioned recessed portions 3093a and locating lugs 3093b of the base portion 3093 of the support 3091. This arrangement securely holds the PCB 3090 in position so as to enable reliable connection between the drive electronics 3100 of the PCB 3090 and the printhead integrated circuits 3051 of the printhead module 3030.

Referring again to FIG. 38A, an exemplary circuit arrangement of the PCB 3090 will now be described. The circuitry includes the drive electronics 3100 in the form of a print engine controller (PEC) integrated circuit. The PEC integrated circuit 3100 is used to drive the printhead integrated circuits 3051 of the printhead module 3030 in order to print information on the print media passing the printhead assembly 3010 when mounted to a printing unit. The functions and structure of the PEC integrated circuit 3100 are discussed in more detail later.

The exemplary circuitry of the PCB 3090 also includes four connectors 3098 in the upper portion thereof (see FIG. 38B) which receive lower connecting portions 3081 of the flex PCBs 3080 that extend from each of the printhead tiles 3050 (see FIG. 26). Specifically, the corresponding ends of four of the flex PCBs 3080 are connected between the PCBs 3052 of four printhead tiles 3050 and the four connectors 3098 of the PCB 3090. In turn, the connectors 3098 are connected to the PEC integrated circuit 3100 so that data communication can take place between the PEC integrated circuit 3100 and the printhead integrated circuits 3051 of the four printhead tiles 3050.

In the above-described embodiment, one PEC integrated circuit is chosen to control four printhead tiles in order to satisfy the necessary printing speed requirements of the printhead assembly. In this manner, for a printhead assembly having 16 printhead tiles, as described above with respect to FIGS. 21 and 22, four PEC integrated circuits are required and therefore four PCB supports 3091 are used. However, it will be understood by those skilled in the art that the number of PEC integrated circuits used to control a number of printhead tiles may be varied, and as such many different combinations of the number of printhead tiles, PEC integrated circuits, PCBs and PCB supports that may be employed depending on the specific application of the printhead assembly of the present invention. Further, a single PEC integrated circuit 3100 could be provided to drive a single printhead integrated circuit 3051. Furthermore, more than one PEC integrated circuit 3100 may be placed on a PCB 3090, such that differently configured PCBs 3090 and supports 3091 may be used.

It is to be noted that the modular approach of employing a number of PCBs holding separate PEC integrated circuits for controlling separate areas of the printhead advantageously assists in the easy determination, removal and replacement of defective circuitry in the printhead assembly.

The above-mentioned power supply to the circuitry of the PCB 3090 and the printhead integrated circuits 3051 mounted to the printhead tiles 3050 is provided by the flex PCBs 3080. Specifically, the flex PCBs 3080 are used for the two functions of providing data connection between the PEC integrated circuit(s) 3100 and the printhead integrated circuits 3051 and providing power connection between the busbars 3071, 3072 and 3073 and the PCB 3090 and the printhead integrated circuits 3051. In order to provide the necessary electrical connections, the flex PCBs 3080 are arranged to extend from the printhead tiles 3050 to the PCB 3090. This may be achieved by employing the arrangement shown in FIG. 23, in which a resilient pressure plate 3074 is provided to urge the flex PCBs 3080 against the busbars 3071, 3072 and 3073. In this arrangement, suitably arranged electrical connections are provided on the flex PCBs 3080 which route power from the busbars 3071 and 3072 (i.e., Vcc and Gnd) to the connectors 3098 of the PCB 3090 and power from all of the busbars 3071, 3072 and 3073 (i.e., Vcc, Gnd and V+) to the PCB 3052 of the printhead tiles 3050.

The pressure plate 3074 is shown in more detail in FIGS. 39A to 41. The pressure plate 3074 includes a raised portion (pressure elastomer) 3075 which is positioned on a rear surface of the pressure plate 3074 (with respect to the mounting direction on the support 3091), as shown in FIG. 39B, so as to be aligned with the busbars 3071, 3072 and 3073, with the flex PCBs 3080 lying therebetween when the pressure plate 3074 is mounted on the support 3091. The pressure plate 3074 is mounted to the support 3091 by engaging holes 3074a with corresponding ones of (upper) retaining clips 3099 of the support 3091 which project from the extending arm portions 3094 (see FIG. 35A) and holes 3074b with the corresponding ones of the (lower) retaining clips 3096, via tab portions 3074c thereof (see FIG. 40). The pressure plate 3074 is formed so as to have a spring-like resilience which urges the flex PCBs 3080 into electrical contact with the busbars 3071, 3072 and 3073 with the raised portion 3075 providing insulation between the pressure plate 3074 and the flex PCBs 3080.

Figure 41:
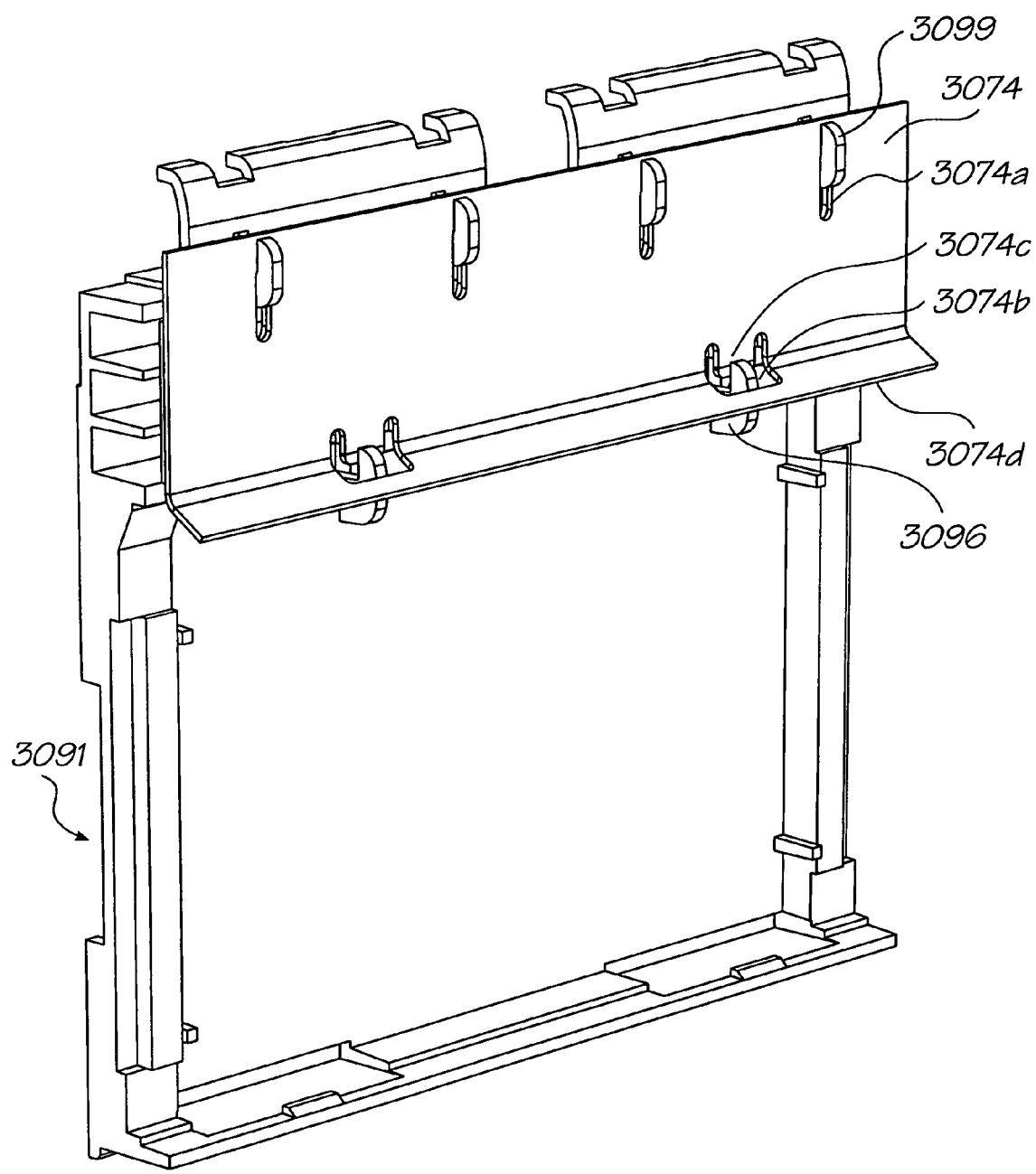
FIG. 41 shows a perspective view illustrating the further components of FIG. 39.

As shown most clearly in FIG. 41, the pressure plate 3074 further includes a curved lower portion 3074d which serves as a means of assisting the demounting of the pressure plate 3074 from the support 3091.

The specific manner in which the pressure plate 3074 is retained on the support 3091 so as to urge the flex PCBs 3080 against the busbars 3071, 3072 and 3073, and the manner in which the extending arm portions 3094 of the support 3091 enable the above-mentioned clipping action will now be fully described with reference to FIGS. 42 and 42A to 42E.

Figure 42:
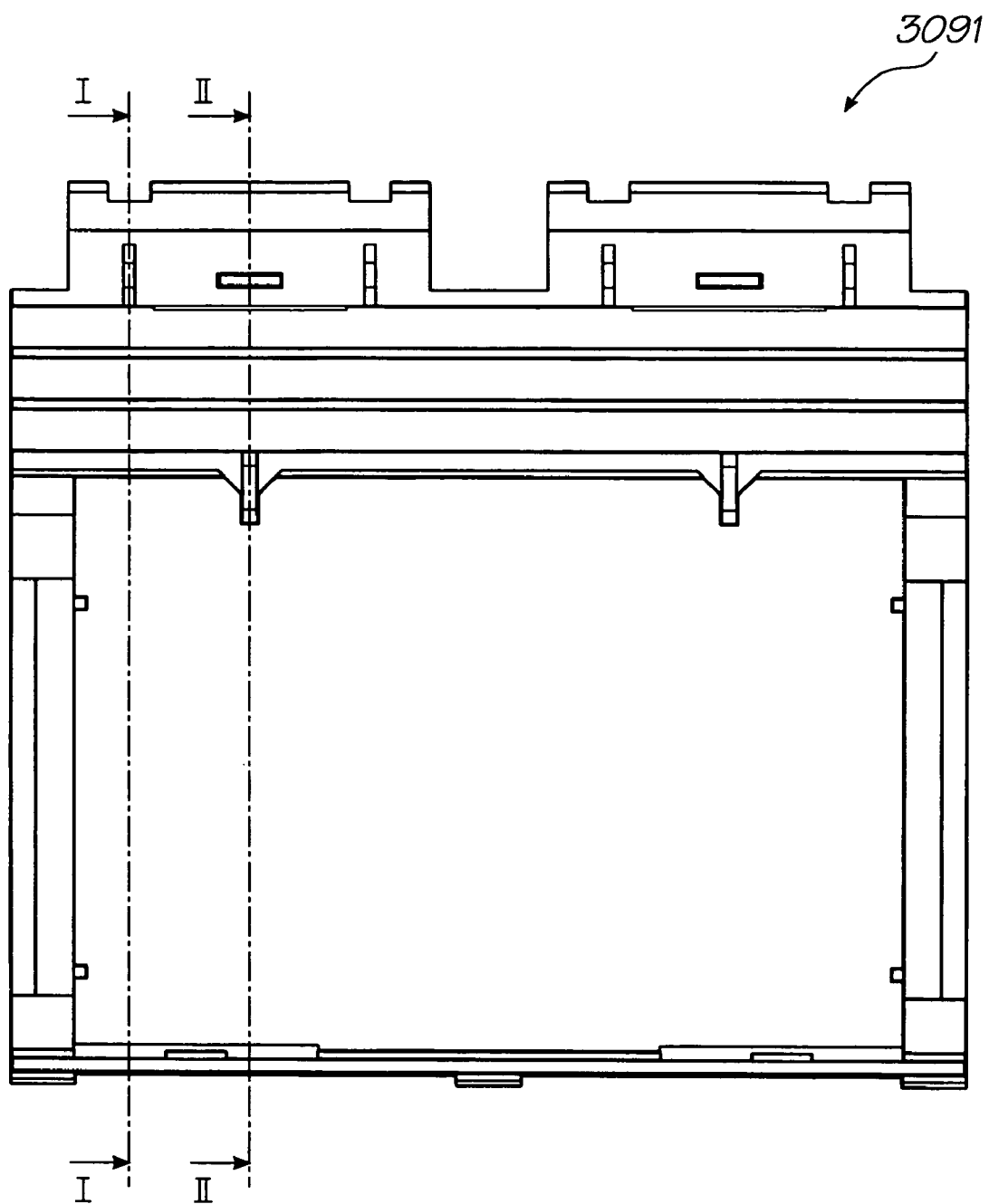
FIG. 42 shows a front view of the PCB support of FIG. 36.
Figures 42A, 42B:
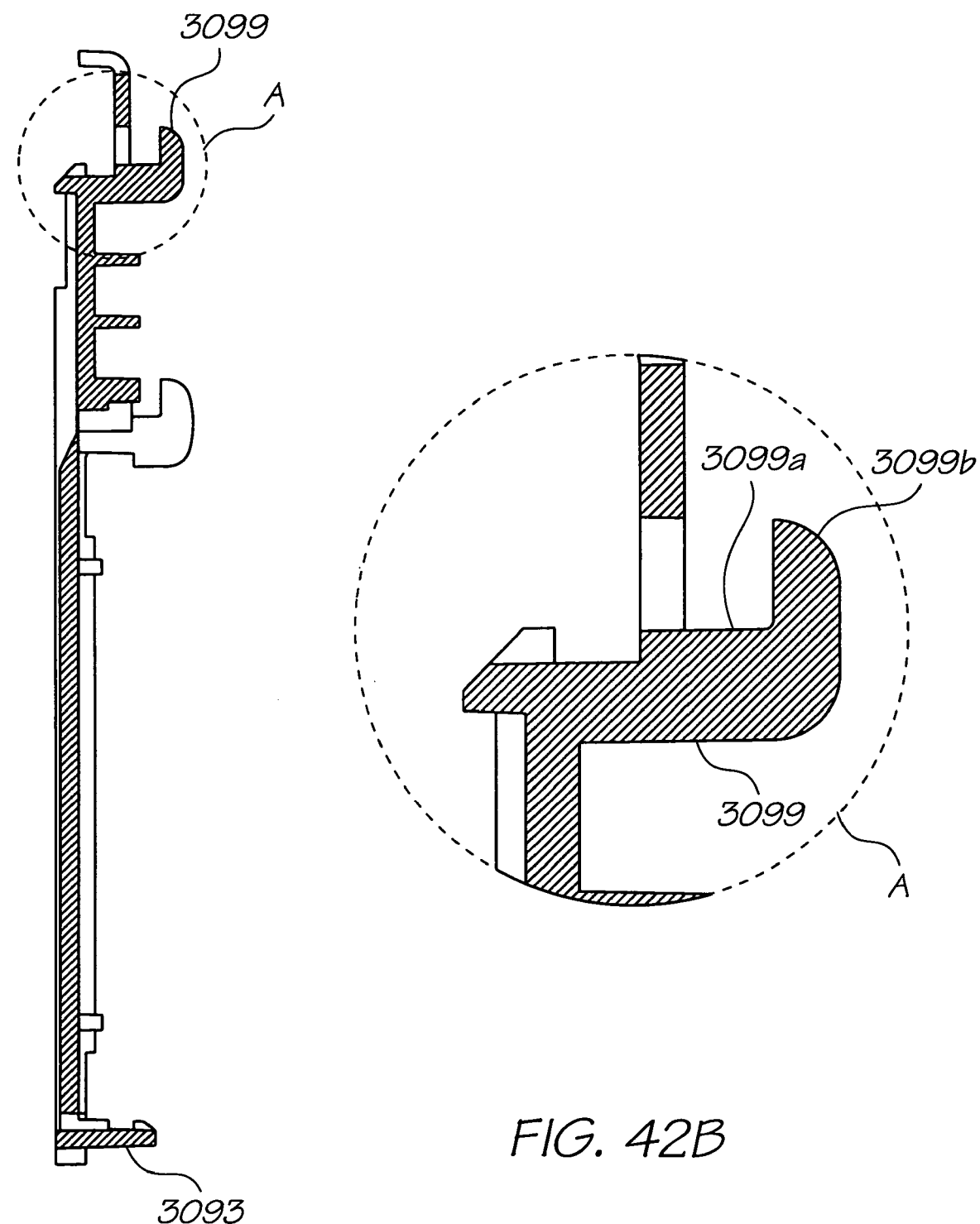
FIG. 42A shows a side sectional view taken along the line I-I in FIG. 42.
FIG. 42B shows an enlarged view of the section A of FIG. 42A.

FIG. 42 illustrates a front schematic view of the support 3091 in accordance with a exemplary embodiment of the present invention. FIG. 42A is a side sectional view taken along the line I-I in FIG. 42 with the hatched sections illustrating the components of the support 3091 situated on the line I-I.

FIG. 42A particularly shows one of the upper retaining clips 3099. An enlarged view of this retaining clip 3099 is shown in FIG. 42B. The retaining clip 3099 is configured so that an upper surface of one of the holes 3074a of the pressure plate 3074 can be retained against an upper surface 3099a and a retaining portion 3099b of the retaining clip 3099 (see FIG. 41). Due to the spring-like resilience of the pressure plate 3074, the upper surface 3099a exerts a slight upwardly and outwardly directed force on the pressure plate 3074 when the pressure plate 3074 is mounted thereon so as to cause the upper part of the pressure plate 3074 to abut against the retaining portion 3099b.

Figures 42C, 42D:
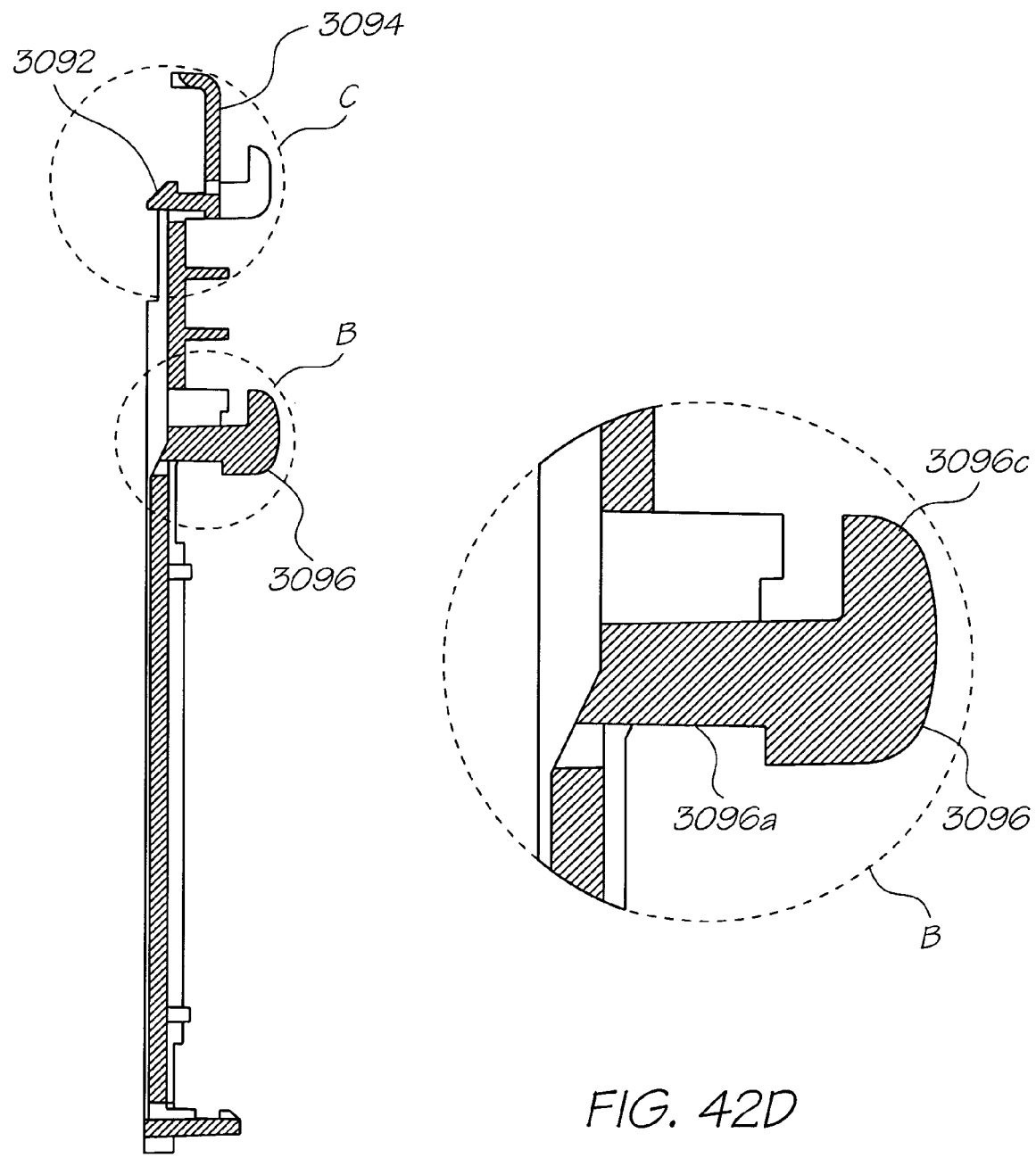
FIG. 42C shows a side sectional view taken along the line II-II in FIG. 42.
FIG. 42D shows an enlarged view of the section B of FIG. 42C.

Referring now to FIG. 42C, which is a side sectional view taken along the line II-II in FIG. 42, one of the lower retaining clips 3096 is illustrated. An enlarged view of this retaining clip 3096 is shown in FIG. 42D. The retaining clip 3096 is configured so that a tab portion 3074c of one of the holes 3074b of the pressure plate 3074 can be retained against an inner surface 3096c of the retaining clip 3096 (see FIG. 40). Accordingly, due to the above-described slight force exerted by the retaining clip 3099 on the upper part of the pressure plate 3074 in a direction away from the support 3091, the lower part of the pressure plate 3074 is loaded towards the opposite direction, e.g., in an inward direction with respect to the support frame 3022. Consequently, the pressure plate 3074 is urged towards the busbars 3071, 3072 and 3073, which in turn serves to urge the flex PCBs 3080 in the same direction via the raised portion 3075, so as to effect reliable contact with the busbars 3071, 3072 and 3073.

Figure 42E:
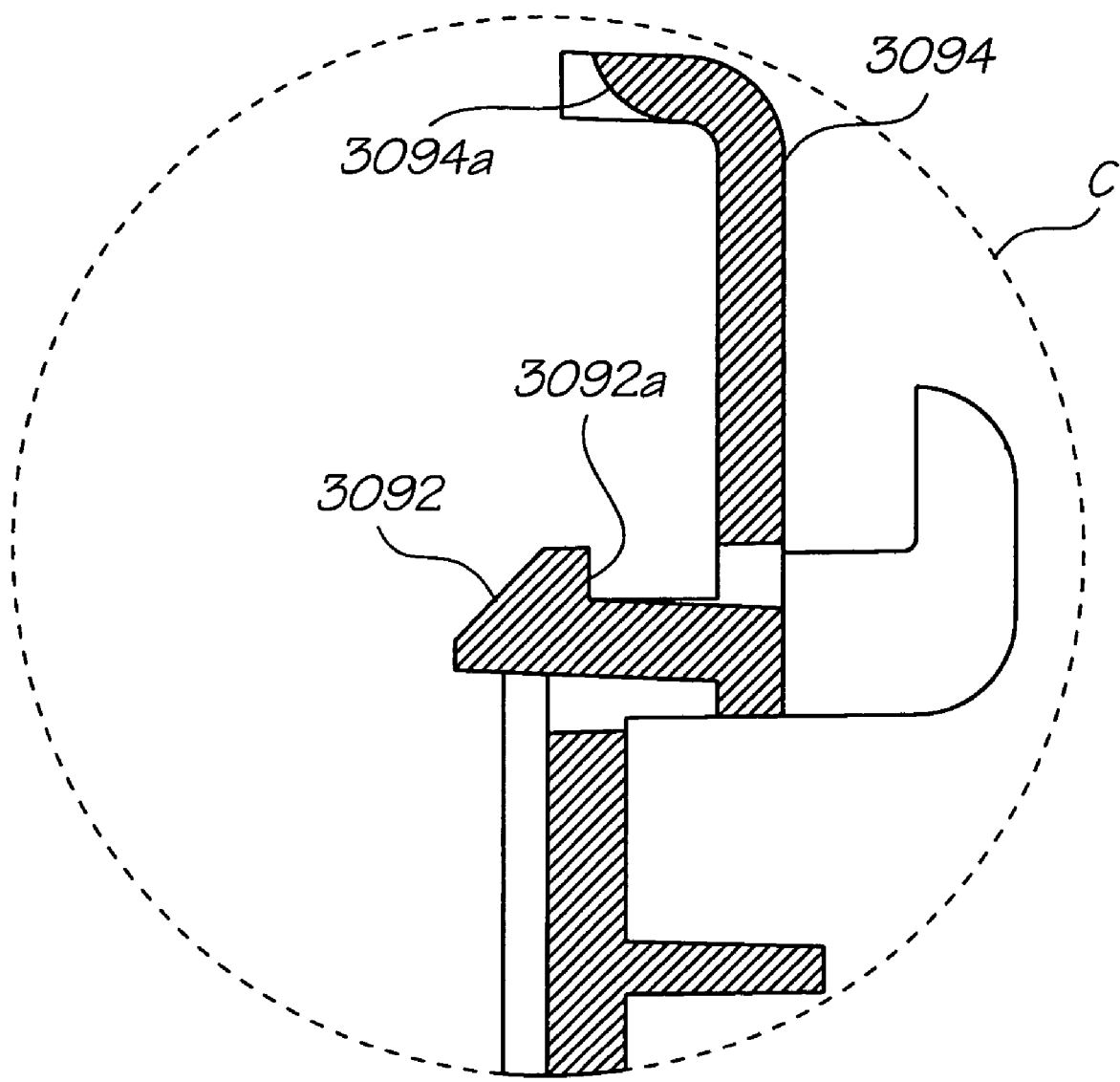
FIG. 42E shows an enlarged view of the section C of FIG. 42C.

Returning to FIG. 42C, in which one of the extending arm portions 3094 is illustrated. An enlarged view of this extending arm portion 3094 is shown in FIG. 42E. The extending arm portion 3094 is configured so as to be substantially L-shaped, with the foot section of the L-shape located so as to fit over the inner side wall 3029 of the channel 3021 and the longitudinally extending tab 3043 of the fluid channel member 3040 of the printhead module 3030 arranged thereon. As shown in FIG. 42E, the end of the foot section of the L-shape has an arced surface. This surface corresponds to the edge of a recessed portion 3094a provided in each the extending arm portions 3094, the centre of which is positioned substantially at the line II-II in FIG. 42 (see FIGS. 36 and 37C). The recessed portions 3094a are arranged so as to engage with angular lugs 3043a regularly spaced along the length of the longitudinally extending tabs 3043 of the fluid channel member 3040 (FIG. 24A), so as to correspond with the placement of the printhead tiles 3050, when the extending arm portions 3094 are clipped over the fluid channel member 3040.

In this position, the arced edge of the recessed portion 3094a is contacted with the angled surface of the angular lugs 3043a (see FIG. 24A), with this being the only point of contact of the extending arm portion 3094 with the longitudinally extending tab 3043. Although not shown in FIG. 24A, the longitudinally extending tab 3043 on the other side of the fluid channel member 3040 has similarly angled lugs 3043a, where the angled surface comes into contact with the upper surface 3024d of the recess 3024b on the support frame 3022.

As alluded to previously, due to this specific arrangement, at these contact points a downwardly and inwardly directed force is exerted on the fluid channel member 3040 by the extending arm portion 3094. The downwardly directed force assists to constrain the printhead module 3030 in the channel 3021 in the z-axis direction as described earlier. The inwardly directed force also assists in constraining the printhead module 3030 in the channel 3021 by urging the angular lugs 3043a on the opposing longitudinally extending tab 3043 of the fluid channel member 3040 into the recess 3024b of the support frame 3020, where the upper surface 3024d of the recess 3024b also applies an opposing downwardly and inwardly directed force on the fluid channel member. In this regard the opposing forces act to constrain the range of movement of the fluid channel member 3040 in the y-axis direction. It is to be understood that the two angular lugs 3043a shown in FIG. 24A for each of the recessed portions 3094a are merely an exemplary arrangement of the angular lugs 3043a.

Figure 38B:
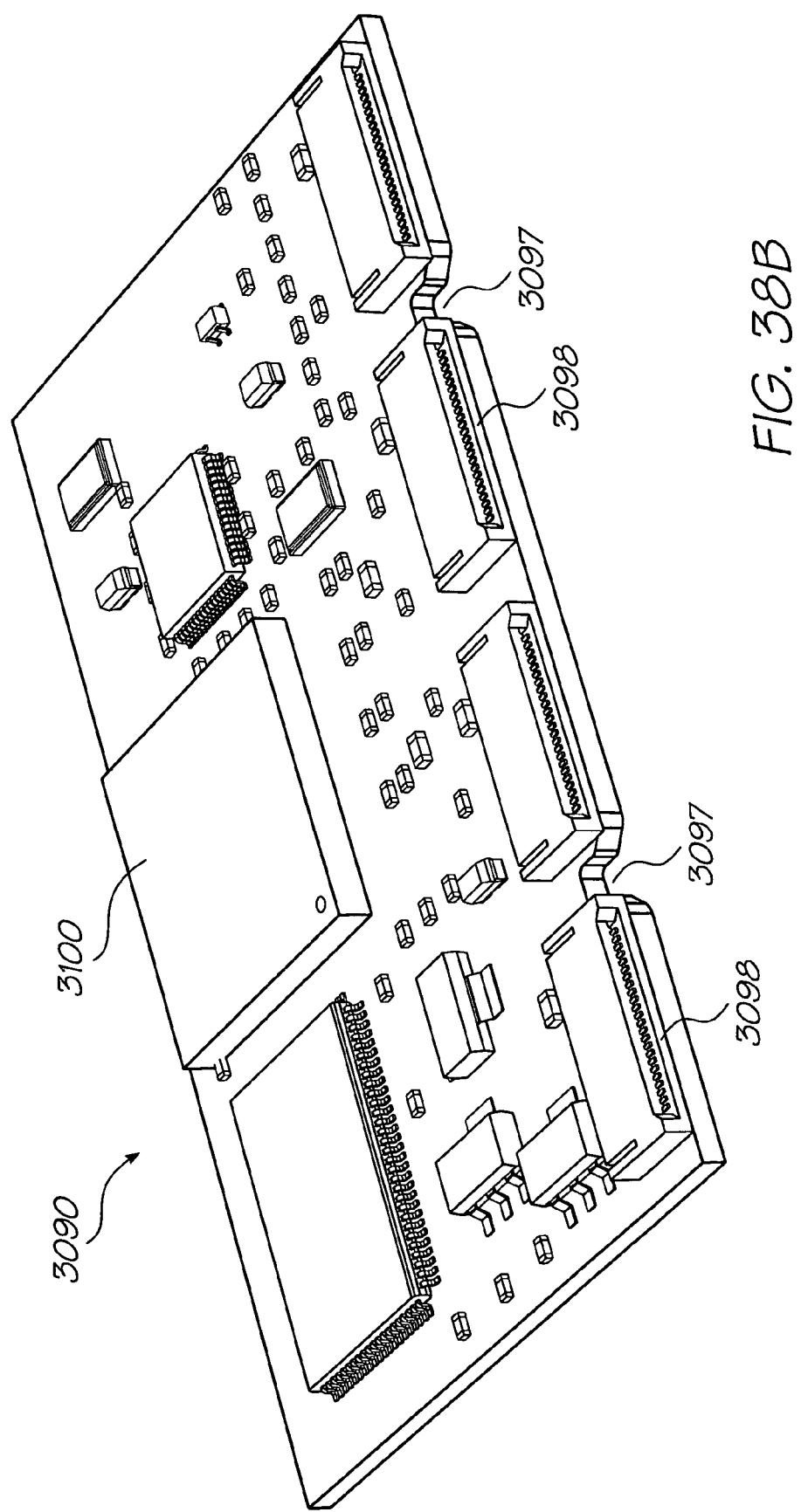
FIG. 38B shows an opposite side perspective view of the PCB and the circuit components of FIG. 38A.
Figure 39A:
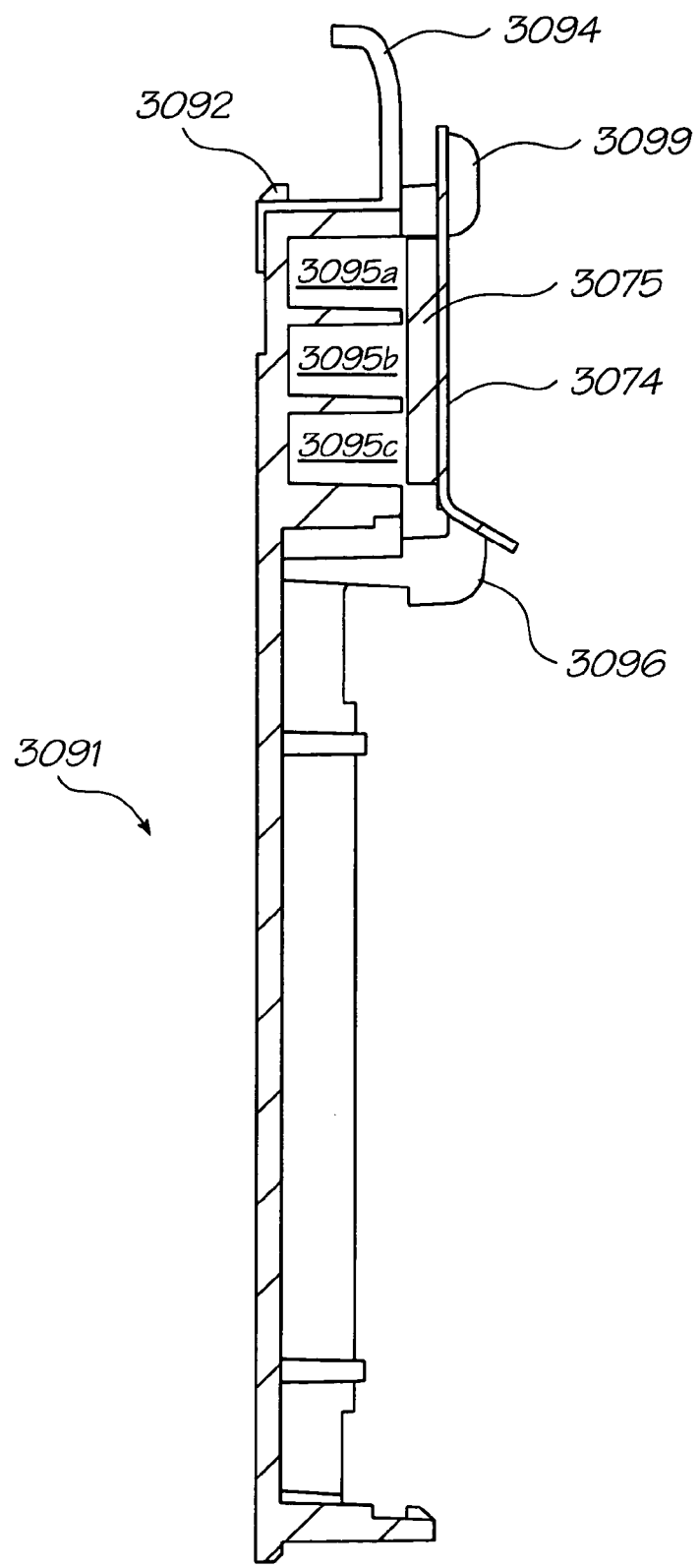
FIG. 39A shows a side view illustrating further components attached to the PCB support of FIG. 36.
Figure 39B:
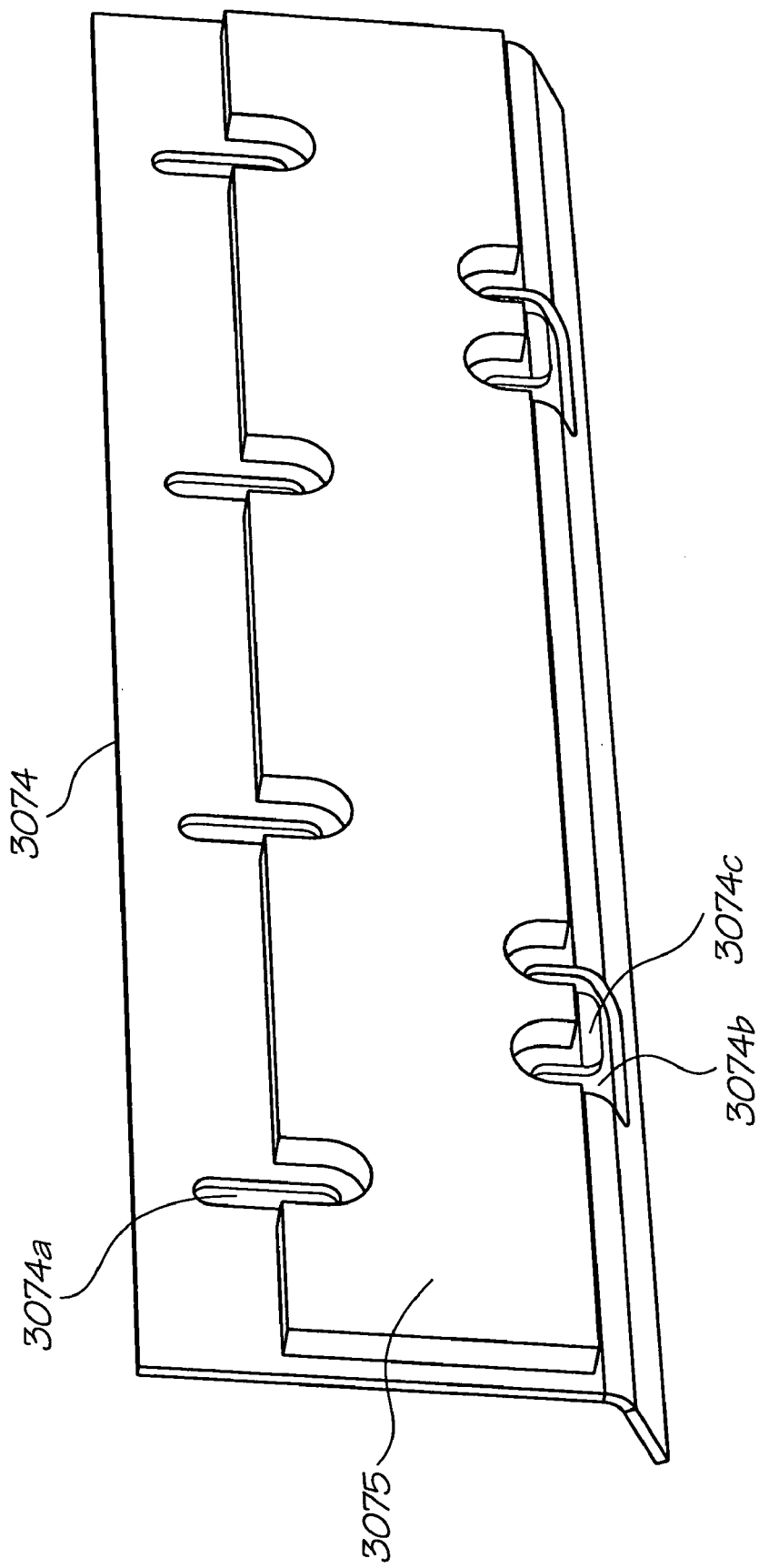
FIG. 39B shows a rear side view of a pressure plate that forms a portion of the printhead assembly of FIG. 21.
Figure 40:
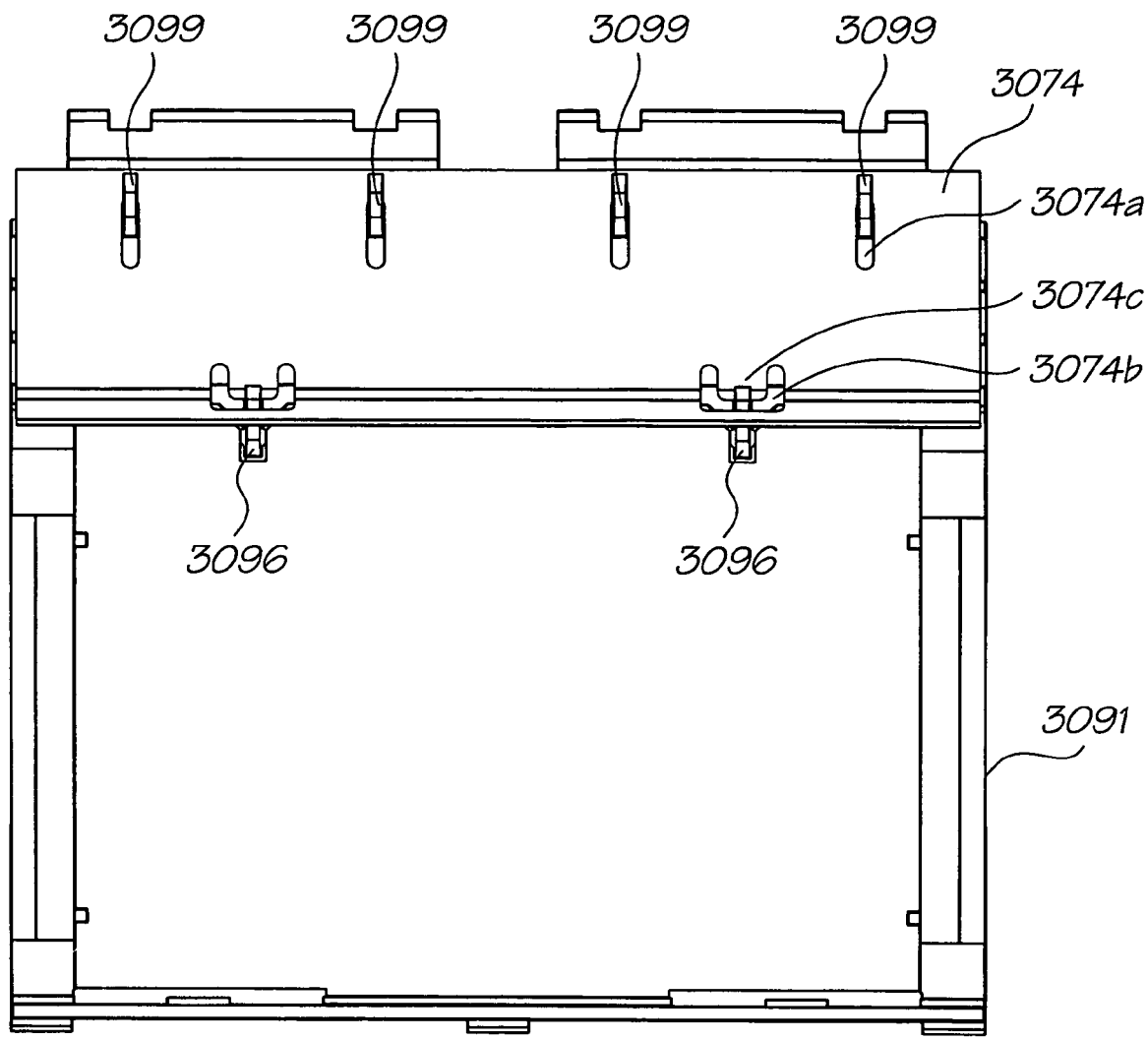
FIG. 40 shows a front view illustrating the further components of FIG. 39.

Further, the angular lugs 3043a are positioned so as to correspond to the placement of the printhead tiles 3050 on the upper surface of the fluid channel member 3040 so that, when mounted, the lower connecting portions 3081 of each of the flex PCBs 3080 are aligned with the corresponding connectors 3098 of the PCBs 3090 (see FIGS. 26 and 38B). This is facilitated by the flex PCBs 3080 having a hole 3082 therein (FIG. 26) which is received by the lower retaining clip 3096 of the support 3091. Consequently, the flex PCBs 3080 are correctly positioned under the pressure plate 3074 retained by the retaining clip 3096 as described above.

Further still, as also shown in FIGS. 42C and 42E, the (upper) lug 3092 of the support 3091 has an inner surface 3092a which is also slightly angled from the normal of the plane of the support 3091 in a direction away from the support 3091. As shown in FIGS. 37B and 37C, the upper lugs 3092 are formed as resilient members which are able to hinge with respect to the support 3091 with a spring-like action. Consequently, when mounted to the casing 3020, a slight force is exerted against the lug 3027a of the uppermost face 3027 of the support frame 3022 which assists in securing the support 3091 to the support frame 3022 of the casing 3020 by biasing the (lower) lug 3092 into the recess formed between the lower part of the inner surface 3025 and the lug 3028a of the arm portion 3028 of the support frame 3022.

The manner in which the structure of the casing 3020 is completed in accordance with an exemplary embodiment of the present invention will now be described with reference to FIGS. 21, 22, 35A and 43.

Figure 43:
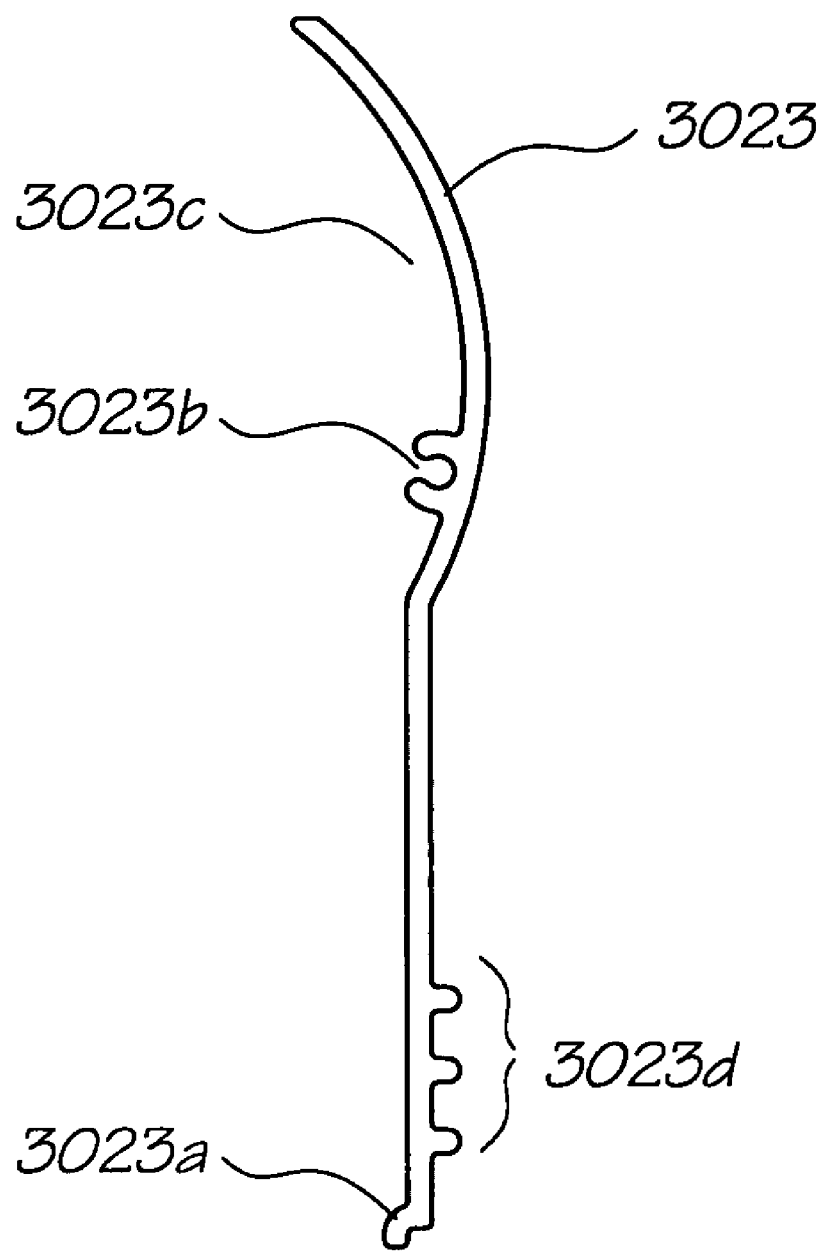
FIG. 43 shows a side view of a cover portion of the casing of the printhead assembly of FIG. 21.

As shown in FIGS. 21 and 22, the casing 3020 includes the aforementioned cover portion 3023 which is positioned adjacent the support frame 3022. Thus, together the support frame 3022 and the cover portion 3023 define the two-piece outer housing of the printhead assembly 3010. The profile of the cover portion 3023 is as shown in FIG. 43.

The cover portion 3023 is configured so as to be placed over the exposed PCB 3090 mounted to the PCB support 3091 which in turn is mounted to the support frame 3022 of the casing 3020, with the channel 3021 thereof holding the printhead module 3030. As a result, the cover portion 3023 encloses the printhead module 3030 within the casing 3020.

Figure 33:
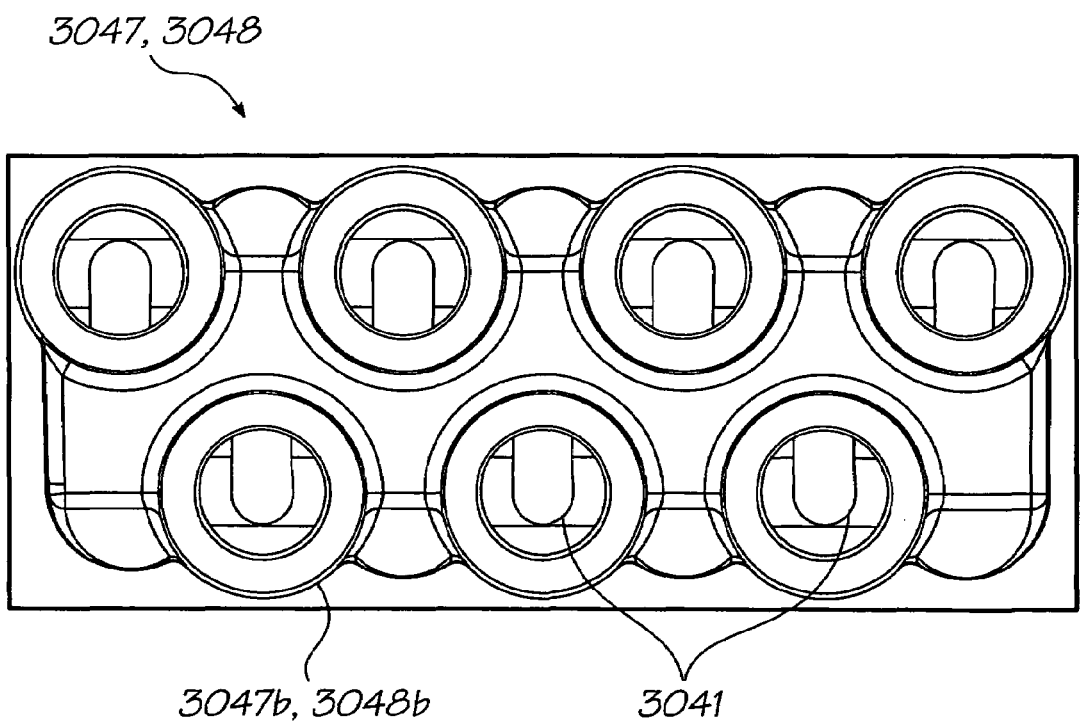
FIG. 33 illustrates a tubular portion arrangement of the fluid delivery connectors of FIGS. 30 and 31.

The cover portion 3023 includes a longitudinally extending tab 3023a on a bottom surface thereof (with respect to the orientation of the printhead assembly 3010) which is received in the recessed portion 3028c formed between the lug 3028b and the curved end portion 3028d of the arm portion 3028 of the support frame 3022 (see FIG. 35A). This arrangement locates and holds the cover portion 3023 in the casing 3020 with respect to the support frame 3022. The cover portion 3023 is further held in place by affixing the end plate 3111 or the end housing 3120 via the end plate 3110 on the longitudinal side thereof using screws through threaded portions 3023b (see FIGS. 43, 49 and 59). The end plates 3110 and/or 111 are also affixed to the support frame 3022 on either longitudinal side thereof using screws through threaded portions 3022a and 3022b provided in the internal cavity 3026 (see FIGS. 35A, 49 and 59). Further, the cover portion 3023 has the profile as shown in FIG. 33, in which a cavity portion 3023c is arranged at the inner surface of the cover portion 3023 (with respect to the inward direction on the printhead assembly 3010) for accommodating the pressure plate(s) 3074 mounted to the PCB support(s) 91.

Further, the cover portion may also include fin portions 3023d (see also FIG. 23) which are provided for dissipating heat generated by the PEC integrated circuits 3100 during operation thereof. To facilitate this the inner surface of the cover portion 3023 may also be provided with a heat coupling material portion (not shown) which physically contacts the PEC integrated circuits 3100 when the cover portion 3023 is attached to the support frame 3022. Further still, the cover portion 3023 may also function to inhibit electromagnetic interference (EMI) which can interfere with the operation of the dedicated electronics of the printhead assembly 3010.

The manner in which a plurality of the PCB supports 3091 are assembled in the support frame 3022 to provide a sufficient number of PEC integrated circuits 3100 per printhead module 3030 in accordance with one embodiment of the present invention will now be described with reference to FIGS. 36 and 44 to 47.

Figure 44:
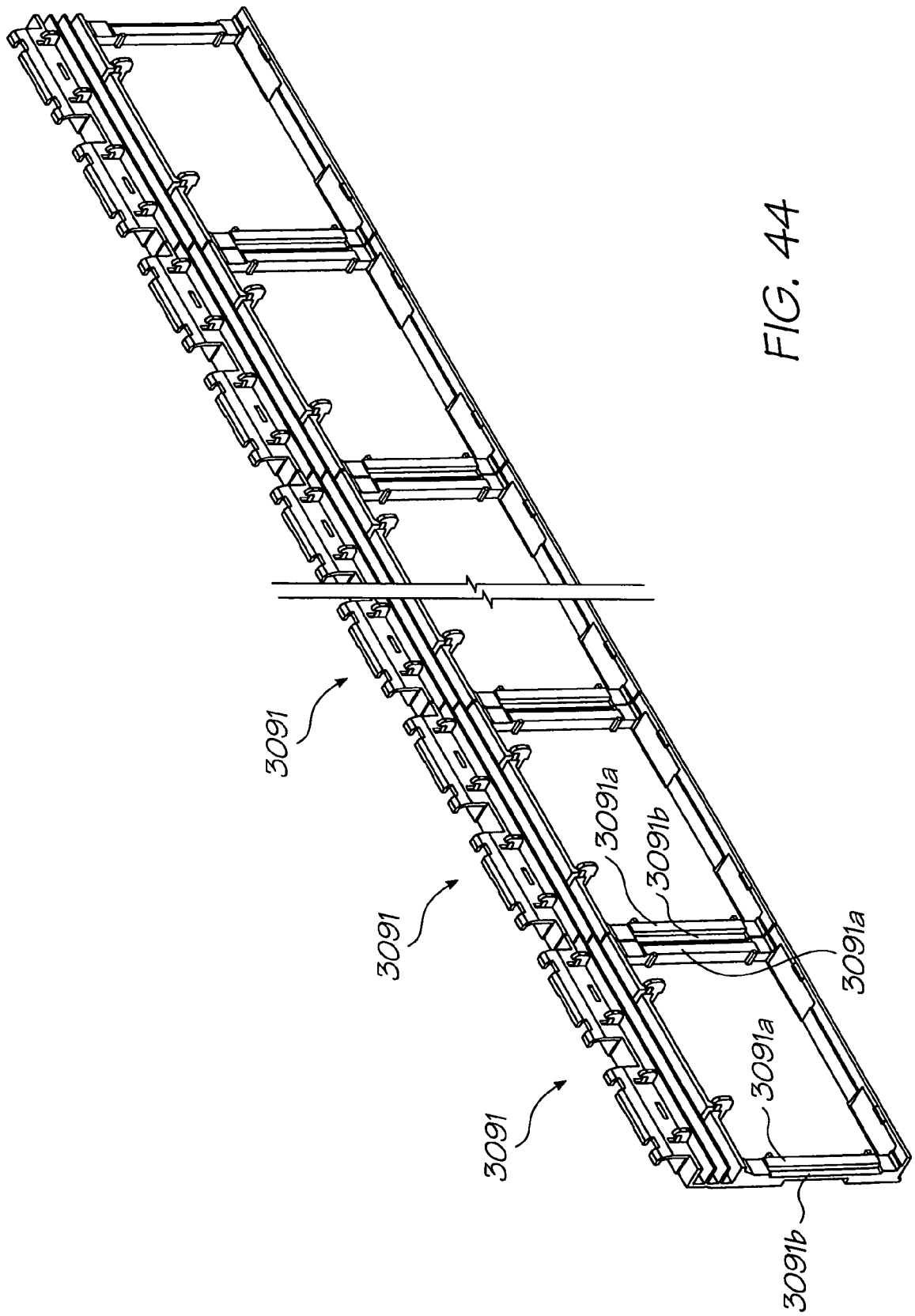
FIG. 44 illustrates a plurality of the PCB supports of FIG. 36 in a modular assembly.

As described earlier, in one embodiment of the present invention, each of the supports 3091 is arranged to hold one of the PEC integrated circuits 3100 which in turn drives four printhead integrated circuits 3051. Accordingly, in a printhead module 3030 having 16 printhead tiles, for example, four PEC integrated circuits 3100, and therefore four supports 3091 are required. For this purpose, the supports 3091 are assembled in an end-to-end manner, as shown in FIG. 44, so as to extend the length of the casing 3020, with each of the supports 3091 being mounted and clipped to the support frame 3022 and printhead module 3030 as previously described. In such a way, the single printhead module 3030 of sixteen printhead tiles 3050 is securely held to the casing 3020 along the length thereof.

Figure 36:
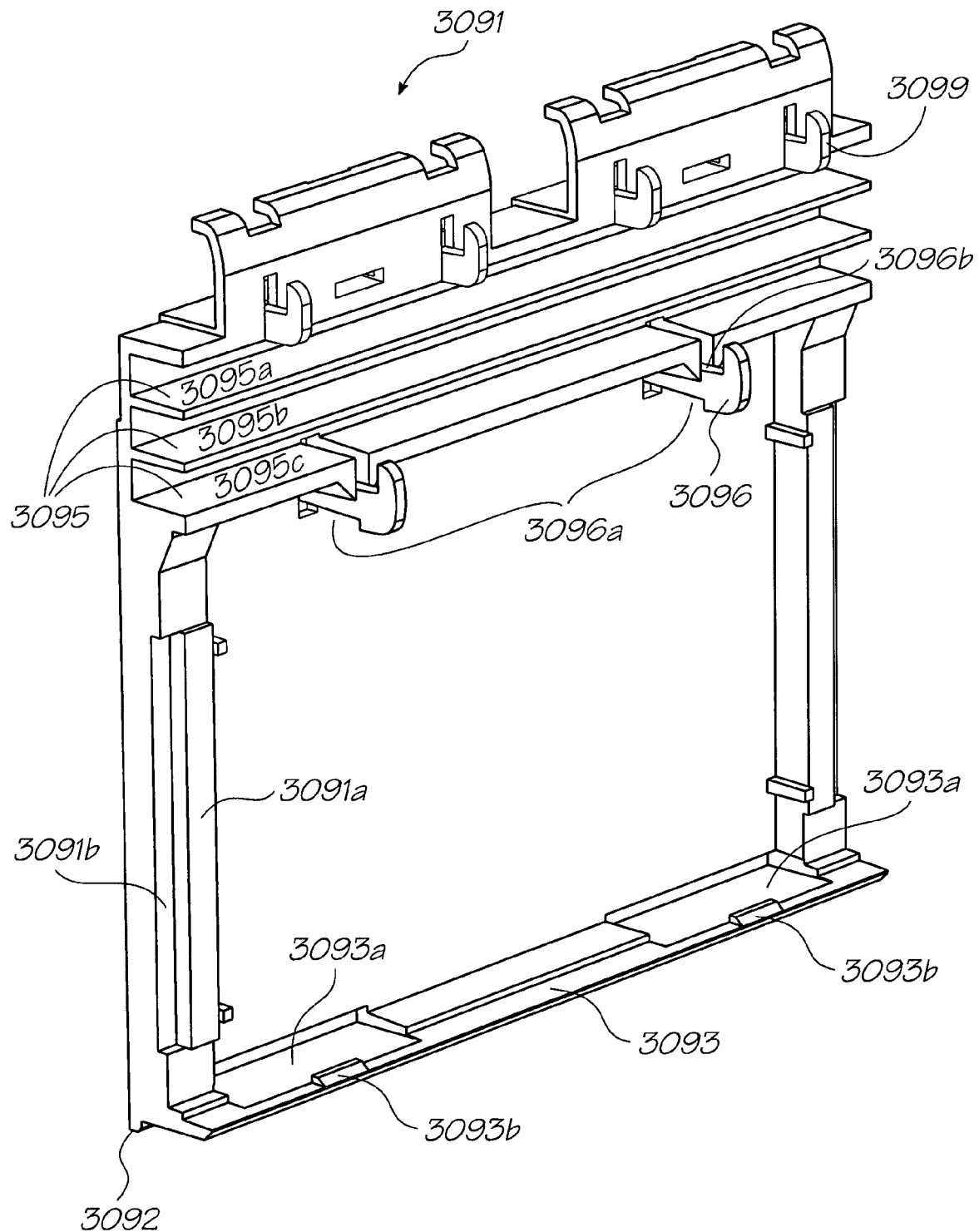
FIG. 36 illustrates a printed circuit board (PCB) support that forms a portion of the printhead assembly of FIG. 21.

As shown more clearly in FIG. 36, the supports 3091 further include raised portions 3091a and recessed portions 3091b at each end thereof That is, each edge region of the end walls of the supports 3091 include a raised portion 3091a with a recessed portion 3091b formed along the outer edge thereof This configuration produces the abutting arrangement between the adjacent supports 3091 shown in FIG. 44.

Figure 45:
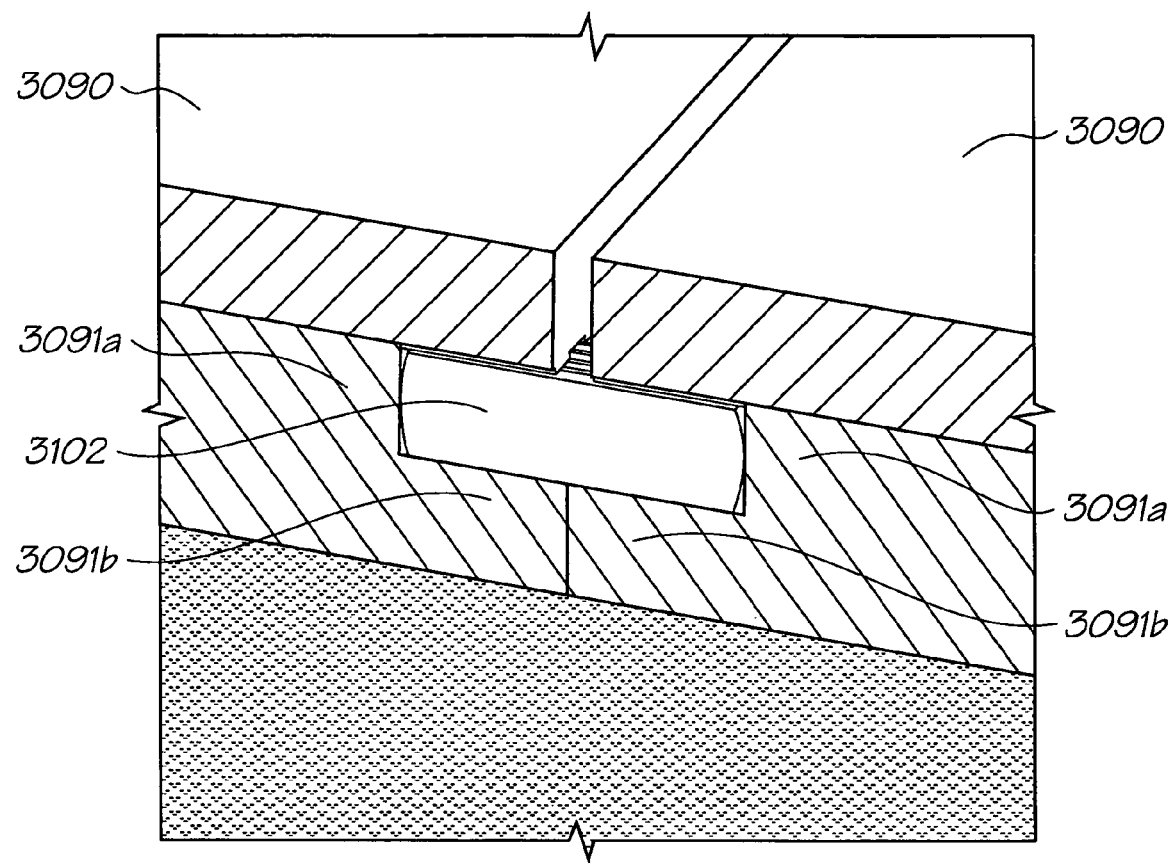
FIG. 45 illustrates a connecting member that is carried by two adjacent PCB supports of FIG. 44 and which is used for interconnecting PCBs that are carried by the PCB supports.

This arrangement of two abutting recessed portions 3091b with one raised portion 3091a at either side thereof forms a cavity which is able to receive a suitable electrical connecting member 3102 therein, as shown in cross-section in FIG. 45. Such an arrangement enables adjacent PCBs 3090, carried on the supports 3091 to be electrically connected together so that data signals which are input from either or both ends of the plurality of assembled supports 3091, i.e., via data connectors (described later) provided at the ends of the casing 3020, are routed to the desired PEC integrated circuits 3100, and therefore to the desired printhead integrated circuits 3051.

Figure 46:
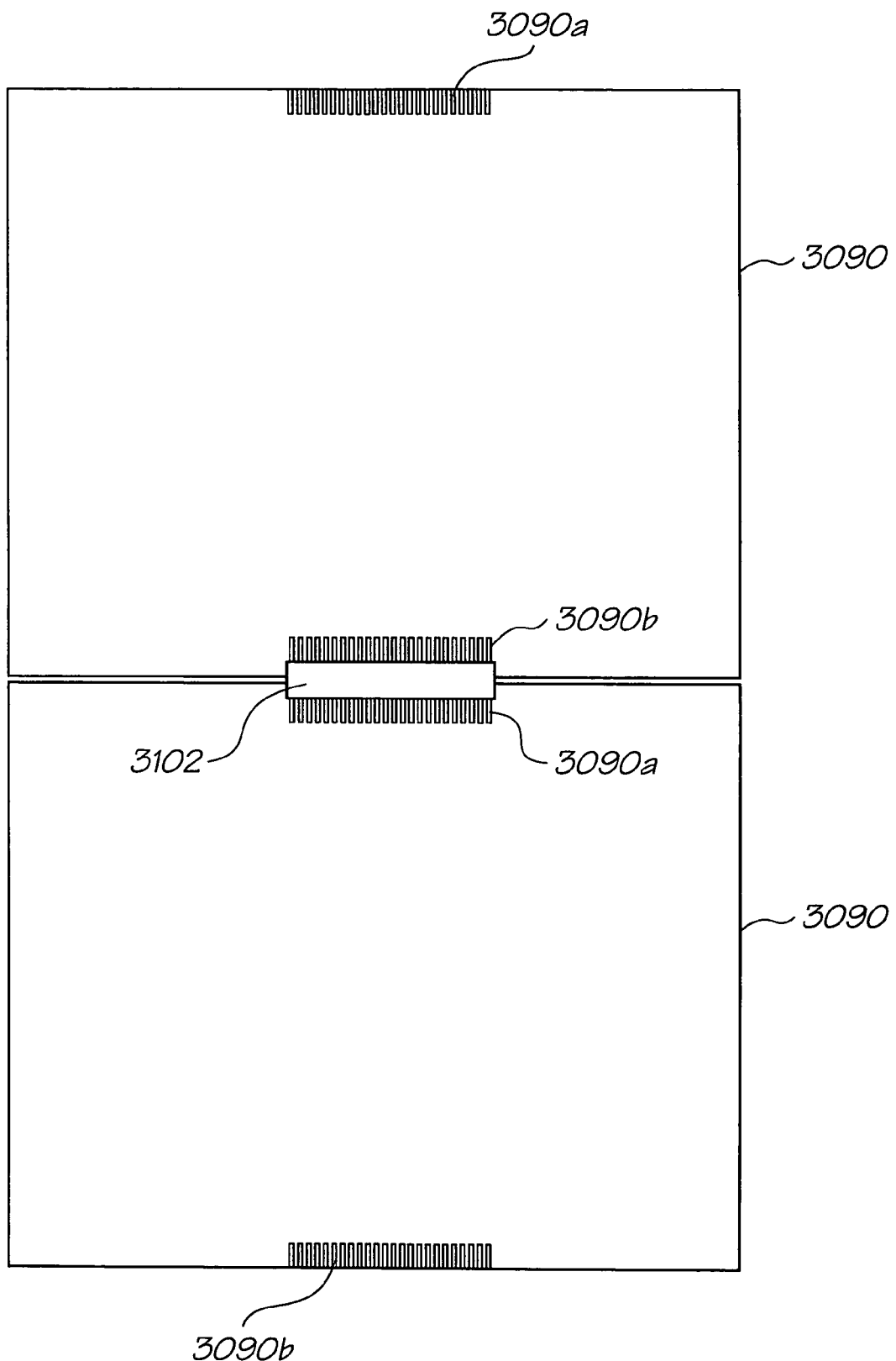
FIG. 46 illustrates the connecting member of FIG. 45 interconnecting two PCBs.

To this end, the connecting members 3102 provide electrical connection between a plurality of pads provided at edge contacting regions on the underside of each of the PCBs 3090 (with respect to the mounting direction on the supports 3091). Each of these pads is connected to different regions of the circuitry of the PCB 3090. FIG. 46 illustrates the pads of the PCBs as positioned over the connecting member 3102. Specifically, as shown in FIG. 46, the plurality of pads are provided as a series of connection strips 3090a and 3090b in a substantially central region of each edge of the underside of the PCBs 3090.

As mentioned above, the connecting members 3102 are placed in the cavity formed by the abutting recessed portions 3091b of adjacent supports 3091 (see FIG. 45), such that when the PCBs 3090 are mounted on the supports 3091, the connection strips 3090a of one PCB 3090 and the connection strips 3090b of the adjacent PCB 3090 come into contact with the same connecting member 3102 so as to provide electrical connection therebetween.

Figure 47:
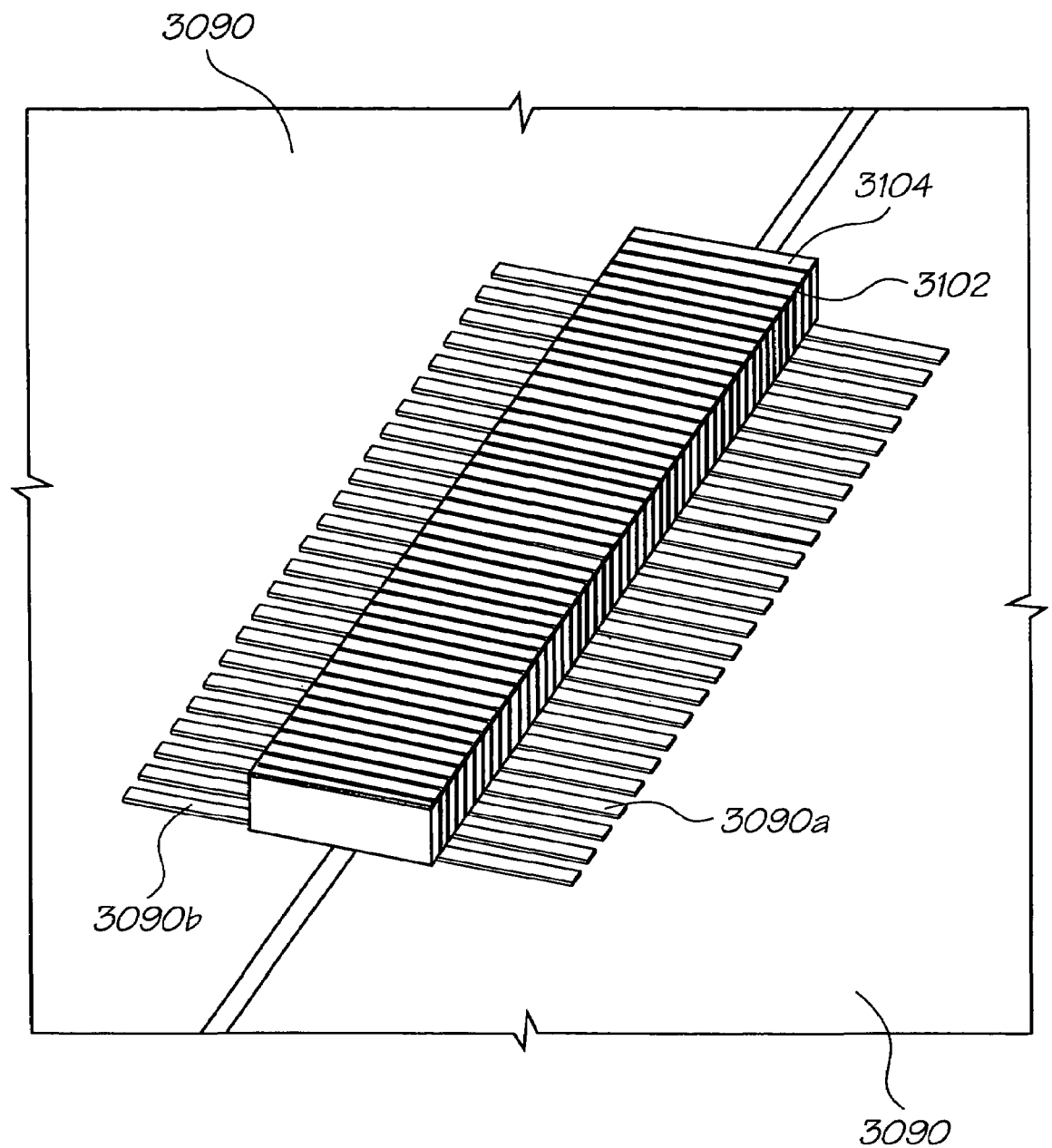
FIG. 47 illustrates the interconnection between two PCBs by the connecting member of FIG. 45.

To achieve this, the connecting members 3102 may each be formed as shown in FIG. 47 to be a rectangular block having a series of conducting strips 3104 provided on each surface thereof Alternatively, the conducting strips 3104 may be formed on only one surface of the connecting members 3102 as depicted in FIGS. 45 and 3046. Such a connecting member may typically be formed of a strip of silicone rubber printed to provide sequentially spaced conductive and non-conductive material strips. A shown in FIG. 47, these conducting strips 3104 are provided in a 2:1 relationship with the connecting strips 3090a and 3090b of the PCBs 3090. That is, twice as many of the conducting strips 3104 are provided than the connecting strips 3090a and 3090b, with the width of the conducting strips 3104 being less than half the width of the connecting strips 3090a and 3090b. Accordingly, any one connecting strip 3090a or 90b may come into contact with one or both of two corresponding conducting strips 3104, thus minimising alignment requirements between the connecting members 3104 and the contacting regions of the PCBs 3090.

In one embodiment of the present invention, the connecting strips 3090a and 3090b are about 0.4 mm wide with a 0.4 mm spacing therebetween, so that two thinner conducting strips 3104 can reliably make contact with only one each of the connecting strips 3090a and 3090b whilst having a sufficient space therebetween to prevent short circuiting. The connecting strips 3090a and 3090b and the conducting strips 3104 may be gold plated so as to provide reliable contact. However, those skilled in the art will understand that use of the connecting members and suitably configured PCB supports is only one exemplary way of connecting the PCBs 3090, and other types of connections are within the scope of the present invention.

Additionally, the circuitry of the PCBs 3090 is arranged so that a PEC integrated circuit 3100 of one of the PCB 3090 of an assembled support 3091 can be used to drive not only the printhead integrated circuits 3051 connected directly to that PCB 3090, but also those of the adjacent PCB(s) 3090, and further of any non-adjacent PCB(s) 3090. Such an arrangement advantageously provides the printhead assembly 3010 with the capability of continuous operation despite one of the PEC integrated circuits 3100 and/or PCBs 3090 becoming defective, albeit at a reduced printing speed.

In accordance with the above-described scalability of the printhead assembly 3010 of the present invention, the end-to-end assembly of the PCB supports 3091 can be extended up to the required length of the printhead assembly 3010 due to the modularity of the supports 3091. For this purpose, the busbars 3071, 3072 and 3073 need to be extended for the combined length of the plurality of PCB supports 3091, which may result in insufficient power being delivered to each of the PCBs 3090 when a relatively long printhead assembly 3010 is desired, such as in wide format printing applications.

In order to minimise power loss, two power supplies can be used, one at each end of the printhead assembly 3010, and a group of busbars 3070 from each end may be employed. The connection of these two busbar groups, e.g., substantially in the centre of the printhead assembly 3010, is facilitated by providing the exemplary connecting regions 3071a, 3072a and 3073a shown in FIG. 48.

Figure 48:
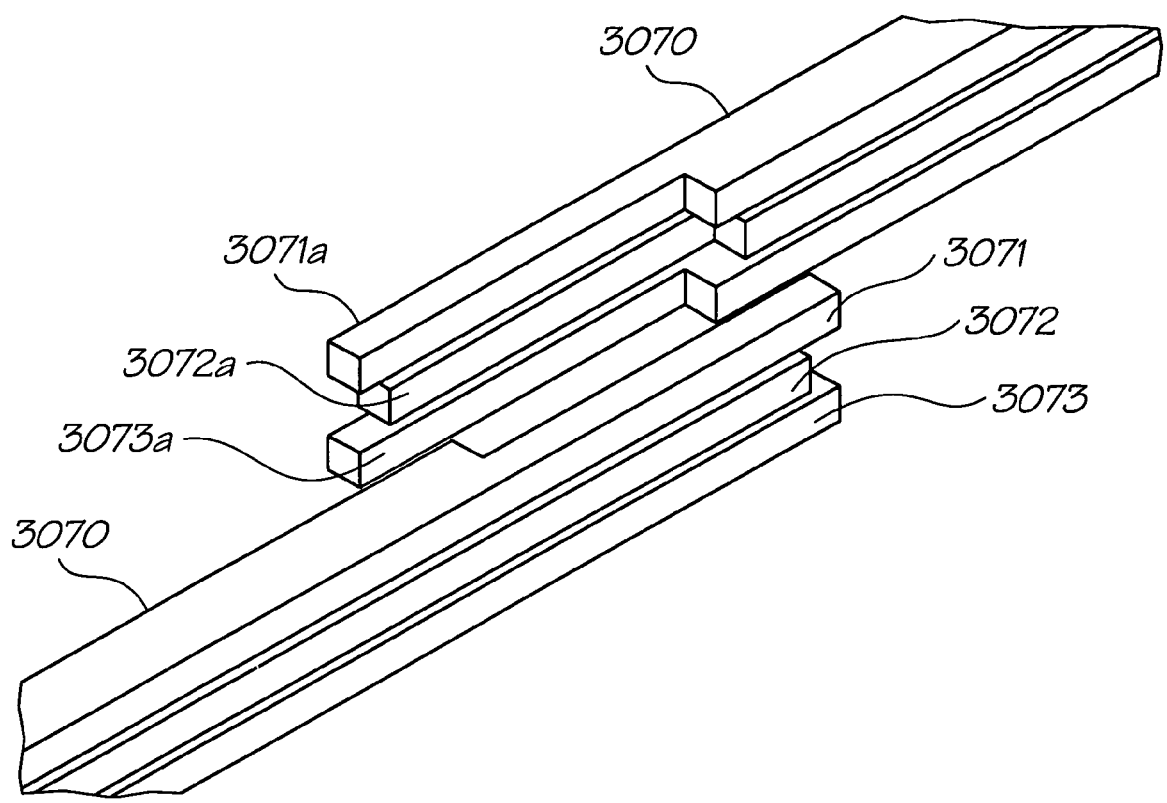
FIG. 48 illustrates a connecting region of busbars that are located in the printhead assembly of FIG. 21.

Specifically, the busbars 3071, 3072 and 3073 are provided in a staggered arrangement relative to each other and the end regions thereof are configured with the rebated portions shown in FIG. 48 as connecting regions 3071a, 3072a and 3073a. Accordingly, the connecting regions 3071a, 3072a and 3073a of the first group of busbars 3070 overlap and are engaged with the connecting regions 3071a, 3072a and 3073a of the corresponding ones of the busbars 3071, 3072 and 3073 of the second group of busbars 3070.

The manner in which the busbars are connected to the power supply and the arrangements of the end plates 3110 and 111 and the end housing(s) 3120 which house these connections will now be described with reference to FIGS. 21, 22 and 49 to 59.

Figure 49:
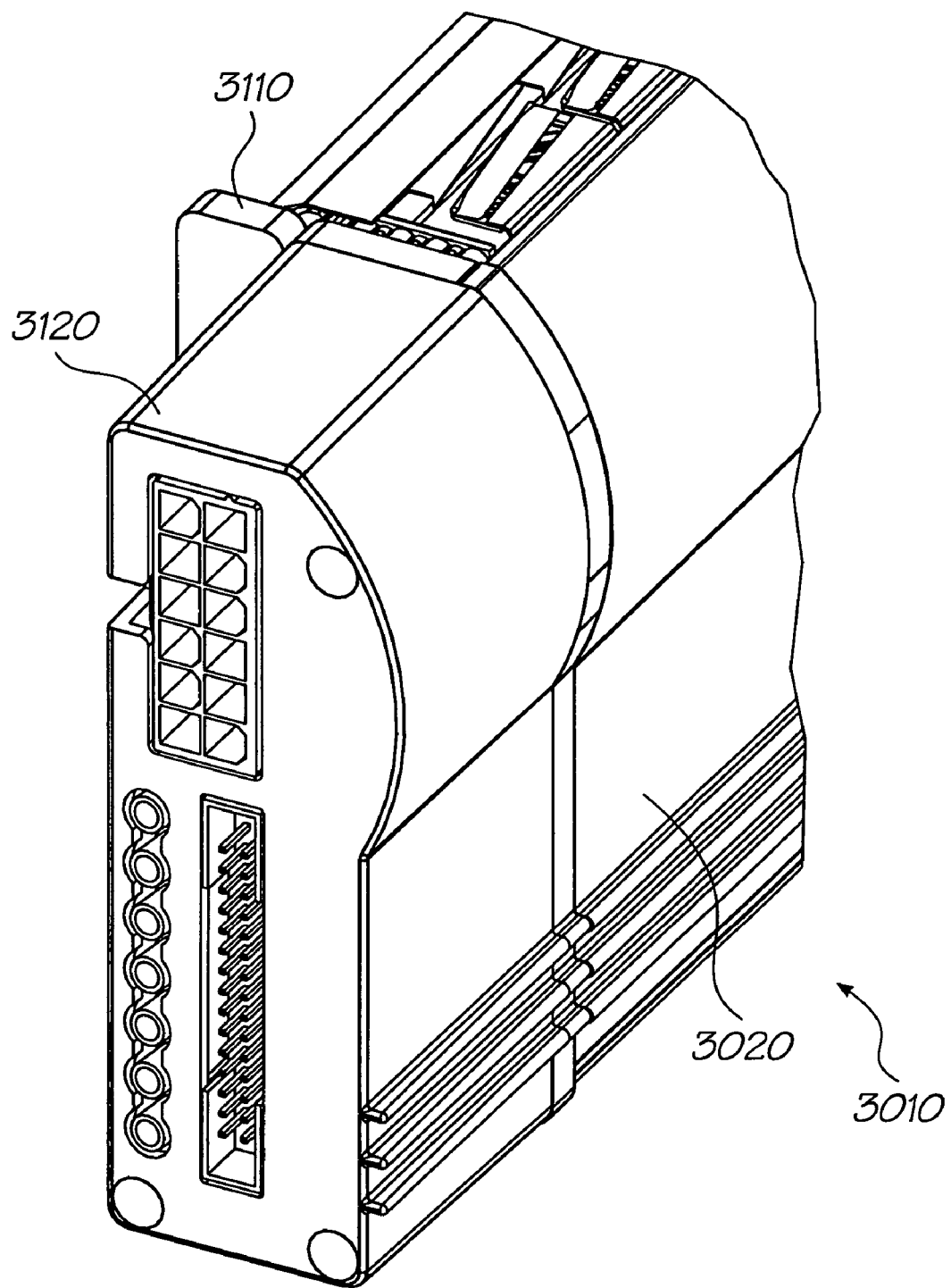
FIG. 49 shows a perspective view of an end portion of a printhead assembly in accordance with an embodiment of the present invention.

FIG. 49 illustrates an end portion of an exemplary printhead assembly according to one embodiment of the present invention similar to that shown in FIG. 21. At this end portion, the end housing 3120 is attached to the casing 3020 of the printhead assembly 3010 via the end plate 3110.

The end housing and plate assembly houses connection electronics for the supply of power to the busbars 3071, 3072 and 3073 and the supply of data to the PCBs 3090. The end housing and plate assembly also houses connections for the internal fluid delivery tubes 3006 to external fluid delivery tubes (not shown) of the fluid supply of the printing system to which the printhead assembly 3010 is being applied.

Figure 50:
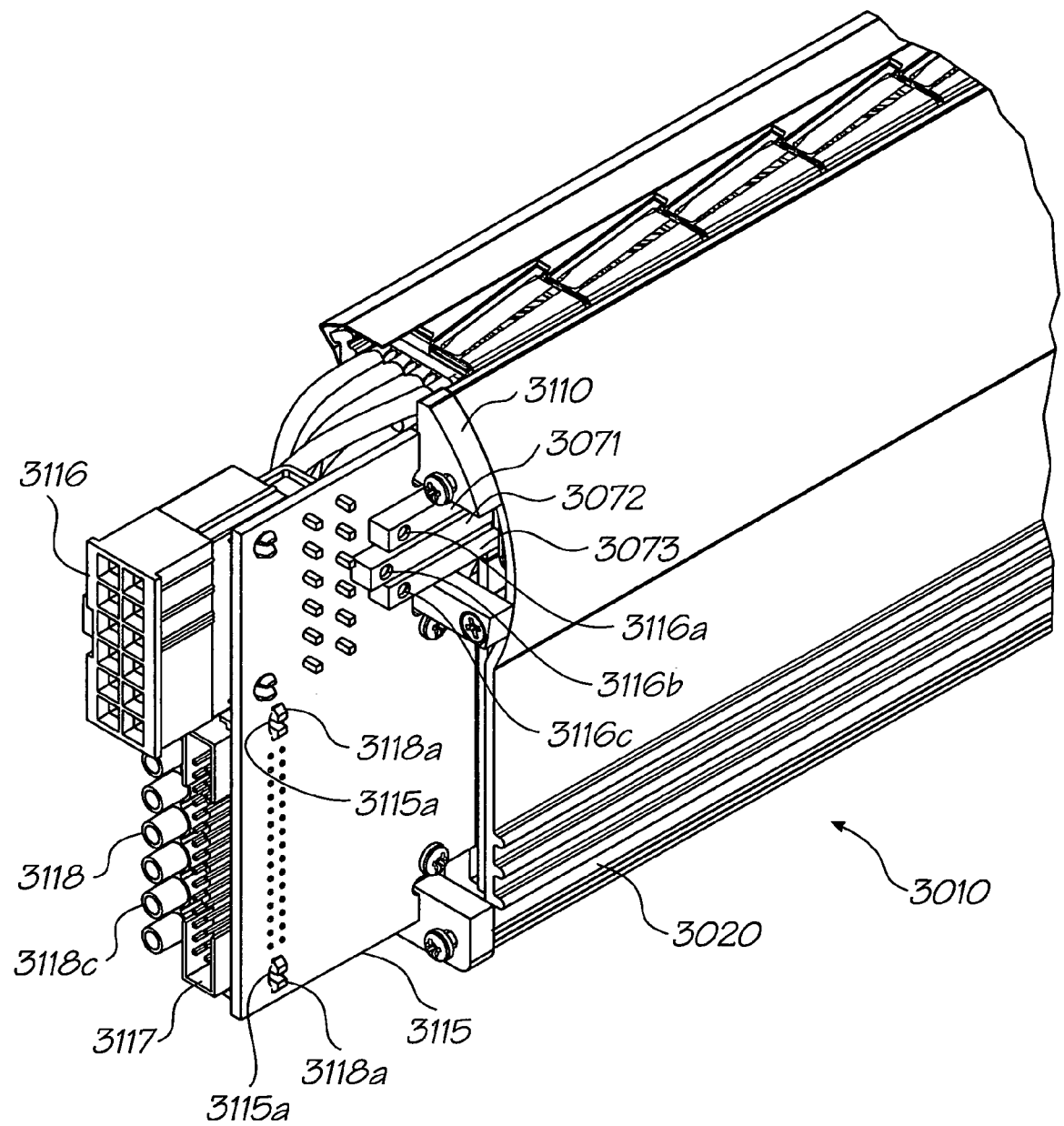
FIG. 50 illustrates a connector arrangement that is located in the end portion of the printhead assembly as shown in FIG. 49.
Figure 51:
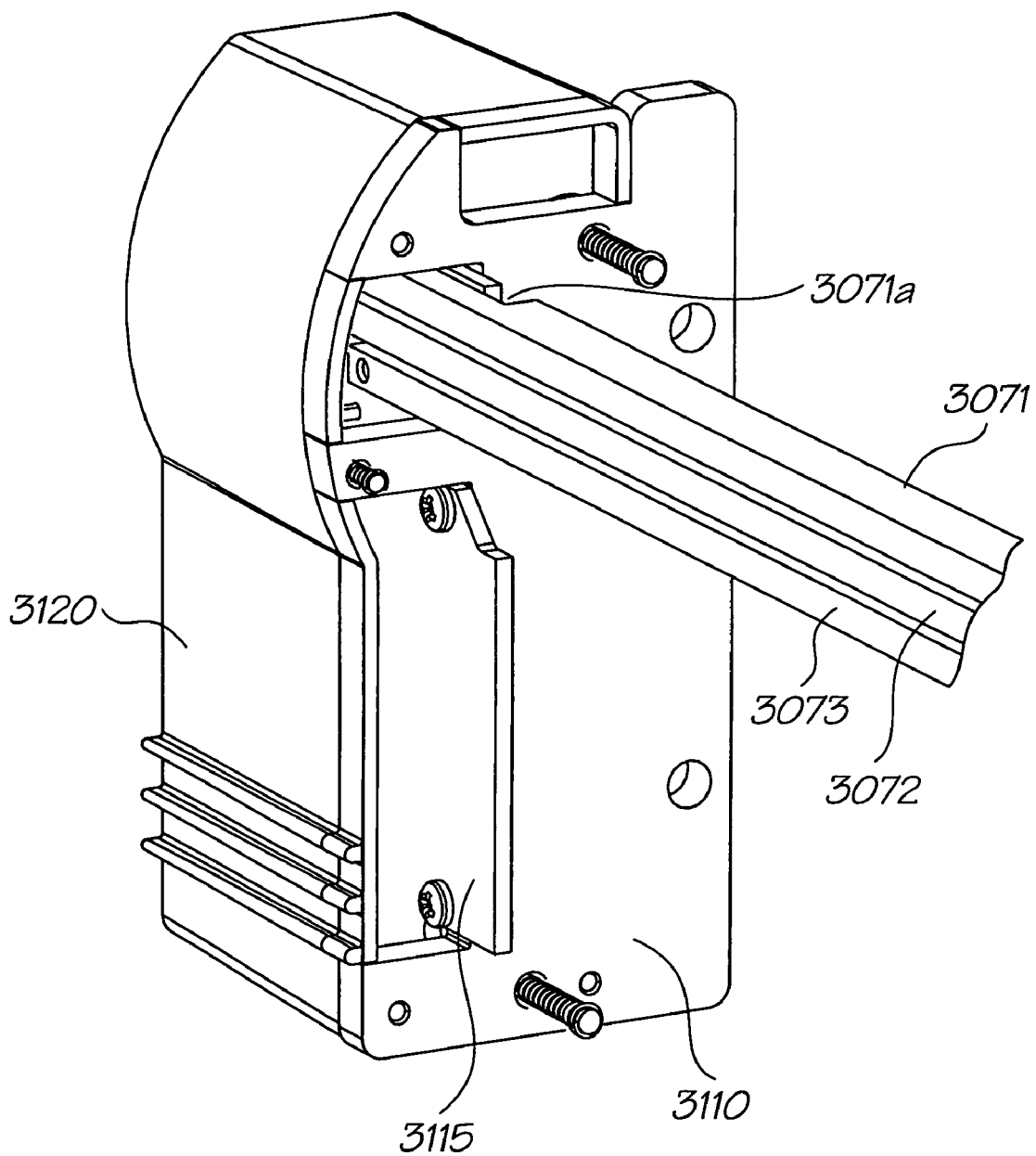
FIG. 51 illustrates the connector arrangement of FIG. 50 housed in an end housing and plate assembly which forms a portion of the printhead assembly.

These connections are provided on a connector arrangement 3115 as shown in FIG. 50. FIG. 50 illustrates the connector arrangement 3115 fitted to the end plate 3110 which is attached, via screws as described earlier, to an end of the casing 3020 of the printhead assembly 3010 according to one embodiment of the present invention. As shown, the connector arrangement 3115 includes a power supply connection portion 3116, a data connection portion 3117 and a fluid delivery connection portion 3118. Terminals of the power supply connection portion 3116 are connected to corresponding ones of three contact screws 3116a, 3116b, 3116c provided so as to each connect with a corresponding one of the busbars 3071, 3072 and 3073. To this end, each of the busbars 3071, 3072 and 3073 is provided with threaded holes in suitable locations for engagement with the contact screws 3116a, 3116b, 3116c. Further, the connection regions 3071a, 3072a and 3073a (see FIG. 48) may also be provided at the ends of the busbars 3071, 3072 and 3073 which are to be in contact with the contact screws 3116a, 3116b, 3116c so as to facilitate the engagement of the busbars 3071, 3072 and 3073 with the connector arrangement 3115, as shown in FIG. 51.

Figure 52A:
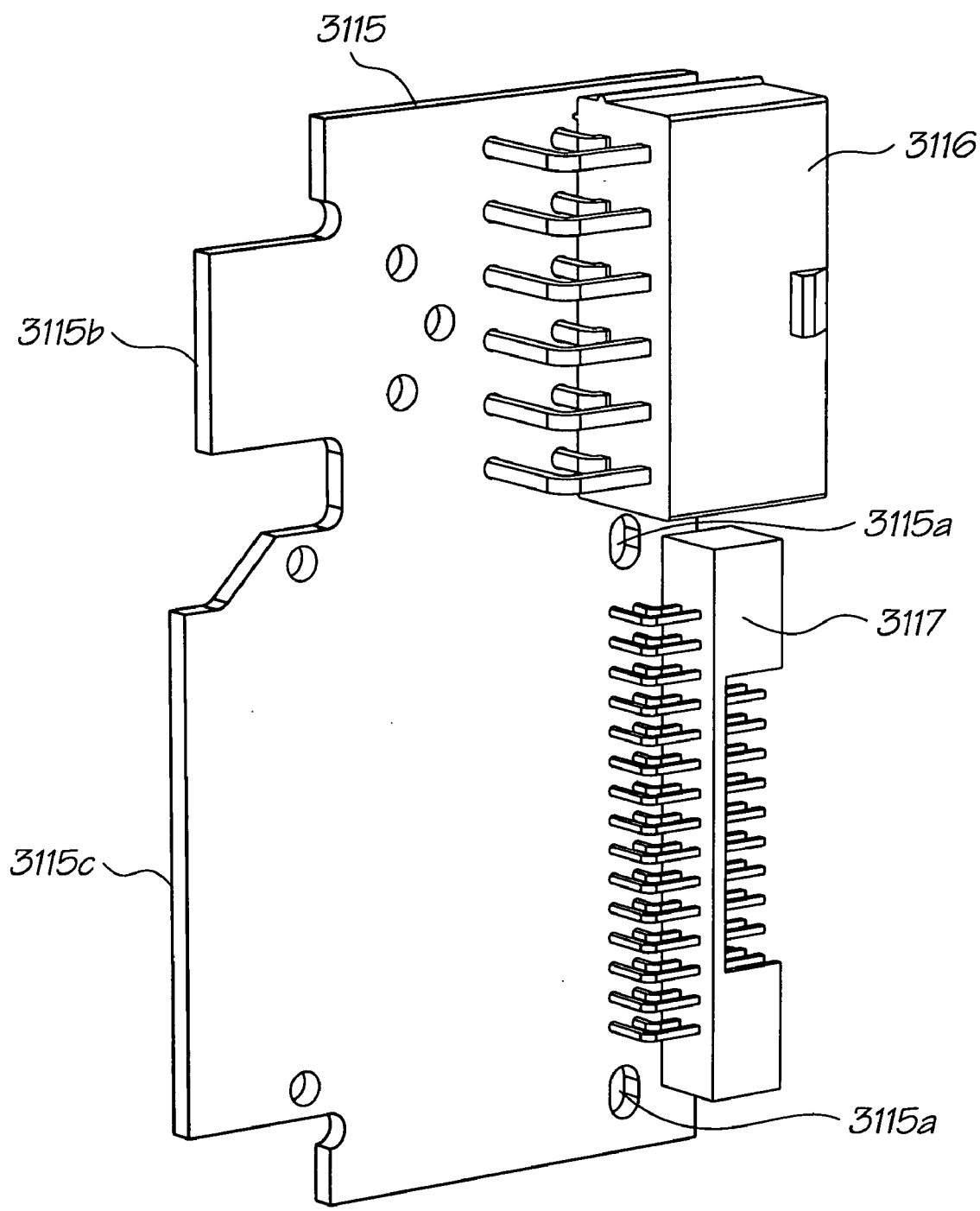
FIGS. 52A and 52B show opposite side views of the connector arrangement of FIG. 50.
Figure 52B:
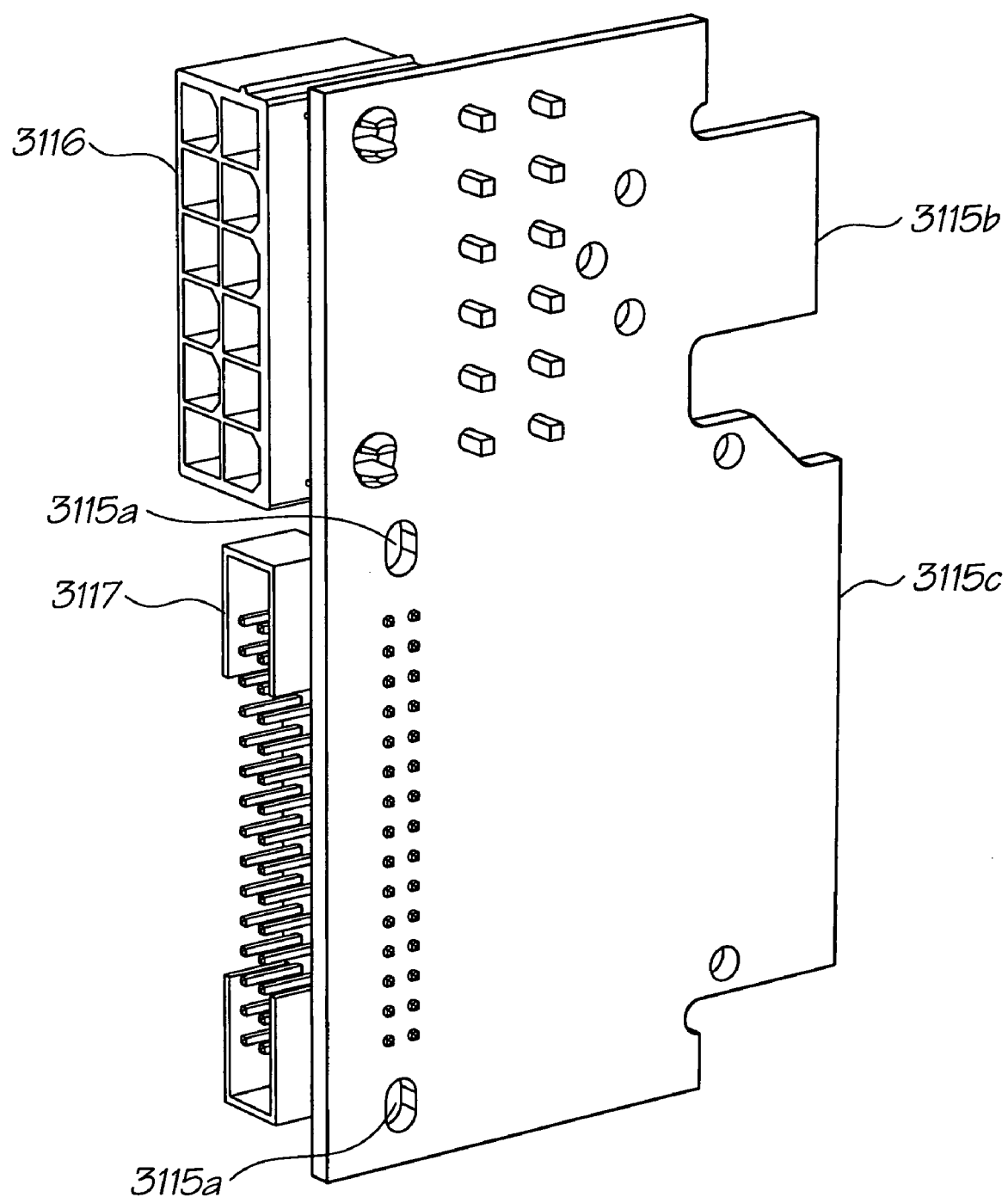

In FIGS. 50, 52A and 52B, only three contact screws or places for three contact screws are shown, one for each of the busbars. However, the use of a different number of contact screws is within the scope of the present invention. That is, depending on the amount of power being routed to the busbars, in order to provide sufficient power contact it may be necessary to provide two or more contact screws for each busbar (see, for example, FIGS. 53B and 53C). Further, as mentioned earlier a greater or lesser number of busbars may be used, and therefore a corresponding greater of lesser number of contact screws. Further still, those skilled in the art will understand that other means of contacting the busbars to the power supply via the connector arrangements as are typical in the art, such as soldering, are within the scope of the present invention.

The manner in which the power supply connection portion 3116 and the data connection portion 3117 are attached to the connector arrangement 3115 is shown in FIGS. 52A and 52B. Further, connection tabs 3118a of the fluid delivery connection portion 3118 are attached at holes 3115a of the connector arrangement 3115 so as that the fluid delivery connection portion 3118 overlies the data connection portion 3117 with respect to the connector arrangement 3115 (see FIGS. 50 and 52C).

Figure 52C:
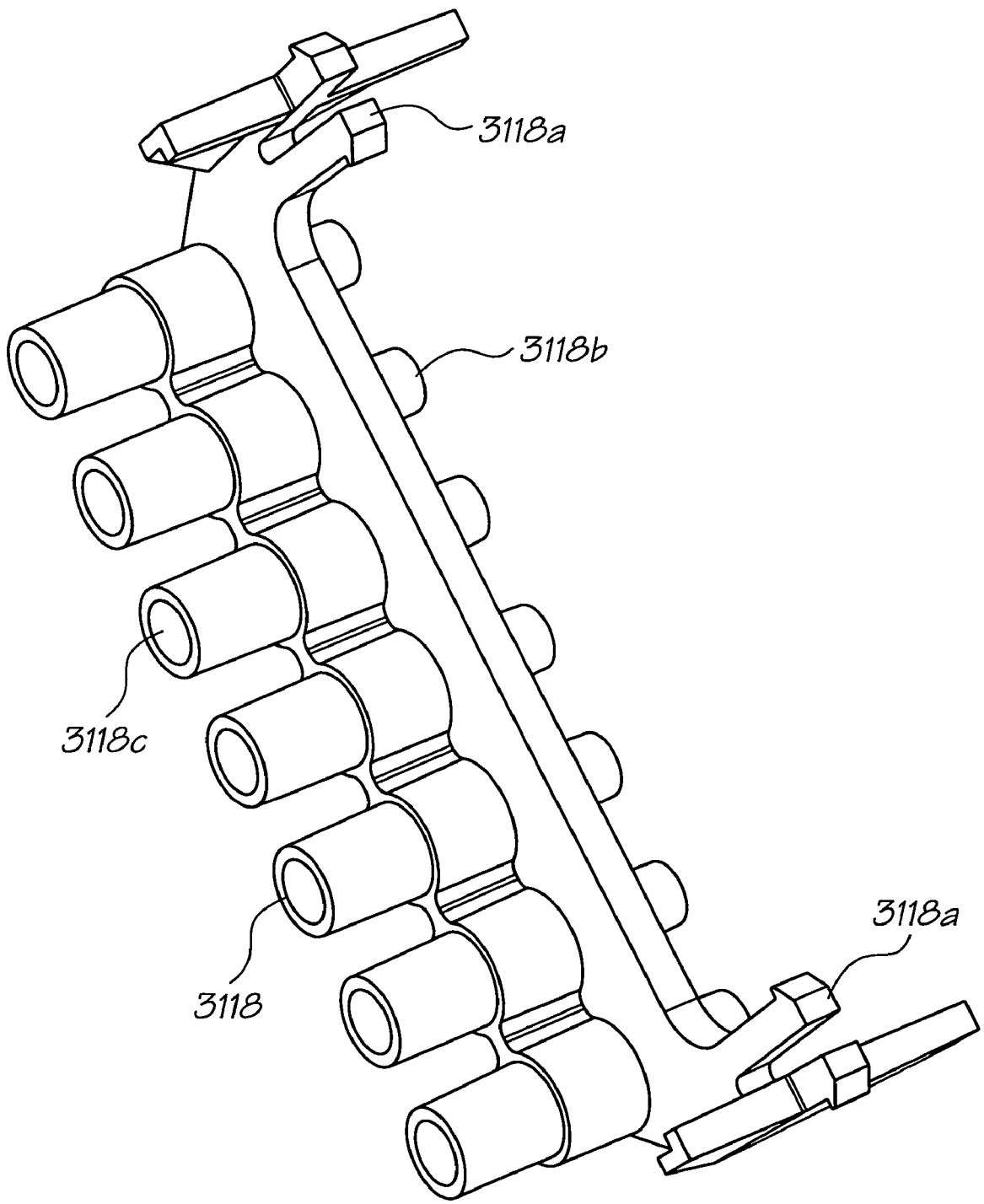
FIG. 52C illustrates a fluid delivery connection portion of the connector arrangement of FIG. 50.
Figure 54:
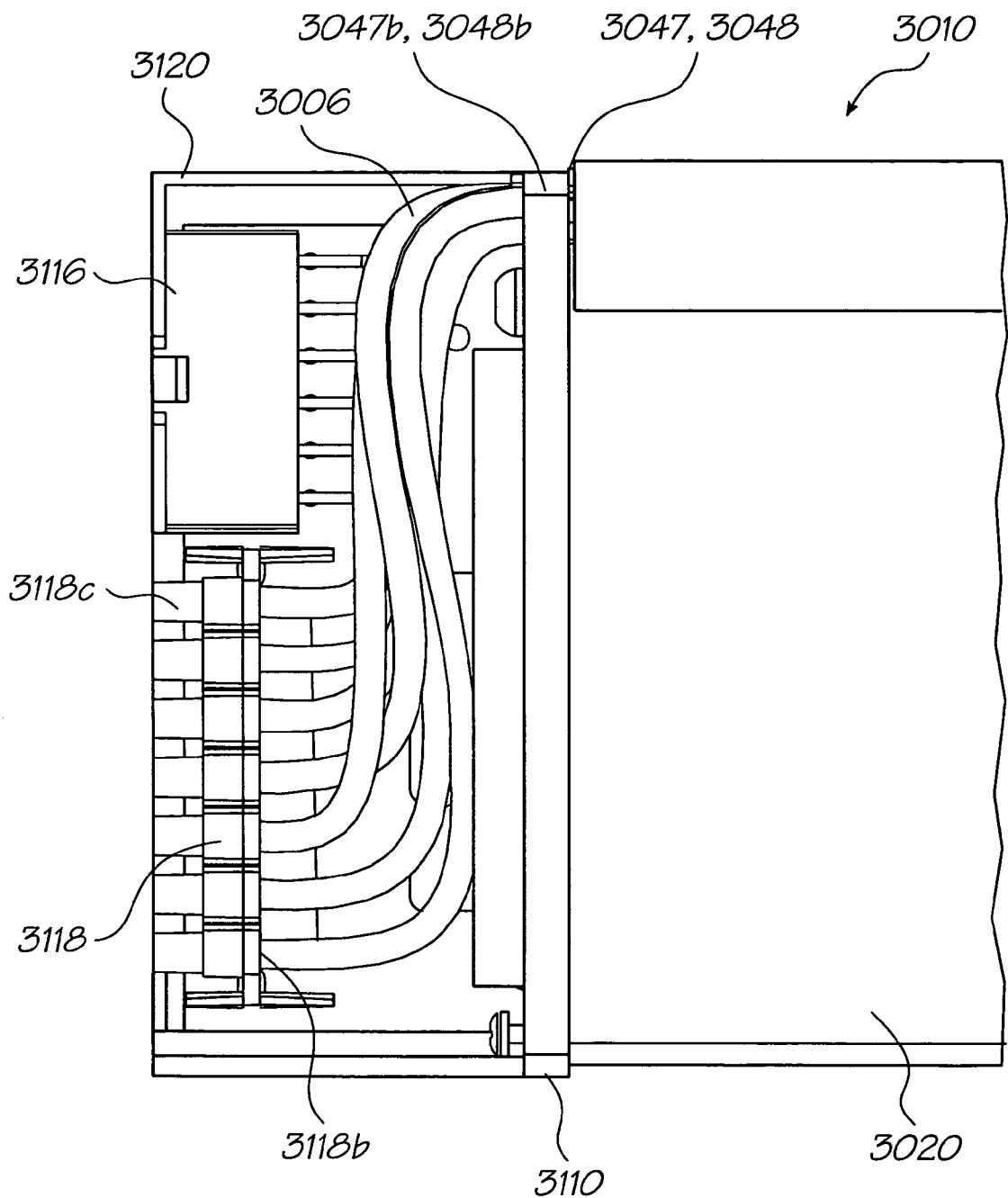
FIG. 54 illustrates the connector arrangement of FIG. 50 housed in the end housing and plate assembly of FIG. 51 attached to the casing of the printhead assembly.

As seen in FIGS. 50 and 52C, seven internal and external tube connectors 3118b and 118c are provided in the fluid delivery connection portion 3118 in accordance with the seven internal fluid delivery tubes 3006. That is, as shown in FIG. 54, the fluid delivery tubes 3006 connect between the internal tube connectors 3118b of the fluid delivery connection portion 3118 and the seven tubular portions 3047b or 3048b of the fluid delivery connector 3047 or 3048. As stated earlier, those skilled in the art clearly understand that the present invention is not limited to this number of fluid delivery tubes, etc.

Returning to FIGS. 52A and 52B, the connector arrangement 3115 is shaped with regions 3115b and 3115c so as to be received by the casing 3020 in a manner which facilitates connection of the busbars 3071, 3072 and 3073 to the contact screws 3116a, 3116b and 3116c of the power supply connection portion 3116 via region 3115b and connection of the end PCB 3090 of the plurality of PCBs 3090 arranged on the casing 3020 to the data connection portion 3117 via region 3115c.

The region 3115c of the connector arrangement 3115 is advantageously provided with connection regions (not shown) of the data connection portion 3117 which correspond to the connection strips 3090a or 90b provided at the edge contacting region on the underside of the end PCB 3090, so that one of the connecting members 3102 can be used to connect the data connections of the data connection portion 3117 to the end PCB 3090, and thus all of the plurality of PCBs 3090 via the connecting members 3102 provided therebetween.

Figure 53A:
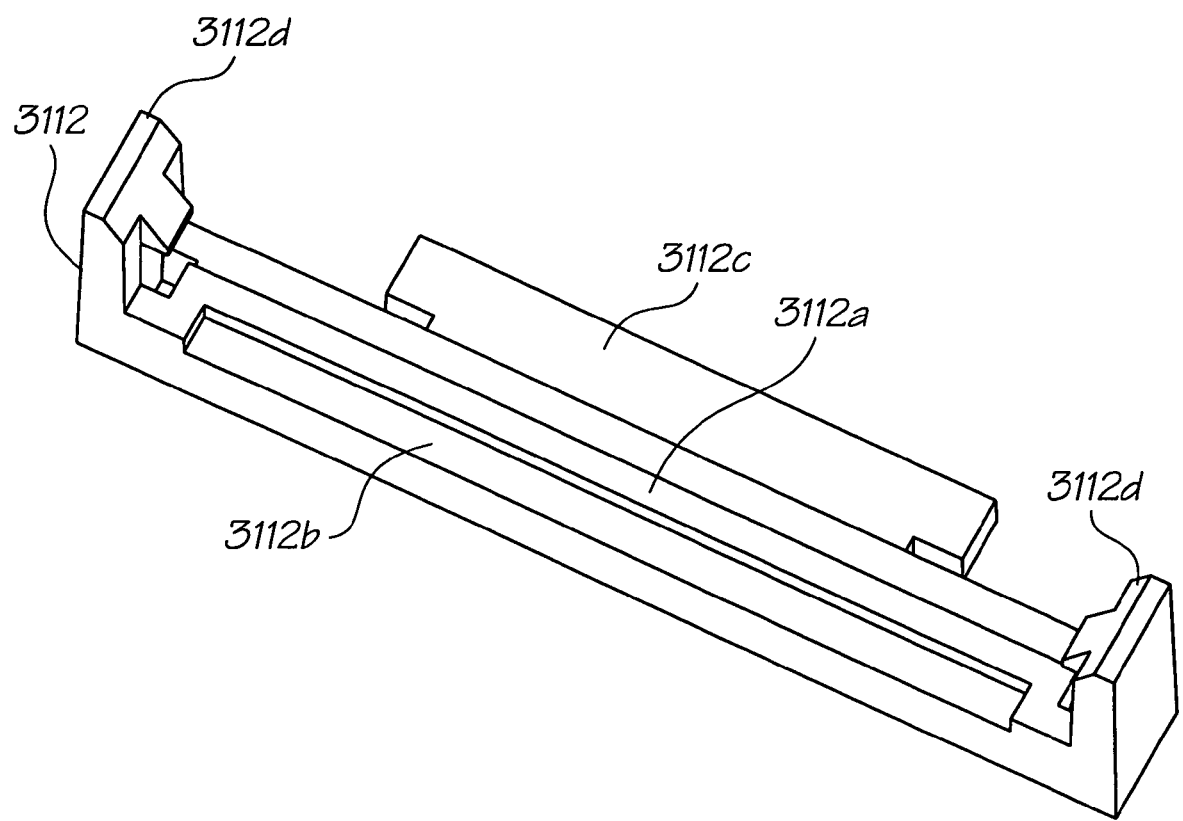
FIG. 53A illustrates a support member that is located in a printhead assembly in accordance with an embodiment of the present invention.

This is facilitated by using a support member 3112 as shown in FIG. 53A, which has a raised portion 3112a and a recessed portion 3112b at one edge thereof which is arranged to align with the raised and recessed portions 3091a and 3091b, respectively, of the end PCB support 3091 (see FIG. 44). The support member 3112 is attached to the rear surface of the end PCB support 3091 by engaging a tab 3112c with a slot region 3091c on the rear surface of the end PCB support 3091 (see FIGS. 37B and 37C), and the region 3115c of the connector arrangement 3115 is retained at upper and lower side surfaces thereof by clip portions 3112d of the support member 3112 so as that the connection regions of the region 3115c are in substantially the same plane as the edge contacting regions on the underside of the end PCB 3090.

Figure 53B:
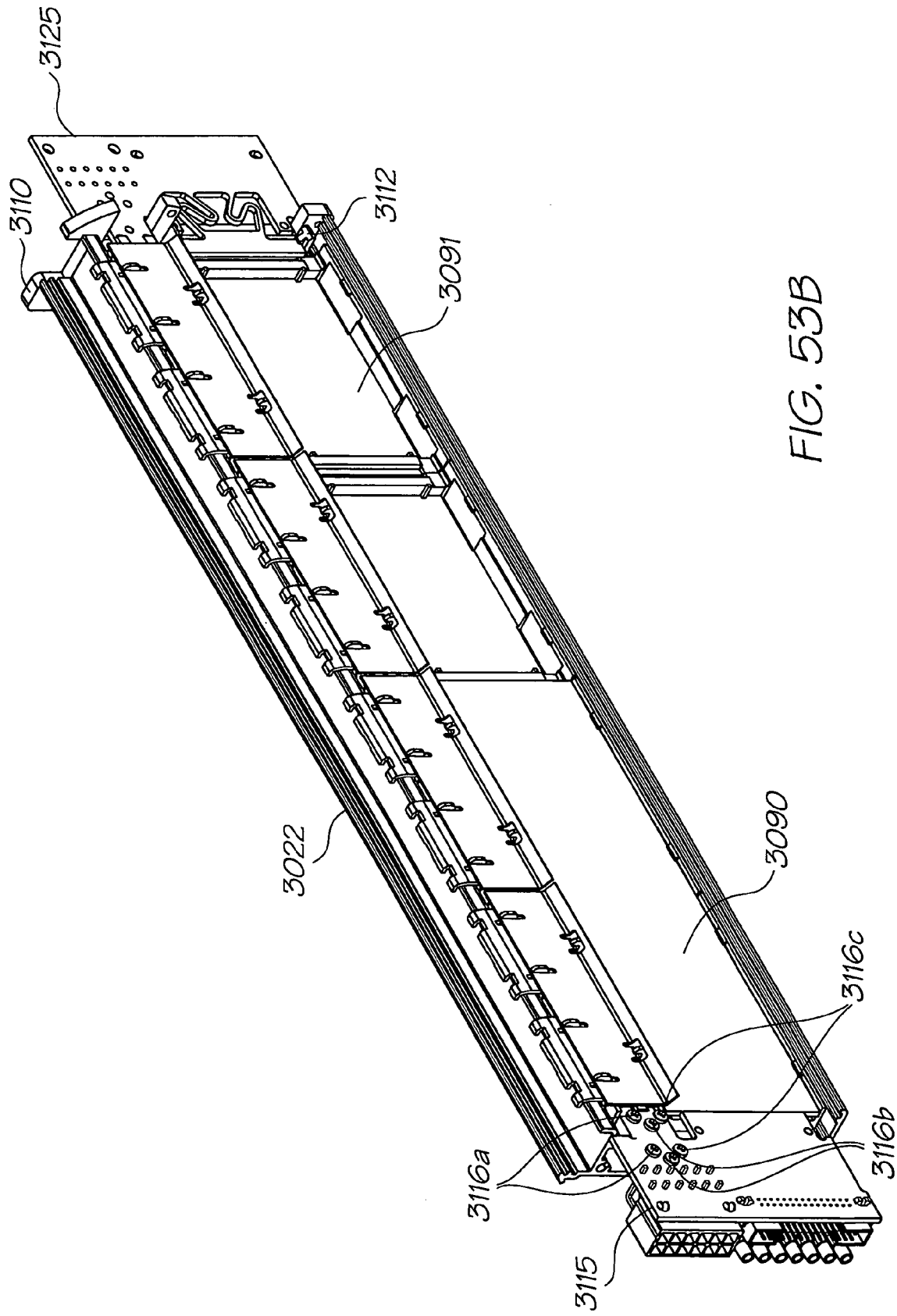
FIG. 53B shows a sectional view of the printhead assembly with the support member of FIG. 53A located therein.
Figure 53C:
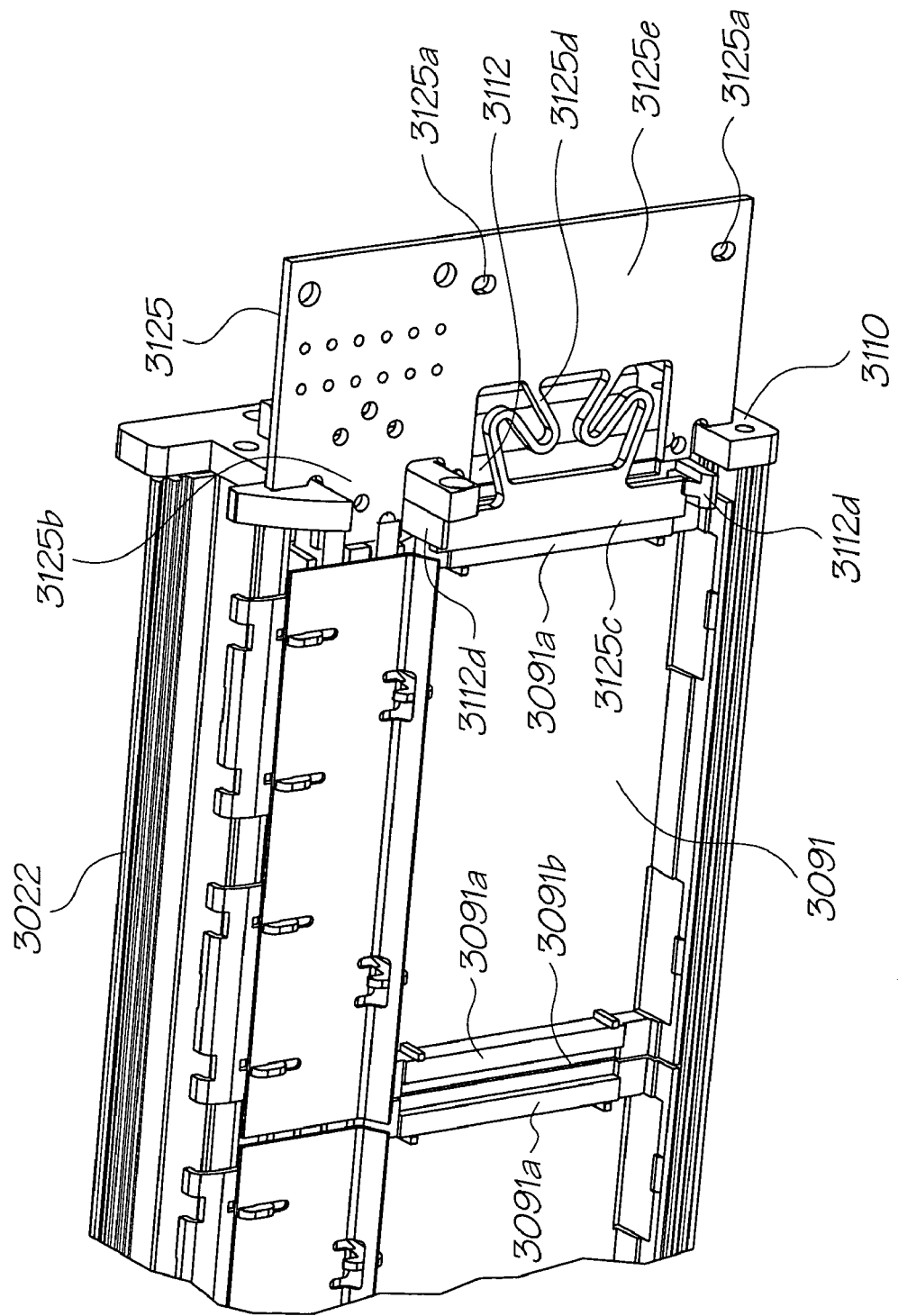
FIG. 53C illustrates a part of the printhead assembly of FIG. 53B in more detail.

Thus, when the end plate 3110 is attached to the end of the casing 3020, an abutting arrangement is formed between the recessed portions 3112b and 3091b, similar to the abutting arrangement formed between the recessed portions 3091b of the adjacent supports 3091 of FIG. 44. Accordingly, the connecting member 3102 can be accommodated compactly between the end PCB 3090 and the region 3115c of the connector arrangement 3115. This arrangement is shown in FIGS. 53B and 33C for another type of connector arrangement 3125 with a corresponding region 3125c, which is described in more detail below with respect to FIGS. 57, 58A and 58B.

This exemplary manner of connecting the data connection portion 3117 to the end PCB 3090 contributes to the modular aspect of the present invention, in that it is not necessary to provide differently configured PCBs 3090 to be arranged at the longitudinal ends of the casing 3020 and the same method of data connection can be retained throughout the printhead assembly 3010. It will be understood by those skilled in the art however that the provision of additional or other components to connect the data connection portion 3117 to the end PCB 3090 is also included in the scope of the present invention.

Figure 55A:
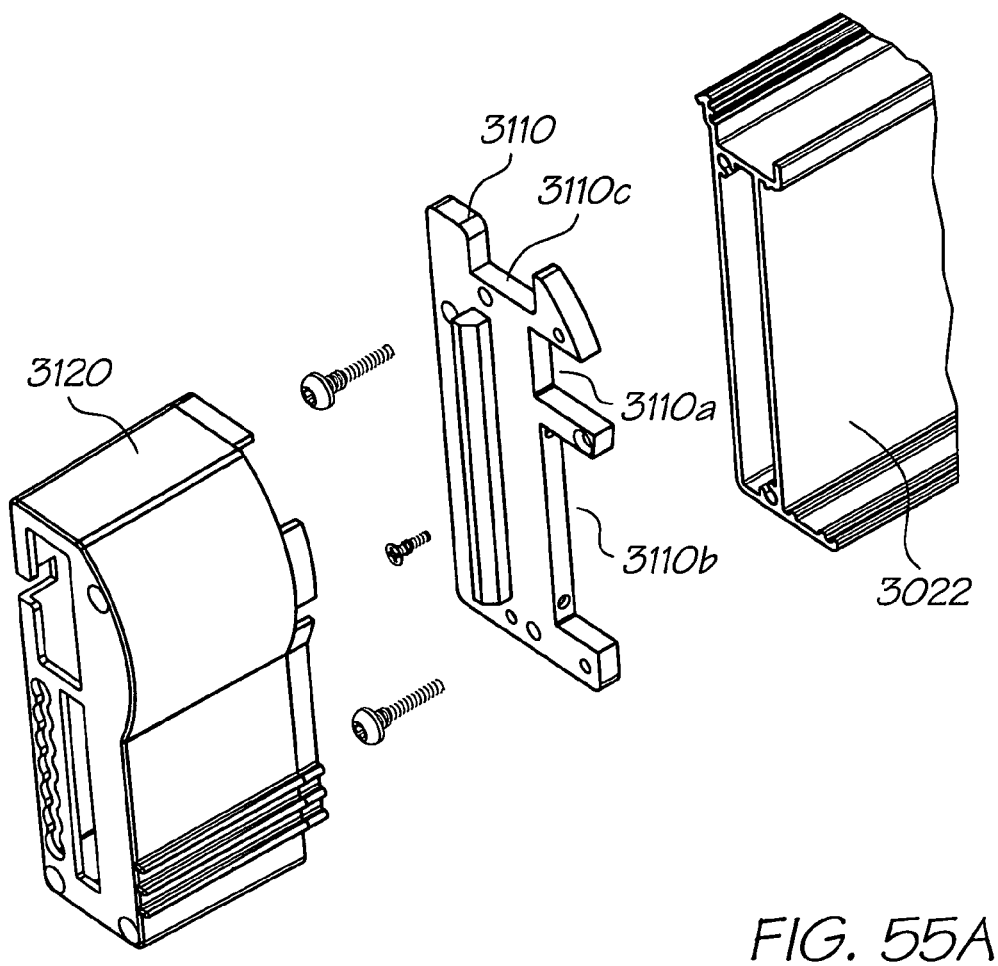
FIG. 55A shows an exploded perspective view of the end housing and plate assembly of FIG. 51.

Returning to FIG. 50, it can be seen that the end plate 3110 is shaped so as to conform with the regions 3115b and 3115c of the connector arrangement 3115, such that these regions can project into the casing 3020 for connection to the busbars 3071, 3072 and 3073 and the end PCB 3090, and so that the busbars 3071, 3072 and 3073 can extend to contact screws 3116a, 3116b and 3116c provided on the connector arrangement 3115. This particular shape of the end plate 3110 is shown in FIG. 55A, where regions 3110a and 3110b of the endplate 3110 correspond with the regions 3115b and 3115c of the connector arrangement 3115, respectively. Further, a region 3110c of the end plate 3110 is provided so as to enable connection between the internal fluid delivery tubes 3006 and the fluid delivery connectors 3047 and 3048 of the printhead module 3030.

The end housing 3120 is also shaped as shown in FIG. 55A, so as to retain the power supply, data and fluid delivery connection portions 3116, 3117 and 3118 so that external connection regions thereof, such as the external tube connector 3118c of the fluid delivery connection portion 3118 shown in FIG. 52C, are exposed from the printhead assembly 3010, as shown in FIG. 49.

Figure 55B:
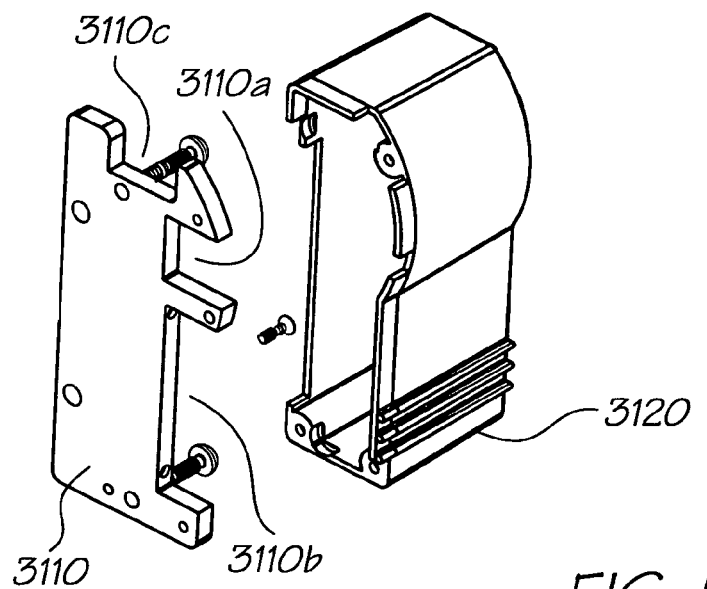
FIG. 55B shows an exploded perspective view of an end housing and plate assembly which forms a portion of the printhead assembly of FIG. 21.
Figure 56:
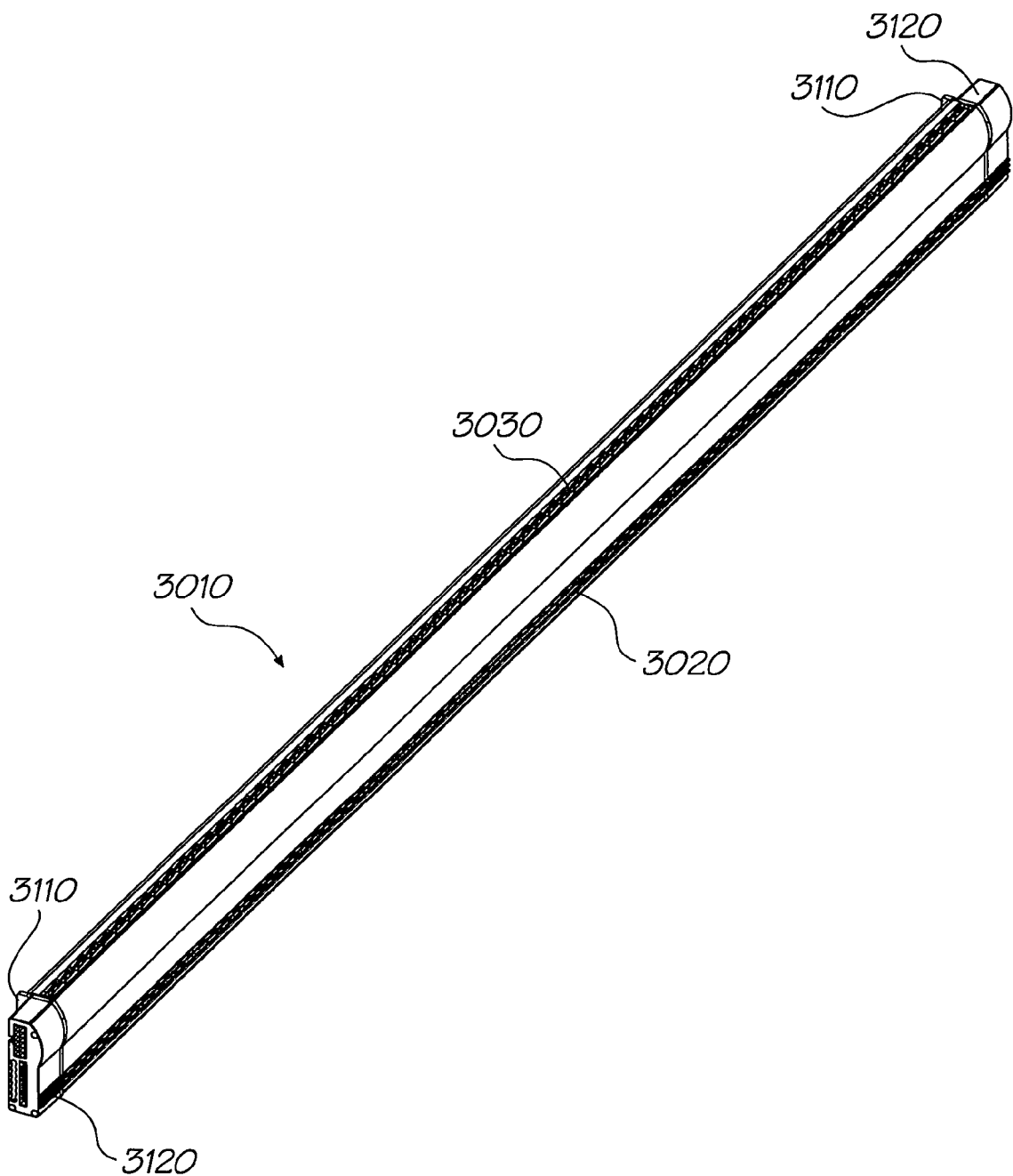
FIG. 56 shows a perspective view of the printhead assembly when in a form which uses both of the end housing and plate assemblies of FIGS. 55A and 55B.

FIG. 55B illustrates the end plate 3110 and the end housing 3120 which may be provided at the other end of the casing 3020 of the printhead assembly 3010 according to an exemplary embodiment of the present invention. The exemplary embodiment shown in FIG. 55B, for example, corresponds to a situation where an end housing is provided at both ends of the casing so as to provide power supply and/or fluid delivery connections at both ends of the printhead assembly. Such an exemplary printhead assembly is shown in FIG. 56, and corresponds, for example, to the above-mentioned exemplary application of wide format printing, in which the printhead assembly is relatively long.

Figure 57:
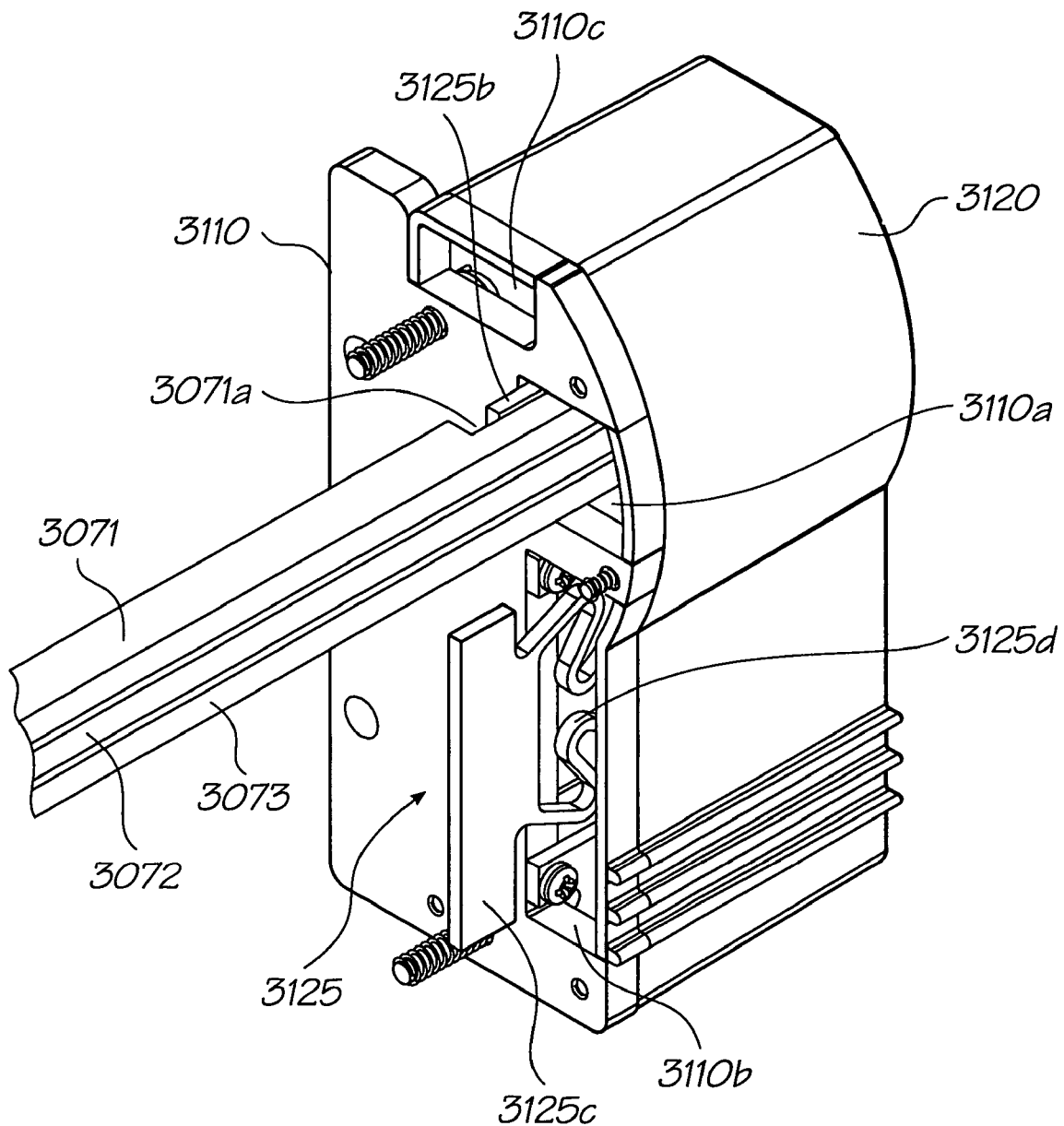
FIG. 57 illustrates a connector arrangement housed in the end housing and plate assembly of FIG. 55B.

To this end, FIG. 57 illustrates the end housing and plate assembly for the other end of the casing with the connector arrangement 3125 housed therein. The busbars 3071, 3072 and 3073 are shown attached to the connector arrangement 3125 for illustration purposes. As can be seen, the busbars 3071, 3072 and 3073 are provided with connection regions 3071a, 3072a and 3073a for engagement with connector arrangement 3125, similar to that shown in FIG. 51 for the connector arrangement 3115. The connector arrangement 3125 is illustrated in more detail in FIGS. 58A and 58B.

Figure 58A:
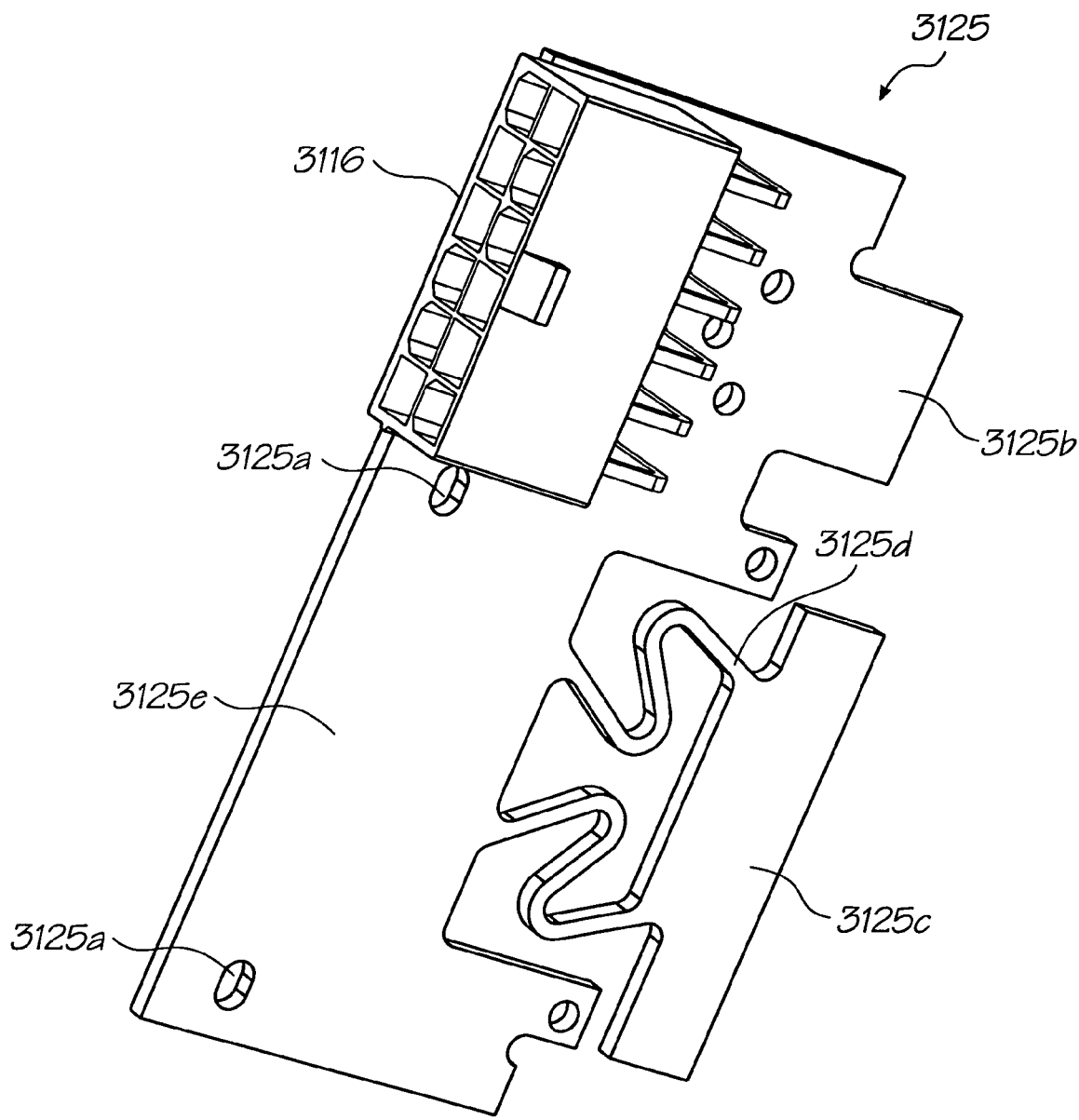
FIGS. 58A and 58B shows opposite side views of the connector arrangement of FIG. 57.
Figure 58B:
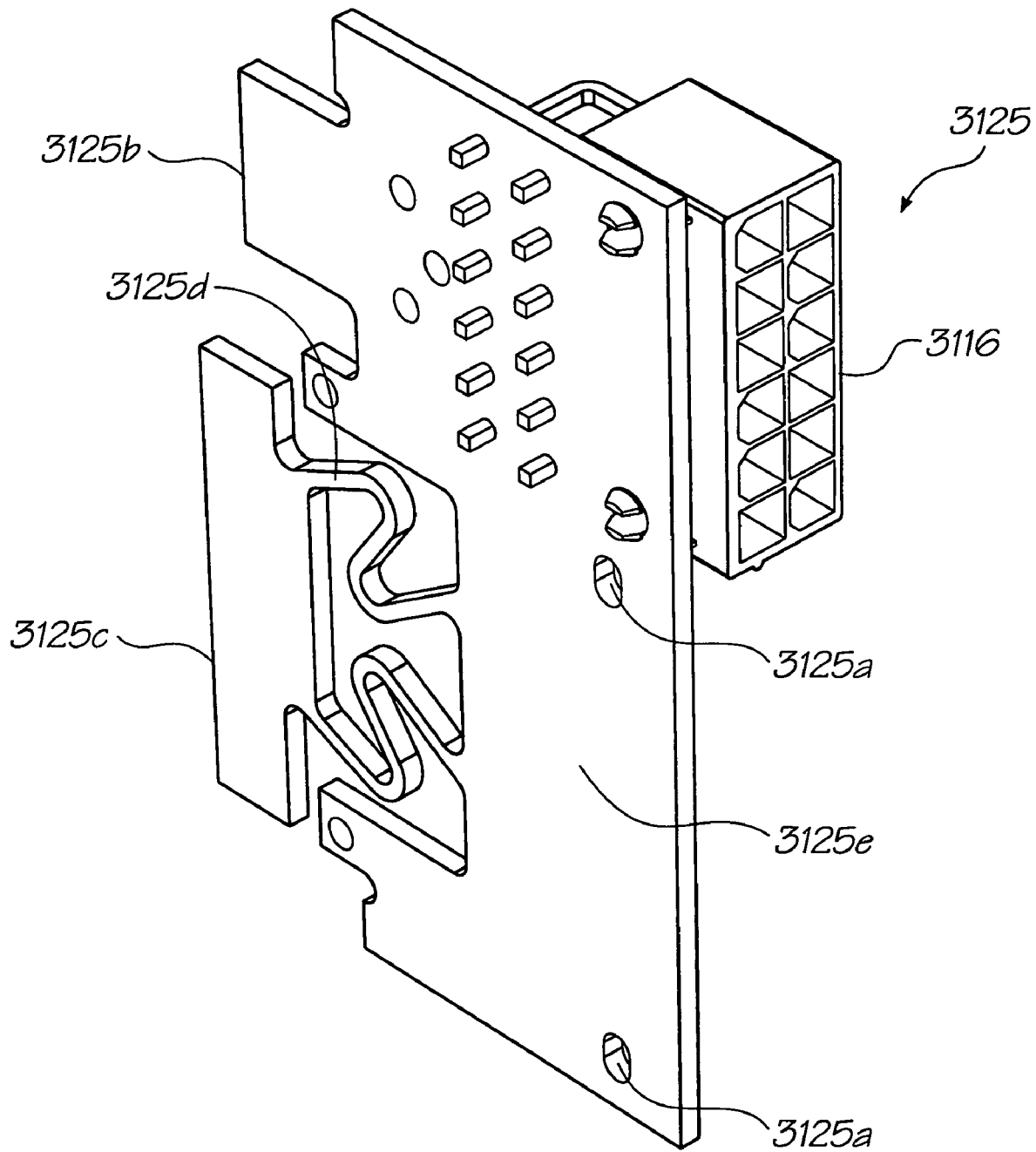

As can be seen from FIGS. 58A and 58B, like the connector arrangement 3115, the connector arrangement 3125 holds the power supply connection portion 3116 and includes places for contact screws for contact with the busbars 3071, 3072 and 3073, holes 3125a for retaining the clips 3118a of the fluid delivery portion 3118 (not shown), and regions 3125b and 3125c for extension into the casing 3020 through regions 3110 and 3110b of the end plate 3110, respectively. However, unlike the connector arrangement 3115, the connector arrangement 3125 does not hold the data connection portion 3117 and includes in place thereof a spring portion 3125d.

This is because, unlike the power and fluid supply in a relatively long printhead assembly application, it is only necessary to input the driving data from one end of the printhead assembly. However, in order to input the data signals correctly to the plurality of PEC integrated circuits 3100, it is necessary to terminate the data signals at the end opposite to the data input end. Therefore, the region 3125c of the connector arrangement 3125 is provided with termination regions (not shown) which correspond with the edge contacting regions on the underside of the end PCB 3090 at the terminating end. These termination regions are suitably connected with the contacting regions via a connecting member 3102, in the manner described above.

The purpose of the spring portion 3125d is to maintain these terminal connections even in the event of the casing 3020 expanding and contracting due to temperature variations as described previously, any effect of which may exacerbated in the longer printhead applications. The configuration of the spring portion 3125d shown in FIGS. 58A and 58B, for example, enables the region 3125c to be displaced through a range of distances from a body portion 3125e of the connector arrangement 3125, whilst being biased in a normal direction away from the body portion 3125e.

Thus, when the connector arrangement 3125 is attached to the end plate 3110, which in turn has been attached to the casing 3020, the region 3125c is brought into abutting contact with the adjacent edge of the end PCB 3090 in such a manner that the spring portion 3125d experiences a pressing force on the body of the connector arrangement 3125, thereby displacing the region 3125c from its rest position toward the body portion 3125e by a predetermined amount. This arrangement ensures that in the event of any dimensional changes of the casing 3020 via thermal expansion and contraction thereof, the data signals remain terminated at the end of the plurality of PCBs 3090 opposite to the end of data signal input as follows.

The PCB supports 3091 are retained on the support frame 3022 of the casing 3020 so as to "float" thereon, similar to the manner in which the printhead module(s) 3030 "float" on the channel 3021 as described earlier. Consequently, since the supports 3091 and the fluid channel members 3040 of the printhead modules 3030 are formed of similar materials, such as LCP or the like, which have the same or similar coefficients of expansion, then in the event of any expansion and contraction of the casing 3020, the supports 3091 retain their relative position with the printhead module(s) 3030 via the clipping of the extending arm portions 3094.

Therefore, each of the supports 3091 retain their adjacent connections via the connecting members 3102, which is facilitated by the relatively large overlap of the connecting members 3102 and the connection strips 3090a and 3090b of the PCBs 3090 as shown in FIG. 47. Accordingly, since the PCBs 3090, and therefore the supports 3091 to which they are mounted, are biased towards the connector arrangement 3115 by the spring portion 3125d of the connector arrangement 3125, then should the casing 3020 expand and contract, any gaps which might otherwise form between the connector arrangements 3115 and 3125 and the end PCBs 3090 are prevented, due to the action of the spring portion 3125d.

Accommodation for any expansion and contraction is also facilitated with respect to the power supply by the connecting regions 3071a, 3072a and 3073a of the two groups of busbars 3070 which are used in the relatively long printhead assembly application. This is because, these connecting regions 3071a, 3072a and 3073a are configured so that the overlap region between the two groups of busbars 3070 allows for the relative movement of the connector arrangements 3115 and 3125 to which the busbars 3071, 3072 and 3073 are attached whilst maintaining a connecting overlap in this region.

In the examples illustrated in FIGS. 50, 53B, 53C and 57, the end sections of the busbars 3071, 3072 and 3073 are shown connected to the connector arrangements 3115 and 3125 (via the contact screws 3116a, 3116b and 3116c) on the front surface of the connector arrangements 3115 and 3125 (with respect to the direction of mounting to the casing 3020). Alternatively, the busbars 3071, 3072 and 3073 can be connected at the rear surfaces of the connector arrangements 3115 and 3125. In such an alternative arrangement, even though the busbars 3071, 3072 and 3073 thus connected may cause the connector arrangements 3115 and 3125 be slightly displaced toward the cover portion 3023, the regions 3115c and 3125c of the connector arrangements 3115 and 3125 are maintained in substantially the same plane as the edge contacting regions of the end PCBs 3090 due to the clip portions 3112d of the support members 3112 which retain the upper and lower side surfaces of the regions 3115c and 3125c.

Printed circuit boards having connecting regions printed in discrete areas may be employed as the connector arrangements 3115 and 3125 in order to provide the various above-described electrical connections provided thereby.

Figure 59:
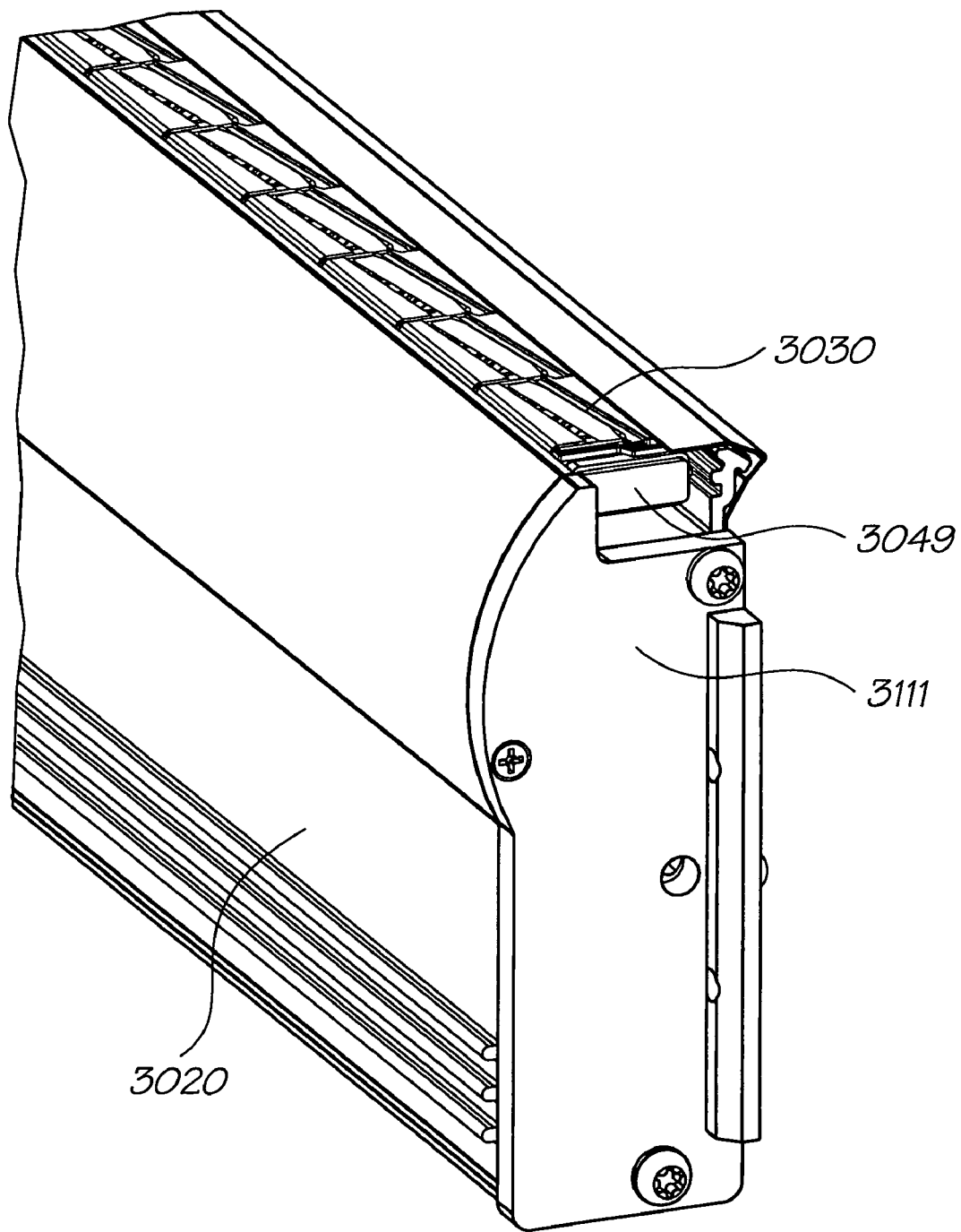
FIG. 59 illustrates an end plate when attached to the printhead assembly of FIG. 49.

FIG. 59 illustrates the end plate 3111 which may be attached to the other end of the casing 3020 of the printhead assembly 3010 according to an exemplary embodiment of the present invention, instead of the end housing and plate assemblies shown in FIGS. 55A and 55B. This provides for a situation where the printhead assembly is not of a length which requires power and fluid to be supplied from both ends. For example, in an A4-sized printing application where a printhead assembly housing one printhead module of 16 printhead tiles may be employed.

In such a situation therefore, since it is unnecessary specifically to provide a connector arrangement at the end of the printhead module 3030 which is capped by the capping member 3049, then the end plate 3111 can be employed which serves to securely hold the support frame 3022 and cover portion 3023 of the casing 3020 together via screws secured to the threaded portions 3022a, 22b and 23b thereof, in the manner already described (see also FIG. 22).

Further, if it is necessary to provide data signal termination at this end of the plurality of PCBs 3090, then the end plate 3111 can be provided with a slot section (not shown) on the inner surface thereof (with respect to the mounting direction on the casing 3020), which can support a PCB (not shown) having termination regions which correspond with the edge contacting regions of the end PCB 3090, similar to the region 3125c of the connector arrangement 3125. Also similarly, these termination regions may be suitably connected with the contacting regions via a support member 3112 and a connecting member 3102. This PCB may also include a spring portion between the termination regions and the end plate 3111, similar to the spring portion 3125d of the connector arrangement 3125, in case expansion and contraction of the casing 3020 may also cause connection problems in this application.

With either the attachment of the end housing 3120 and plate 3110 assemblies to both ends of the casing 3020 or the attachment of the end housing 3120 and plate 3110 assembly to one end of the casing 3020 and the end plate 3111 to the other end, the structure of the printhead assembly according to the present invention is completed.

The thus-assembled printhead assembly can then be mounted to a printing unit to which the assembled length of the printhead assembly is applicable. Exemplary printing units to which the printhead module and printhead assembly of the present invention is applicable are as follows.

For a home office printing unit printing on A4 and letter-sized paper, a printhead assembly having a single printhead module comprising 11 printhead integrated circuits can be used to present a printhead width of 224 mm. This printing unit is capable of printing at approximately 60 pages per minute (ppm) when the nozzle speed is about 20 kHz. At this speed a maximum of about 1690×10$^6$ drops or about 1.6896 ml of ink is delivered per second for the entire printhead. This results in a linear printing speed of about 0.32 ms$^{-1}$ or an area printing speed of about 0.07 sqms$^{-1}$. A single PEC integrated circuit can be used to drive all 11 printhead integrated circuits, with the PEC integrated circuit calculating about 1.8 billion dots per second.

For a printing unit printing on A3 and tabloid-sized paper, a printhead assembly having a single printhead module comprising 16 printhead integrated circuits can be used to present a printhead width of 325 mm. This printing unit is capable of printing at approximately 120 ppm when the nozzle speed is about 55 kHz. At this speed a maximum of about 6758×10$^6$ drops or about 6.7584 ml of ink is delivered per second for the entire printhead. This results in a linear printing speed of about 0.87 ms$^{-1}$ or an area printing speed of about 0.28 sqms$^{-1}$. Four PEC integrated circuits can be used to each drive four of the printhead integrated circuits, with the PEC integrated circuits collectively calculating about 7.2 billion dots per second.

For a printing unit printing on a roll of wallpaper, a printhead assembly having one or more printhead modules providing 36 printhead integrated circuits can be used to present a printhead width of 732 mm. When the nozzle speed is about 55 kHz, a maximum of about 15206×10⁶ drops or about 15.2064 ml of ink is delivered per second for the entire printhead. This results in a linear printing speed of about 0.87 ms$^{-1}$ or an area printing speed of about 0.64 sqms$^{-1}$. Nine PEC integrated circuits can be used to each drive four of the printhead integrated circuits, with the PEC integrated circuits collectively calculating about 16.2 billion dots per second.

For a wide format printing unit printing on a roll of print media, a printhead assembly having one or more printhead modules providing 92 printhead integrated circuits can be used to present a printhead width of 1869 mm. When the nozzle speed is in a range of about 15 to 55 kHz, a maximum of about 10598×10⁶ to 38861×10⁶ drops or about 10.5984 to 38.8608 ml of ink is delivered per second for the entire printhead. This results in a linear printing speed of about 0.24 to 0.87 ms$^{-1}$ or an area printing speed of about 0.45 to 1.63 sqms$^{-1}$. At the lower speeds, six PEC integrated circuits can be used to each drive 16 of the printhead integrated circuits (with one of the PEC integrated circuits driving 12 printhead integrated circuits), with the PEC integrated circuits collectively calculating about 10.8 billion dots per second. At the higher speeds, 23 PEC integrated circuits can be used each to drive four of the printhead integrated circuits, with the PEC integrated circuits collectively calculating about 41.4 billions dots per second.

For a "super wide" printing unit printing on a roll of print media, a printhead assembly having one or more printhead modules providing 200 printhead integrated circuits can be used to present a printhead width of 4064 mm. When the nozzle speed is about 15 kHz, a maximum of about 23040× 10⁶ drops or about 23.04 ml of ink is delivered per second for the entire printhead. This results in a linear printing speed of about 0.24 ms$^{-1}$ or an area printing speed of about 0.97 sqms$^{-1}$. Thirteen PEC integrated circuits can be used to each drive 16 of the printhead integrated circuits (with one of the PEC integrated circuits driving eight printhead integrated circuits), with the PEC integrated circuits collectively calculating about 23.4 billion dots per second.

For the above exemplary printing unit applications, the required printhead assembly may be provided by the corresponding standard length printhead module or built-up of several standard length printhead modules. Of course, any of the above exemplary printing unit applications may involve duplex printing with simultaneous double-sided printing, such that two printhead assemblies are used each having the number of printhead tiles given above. Further, those skilled in the art understand that these applications are merely examples and the number of printhead integrated circuits, nozzle speeds and associated printing capabilities of the printhead assembly depends upon the specific printing unit application.

Print Engine Controller Integrated Circuit

The functions and structure of the PEC integrated circuit applicable to the printhead assembly of the present invention will now be discussed with reference to FIGS. 60 to 62.

In the above-described exemplary embodiments of the present invention, the printhead integrated circuits 3051 of the printhead assembly 3010 are controlled by the PEC integrated circuits 3100 of the drive electronics 3100. One or more PEC integrated circuits 3100 is or are provided in order to enable pagewidth printing over a variety of different sized pages. As described earlier, each of the PCBs 3090 supported by the PCB supports 3091 has one PEC integrated circuit 3100 which interfaces with four of the printhead integrated circuits 3051, where the PEC integrated circuit 3100 essentially drives the printhead integrated circuits 3051 and transfers received print data thereto in a form suitable for printing.

An exemplary PEC integrated circuit which is suited to driving the printhead integrated circuits of the present invention is described in the Applicant's co-pending U.S. patent applications Ser. Nos. 09/575,108 09/575,109, 09/575,110, 09/607,985, 09/607,990 and 09/606,999, which are incorporated herein by reference.

Figure 60:
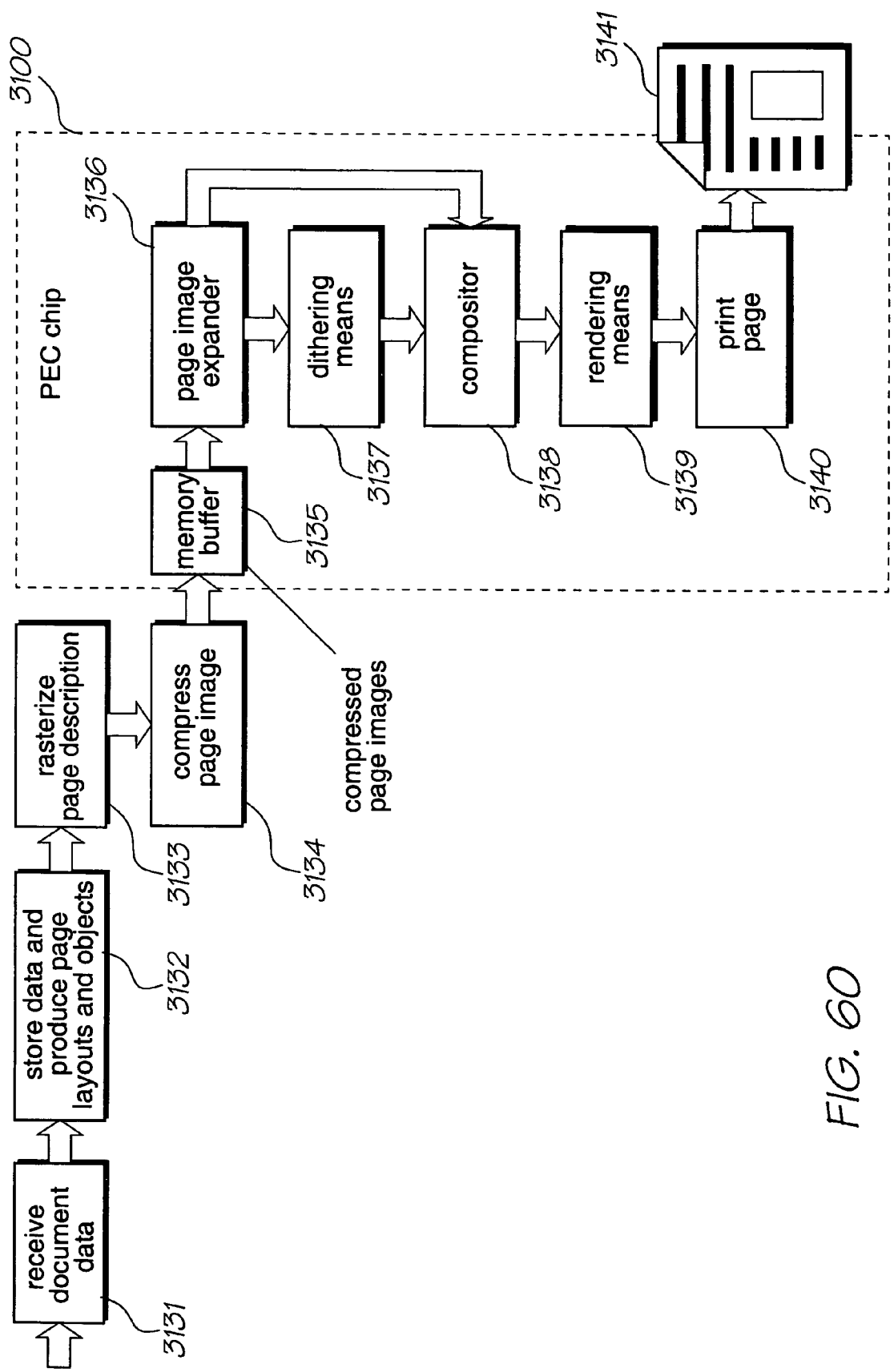
FIG. 60 illustrates data flow and functions performed by a print engine controller integrated circuit that forms one of the circuit components shown in FIG. 38A.

Referring to FIG. 60, the data flow and functions performed by the PEC integrated circuit 3100 will be described for a situation where the PEC integrated circuit 3100 is suited to driving a printhead assembly having a plurality of printhead modules 3030. As described above, the printhead module 3030 of one embodiment of the present invention utilises six channels of fluid for printing. These are:

Cyan, Magenta and Yellow (CMY) for regular colour printing;

Black (K) for black text and other black or greyscale printing;

Infrared (IR) for tag-enabled applications; and

Fixative (F) to enable printing at high speed.

As shown in FIG. 60, documents are typically supplied to the PEC integrated circuit 3100 by a computer system or the like, having Raster Image Processor(s) (RIP(s)), which is programmed to perform various processing steps 3131 to 3134 involved in printing a document prior to transmission to the PEC integrated circuit 3100. These steps typically involve receiving the document data (step 3131) and storing this data in a memory buffer of the computer system (step 3132), in which page layouts may be produced and any required objects may be added. Pages from the memory buffer are rasterized by the RIP (step 3133) and are then compressed (step 3134) prior to transmission to the PEC integrated circuit 3100. Upon receiving the page data, the PEC integrated circuit 3100 processes the data so as to drive the printhead integrated circuits 3051.

Due to the page-width nature of the printhead assembly of the present invention, each page must be printed at a constant speed to avoid creating visible artifacts. This means that the printing speed cannot be varied to match the input data rate. Document rasterization and document printing are therefore decoupled to ensure the printhead assembly has a constant supply of data. In this arrangement, a page is not printed until it is fully rasterized, and in order to achieve a high constant printing speed a compressed version of each rasterized page image is stored in memory. This decoupling also allows the RIP(s) to run ahead of the printer when rasterizing simple pages, buying time to rasterize more complex pages.

Because contone colour images are reproduced by stochastic dithering, but black text and line graphics are reproduced directly using dots, the compressed page image format contains a separate foreground bi-level black layer and background contone colour layer. The black layer is composited over the contone layer after the contone layer is dithered (although the contone layer has an optional black component). If required, a final layer of tags (in IR or black ink) is optionally added to the page for printout.

Dither matrix selection regions in the page description are rasterized to a contone-resolution bi-level bitmap which is losslessly compressed to negligible size and which forms part of the compressed page image. The IR layer of the printed page optionally contains encoded tags at a programmable density.

As described above, the RIP software/hardware rasterizes each page description and compresses the rasterized page image. Each compressed page image is transferred to the PEG integrated circuit 3100 where it is then stored in a memory buffer 3135. The compressed page image is then retrieved and fed to a page image expander 3136 in which page images are retrieved. If required, any dither may be applied to any contone layer by a dithering means 3137 and any black bi-level layer may be composited over the contone layer by a compositor 3138 together with any infrared tags which may be rendered by the rendering means 3139. Returning to a description of process steps, the PEC integrated circuit 3100 then drives the printhead integrated circuits 3051 to print the composited page data at step 3140 to produce a printed page 3141.

In this regard, the process performed by the PEC integrated circuit 3100 can be considered to consist of a number of distinct stages. The first stage has the ability to expand a JPEG-compressed contone CMYK layer, a Group 4 Fax-compressed bi-level dither matrix selection map, and a Group 4 Fax-compressed bi-level black layer, all in parallel. In parallel with this, bi-level IR tag data can be encoded from the compressed page image. The second stage dithers the contone CMYK layer using a dither matrix selected by a dither matrix select map, composites the bi-level black layer over the resulting bi-level K layer and adds the IR layer to the page. A fixative layer is also generated at each dot position wherever there is a need in any of the C, M, Y, K, or IR channels. The last stage prints the bi-level CMYK+IR data through the printhead assembly.

Figure 61:
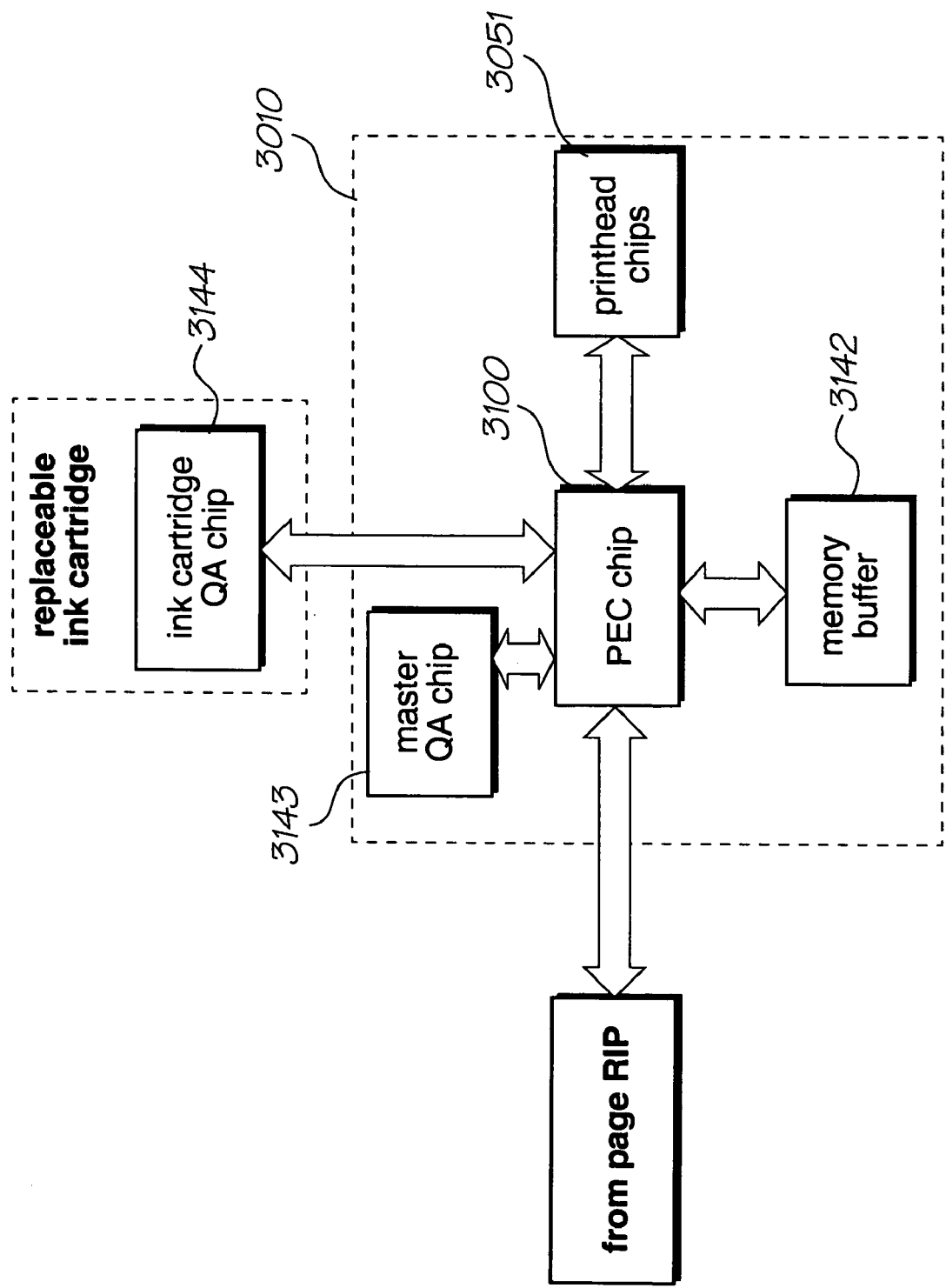
FIG. 61 illustrates the print engine controller integrated circuit of FIG. 60 in the context of an overall printing system architecture.
Figure 62:
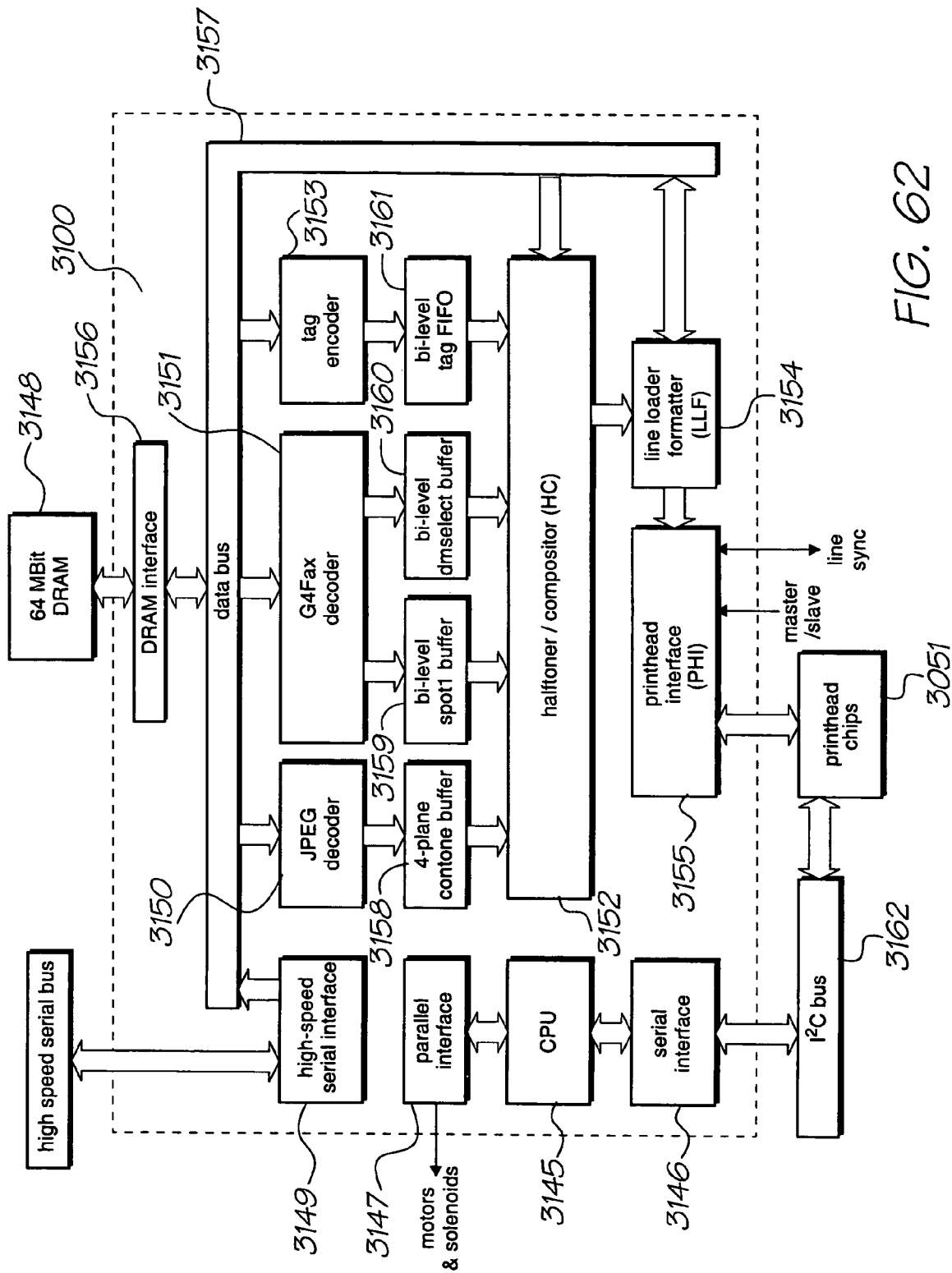
FIG. 62 illustrates the architecture of the print engine controller integrated circuit of FIG. 61.

FIG. 61 shows an exemplary embodiment of the printhead assembly of the present invention including the PEC integrated circuit(s) 3100 in the context of the overall printing system architecture. As shown, the various components of the printhead assembly includes:

- a PEC integrated circuit 3100 which is responsible for receiving the compressed page images for storage in a memory buffer 3142, performing the page expansion, black layer compositing and sending the dot data to the printhead integrated circuits 3051. The PEC integrated circuit 3100 may also communicate with a master Quality Assurance (QA) integrated circuit 3143 and a (replaceable) ink cartridge QA integrated circuit 3144, and provides a means of retrieving the printhead assembly characteristics to ensure optimum printing;
- the memory buffer 3142 for storing the compressed page image and for scratch use during the printing of a given page. The construction and working of memory buffers is known to those skilled in the art and a range of standard integrated circuits and techniques for their use might be utilized in use of the PEC integrated circuit(s) 3100; and
- the master integrated circuit 3143 which is matched to the replaceable ink cartridge QA integrated circuit 3144. The construction and working of QA integrated circuits is known to those skilled in the art and a range of known QA processes might be utilized in use of the PEC integrated circuit(s) 3100;

As mentioned in part above, the PEC integrated circuit 3100 of the present invention essentially performs four basic levels of functionality:

- receiving compressed pages via a serial interface such as an IEEE 1394;
- acting as a print engine for producing a page from a compressed form. The print engine functionality includes expanding the page image, dithering the contone layer, compositing the black layer over the contone layer, optionally adding infrared tags, and sending the resultant image to the printhead integrated circuits;
- acting as a print controller for controlling the printhead integrated circuits and stepper motors of the printing system; and
- serving as two standard low-speed serial ports for communication with the two QA integrated circuits. In this regard, two ports are used, and not a single port, so as to ensure strong security during authentication procedures.

These functions are now described in more detail with reference to FIG. 62 which provides a more specific illustration of the PEC integrated circuit architecture according to an exemplary embodiment of the present invention.

The PEC integrated circuit 3100 incorporates a simple micro-controller CPU core 3145 to perform the following functions:

- perform QA integrated circuit authentication protocols via a serial interface 3146 between print pages;
- run the stepper motor of the printing system via a parallel interface 3147 during printing to control delivery of the paper to the printhead integrated circuits 3051 for printing (the stepper motor requires a 5 KHz process);
- synchronize the various components of the PEC integrated circuit 3100 during printing;
- provide a means of interfacing with external data requests (programming registers etc.);
- provide a means of interfacing with the corresponding printhead module's low-speed data requests (such as reading the characterization vectors and writing pulse profiles); and
- provide a means of writing the portrait and landscape tag structures to an external DRAM 3148.

In order to perform the page expansion and printing process, the PEC integrated circuit 3100 includes a high-speed serial interface 3149 (such as a standard IEEE 1394 interface), a standard JPEG decoder 3150, a standard Group 4 Fax decoder 3151, a custom halftoner/compositor (HC) 3152, a custom tag encoder 3153, a line loader/formatter (LLF) 154, and a printhead interface 3155 (PHI) which communicates with the printhead integrated circuits 3051. The decoders 3150 and 3151 and the tag encoder 3153 are buffered to the HC 3152. The tag encoder 3153 establishes an infrared tag(s) to a page according to protocols dependent on what uses might be made of the page.

The print engine function works in a double-buffered manner. That is, one page is loaded into the external DRAM 3148 via a DRAM interface 3156 and a data bus 3157 from the high-speed serial interface 3149, while the previously loaded page is read from the DRAM 3148 and passed through the print engine process. Once the page has finished printing, then the page just loaded becomes the page being printed, and a new page is loaded via the high-speed serial interface 3149.

At the aforementioned first stage, the process expands any JPEG-compressed contone (CMYK) layers, and expands any of two Group 4 Fax-compressed bi-level data streams. The two streams are the black layer (although the PEC integrated circuit 3100 is actually colour agnostic and this bi-level layer can be directed to any of the output inks) and a matte for selecting between dither matrices for contone dithering. At the second stage, in parallel with the first, any tags are encoded for later rendering in either IR or black ink.

Finally, in the third stage the contone layer is dithered, and position tags and the bi-level spot layer are composited over the resulting bi-level dithered layer. The data stream is ideally adjusted to create smooth transitions across overlapping segments in the printhead assembly and ideally it is adjusted to compensate for dead nozzles in the printhead assembly. Up to six channels of bi-level data are produced from this stage.

However, it will be understood by those skilled in the art that not all of the six channels need be present on the printhead module 3030. For example, the printhead module 3030 may provide for CMY only, with K pushed into the CMY channels and IR ignored. Alternatively, the position tags may be printed in K if IR ink is not available (or for testing purposes). The resultant bi-level CMYK-IR dot-data is buffered and formatted for printing with the printhead integrated circuits 3051 via a set of line buffers (not shown). The majority of these line buffers might be ideally stored on the external DRAM 3148. In the final stage, the six channels of bi-level dot data are printed via the PHI 3155.

The HC 3152 combines the functions of halftoning the contone (typically CMYK) layer to a bi-level version of the same, and compositing the spot1 bi-level layer over the appropriate halftoned contone layer(s). If there is no K ink, the HC 3152 is able to map K to CMY dots as appropriate. It also selects between two dither matrices on a pixel-by-pixel basis, based on the corresponding value in the dither matrix select map. The input to the HC 3152 is an expanded contone layer (from the JPEG decoder 146) through a buffer 3158, an expanded bi-level spot1 layer through a buffer 3159, an expanded dither-matrix-select bitmap at typically the same resolution as the contone layer through a buffer 3160, and tag data at full dot resolution through a buffer (FIFO) 3161.

The HC 3152 uses up to two dither matrices, read from the external DRAM 3148. The output from the HC 3152 to the LLF 3154 is a set of printer resolution bi-level image lines in up to six colour planes. Typically, the contone layer is CMYK or CMY, and the bi-level spot1 layer is K. Once started, the HC 3152 proceeds until it detects an "end-of-page" condition, or until it is explicitly stopped via its control register (not shown).

The LLF 3154 receives dot information from the HC 3152, loads the dots for a given print line into appropriate buffer storage (some on integrated circuit (not shown) and some in the external DRAM 3148) and formats them into the order required for the printhead integrated circuits 3051. Specifically, the input to the LLF 3154 is a set of six 32-bit words and a DataValid bit, all generated by the HC 3152. The output of the LLF 3154 is a set of 190 bits representing a maximum of 15 printhead integrated circuits of six colours. Not all the output bits may be valid, depending on how many colours are actually used in the printhead assembly.

The physical placement of the nozzles on the printhead assembly of an exemplary embodiment of the present invention is in two offset rows, which means that odd and even dots of the same colour are for two different lines. The even dots are for line L, and the odd dots are for line L-2. In addition, there is a number of lines between the dots of one colour and the dots of another. Since the six colour planes for the same dot position are calculated at one time by the HC 3152, there is a need to delay the dot data for each of the colour planes until the same dot is positioned under the appropriate colour nozzle. The size of each buffer line depends on the width of the printhead assembly. Since a single PEC integrated circuit 3100 can generate dots for up to 15 printhead integrated circuits 3051, a single odd or even buffer line is therefore 15 sets of 640 dots, for a total of 9600 bits (1200 bytes). For example, the buffers required for six colour odd dots totals almost 45 KBytes.

The PHI 3155 is the means by which the PEC integrated circuit 3100 loads the printhead integrated circuits 3051 with the dots to be printed, and controls the actual dot printing process. It takes input from the LLF 3154 and outputs data to the printhead integrated circuits 3051. The PHI 3155 is capable of dealing with a variety of printhead assembly lengths and formats. The internal structure of the PHI 3155 allows for a maximum of six colours, eight printhead integrated circuits 3051 per transfer, and a maximum of two printhead integrated circuit 3051 groups which is sufficient for a printhead assembly having 15 printhead integrated circuits 3051 (8.5 inch) printing system capable of printing on A4/Letter paper at full speed.

A combined characterization vector of the printhead assembly 3010 can be read back via the serial interface 3146. The characterization vector may include dead nozzle information as well as relative printhead module alignment data. Each printhead module can be queried via its low-speed serial bus 3162 to return a characterization vector of the printhead module. The characterization vectors from multiple printhead modules can be combined to construct a nozzle defect list for the entire printhead assembly and allows the PEC integrated circuit 3100 to compensate for defective nozzles during printing. As long as the number of defective nozzles is low, the compensation can produce results indistinguishable from those of a printhead assembly with no defective nozzles.

Fluid Distribution Stack

An exemplary structure of the fluid distribution stack of the printhead tile will now be described with reference to FIG. 63.

Figure 63:
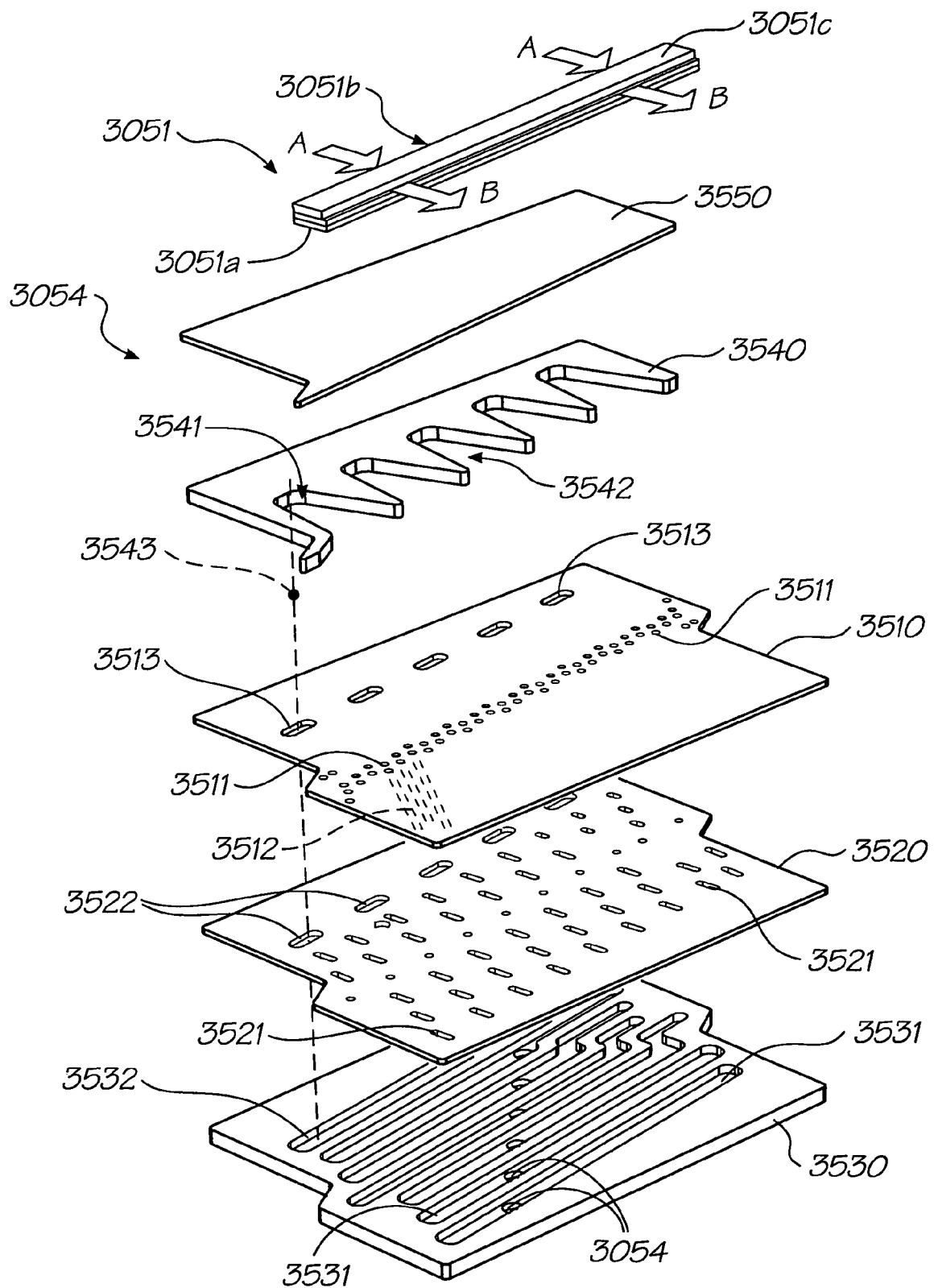
FIG. 63 shows an exploded view of a fluid distribution stack of elements that form the printhead tile of FIG. 25A.

FIG. 63 shows an exploded view of the fluid distribution stack 3500 with the printhead integrated circuit 3051 also shown in relation to the stack 3500. In the exemplary embodiment shown in FIG. 63, the stack 3500 includes three layers, an upper llayer 3510, a middle layer 3520 and a lower layer 3530, and further includes a channel layer 3540 and a plate 3550 which are provided in that order on top of the upper llayer 3510. Each of the layers 3510, 3520 and 3530 are formed as stainless-steel or micro-moulded plastic material sheets.

The printhead integrated circuit 3051 is bonded onto the upper llayer 3510 of the stack 3500, so as to overlie an array of holes 3511 etched therein, and therefore to sit adjacent the stack of the channel layer 3540 and the plate 3550. The printhead integrated circuit 3051 itself is formed as a multilayer stack of silicon which has fluid channels (not shown) in a bottom layer 3051a. These channels are aligned with the holes 3511 when the printhead integrated circuit 3051 is mounted on the stack 3500. In one embodiment of the present invention, the printhead integrated circuits 3051 are approximately 1 mm in width and 21 mm in length. This length is determined by the width of the field of a stepper which is used to fabricate the printhead integrated circuit 3051. Accordingly, the holes 3511 are arranged to conform to these dimensions of the printhead integrated circuit 3051.

The upper llayer 3510 has channels 3512 etched on the underside thereof (FIG. 63 shows only some of the channels 3512 as hidden detail). The channels 3512 extend as shown so that their ends align with holes 3521 of the middle layer 3520. Different ones of the channels 3512 align with different ones of the holes 3521. The holes 3521, in turn, align with channels 3531 in the lower layer 3530.

Each of the channels 3531 carries a different respective colour or type of ink, or fluid, except for the last channel, designated with the reference numeral 3532. The last channel 3532 is an air channel and is aligned with further holes 3522 of the middle layer 3520, which in turn are aligned with further holes 3513 of the upper layer 3510. The further holes 3513 are aligned with inner sides 3541 of slots 3542 formed in the channel layer 3540, so that these inner sides 3541 are aligned with, and therefore in fluid-flow communication with, the air channel 3532, as indicated by the dashed line 30543.

The lower layer 3530 includes the inlet ports 3054 of the printhead tile 3050, with each opening into the corresponding ones of the channels 3531 and 532.

In order to feed air to the printhead integrated circuit surface, compressed filtered air from an air source (not shown) enters the air channel 3532 through the corresponding inlet port 3054 and passes through the holes 3522 and 3513 and then the slots 3542 in the middle layer 3520, the upper llayer 3510 and the channel layer 3540, respectively. The air enters into a side surface 3051b of the printhead integrated circuit 3051 in the direction of arrows A and is then expelled from the printhead integrated circuit 3051 substantially in the direction of arrows B. A nozzle guard 3051c may be further arranged on a top surface of the printhead integrated circuit 3051 partially covering the nozzles to assist in keeping the nozzles clear of print media dust.

In order to feed different colour and types of inks and other fluids (not shown) to the nozzles, the different inks and fluids enter through the inlet ports 3054 into the corresponding ones of the channels 3531, pass through the corresponding holes 3521 of the middle layer 3520, flow along the corresponding channels 3512 in the underside of the upper llayer 3510, pass through the corresponding holes 3511 of the upper llayer 3510, and then finally pass through the slots 3542 of the channel layer 3540 to the printhead integrated circuit 3051, as described earlier.

In traversing this path, the flow diameters of the inks and fluids are gradually reduced from the macro-sized flow diameter at the inlet ports 3054 to the required micro-sized flow diameter at the nozzles of the printhead integrated circuit 3051.

The exemplary embodiment of the fluid distribution stack shown in FIG. 63 is arranged to distribute seven different fluids to the printhead integrated circuit, including air, which is in conformity with the earlier described exemplary embodiment of the ducts of the fluid channel member. However, it will be understood by those skilled in the art that a greater or lesser number of fluids may be used depending on the specific printing application, and therefore the fluid distribution stack can be configured as necessary.

Nozzles and Actuators

An exemplary nozzle arrangement which is suitable for the printhead assembly of the present invention is described in the Applicant's co-pending/granted applications

| | | | | | |
|---|---|---|---|---|---|
| 6,227,652 | 6,213,588 | 6,213,589 | 6,231,163 | 6,247,795 | 6,394,581 |
| 6,244,691 | 6,257,704 | 6,416,168 | 6,220,694 | 6,257,705 | 6,247,794 |
| 6,234,610 | 6,247,793 | 6,264,306 | 6,241,342 | 6,247,792 | 6,264,307 |
| 6,254,220 | 6,234,611 | 6,302,528 | 6,283,582 | 6,239,821 | 6,338,547 |
| 6,247,796 | 6,557,977 | 6,390,603 | 6,362,843 | 6,293,653 | 6,312,107 |
| 6,227,653 | 6,234,609 | 6,238,040 | 6,188,415 | 6,227,654 | 6,209,989 |
| 6,247,791 | 6,336,710 | 6,217,153 | 6,416,167 | 6,243,113 | 6,283,581 |
| 6,247,790 | 6,260,953 | 6,267,469 | 6,273,544 | 6,309,048 | 6,420,196 |
| 6,443,558 | 6,439,689 | 6,378,989 | 09/425,420 | 6,634,735 | 6,299,289 |
| 6,299,290 | 6,425,654 | 6,623,101 | 6,406,129 | 6,505,916 | 6,457,809 |
| 6,550,895 | 6,457,812 | 6,428,133 | 6,390,605 | 6,322,195 | 6,612,110 |
| 6,480,089 | 6,460,778 | 6,305,788 | 6,426,014 | 6,364,453 | 6,457,795 |
| 6,595,624 | 6,417,757 | 6,623,106 | 10/129,433 | 6,575,549 | 6,659,590 |
| 10/129,503 | 10/129,437 | 6,439,693 | 6,425,971 | 6,478,406 | 6,315,399 |
| 6,338,548 | 6,540,319 | 6,328,431 | 6,328,425 | 09/575,127 | 6,383,833 |
| 6,464,332 | 6,390,591 | 09/575,152 | 09/575,176 | 6,322,194 | 09/575,177 |
| 6,629,745 | 09/608,780 | 6,428,139 | 6,575,549 | 09/693,079 | 09/693,135 |
| 6,428,142 | 6,565,193 | 6,609,786 | 6,609,787 | 6,439,908 | 09/693,735 |
| 6,588,885 | 6,502,306 | 6,652,071 | 10/407,212 | 10/407,207 | JUM003 |
| JUM004 | 10/302,274 | 10/302,669 | 10/303,352 | 10/303,348 | 10/303,433 |
| 10/303,312 | 10/302,668 | 10/302,577 | 10/302,644 | 10/302,618 | 10/302,617 |
| 10/302,297 | MTB01 | MTB02 | MTB03 | MTB04 | MTB05 |
| MTB06 | MTB07 | MTB08 | MTB09 | MTB10 | MTB11 |
| MTB12 | MTB13 | MTB14 | | | | which are incorporated herein by reference. Some applications have been temporarily identified by their docket number. These will be replaced by the corresponding USSN (or for PCT cases) International Patent application numbers when available.

Figure 64:
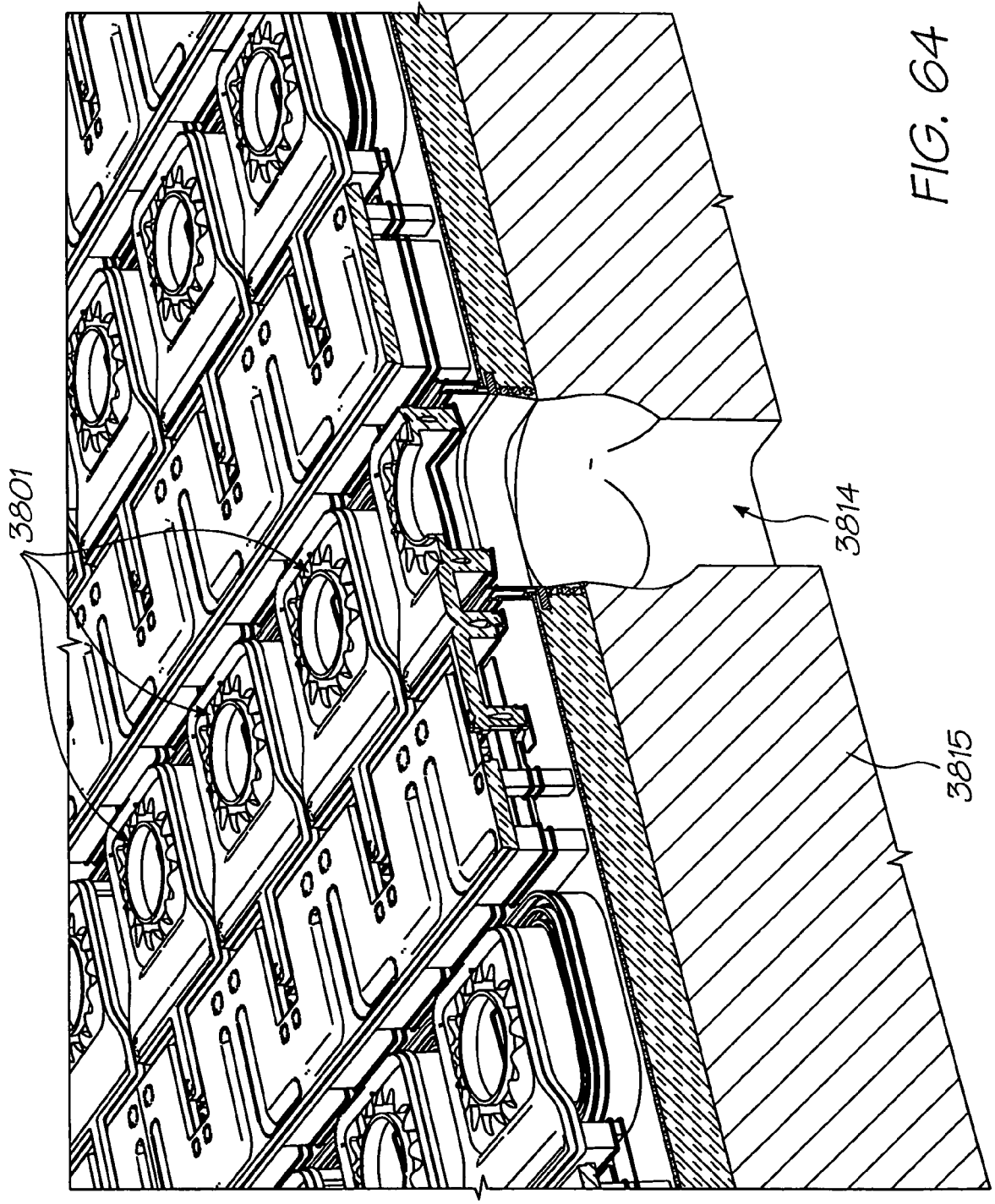
FIG. 64 shows a perspective view (partly in section) of a portion of a nozzle system of a printhead integrated circuit that is incorporated in the printhead module of the printhead assembly of FIG. 21.

This nozzle arrangement will now be described with reference to FIGS. 64 to 73. One nozzle arrangement which is incorporated in each of the printhead integrated circuits 3051 mounted on the printhead tiles 3050 (see FIG. 25A) includes a nozzle and corresponding actuator. FIG. 64 shows an array of the nozzle arrangements 3801 formed on a silicon substrate 3815. The nozzle arrangements are identical, but in one embodiment, different nozzle arrangements are fed with different coloured inks and fixative. It will be noted that rows of the nozzle arrangements 3801 are staggered with respect to each other, allowing closer spacing of ink dots during printing than would be possible with a single row of nozzles. The multiple rows also allow for redundancy (if desired), thereby allowing for a predetermined failure rate per nozzle.

Each nozzle arrangement 3801 is the product of an integrated circuit fabrication technique. As illustrated, the nozzle arrangement 3801 is constituted by a micro-electromechanical system (MEMS).

For clarity and ease of description, the construction and operation of a single nozzle arrangement 3801 will be described with reference to FIGS. 65 to 73.

Each printhead integrated circuit 3051 includes a silicon wafer substrate 3815. 0.42 Micron 1 P4M 12 volt CMOS microprocessing circuitry is positioned on the silicon wafer substrate 3815.

A silicon dioxide (or alternatively glass) layer 3817 is positioned on the wafer substrate 3815. The silicon dioxide layer 3817 defines CMOS dielectric layers. CMOS top-level metal defines a pair of aligned aluminium electrode contact layers 3830 positioned on the silicon dioxide layer 3817. Both the silicon wafer substrate 3815 and the silicon dioxide layer 3817 are etched to define an ink inlet channel 3814 having a generally circular cross section (in plan). An aluminium diffusion barrier 3828 of CMOS metal 1, CMOS metal 2/3 and CMOS top level metal is positioned in the silicon dioxide layer 3817 about the ink inlet channel 3814. The diffusion barrier 3828 serves to inhibit the diffusion of hydroxyl ions through CMOS oxide layers of the drive circuitry layer 3817.

A passivation layer in the form of a layer of silicon nitride 831 is positioned over the aluminium contact layers 3830 and the silicon dioxide layer 3817. Each portion of the passivation layer 3831 positioned over the contact layers 3830 has an opening 3832 defined therein to provide access to the contacts 3830.

Figure 65:
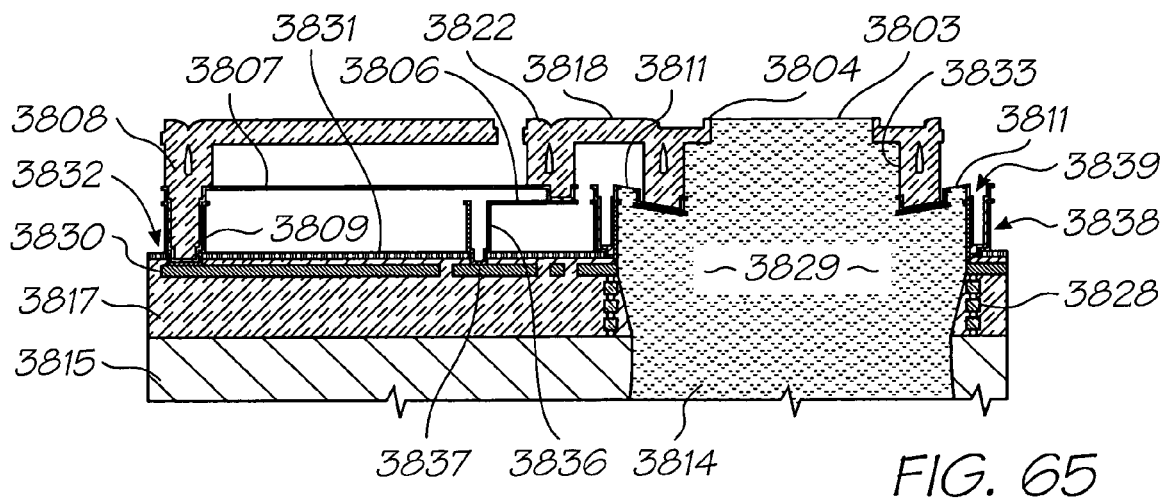
FIG. 65 shows a vertical sectional view of a single nozzle (of the nozzle system shown in FIG. 64) in a quiescent state.

The nozzle arrangement 3801 includes a nozzle chamber 3829 defined by an annular nozzle wall 3833, which terminates at an upper end in a nozzle roof and a radially inner nozzle rim 3804 that is circular in plan. The ink inlet channel 3814 is in fluid communication with the nozzle chamber 3829. At a lower end of the nozzle wall, there is disposed a movable rim 3810, that includes a movable seal lip 3840. An encircling wall 3838 surrounds the movable nozzle, and includes a stationary seal lip 3839 that, when the nozzle is at rest as shown in FIG. 65, is adjacent the moving rim 3810. A fluidic seal 3811 is formed due to the surface tension of ink trapped between the stationary seal lip 3839 and the moving seal lip 3840. This prevents leakage of ink from the chamber whilst providing a low resistance coupling between the encircling wall 3838 and the nozzle wall 3833.

Figure 72:
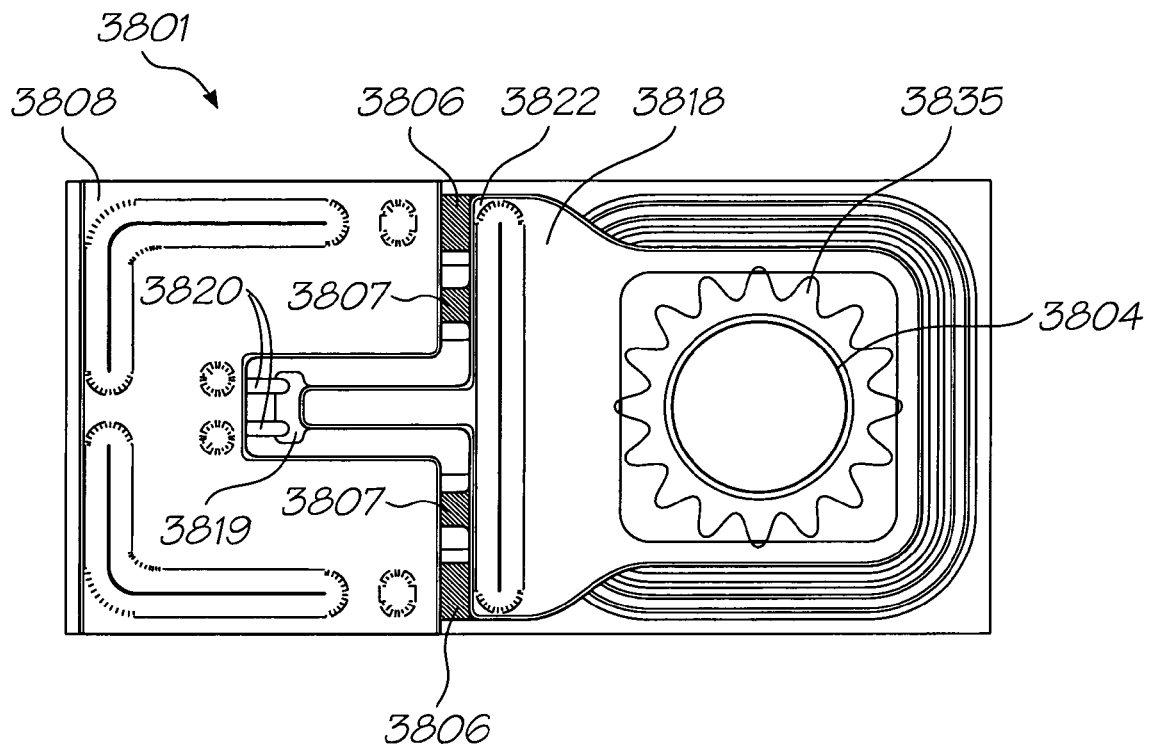
FIG. 72 shows a plan view of the nozzle of FIG. 65.

As best shown in FIG. 72, a plurality of radially extending recesses 3835 is defined in the roof about the nozzle rim 3804. The recesses 3835 serve to contain radial ink flow as a result of ink escaping past the nozzle rim 3804.

The nozzle wall 3833 forms part of a lever arrangement that is mounted to a carrier 3836 having a generally U-shaped profile with a base 3837 attached to the layer 3831 of silicon nitride.

Figure 68:
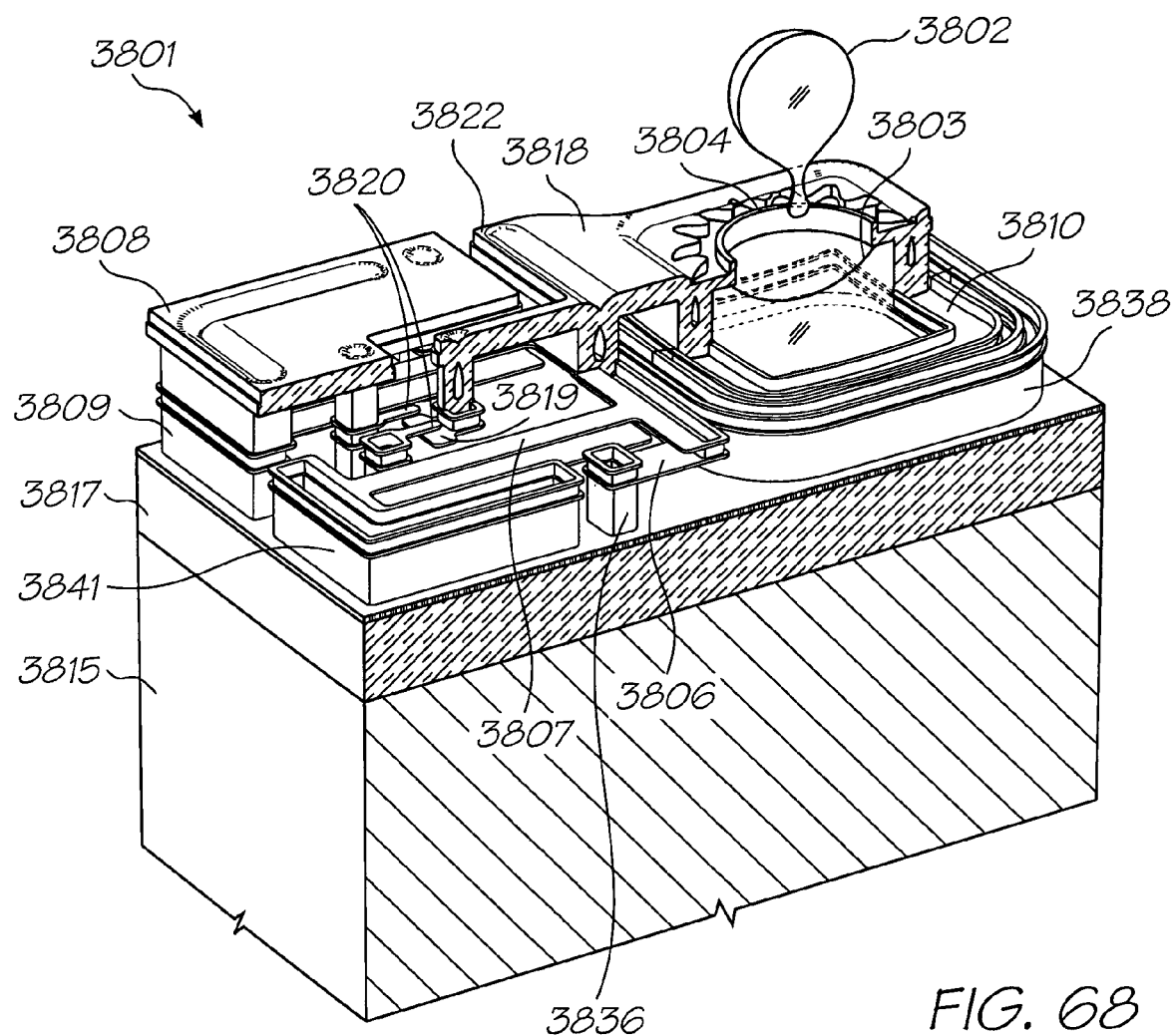
FIG. 68 shows in perspective a partial vertical sectional view of the nozzle of FIG. 65, at the actuation state shown in FIG. 66.
Figure 69:
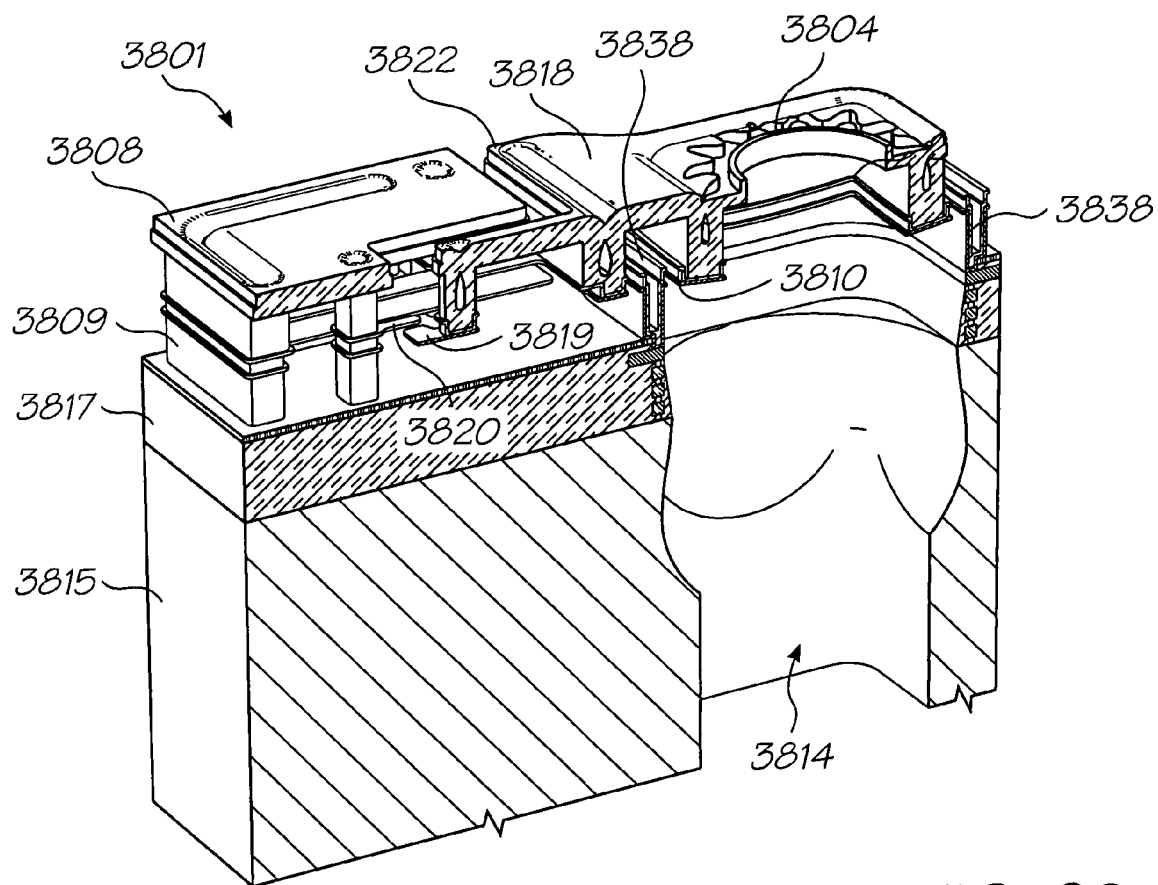
FIG. 69 shows in perspective a vertical section of the nozzle of FIG. 65, with ink omitted.
Figure 70:
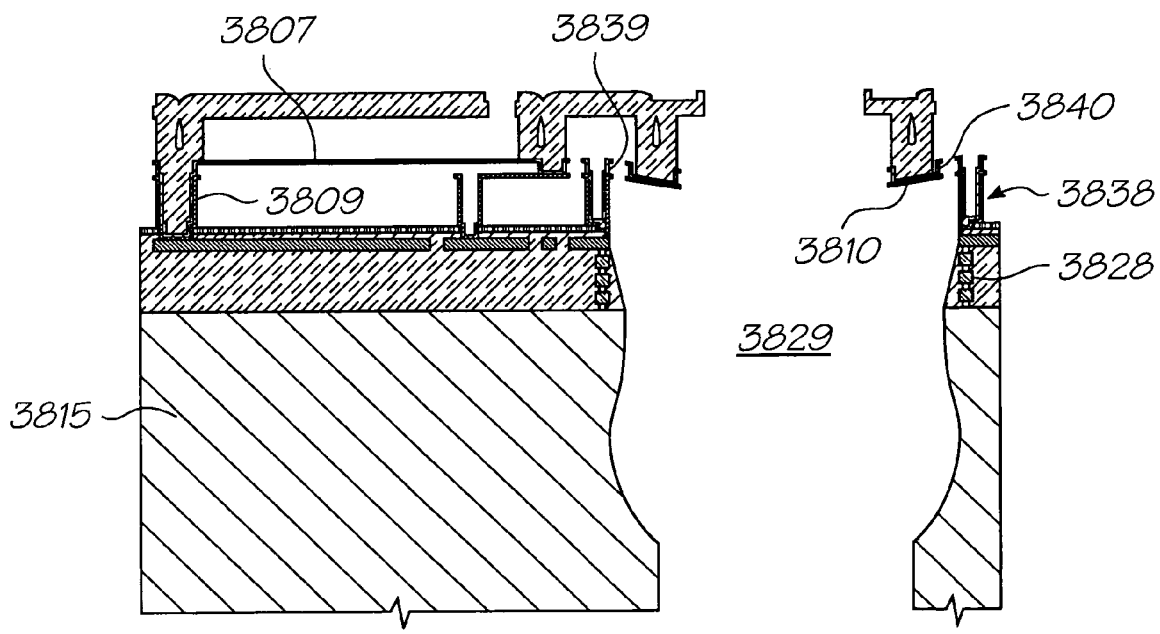
FIG. 70 shows a vertical sectional view of the nozzle of FIG. 69.
Figure 71:
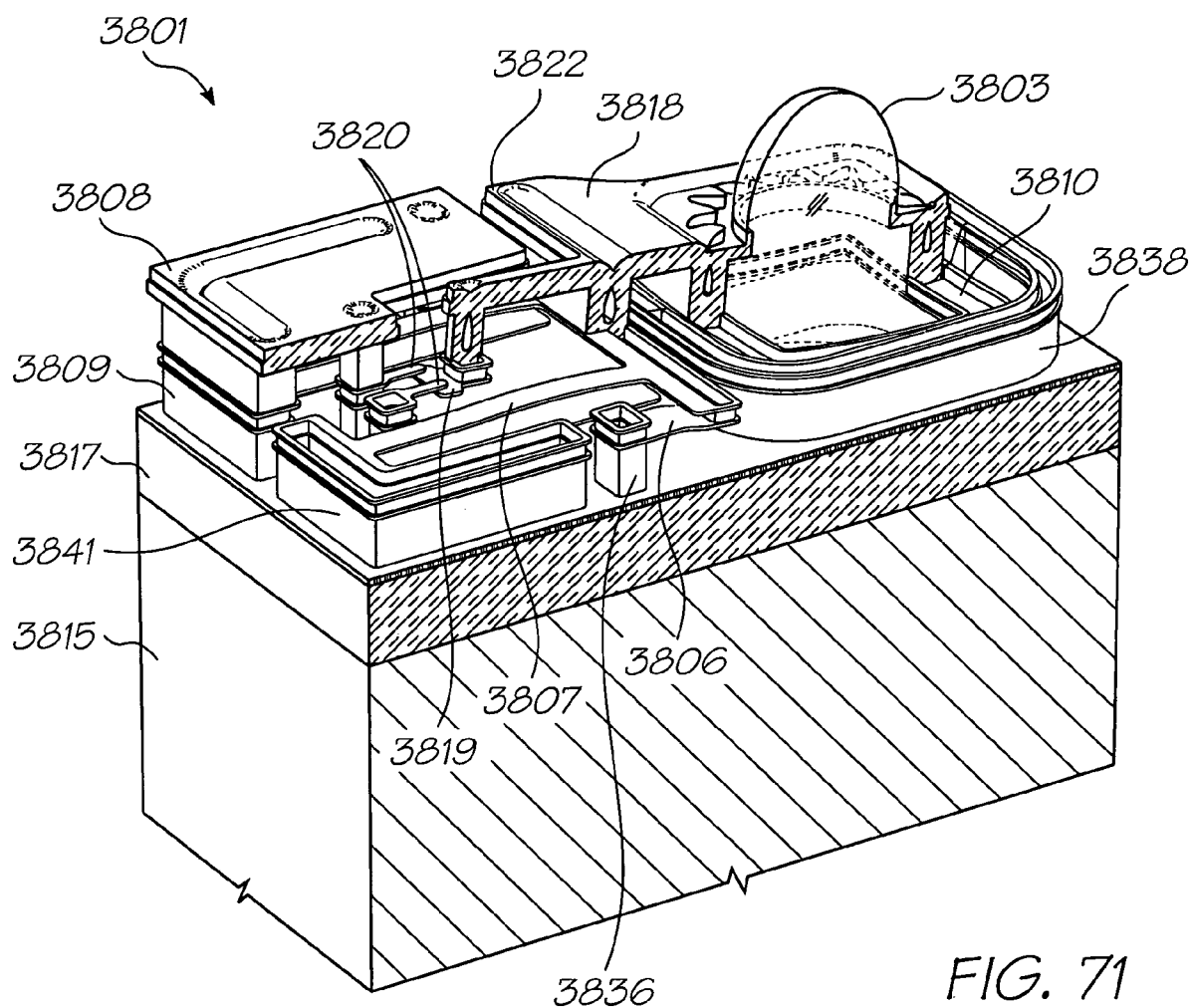
FIG. 71 shows in perspective a partial vertical sectional view of the nozzle of FIG. 65, at the actuation state shown in FIG. 66.

The lever arrangement also includes a lever arm 3818 that extends from the nozzle walls and incorporates a lateral stiffening beam 3822. The lever arm 3818 is attached to a pair of passive beams 3806, formed from titanium nitride (TiN) and positioned on either side of the nozzle arrangement, as best shown in FIGS. 68 and 71. The other ends of the passive beams 3806 are attached to the carrier 3836.

The lever arm 3818 is also attached to an actuator beam 3807, which is formed from TiN. It will be noted that this attachment to the actuator beam is made at a point a small but critical distance higher than the attachments to the passive beam 3806.

As best shown in FIGS. 68 and 71, the actuator beam 3807 is substantially U-shaped in plan, defining a current path between the electrode 3809 and an opposite electrode 3841. Each of the electrodes 3809 and 3841 is electrically connected to a respective point in the contact layer 3830. As well as being electrically coupled via the contacts 3809, the actuator beam is also mechanically anchored to anchor 3808. The anchor 3808 is configured to constrain motion of the actuator beam 3807 to the left of FIGS. 65 to 67 when the nozzle arrangement is in operation.

The TiN in the actuator beam 3807 is conductive, but has a high enough electrical resistance that it undergoes self-heating when a current is passed between the electrodes 3809 and 3841. No current flows through the passive beams 3806, so they do not expand.

In use, the device at rest is filled with ink 3813 that defines a meniscus 3803 under the influence of surface tension. The ink is retained in the chamber 3829 by the meniscus, and will not generally leak out in the absence of some other physical influence.

Figure 66:
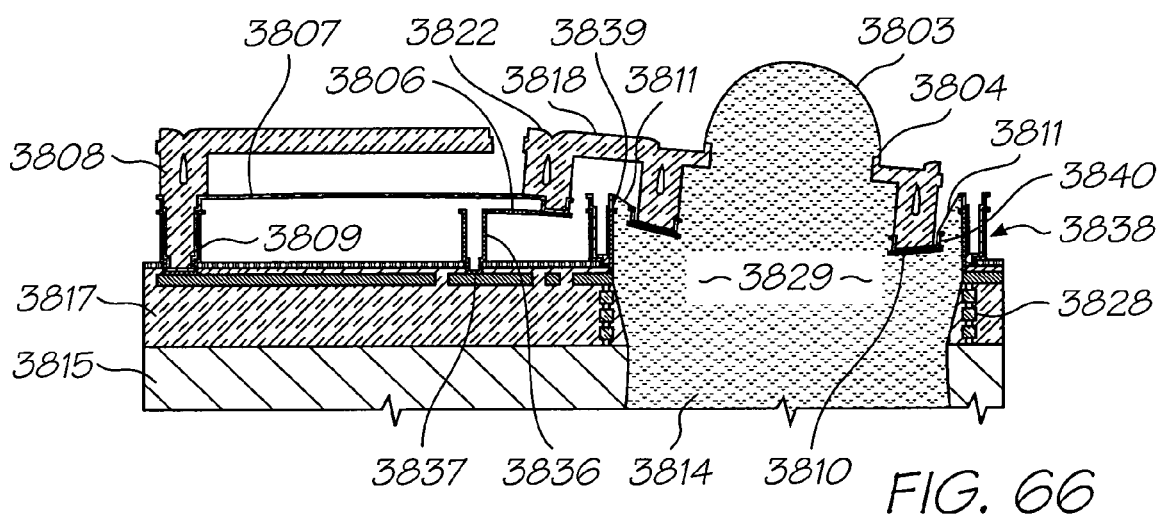
FIG. 66 shows a vertical sectional view of the nozzle of FIG. 65 at an initial actuation state.

As shown in FIG. 66, to fire ink from the nozzle, a current is passed between the contacts 3809 and 3841, passing through the actuator beam 3807. The self-heating of the beam 3807 due to its resistance causes the beam to expand. The dimensions and design of the actuator beam 3807 mean that the majority of the expansion in a horizontal direction with respect to FIGS. 65 to 67. The expansion is constrained to the left by the anchor 3808, so the end of the actuator beam 3807 adjacent the lever arm 3818 is impelled to the right.

The relative horizontal inflexibility of the passive beams 3806 prevents them from allowing much horizontal movement the lever arm 3818. However, the relative displacement of the attachment points of the passive beams and actuator beam respectively to the lever arm causes a twisting movement that causes the lever arm 3818 to move generally downwards. The movement is effectively a pivoting or hinging motion. However, the absence of a true pivot point means that the rotation is about a pivot region defined by bending of the passive beams 3806.

The downward movement (and slight rotation) of the lever arm 3818 is amplified by the distance of the nozzle wall 3833 from the passive beams 3806. The downward movement of the nozzle walls and roof causes a pressure increase within the chamber 3029, causing the meniscus to bulge as shown in FIG. 66. It will be noted that the surface tension of the ink means the fluid seal 3011 is stretched by this motion without allowing ink to leak out.

Figure 67:
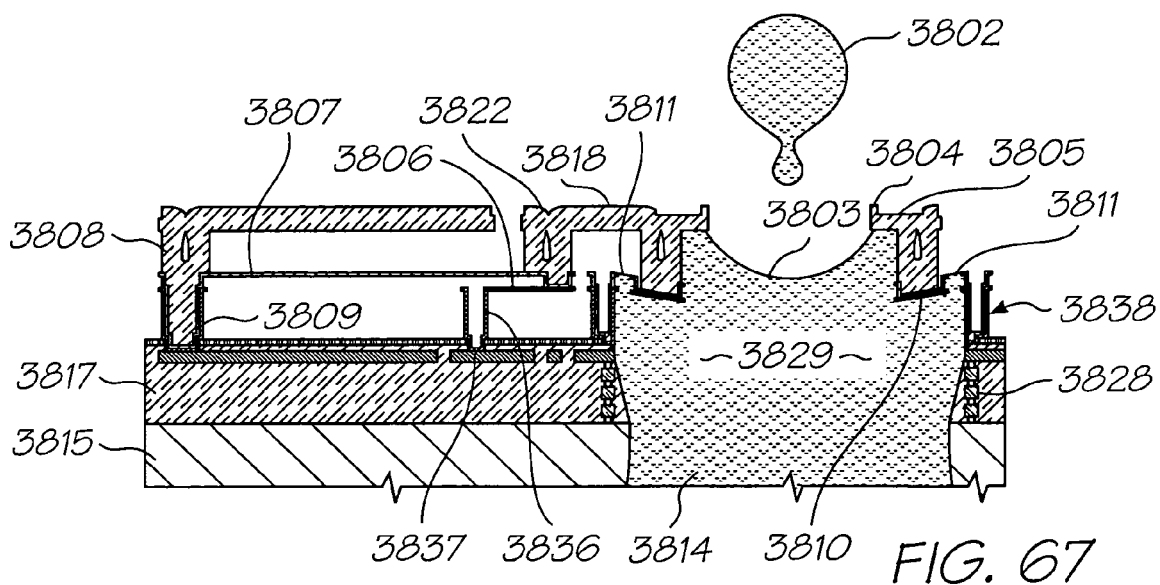
FIG. 67 shows a vertical sectional view of the nozzle of FIG. 66 at a later actuation state.

As shown in FIG. 67, at the appropriate time, the drive current is stopped and the actuator beam 3807 quickly cools and contracts. The contraction causes the lever arm to commence its return to the quiescent position, which in turn causes a reduction in pressure in the chamber 3829. The interplay of the momentum of the bulging ink and its inherent surface tension, and the negative pressure caused by the upward movement of the nozzle chamber 3829 causes thinning, and ultimately snapping, of the bulging meniscus to define an ink drop 3802 that continues upwards until it contacts the adjacent print media.

Immediately after the drop 3802 detaches, the meniscus forms the concave shape shown in FIG. 65. Surface tension causes the pressure in the chamber 3829 to remain relatively low until ink has been sucked upwards through the inlet 3814, which returns the nozzle arrangement and the ink to the quiescent situation shown in FIG. 65.

As best shown in FIG. 68, the nozzle arrangement also incorporates a test mechanism that can be used both post-manufacture and periodically after the printhead assembly is installed. The test mechanism includes a pair of contacts 3820 that are connected to test circuitry (not shown). A bridging contact 3819 is provided on a finger that extends from the lever arm 3818. Because the bridging contact 3819 is on the opposite side of the passive beams 3806, actuation of the nozzle causes the priding contact to move upwardly, into contact with the contacts 3820. Test circuitry can be used to confirm that actuation causes this closing of the circuit formed by the contacts 3819 and 820. If the circuit is closed appropriately, it can generally be assumed that the nozzle is operative.

Exemplary Method of Assembling Components

An exemplary method of assembling the various above-described modular components of the printhead assembly in accordance with one embodiment of the present invention will now be described. It is to be understood that the below described method represents only one example of assembling a particular printhead assembly of the present invention, and different methods may be employed to assemble this exemplary printhead assembly or other exemplary printhead assemblies of the present invention.

The printhead integrated circuits 3051 and the printhead tiles 3050 are assembled as follows:

A. The printhead integrated circuit 3051 is first prepared by forming 7680 nozzles in an upper surface thereof, which are spaced so as to be capable of printing with a resolution of 1600 dpi;

B. The fluid distribution stacks 3500 (from which the printhead tiles 3050 are formed) are constructed so as to have the three layers 3510, 3520 and 3530, the channel layer 3540 and the plate 3550 made of stainless steel bonded together in a vacuum furnace into a single body via metal inter-diffusion, where the inner surface of the lower layer 3530 and the surfaces of the middle and upper layers 3520 and 3510 are etched so as to be provided with the channels and holes 3531 and 3532, 3521 and 3522, and 3511 to 3513, respectively, so as to be capable of transporting the CYMK and IR inks and fixative to the individual nozzles of the printhead integrated circuit 3051 and air to the surface of the printhead integrated circuit 3051, as described earlier. Further, the outer surface of the lower layer 3530 is etched so as to be provided with the inlet ports 3054;

C. An adhesive, such as a silicone adhesive, is then applied to an upper surface of the fluid distribution stack 3500 for attaching the printhead integrated circuit 3051 and the (fine pitch) PCB 3052 in close proximity thereto;

D. The printhead integrated circuit 3051 and the PCB 3052 are picked up, pre-centred and then bonded on the upper surface of the fluid distribution stack 3500 via a pick-and-place robot;

E. This assembly is then placed in an oven whereby the adhesive is allowed to cure so as to fix the printhead integrated circuit 3051 and the PCB 3052 in place;

F. Connection between the printhead integrated circuit 3051 and the PCB 3052 is then made via a wire bonding machine, whereby a 25 micron diameter alloy, gold or aluminium wire is bonded between the bond pads on the printhead integrated circuit 3051 and conductive pads on the PCB 3052;

G. The wire bond area is then encapsulated in an epoxy adhesive dispensed by an automatic two-head dispenser. A high viscosity non-sump adhesive is firstly applied to draw a dam around the wire bond area, and the dam is then filled with a low viscosity adhesive to fully encapsulate the wire bond area beneath the adhesive;

H. This assembly is then placed on levelling plates in an oven and heat cured to form the epoxy encapsulant 3053. The levelling plates ensure that no encapsulant flows from the assembly during curing; and I. The thus-formed printhead tiles 3050 and printhead integrated circuits 3051 are 'wet' tested with a suitable fluid, such as pure water, to ensure reliable performance and are then dried out, where they are then ready for assembly on the fluid channel member 3040.

The units composed of the printhead tiles 3050 and the printhead integrated circuits 3051 are prepared for assembly to the fluid channel members 3040 as follows:

J. The (extended) flex PCB 3080 is prepared to provide data and power connection to the printhead integrated circuit 3051 from the PCB 3090 and busbars 3071, 3072 and 3073; and K. The flex PCB 3080 is aligned with the PCB 3052 and attached using a hot bar soldering machine.

The fluid channel members 3040 and the casing 3020 are formed and assembled as follows:

L. Individual fluid channel members 3040 are formed by injection moulding an elongate body portion 3044a so as to have seven individual grooves (channels) extending therethrough and the two longitudinally extending tabs 3043 extending therealong on either side thereof. The (elongate) lid portion 3044b is also moulded so as to be capable of enclosing the body portion 3044a to separate each of the channels. The body and lid portions are both moulded so as to have end portions which form the female and male end portions 3045 and 3046 when assembled together. The lid portion 3044b and the body portion 3044a are then adhered together with epoxy and cured so as to form the seven ducts 3041;

M. The casing 3020 is then formed by extruding aluminium to a desired configuration and length by separately forming the (elongate) support frame 3022, with the channel 3021 formed on the upper wall 3027 thereof, and the (elongate) cover portion 3023;

N. The end plate 3110 is attached with screws via the threaded portions 3022a and 3022b formed in the support frame 3022 to one (first) end of the casing 3020, and the end plate 3111 is attached with screws via the threaded portions 3022a and 3022b to the other (second) end of the casing 3020;

O. An epoxy is applied to the appropriate regions (i.e., so as not to cover the channels) of either a female or male connector 3047 or 3048, and either the female or male connecting section 3049a or 3049b of a capping member 3049 via a controlled dispenser;

P. An epoxy is applied to the appropriate regions (i.e., so as not to cover the channels) of the female and male end portions 3045 and 3046 of the plurality of fluid channel members 3040 to be assembled together, end-to-end, so as to correspond to the desired length via the controlled dispenser;

Q. The female or male connector 3047 or 3048 is then attached to the male or female end portion 3046 or 3045 of the fluid channel member 3040 which is to be at the first end of the plurality of fluid channel members 3040 and the female or male connecting section 3049a or 3049b of the capping member 3049 is attached to the male or female end portion 3046 or 3045 of the fluid channel member 3040 which is to be at the second end of the plurality of fluid channel members 3040;

R. Each of the fluid channel members 3040 is then placed within the channel 3021 one-by-one. Firstly, the (first) fluid channel member 3040 to be at the first end is placed within the channel 3021 at the first end, and is secured in place by way of the PCB supports 3091 which are clipped into the support frame 3022, in the manner described earlier, so that the unconnected end portion 3045 or 3046 of the fluid channel member 3040 is left exposed with the epoxy thereon. Then, a second member 3040 is placed in the channel 3021 so as to mate with the first fluid channel member 3040 via its corresponding end portion 3045 or 3046 and the epoxy therebetween and is then clipped into place with its PCB supports 3091. This can then be repeated until the final fluid channel member 3040 is in place at the second end of the channel 3021. Of course, only one fluid channel member 3040 may be used, in which case it may have a connector 3047 or 3048 attached to one end portion 3046 or 3045 and a capping member 3049 attached at the other end portion 3045 or 3046;

S. This arrangement is then placed in a compression jig, whereby a compression force is applied against the ends of the assembly to assist in sealing the connections between the individual fluid channel members 3040 and their end connector 3047 or 3048 and capping member 3049. The complete assembly and jig is then placed in an oven at a temperature of about 100° C. for a predefined period, for example, about 45 minutes, to enhance the curing of the adhesive connections. However, other methods of curing, such as room temperature curing, could also be employed;

T. Following curing, the arrangement is pressure tested to ensure the integrity of the seal between the individual fluid channel members 3040, the connector 3047 or 3048, and the capping member 3049; and U. The exposed upper surface of the assembly is then oxygen plasma cleaned to facilitate attachment of the individual printhead tiles 3050 thereto.

The printhead tiles 3050 are attached to the fluid channel members 3040 as follows:

V. Prior to placement of the individual printhead tiles 3050 upon the upper surface of the fluid channel members 3040, the bottom surface of the printhead tiles 3050 are argon plasma cleaned to enhance bonding. An adhesive is then applied via a robotic dispenser to the upper surface of the fluid channel members 3040 in the form of an epoxy in strategic positions on the upper surface around and symmetrically about the outlet ports 3042. To assist in fixing the printhead tiles 3050 in place a fast acting adhesive, such as cyanoacrylate, is applied in the remaining free areas of the upper surface as the adhesive drops 3062 immediately prior to placing the printhead tiles 3050 thereon;

W. Each of the individual printhead tiles 3050 is then carefully aligned and placed on the upper surface of the fluid channel members 3040 via a pick-and-place robot, such that a continuous print surface is defined along the length of the printhead module 3030 and also to ensure that that the outlet ports 3042 of the fluid channel members 3040 align with the inlet ports 3054 of the individual printhead tiles 3050. Following placement, the pick-and-place robot applies a pressure on the printhead tile 3050 for about 5 to 10 seconds to assist in the setting of the cyanoacrylate and to fix the printhead tile 3050 in place. This process is repeated for each printhead tile 3050;

X. This assembly is then placed in an oven at about 100° C. for about 45 minutes to cure the epoxy so as to form the gasket member 3060 and the locators 3061 for each printhead tile 3050 which seal the fluid connection between each of the outlet and inlet ports 3042 and 3054. This fixes the printhead tiles 3050 in place on the fluid channel members 3040 so as to define the print surface; and Y. Following curing, the assembly is inspected and tested to ensure correct alignment and positioning of the printhead tiles 3050.

The printhead assembly 3010 is assembled as follows:

Z. The support member 3112 is attached to the end PCB supports 3091 so as to align with the recessed portion 3091*b* of the end supports 3091;

AA. The connecting members 3102 are placed in the abutting recessed portions 3091*b* between the adjacent PCB supports 3091 and in the abutting recessed portions 3112*b* and 3091*b* of the support members 3112 and end PCB supports 3091, respectively;

BB. The PCBs 3090, each having assembled thereon a PEC integrated circuit 3100 and its associated circuitry, are then mounted on the PCB supports 3091 along the length of the casing 3020 and are retained in place between the notch portions 3096*a* of the retaining clips 3096 and the recessed portions 3093*a* and locating lugs 3093*b* of the base portions 3093 of the PCB supports 3091. As described earlier, the PCBs 3090 can be arranged such that the PEC integrated circuit 3100 of one PCB 3090 drives the printhead integrated circuits 3051 of four printhead tiles 3050, or of eight printhead tiles 3050, or of 16 printhead tiles 3050. Each of the PCBs 3090 include the connection strips 3090*a* and 3090*b* on the inner face thereof which communicate with the connecting members 3102 allowing data transfer between the PEC integrated circuits 3100 of each of the PCBs 3090, between the printhead integrated circuits 3051 and PEC integrated circuits 3100 of each of the PCBs 3090, and between the data connection portion 3117 of the connector arrangement 3115;

CC. The connector arrangement 3115, with the power supply, data and fluid delivery connection portions 3116, 3117 and 3118 attached thereto, is attached to the end plate 3110 with screws so that the region 3115*c* of the connector arrangement 3115 is clipped into the clip portions 3112*d* of the support member 3112;

DD. The busbars 3071, 3072 and 3073 are inserted into the corresponding channelled recesses 3095*a*, 3095*b* and 3095*c* of the plurality of PCB supports 3091 and are connected at their ends to the corresponding contact screws 3116*a*, 3116*b* and 3116*c* of the power supply connection portion 3116 of the connector arrangement 3115. The busbars 3071, 3072 and 3073 provide a path for power to be distributed throughout the printhead assembly;

EE. Each of the flex PCBs 3080 extending from each of the printhead tiles 3050 is then connected to the connectors 3098 of the corresponding PCBs 3090 by slotting the slot regions 81 into the connectors 3098;

FF. The pressure plates 3074 are then clipped onto the PCB supports 3091 by engaging the holes 3074*a* and the tab portions 3074*c* of the holes 3074*b* with the corresponding retaining clips 3099 and 3096 of the PCB supports 3091, such that the raised portions 75 of the pressure plates 3074 urge the power contacts of the flex PCBs 3080 into contact with each of the busbars 3071, 3072 and 3073, thereby providing a path for the transfer of power between the busbars 3071, 3072 and 3073, the PCBs 3090 and the printhead integrated circuits 3051;

GG. The internal fluid delivery tubes 3006 are then attached to the corresponding tubular portions 3047*b* or 3048*b* of the female or male connector 3047 or 3048; and HH. The elongate, aluminium cover portion 3023 of the casing 3020 is then placed over the assembly and screwed into place via screws through the remaining holes in the end plates 3110 and 3111 into the threaded portions 3023*b* of the cover portion 3023, and the end housing 3120 is placed over the connector arrangement 3115 and screwed into place with screws into the end plate 3110 thereby completing the outer housing of the printhead assembly and so as to provide electrical and fluid communication between the printhead assembly and a printer unit. The external fluid tubes or hoses can then be assembled to supply ink and the other fluids to the channels ducts. The cover portion 3023 can also act as a heat sink for the PEC integrated circuits 3100 if the fin portions 3023*d* are provided thereon, thereby protecting the circuitry of the printhead assembly 3010.

Testing of the printhead assembly occurs as follows:

II. The thus-assembled printhead assembly 3010 is moved to a testing area and inserted into a final print test machine which is essentially a working printing unit, whereby connections from the printhead assembly 3010 to the fluid and power supplies are manually performed;

JJ. A test page is printed and analysed and appropriate adjustments are made to finalise the printhead electronics; and KK. When passed, the print surface of the printhead assembly 3010 is capped and a plastic sealing film is applied to protect the printhead assembly 3010 until product installation.

Other Inkjet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per printhead, but is a major impediment to the fabrication of pagewidth printheads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)
high resolution capability (1,600 dpi or more)
photographic quality output
low manufacturing cost
small size (pagewidth times minimum cross section)
high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the table under the heading Cross References to Related Applications.

The ink jet designs shown here are suitable for a wide range of digital printing systems, from battery powered one-time use digital cameras, through to desktop and network printers, and through to commercial printing systems.

For ease of manufacture using standard process equipment, the printhead is designed to be a monolithic 0.5 micron CMOS chip with MEMS post processing. For color photographic applications, the printhead is 100 mm long, with a width which depends upon the ink jet type. The smallest printhead designed is IJ38, which is 0.35 mm wide, giving a chip area of 35 square mm. The printheads each contain 19,200 nozzles plus data and control circuitry.

Ink is supplied to the back of the printhead by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The printhead is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of inkjet types.

Actuator mechanism (18 types)
Basic operation mode (7 types)
Auxiliary mechanism (8 types)
Actuator amplification or modification method (17 types)
Actuator motion (19 types)
Nozzle refill method (4 types)
Method of restricting back-flow through inlet (10 types)
Nozzle clearing method (9 types)
Nozzle plate construction (9 types)
Drop ejection direction (5 types)
Ink type (7 types)

The complete eleven dimensional table represented by these axes contains 36.9 billion possible configurations of ink jet nozzle. While not all of the possible combinations result in a viable inkjet technology, many million configurations are viable. It is clearly impractical to elucidate all of the possible configurations. Instead, certain ink jet types have been investigated in detail. These are designated IJ01 to IJ45 above which matches the docket numbers in the table under the heading Cross References to Related Applications.

Other ink jet configurations can readily be derived from these forty-five examples by substituting alternative configurations along one or more of the 11 axes. Most of the IJ01 to IJ45 examples can be made into ink jet printheads with characteristics superior to any currently available ink jet technology.

Where there are prior art examples known to the inventor, one or more of these examples are listed in the examples column of the tables below. The IJ01 to IJ45 series are also listed in the examples column. In some cases, print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| | Actuator mechanism (applied only to selected ink drops) | | | |
|---|---|---|---|---|
| | Description | Advantages | Disadvantages | Examples |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | Large force generated Simple construction No moving parts Fast operation Small chip area required for actuator | High power Ink carrier limited to water Low efficiency High temperatures required High mechanical stress Unusual materials required Large drive transistors Cavitation causes actuator failure Kogation reduces bubble formation Large print heads are difficult to fabricate | Canon Bubblejet 1979 Endo et al GB patent 2,007,162 Xerox heater-in-pit 1990 Hawkins et al U.S. Pat. No. 4,899,181 Hewlett-Packard TIJ 1982 Vaught et al U.S. Pat. No. 4,490,728 |
| Piezoelectric | A piezoelectric crystal such as lead lanthanum zirconate (PZT) is electrically activated, and either expands, shears, or bends to apply pressure to the ink, ejecting drops. | Low power consumption Many ink types can be used Fast operation High efficiency | Very large area required for actuator Difficult to integrate with electronics High voltage drive transistors required Full pagewidth print heads impractical due to actuator size Requires electrical poling in high field strengths during manufacture | Kyser et al U.S. Pat. No. 3,946,398 Zoltan U.S. Pat. No. 3,683,212 1973 Stemme U.S. Pat No. 3,747,120 Epson Stylus Tektronix IJ04 |
| Electrostrictive | An electric field is used to activate electrostriction in relaxor materials such as lead lanthanum zirconate titanate (PLZT) or lead magnesium niobate (PMN). | Low power consumption Many ink types can be used Low thermal expansion Electric field strength required (approx. 3.5 V/$\mu$m) can be generated without difficulty Does not require electrical poling | Low maximum strain (approx. 0.01%) Large area required for actuator due to low strain Response speed is marginal (~10 $\mu$s) High voltage drive transistors required Full pagewidth print heads impractical due to actuator size | Seiko Epson, Usui et al JP 253401/96 IJ04 |
| Ferroelectric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | Low power consumption Many ink types can be used Fast operation (<1 $\mu$s) Relatively high longitudinal strain High efficiency Electric field strength of around 3 V/$\mu$m can be readily provided | Difficult to integrate with electronics Unusual materials such as PLZSnT are required Actuators require a large area | IJ04 |

-continued

| | Actuator mechanism (applied only to selected ink drops) | | | |
|---|---|---|---|---|
| | Description | Advantages | Disadvantages | Examples |
| Electrostatic plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | Low power consumption Many ink types can be used Fast operation | Difficult to operate electrostatic devices in an aqueous environment The electrostatic actuator will normally need to be separated from the ink Very large area required to achieve high forces High voltage drive transistors may be required Full pagewidth print heads are not competitive due to actuator size | IJ02, IJ04 |
| Electrostatic pull on ink | A strong electric field is applied to the ink, whereupon electrostatic attraction accelerates the ink towards the print medium. | Low current consumption Low temperature | High voltage required May be damaged by sparks due to air breakdown Required field strength increases as the drop size decreases High voltage drive transistors required Electrostatic field attracts dust | 1989 Saito et al, U.S. Pat No. 4,799,068 1989 Miura et al, U.S. Pat No. 4,810,954 Tone-jet |
| Permanent magnet electromagnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | Low power consumption Many ink types can be used Fast operation High efficiency Easy extension from single nozzles to pagewidth print heads | Complex fabrication Permanent magnetic material such as Neodymium Iron Boron (NdFeB) required. High local currents required Copper metalization should be used for long electromigration lifetime and low resistivity Pigmented inks are usually infeasible Operating temperature limited to the Curie temperature (around 540 K) | IJ07, IJ10 |
| Soft magnetic core electromagnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | Low power consumption Many ink types can be used Fast operation High efficiency Easy extension from single nozzles to pagewidth print heads | Complex fabrication Materials not usually present in a CMOS fab such as NiFe, CoNiFe, or CoFe are required High local currents required Copper metalization should be used for long electromigration lifetime and low resistivity Electroplating is required High saturation | IJ01, IJ05, IJ08, IJ10, IJ12, IJ14, IJ15, IJ17 |

-continued

| | Actuator mechanism (applied only to selected ink drops) | | | |
|---|---|---|---|---|
| | Description | Advantages | Disadvantages | Examples |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | Low power consumption Many ink types can be used Fast operation High efficiency Easy extension from single nozzles to pagewidth print heads | flux density is required (2.0-2.1 T is achievable with CoNiFe [1]) Force acts as a twisting motion Typically, only a quarter of the solenoid length provides force in a useful direction High local currents required Copper metalization should be used for long electromigration lifetime and low resistivity Pigmented inks are usually infeasible | IJ06, IJ11, IJ13, IJ16 |
| Magnetostriction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be prestressed to approx. 8 MPa. | Many ink types can be used Fast operation Easy extension from single nozzles to pagewidth print heads High force is available | Force acts as a twisting motion Unusual materials such as Terfenol-D are required High local currents required Copper metalization should be used for long electromigration lifetime and low resistivity Pre-stressing may be required | Fischenbeck, U.S. Pat No. 4,032,929 IJ25 |
| Surface tension reduction | Ink under positive pressure is held in a nozzle by surface tension. The surface tension of the ink is reduced below the bubble threshold, causing the ink to egress from the nozzle. | Low power consumption Simple construction No unusual materials required in fabrication High efficiency Easy extension from single nozzles to pagewidth print heads | Requires supplementary force to effect drop separation Requires special ink surfactants Speed may be limited by surfactant properties | Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | Simple construction No unusual materials required in fabrication Easy extension from single nozzles to pagewidth print heads | Requires supplementary force to effect drop separation Requires special ink viscosity properties High speed is difficult to achieve Requires oscillating ink pressure A high temperature difference (typically 80 degrees) is required | Silverbrook, EP 0771 658 A2 and related patent applications |
| Acoustic | An acoustic wave is generated and focussed upon the drop ejection region. | Can operate without a nozzle plate | Complex drive circuitry Complex fabrication Low efficiency Poor control of drop position | 1993 Hadimioglu et al, EUP 550,192 1993 Elrod et al, EUP 572,220 |

| -continued |
|---|

| Actuator mechanism (applied only to selected ink drops) | | | | |
|---|---|---|---|---|
| | Description | Advantages | Disadvantages | Examples |
| Thermoelastic bend actuator | An actuator which relies upon differential thermal expansion upon Joule heating is used. | Low power consumption Many ink types can be used Simple planar fabrication Small chip area required for each actuator Fast operation High efficiency CMOS compatible voltages and currents Standard MEMS processes can be used Easy extension from single nozzles to pagewidth print heads | Poor control of drop volume Efficient aqueous operation requires a thermal insulator on the hot side Corrosion prevention can be difficult Pigmented inks may be infeasible, as pigment particles may jam the bend actuator | IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |
| High CTE thermoelastic actuator | A material with a very high coefficient of thermal expansion (CTE) such as polytetrafluoroethylene (PTFE) is used. As high CTE materials are usually non-conductive, a heater fabricated from a conductive material is incorporated. A 50 µm long PTFE bend actuator with polysilicon heater and 15 mW power input can provide 180 µN force and 10 µm deflection. Actuator motions include: Bend Push Buckle Rotate | High force can be generated Three methods of PTFE deposition are under development: chemical vapor deposition (CVD), spin coating, and evaporation PTFE is a candidate for low dielectric constant insulation in ULSI Very low power consumption Many ink types can be used Simple planar fabrication Small chip area required for each actuator Fast operation High efficiency CMOS compatible voltages and currents Easy extension from single nozzles to pagewidth print heads | Requires special material (e.g. PTFE) Requires a PTFE deposition process, which is not yet standard in ULSI fabs PTFE deposition cannot be followed with high temperature (above 350° C.) processing Pigmented inks may be infeasible, as pigment particles may jam the bend actuator | IJ09, IJ17, IJ18, IJ20, IJ21, IJ22, IJ23, IJ24, IJ27, IJ28, IJ29, IJ30, IJ31, IJ42, IJ43, IJ44 |
| Conduct-ive polymer thermoelastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include: Carbon nanotubes Metal fibers Conductive polymers such as doped polythiophene | High force can be generated Very low power consumption Many ink types can be used Simple planar fabrication Small chip area required for each actuator Fast operation High efficiency CMOS compatible voltages and currents Easy extension from single nozzles to pagewidth print heads | Requires special materials development (High CTE conductive polymer) Requires a PTFE deposition process, which is not yet standard in ULSI fabs PTFE deposition cannot be followed with high temperature (above 350° C.) processing Evaporation and CVD deposition techniques cannot be used Pigmented inks may be infeasible, | IJ24 |

-continued

Actuator mechanism (applied only to selected ink drops)

| | Description | Advantages | Disadvantages | Examples |
|---|---|---|---|---|
| | Carbon granules | | as pigment particles may jam the bend actuator | |
| Shape memory alloy | A shape memory alloy such as TiNi (also known as Nitinol — Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | High force is available (stresses of hundreds of MPa) Large strain is available (more than 3%) High corrosion resistance Simple construction Easy extension from single nozzles to pagewidth print heads Low voltage operation | Fatigue limits maximum number of cycles Low strain (1%) is required to extend fatigue resistance Cycle rate limited by heat removal Requires unusual materials (TiNi) The latent heat of transformation must be provided High current operation Requires pre-stressing to distort the martensitic state | IJ26 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | Linear Magnetic actuators can be constructed with high thrust, long travel, and high efficiency using planar semiconductor fabrication techniques Long actuator travel is available Medium force is available Low voltage operation | Requires unusual semiconductor materials such as soft magnetic alloys (e.g. CoNiFe) Some varieties also require permanent magnetic materials such as Neodymium iron boron (NdFeB) Requires complex multi-phase drive circuitry High current operation | IJ12 |

Basic operation mode

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | Simple operation No external fields required Satellite drops can be avoided if drop velocity is less than 4 m/s Can be efficient, depending upon the actuator used | Drop repetition rate is usually limited to around 10 kHz. However, this is not fundamental to the method, but is related to the refill method normally used All of the drop kinetic energy must be provided by the actuator Satellite drops usually form if drop velocity is greater than 4.5 m/s | Thermal ink jet Piezoelectric ink jet IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by | Very simple print head fabrication can be used The drop selection means does not need to provide the energy required to separate the drop from the nozzle | Requires close proximity between the print head and the print media or transfer roller May require two print heads printing alternate rows of the image Monolithic color | Silverbrook, EP 0771 658 A2 and related patent applications |

| | -continued | | | |
|---|---|---|---|---|
| | Basic operation mode | | | |
| | Description | Advantages | Disadvantages | Examples |
| | contact with the print medium or a transfer roller. | | print heads are difficult | |
| Electrostatic pull on ink | The drops to be printed are selected by some manner (e.g. thermally induced surface tension reduction of pressurized ink). Selected drops are separated from the ink in the nozzle by a strong electric field. | Very simple print head fabrication can be used The drop selection means does not need to provide the energy required to separate the drop from the nozzle | Requires very high electrostatic field Electrostatic field for small nozzle sizes is above air breakdown Electrostatic field may attract dust | Silverbrook, EP 0771 658 A2 and related patent applications Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | Very simple print head fabrication can be used The drop selection means does not need to provide the energy required to separate the drop from the nozzle | Requires magnetic ink Ink colors other than black are difficult Requires very high magnetic fields | Silverbrook, EP 0771 658 A2 and related patent applications |
| Shutter | The actuator moves a shutter to block ink flow to the nozzle. The ink pressure is pulsed at a multiple of the drop ejection frequency. | High speed (>50 kHz) operation can be achieved due to reduced refill time Drop timing can be very accurate The actuator energy can be very low | Moving parts are required Requires ink pressure modulator Friction and wear must be considered Stiction is possible | IJ13, IJ17, IJ21 |
| Shuttered grill | The actuator moves a shutter to block ink flow through a grill to the nozzle. The shutter movement need only be equal to the width of the grill holes. | Actuators with small travel can be used Actuators with small force can be used High speed (>50 KHz) operation can be achieved | Moving parts are required Requires ink pressure modulator Friction and wear must be considered Stiction is possible | IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | Extremely low energy operation is possible No heat dissipation problems | Requires an external pulsed magnetic field Requires special materials for both the actuator and the ink pusher Complex construction | IJ10 |

| | Auxiliary mechanism (applied to all nozzles) | | | |
|---|---|---|---|---|
| | Description | Advantages | Disadvantages | Examples |
| None | The actuator directly fires the ink drop, and there is no external field or other mechanism required. | Simplicity of construction Simplicity of operation Small physical size | Drop ejection energy must be supplied by individual nozzle actuator | Most ink jets, including piezoelectric and thermal bubble. IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, |

-continued

| | Auxiliary mechanism (applied to all nozzles) | | | |
|---|---|---|---|---|
| | Description | Advantages | Disadvantages | Examples |
| | | | | IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | Oscillating ink pressure can provide a refill pulse, allowing higher operating speed The actuators may operate with much lower energy Acoustic lenses can be used to focus the sound on the nozzles | Requires external ink pressure oscillator Ink pressure phase and amplitude must be carefully controlled Acoustic reflections in the ink chamber must be designed for | Silverbrook, EP 0771 658 A2 and related patent applications IJ08, IJ13, IJ15, IJ17, IJ18, IJ19, IJ21 |
| Media proximity | The print head is placed in close proximity to the print medium. Selected drops protrude from the print head further than unselected drops, and contact the print medium. The drop soaks into the medium fast enough to cause drop separation. | Low power High accuracy Simple print head construction | Precision assembly required Paper fibers may cause problems Cannot print on rough substrates | Silverbrook, EP 0771 658 A2 and related patent applications |
| Transfer roller | Drops are printed to a transfer roller instead of straight to the print medium. A transfer roller can also be used for proximity drop separation. | High accuracy Wide range of print substrates can be used Ink can be dried on the transfer roller | Bulky Expensive Complex construction | Silverbrook, EP 0771 658 A2 and related patent applications Tektronix hot melt piezoelectric ink jet Any of the IJ series |
| Electrostatic | An electric field is used to accelerate selected drops towards the print medium. | Low power Simple print head construction | Field strength required for separation of small drops is near or above air breakdown | Silverbrook, EP 0771 658 A2 and related patent applications Tone-Jet |
| Direct magnetic field | A magnetic field is used to accelerate selected drops of magnetic ink towards the print medium. | Low power Simple print head construction | Requires magnetic ink Requires strong magnetic field | Silverbrook, EP 0771 658 A2 and related patent applications |
| Cross magnetic field | The print head is placed in a constant magnetic field. The Lorenz force in a current carrying wire is used to move the actuator. | Does not require magnetic materials to be integrated in the print head manufacturing process | Requires external magnet Current densities may be high, resulting in electromigration problems | IJ06, IJ16 |
| Pulsed magnetic field | A pulsed magnetic field is used to cyclically attract a paddle, which pushes on the ink. A small actuator moves a catch, which selectively prevents the paddle from moving. | Very low power operation is possible Small print head size | Complex print head construction Magnetic materials required in print head | IJ10 |

| | Actuator amplification or modification method | | | |
|---|---|---|---|---|
| | Description | Advantages | Disadvantages | Examples |
| None | No actuator mechanical amplification is used. The actuator directly drives the drop ejection process. | Operational simplicity | Many actuator mechanisms have insufficient travel, or insufficient force, to efficiently drive the drop ejection process | Thermal Bubble Ink jet IJ01, IJ02, IJ06, IJ07, IJ16, IJ25, IJ26 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | Provides greater travel in a reduced print head area | High stresses are involved Care must be taken that the materials do not delaminate Residual bend resulting from high temperature or high stress during formation | Piezoelectric IJ03, IJ09, IJ17, IJ18, IJ19, IJ20, IJ21, IJ22, IJ23, IJ24, IJ27, IJ29, IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | Very good temperature stability High speed, as a new drop can be fired before heat dissipates Cancels residual stress of formation | High stresses are involved Care must be taken that the materials do not delaminate | IJ40, IJ41 |
| Reverse spring | The actuator loads a spring. When the actuator is turned off, the spring releases. This can reverse the force/distance curve of the actuator to make it compatible with the force/time requirements of the drop ejection. | Better coupling to the ink | Fabrication complexity High stress in the spring | IJ05, IJ11 |
| Actuator stack | A series of thin actuators are stacked. This can be appropriate where actuators require high electric field strength, such as electrostatic and piezoelectric actuators. | Increased travel Reduced drive voltage | Increased fabrication complexity Increased possibility of short circuits due to pinholes | Some piezoelectric ink jets IJ04 |
| Multiple actuators | Multiple smaller actuators are used simultaneously to move the ink. Each actuator need provide only a portion of the force required. | Increases the force available from an actuator Multiple actuators can be positioned to control ink flow accurately | Actuator forces may not add linearly, reducing efficiency | IJ12, IJ13, IJ18, IJ20, IJ22, IJ28, IJ42, IJ43 |
| Linear Spring | A linear spring is used to transform a motion with small travel and high force into a longer travel, lower force motion. | Matches low travel actuator with higher travel requirements Non-contact method of motion transformation | Requires print head area for the spring | IJ15 |
| Coiled actuator | A bend actuator is coiled to provide greater travel in a reduced chip area. | Increases travel Reduces chip area Planar implementations are relatively easy to fabricate. | Generally restricted to planar implementations due to extreme fabrication difficulty in other orientations. | IJ17, IJ21, IJ34, IJ35 |
| Flexure bend actuator | A bend actuator has a small region near the fixture point, which flexes much more readily than the | Simple means of increasing travel of a bend actuator | Care must be taken not to exceed the elastic limit in the flexure area Stress | IJ10, IJ19, IJ33 |

-continued

Actuator amplification or modification method

| | Description | Advantages | Disadvantages | Examples |
|---|---|---|---|---|
| | remainder of the actuator. The actuator flexing is effectively converted from an even coiling to an angular bend, resulting in greater travel of the actuator tip. | | distribution is very uneven Difficult to accurately model with finite element analysis | |
| Catch | The actuator controls a small catch. The catch either enables or disables movement of an ink pusher that is controlled in a bulk manner. | Very low actuator energy Very small actuator size | Complex construction Requires external force Unsuitable for pigmented inks | IJ10 |
| Gears | Gears can be used to increase travel at the expense of duration. Circular gears, rack and pinion, ratchets, and other gearing methods can be used. | Low force, low travel actuators can be used Can be fabricated using standard surface MEMS processes | Moving parts are required Several actuator cycles are required More complex drive electronics Complex construction Friction, friction, and wear are possible | IJ13 |
| Buckle plate | A buckle plate can be used to change a slow actuator into a fast motion. It can also convert a high force, low travel actuator into a high travel, medium force motion. | Very fast movement achievable | Must stay within elastic limits of the materials for long device life High stresses involved Generally high power requirement | S. Hirata et al, "An Ink-jet Head Using Diaphragm Microactuator", Proc. IEEE MEMS, Feb. 1996, pp 418-423. IJ18, IJ27 |
| Tapered magnetic pole | A tapered magnetic pole can increase travel at the expense of force. | Linearizes the magnetic force/distance curve | Complex construction | IJ14 |
| Lever | A lever and fulcrum is used to transform a motion with small travel and high force into a motion with longer travel and lower force. The lever can also reverse the direction of travel. | Matches low travel actuator with higher travel requirements Fulcrum area has no linear movement, and can be used for a fluid seal | High stress around the fulcrum | IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | High mechanical advantage The ratio of force to travel of the actuator can be matched to the nozzle requirements by varying the number of impeller vanes | Complex construction Unsuitable for pigmented inks | IJ28 |
| Acoustic lens | A refractive or diffractive (e.g. zone plate) acoustic lens is used to concentrate sound waves. | No moving parts | Large area required Only relevant for acoustic ink jets | 1993 Hadimioglu et al, EUP 550,192 1993 Elrod et al, EUP 572,220 |
| Sharp conductive point | A sharp point is used to concentrate an electrostatic field. | Simple construction | Difficult to fabricate using standard VLSI processes for a surface ejecting ink-jet Only relevant for electrostatic ink jets | Tone-jet |

|  | Actuator motion | | | |
| --- | --- | --- | --- | --- |
|  | Description | Advantages | Disadvantages | Examples |
| Volume expansion | The volume of the actuator changes, pushing the ink in all directions. | Simple construction in the case of thermal ink jet | High energy is typically required to achieve volume expansion. This leads to thermal stress, cavitation, and kogation in thermal ink jet implementations | Hewlett-Packard Thermal Ink jet Canon Bubblejet |
| Linear, normal to chip surface | The actuator moves in a direction normal to the print head surface. The nozzle is typically in the line of movement. | Efficient coupling to ink drops ejected normal to the surface | High fabrication complexity may be required to achieve perpendicular motion | IJ01, IJ02, IJ04, IJ07, IJ11, IJ14 |
| Parallel to chip surface | The actuator moves parallel to the print head surface. Drop ejection may still be normal to the surface. | Suitable for planar fabrication | Fabrication complexity Friction Stiction | IJ12, IJ13, IJ15, IJ33, IJ34, IJ35, IJ36 |
| Membrane push | An actuator with a high force but small area is used to push a stiff membrane that is in contact with the ink. | The effective area of the actuator becomes the membrane area | Fabrication complexity Actuator size Difficulty of integration in a VLSI process | 1982 Howkins U.S. Pat No. 4,459,601 |
| Rotary | The actuator causes the rotation of some element, such a grill or impeller | Rotary levers may be used to increase travel Small chip area requirements | Device complexity May have friction at a pivot point | IJ05, IJ08, IJ13, IJ28 |
| Bend | The actuator bends when energized. This may be due to differential thermal expansion, piezoelectric expansion, magnetostriction, or other form of relative dimensional change. | A very small change in dimensions can be converted to a large motion. | Requires the actuator to be made from at least two distinct layers, or to have a thermal difference across the actuator | 1970 Kyser et al U.S. Pat No. 3,946,398 1973 Stemme U.S. Pat No. 3,747,120 IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | Allows operation where the net linear force on the paddle is zero Small chip area requirements | Inefficient coupling to the ink motion | IJ06 |
| Straighten | The actuator is normally bent, and straightens when energized. | Can be used with shape memory alloys where the austenic phase is planar | Requires careful balance of stresses to ensure that the quiescent bend is accurate | IJ26, IJ32 |
| Double bend | The actuator bends in one direction when one element is energized, and bends the other way when another element is energized. | One actuator can be used to power two nozzles. Reduced chip size. Not sensitive to ambient temperature | Difficult to make the drops ejected by both bend directions identical. A small efficiency loss compared to equivalent single bend actuators. | IJ36, IJ37, IJ38 |
| Shear | Energizing the actuator causes a shear motion in the actuator material. | Can increase the effective travel of piezoelectric actuators | Not readily applicable to other actuator mechanisms | 1985 Fishbeck U.S. Pat No. 4,584,590 |
| Radial constriction | The actuator squeezes an ink reservoir, forcing ink from a constricted nozzle. | Relatively easy to fabricate single nozzles from glass tubing as macroscopic structures | High force required Inefficient Difficult to integrate with VLSI processes | 1970 Zoltan U.S. Pat No. 3,683,212 |
| Coil/uncoil | A coiled actuator uncoils or coils more | Easy to fabricate as a planar VLSI | Difficult to fabricate for non- | IJ17, IJ21, IJ34, IJ35 |

Actuator motion

| | Description | Advantages | Disadvantages | Examples |
|---|---|---|---|---|
| | tightly. The motion of the free end of the actuator ejects the ink. | process Small area required, therefore low cost | planar devices Poor out-of-plane stiffness | |
| Bow | The actuator bows (or buckles) in the middle when energized. | Can increase the speed of travel Mechanically rigid | Maximum travel is constrained High force required | IJ16, IJ18, IJ27 |
| Push-Pull | Two actuators control a shutter. One actuator pulls the shutter, and the other pushes it. | The structure is pinned at both ends, so has a high out-of-plane rigidity | Not readily suitable for ink jets which directly push the ink | IJ18 |
| Curl inwards | A set of actuators curl inwards to reduce the volume of ink that they enclose. | Good fluid flow to the region behind the actuator increases efficiency | Design complexity | IJ20, IJ42 |
| Curl outwards | A set of actuators curl outwards, pressurizing ink in a chamber surrounding the actuators, and expelling ink from a nozzle in the chamber. | Relatively simple construction | Relatively large chip area | IJ43 |
| Iris | Multiple vanes enclose a volume of ink. These simultaneously rotate, reducing the volume between the vanes. | High efficiency Small chip area | High fabrication complexity Not suitable for pigmented inks | IJ22 |
| Acoustic vibration | The actuator vibrates at a high frequency. | The actuator can be physically distant from the ink | Large area required for efficient operation at useful frequencies Acoustic coupling and crosstalk Complex drive circuitry Poor control of drop volume and position | 1993 Hadimioglu et al, EUP 550,192 1993 Elrod et al, EUP 572,220 |
| None | In various ink jet designs the actuator does not move. | No moving parts | Various other tradeoffs are required to eliminate moving parts | Silverbrook, EP 0771 658 A2 and related patent applications Tone-jet |

Nozzle refill method

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | Fabrication simplicity Operational simplicity | Low speed Surface tension force relatively small compared to actuator force Long refill time usually dominates the total repetition rate | Thermal ink jet Piezoelectric ink jet IJ01-IJ07, IJ10-IJ14, IJ16, IJ20, IJ22-IJ45 |
| Shuttered oscillating ink pressure | Ink to the nozzle chamber is provided at a pressure that oscillates at twice the | High speed Low actuator energy, as the actuator need only | Requires common ink pressure oscillator May not be | IJ08, IJ13, IJ15, IJ17, IJ18, IJ19, IJ21 |

-continued

Nozzle refill method

| | Description | Advantages | Disadvantages | Examples |
|---|---|---|---|---|
| | drop ejection frequency. When a drop is to be ejected, the shutter is opened for 3 half cycles: drop ejection, actuator return, and refill. The shutter is then closed to prevent the nozzle chamber emptying during the next negative pressure cycle. | open or close the shutter, instead of ejecting the ink drop | suitable for pigmented inks | |
| Refill actuator | After the main actuator has ejected a drop a second (refill) actuator is energized. The refill actuator pushes ink into the nozzle chamber. The refill actuator returns slowly, to prevent its return from emptying the chamber again. | High speed, as the nozzle is actively refilled | Requires two independent actuators per nozzle | IJ09 |
| Positive ink pressure | The ink is held a slight positive pressure. After the ink drop is ejected, the nozzle chamber fills quickly as surface tension and ink pressure both operate to refill the nozzle. | High refill rate, therefore a high drop repetition rate is possible | Surface spill must be prevented Highly hydrophobic print head surfaces are required | Silverbrook, EP 0771 658 A2 and related patent applications Alternative for:, IJ01-IJ07, IJ10-IJ14, IJ16, IJ20, IJ22-IJ45 |

Method of restricting back-flow through inlet

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | Design simplicity Operational simplicity Reduces crosstalk | Restricts refill rate May result in a relatively large chip area Only partially effective | Thermal ink jet Piezoelectric ink jet IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | Drop selection and separation forces can be reduced Fast refill time | Requires a method (such as a nozzle rim or effective hydrophobizing, or both) to prevent flooding of the ejection surface of the print head. | Silverbrook, EP 0771 658 A2 and related patent applications Possible operation of the following: IJ01-IJ07, IJ09-IJ12, IJ14, IJ16, IJ20, IJ22, IJ23-IJ34, IJ36-IJ41, IJ44 |
| Baffle | One or more baffles are placed in the inlet ink flow. When the actuator is energized, the rapid ink movement creates eddies which restrict the flow through the inlet. The slower refill | The refill rate is not as restricted as the long inlet method. Reduces crosstalk | Design complexity May increase fabrication complexity (e.g. Tektronix hot melt Piezoelectric print heads). | HP Thermal Ink Jet Tektronix piezoelectric ink jet |

-continued

Method of restricting back-flow through inlet

| | Description | Advantages | Disadvantages | Examples |
|---|---|---|---|---|
| | process is unrestricted, and does not result in eddies. | | | |
| Flexible flap restricts inlet | In this method recently disclosed by Canon, the expanding actuator (bubble) pushes on a flexible flap that restricts the inlet. | Significantly reduces back-flow for edge-shooter thermal ink jet devices | Not applicable to most ink jet configurations Increased fabrication complexity Inelastic deformation of polymer flap results in creep over extended use | Canon |
| Inlet filter | A filter is located between the ink inlet and the nozzle chamber. The filter has a multitude of small holes or slots, restricting ink flow. The filter also removes particles which may block the nozzle. | Additional advantage of ink filtration Ink filter may be fabricated with no additional process steps | Restricts refill rate May result in complex construction | IJ04, IJ12, IJ24, IJ27, IJ29, IJ30 |
| Small inlet compared to nozzle | The ink inlet channel to the nozzle chamber has a substantially smaller cross section than that of the nozzle, resulting in easier ink egress out of the nozzle than out of the inlet. | Design simplicity | Restricts refill rate May result in a relatively large chip area Only partially effective | IJ02, IJ37, IJ44 |
| Inlet shutter | A secondary actuator controls the position of a shutter, closing off the ink inlet when the main actuator is energized. | Increases speed of the ink-jet print head operation | Requires separate refill actuator and drive circuit | IJ09 |
| The inlet is located behind the ink-pushing surface | The method avoids the problem of inlet back-flow by arranging the ink-pushing surface of the actuator between the inlet and the nozzle. | Back-flow problem is eliminated | Requires careful design to minimize the negative pressure behind the paddle | IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | Significant reductions in back-flow can be achieved Compact designs possible | Small increase in fabrication complexity | IJ07, IJ20, IJ26, IJ38 |
| Nozzle actuator does not result in ink back-flow | In some configurations of ink jet, there is no expansion or movement of an actuator which may cause ink back-flow through the inlet. | Ink back-flow problem is eliminated | None related to ink back-flow on actuation | Silverbrook, EP 0771 658 A2 and related patent applications Valve-jet Tone-jet |

Nozzle Clearing Method

| | Description | Advantages | Disadvantages | Examples |
|---|---|---|---|---|
| Normal nozzle firing | All of the nozzles are fired periodically, before the ink has a chance to dry. When not in use the nozzles | No added complexity on the print head | May not be sufficient to displace dried ink | Most ink jet systems IJ01, IJ02, IJ03, IJ04, IJ05, IJ06, IJ07, IJ09, IJ10, |

-continued

Nozzle Clearing Method

| | Description | Advantages | Disadvantages | Examples |
|---|---|---|---|---|
| | are sealed (capped) against air. The nozzle firing is usually performed during a special clearing cycle, after first moving the print head to a cleaning station. | | | IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink heater | In systems which heat the ink, but do not boil it under normal situations, nozzle clearing can be achieved by over-powering the heater and boiling ink at the nozzle. | Can be highly effective if the heater is adjacent to the nozzle | Requires higher drive voltage for clearing May require larger drive transistors | Silverbrook, EP 0771 658 A2 and related patent applications |
| Rapid success-ion of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | Does not require extra drive circuits on the print head Can be readily controlled and initiated by digital logic | Effectiveness depends substantially upon the configuration of the ink jet nozzle | May be used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | Where an actuator is not normally driven to the limit of its motion, nozzle clearing may be assisted by providing an enhanced drive signal to the actuator. | A simple solution where applicable | Not suitable where there is a hard limit to actuator movement | May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved May be implemented at very low cost in systems which already include acoustic actuators | High implementation cost if system does not already include an acoustic actuator | IJ08, IJ13, IJ15, IJ17, IJ18, IJ19, IJ21 |
| Nozzle clearing plate | A microfabricated plate is pushed against the nozzles. The plate has a post for every nozzle. A post moves through each nozzle, displacing dried ink. | Can clear severely clogged nozzles | Accurate mechanical alignment is required Moving parts are required There is risk of damage to the nozzles Accurate fabrication is required | Silverbrook, EP 0771 658 A2 and related patent applications |
| Ink pressure pulse | The pressure of the ink is temporarily increased so that ink streams from all of the nozzles. This may be used in conjunction with actuator energizing. | May be effective where other methods cannot be used | Requires pressure pump or other pressure actuator Expensive Wasteful of ink | May be used with all IJ series ink jets |

-continued

Nozzle Clearing Method

| | Description | Advantages | Disadvantages | Examples |
|---|---|---|---|---|
| Print head wiper | A flexible 'blade' is wiped across the print head surface. The blade is usually fabricated from a flexible polymer, e.g. rubber or synthetic elastomer. | Effective for planar print head surfaces Low cost | Difficult to use if print head surface is non-planar or very fragile Requires mechanical parts Blade can wear out in high volume print systems | Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | Can be effective where other nozzle clearing methods cannot be used Can be implemented at no additional cost in some ink jet configurations | Fabrication complexity | Can be used with many IJ series ink jets |

Nozzle plate construction

| | Description | Advantages | Disadvantages | Examples |
|---|---|---|---|---|
| Electro-formed nickel | A nozzle plate is separately fabricated from electroformed nickel, and bonded to the print head chip. | Fabrication simplicity | High temperatures and pressures are required to bond nozzle plate Minimum thickness constraints Differential thermal expansion | Hewlett Packard Thermal Ink jet |
| Laser ablated or drilled polymer | Individual nozzle holes are ablated by an intense UV laser in a nozzle plate, which is typically a polymer such as polyimide or polysulphone | No masks required Can be quite fast Some control over nozzle profile is possible Equipment required is relatively low cost | Each hole must be individually formed Special equipment required Slow where there are many thousands of nozzles per print head May produce thin burrs at exit holes | Canon Bubblejet 1988 Sercel et al., SPIE, Vol. 998 Excimer Beam Applications, pp. 76-83 1993 Watanabe et al., USP 5,208,604 |
| Silicon micro-machined | A separate nozzle plate is micromachined from single crystal silicon, and bonded to the print head wafer. | High accuracy is attainable | Two part construction High cost Requires precision alignment Nozzles may be clogged by adhesive | K. Bean, IEEE Transactions on Electron Devices, Vol. ED-25, No. 10, 1978, pp 1185-1195 Xerox 1990 Hawkins et al., USP 4,899,181 |
| Glass capillaries | Fine glass capillaries are drawn from glass tubing. This method has been used for making individual nozzles, but is difficult to use for bulk manufacturing of print heads with thousands of nozzles. | No expensive equipment required Simple to make single nozzles | Very small nozzle sizes are difficult to form Not suited for mass production | 1970 Zoltan USP 3,683,212 |
| Monolithic, surface micro-machined using VLSI litho- | The nozzle plate is deposited as a layer using standard VLSI deposition techniques. Nozzles are etched in the nozzle plate using | High accuracy (<1 µm) Monolithic Low cost Existing processes can be | Requires sacrificial layer under the nozzle plate to form the nozzle chamber Surface may be | Silverbrook, EP 0771 658 A2 and related patent applications IJ01, IJ02, IJ04, IJ11, IJ12, IJ17, |

-continued

Nozzle plate construction

| | Description | Advantages | Disadvantages | Examples |
|---|---|---|---|---|
| graphic processes | VLSI lithography and etching. | used | fragile to the touch | IJ18, IJ20, IJ22, IJ24, IJ27, IJ28, IJ29, IJ30, IJ31, IJ32, IJ33, IJ34, IJ36, IJ37, IJ38, IJ39, IJ40, IJ41, IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | High accuracy (<1 μm) Monolithic Low cost No differential expansion | Requires long etch times Requires a support wafer | IJ03, IJ05, IJ06, IJ07, IJ08, IJ09, IJ10, IJ13, IJ14, IJ15, IJ16, IJ19, IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | No nozzles to become clogged | Difficult to control drop position accurately Crosstalk problems | Ricoh 1995 Sekiya et al USP 5,412,413 1993 Hadimioglu et al EUP 550,192 1993 Elrod et al EUP 572,220 |
| Trough | Each drop ejector has a trough through which a paddle moves. There is no nozzle plate. | Reduced manufacturing complexity Monolithic | Drop firing direction is sensitive to wicking. | IJ35 |
| Nozzle slit instead of individual nozzles | The elimination of nozzle holes and replacement by a slit encompassing many actuator positions reduces nozzle clogging, but increases crosstalk due to ink surface waves | No nozzles to become clogged | Difficult to control drop position accurately Crosstalk problems | 1989 Saito et al USP 4,799,068 |

Drop ejection direction

| | Description | Advantages | Disadvantages | Examples |
|---|---|---|---|---|
| Edge ('edge shooter') | Ink flow is along the surface of the chip, and ink drops are ejected from the chip edge. | Simple construction No silicon etching required Good heat sinking via substrate Mechanically strong Ease of chip handing | Nozzles limited to edge High resolution is difficult Fast color printing requires one print head per color | Canon Bubblejet 1979 Endo et al GB patent 2,007,162 Xerox heater-in-pit 1990 Hawkins et al U.S. Pat. No. 4,899,181 Tone-jet |
| Surface ('roof shooter') | Ink flow is along the surface of the chip, and ink drops are ejected from the chip surface, normal to the plane of the chip. | No bulk silicon etching required Silicon can make an effective heat sink Mechanical strength | Maximum ink flow is severely restricted | Hewlett-Packard TIJ 1982 Vaught et al U.S. Pat. No. 4,490,728 IJ02, IJ11, IJ12, IJ20, IJ22 |
| Through chip, forward ('up shooter') | Ink flow is through the chip, and ink drops are ejected from the front surface of the chip. | High ink flow Suitable for pagewidth print heads High nozzle packing density therefore low manufacturing cost | Requires bulk silicon etching | Silverbrook, EP 0771 658 A2 and related patent applications IJ04, IJ17, IJ18, IJ24, IJ27-IJ45 |

-continued

Drop ejection direction

| | Description | Advantages | Disadvantages | Examples |
|---|---|---|---|---|
| Through chip, reverse ('down shooter') | Ink flow is through the chip, and ink drops are ejected from the rear surface of the chip. | High ink flow Suitable for pagewidth print heads High nozzle packing density therefore low manufacturing cost | Requires wafer thinning Requires special handling during manufacture | IJ01, IJ03, IJ05, IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors, | Suitable for piezoelectric print heads | Pagewidth print heads require several thousand connections to drive circuits Cannot be manufactured in standard CMOS fabs Complex assembly required | Epson Stylus Tektronix hot melt piezoelectric ink jets |

Ink type

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | Environmentally friendly No odor | Slow drying Corrosive Bleeds on paper May strikethrough Cockles paper | Most existing ink jets All IJ series ink jets Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly No odor Reduced bleed Reduced wicking Reduced strikethrough | Slow drying Corrosive Pigment may clog nozzles Pigment may clog actuator mechanisms Cockles paper | IJ02, IJ04, IJ21, IJ26, IJ27, IJ30 Silverbrook, EP 0771 658 A2 and related patent applications Piezoelectric ink-jets Thermal ink jets (with significant restrictions) |
| Methyl Ethyl Ketone (MEK) | MEK is a highly volatile solvent used for industrial printing on difficult surfaces such as aluminum cans. | Very fast drying Prints on various substrates such as metals and plastics | Odorous Flammable | All IJ series ink jets |
| Alcohol (ethanol, 2-butanol, and others) | Alcohol based inks can be used where the printer must operate at temperatures below the freezing point of water. An example of this is in-camera consumer photographic printing. | Fast drying Operates at sub-freezing temperatures Reduced paper cockle Low cost | Slight odor Flammable | All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer | No drying time-ink instantly freezes on the print medium Almost any print medium can be used No paper cockle occurs No wicking occurs No bleed occurs No strikethrough occurs | High viscosity Printed ink typically has a 'waxy' feel Printed pages may 'block' Ink temperature may be above the curie point of permanent magnets Ink heaters consume power | Tektronix hot melt piezoelectric ink jets 1989 Nowak U.S. Pat. No. 4,820,346 All IJ series ink jets |

-continued

| | Ink type | | | |
|---|---|---|---|---|
| | Description | Advantages | Disadvantages | Examples |
| | roller. | | Long warm-up time | |
| Oil | Oil based inks are extensively used in offset printing. They have advantages in improved characteristics on paper (especially no wicking or cockle). Oil soluble dies and pigments are required. | High solubility medium for some dyes Does not cockle paper Does not wick through paper | High viscosity: this is a significant limitation for use in ink jets, which usually require a low viscosity. Some short chain and multi-branched oils have a sufficiently low viscosity. Slow drying | All IJ series ink jets |
| Microemulsion | A microemulsion is a stable, self forming emulsion of oil, water, and surfactant. The characteristic drop size is less than 100 nm, and is determined by the preferred curvature of the surfactant. | Stops ink bleed High dye solubility Water, oil, and amphiphilic soluble dies can be used Can stabilize pigment suspensions | Viscosity higher than water Cost is slightly higher than water based ink High surfactant concentration required (around 5%) | All IJ series ink jets |

While the present invention has been illustrated and described with reference to exemplary embodiments thereof, various modifications will be apparent to and might readily be made by those skilled in the art without departing from the scope and spirit of the present invention. Accordingly, it is not intended that the scope of the claims appended hereto be limited to the description as set forth herein, but, rather, that the claims be broadly construed.

What is claimed is:

1. A printhead assembly for a printer which prints onto a moving web that follows a path, the printhead assembly comprising:
a full width printhead located across the path, the printhead comprising a plurality of inkjet nozzles having nozzle chambers and thermal bend actuators external to the nozzle chambers, each thermal bend actuator having an arm comprising a plurality of separate spaced apart elongate thermal actuator units, the thermal actuator units being configured to thermally expand upon heating thereby bending the associated arm so as to cause ink ejection from the nozzles;
the printhead comprising a color printhead which is at least as wide as the web;
the color printhead being supplied with a number of different colored inks.

2. The printhead assembly of claim 1, further comprising:
a rail which is located across the path and along which the printhead slides into and out of a printing position.

3. The printhead assembly of claim 2, wherein:
the printhead is secured to the rail by fasteners which allow the printhead to be removed when the fasteners are disengaged.

4. The printhead assembly of claim 1, wherein:
the inks are contained in individual reservoirs and a supply tube connects each reservoir to the printhead.

5. The printhead assembly of claim 4, further comprising:
a coupling in each ink supply tube which allows disconnection and withdrawal of the printhead.

6. A printhead assembly as claimed in claim 1 wherein the web is printed by the printhead at a rate exceeding 0.02 square meters per second (775 square feet per hour).

7. A printhead assembly as claimed in claim 1 wherein the web is printed by the printhead at a rate exceeding 0.1 square meters per second (3875 square feet per hour).

8. A printhead assembly as claimed in claim 1 wherein the web is printed by the printhead at a rate exceeding 0.2 square meters per second (7750 square feet per hour).

9. A printhead assembly as claimed in claim 1 wherein the printhead has more than 7680 nozzles.

10. A printhead assembly as claimed in claim 1 wherein the printhead has more than 20,000 nozzles.

11. A printhead assembly as claimed in claim 1 wherein the printhead has more than 100,000 nozzles.

12. A printhead assembly as claimed in claim 1 wherein the printhead has more than 250,000 nozzles.

13. A printhead assembly as claimed in claim 1 wherein the printhead prints ink drops with a volume of less than 5 picoliters.

14. A printhead assembly as claimed in claim 1 wherein the printhead prints ink drops with a volume of less than 3 picoliters.

15. A printhead assembly as claimed in claim 1 wherein the printhead prints ink drops with a volume of less than 1.5 picoliters.

16. A printhead assembly as claimed in claim 1 wherein the printer is adapted to produce rolls of wallpaper, the printer comprising:
a housing in which is located a media path which extends from a blank media intake to a wallpaper exit slot;
a multi-color roll width removable printhead located in the housing and across the media path;
the printhead being supplied by separate ink reservoirs, the reservoirs connected to the printhead by a an ink supply harness, there being a disconnect coupling between the reservoirs and the printhead;
one or more input devices for capturing operator instructions;
a processor which accepts operator inputs which are used to configure the printer for producing a particular roll.

* * * * *